US009054319B2

(12) United States Patent
Nishimura et al.

(10) Patent No.: US 9,054,319 B2
(45) Date of Patent: Jun. 9, 2015

(54) ORGANIC ELECTROLUMINESCENCE DEVICE

(75) Inventors: Kazuki Nishimura, Sodegaura (JP); Toshihiro Iwakuma, Sodegaura (JP); Kenichi Fukuoka, Sodegaura (JP); Chishio Hosokawa, Sodegaura (JP); Jun Endo, Sodegaura (JP); Nobuhiro Yabunouchi, Sodegaura (JP); Hiroshi Yamamoto, Sodegaura (JP)

(73) Assignee: IDEMITSU KOSAN CO., LTD., Tokyo (JP)

( * ) Notice: Subject to any disclaimer, the term of this patent is extended or adjusted under 35 U.S.C. 154(b) by 0 days.

(21) Appl. No.: 13/439,731

(22) Filed: Apr. 4, 2012

(65) Prior Publication Data

US 2012/0199817 A1 Aug. 9, 2012

Related U.S. Application Data

(63) Continuation of application No. 12/744,178, filed as application No. PCT/JP2008/071267 on Nov. 21, 2008, now Pat. No. 8,759,819.

(30) Foreign Application Priority Data

Nov. 22, 2007 (JP) ................................ 2007-303713

(51) Int. Cl.
*H01L 29/08* (2006.01)
*H01L 51/00* (2006.01)
(Continued)

(52) U.S. Cl.
CPC ............ *H01L 51/0054* (2013.01); *C09K 11/06* (2013.01); *C09K 2211/1007* (2013.01); *C09K 2211/1011* (2013.01); *C09K 2211/1014* (2013.01); *C09K 2211/1044* (2013.01); *C09K 2211/185* (2013.01); *C09K 2211/186* (2013.01);
(Continued)

(58) Field of Classification Search
USPC ............................................ 257/40; 428/690
See application file for complete search history.

(56) References Cited

U.S. PATENT DOCUMENTS 6,066,426 A * 5/2000 Mott et al. .................. 430/58.2
6,140,004 A * 10/2000 Mott et al. .................. 430/132

(Continued)

FOREIGN PATENT DOCUMENTS

CN 1703937 A 11/2005
EP 1 645 610 A1 4/2006

(Continued)

OTHER PUBLICATIONS

Jianping Lu, Synthesis and Properties of Multi-Triarylamine-Substituted Carbazole-Based Dendrimers with an Oligothiophene Core for Potential Applications in Organic Solar Cells and Light-Emitting Diodes, 2006, Chem. Mater. 2006, 18, 6194-6203.*

(Continued)

*Primary Examiner* — Caleb Henry
(74) *Attorney, Agent, or Firm* — Foley & Lardner LLP

(57) ABSTRACT

An organic electroluminescence device includes an anode, a cathode, and an organic thin-film layer interposed between the anode and the cathode. The organic thin-film layer includes a phosphorescent-emitting layer containing a host and a phosphorescent dopant, and an electron transporting layer that is provided closer to the cathode than the phosphorescent-emitting layer. The host contains a substituted or unsubstituted polycyclic fused aromatic skeleton.

17 Claims, 1 Drawing Sheet

(51) Int. Cl.
*C09K 11/06* (2006.01)
*H01L 51/50* (2006.01)

(52) U.S. Cl.
CPC ........ *H01L 51/0052* (2013.01); *H01L 51/0055* (2013.01); *H01L 51/0059* (2013.01); *H01L 51/0067* (2013.01); *H01L 51/0071* (2013.01); *H01L 51/0072* (2013.01); *H01L 51/0085* (2013.01); *H01L 51/0087* (2013.01); *H01L 51/5016* (2013.01); *H01L 51/5048* (2013.01)

(56) References Cited

U.S. PATENT DOCUMENTS

| | | | | | |
|---|---|---|---|---|---|
| 6,162,824 | A * | 12/2000 | Ognyanov et al. | ............ | 514/438 |
| 6,660,410 | B2 * | 12/2003 | Hosokawa | .................... | 428/690 |
| 6,818,260 | B2 * | 11/2004 | Farrand et al. | ................. | 428/1.1 |
| 6,835,513 | B2 * | 12/2004 | Jubran et al. | ............... | 430/58.15 |
| 6,835,514 | B2 * | 12/2004 | Jubran et al. | ............... | 430/58.45 |
| 6,838,193 | B2 * | 1/2005 | Tao et al. | ...................... | 428/690 |
| 6,864,025 | B2 * | 3/2005 | Law et al. | .................... | 430/58.6 |
| 6,872,824 | B2 * | 3/2005 | Wong et al. | ................... | 544/294 |
| 6,905,804 | B2 * | 6/2005 | Law et al. | .................. | 430/58.45 |
| 6,908,783 | B1 * | 6/2005 | Kuehl et al. | ..................... | 438/99 |
| 6,939,624 | B2 | 9/2005 | Lamansky et al. | | |
| 6,955,869 | B2 * | 10/2005 | Jubran et al. | .................... | 430/79 |
| 7,011,917 | B2 * | 3/2006 | Jubran et al. | .................... | 430/72 |
| 7,063,928 | B2 * | 6/2006 | Law et al. | .................. | 430/119.6 |
| 7,118,839 | B2 * | 10/2006 | Law et al. | .................. | 430/58.15 |
| 7,202,004 | B2 * | 4/2007 | Law et al. | .................. | 430/119.6 |
| 7,241,513 | B2 * | 7/2007 | Suzuki et al. | ................. | 428/690 |
| 7,329,722 | B2 * | 2/2008 | Vaitkeviciene et al. | ....... | 528/423 |
| 7,358,014 | B2 * | 4/2008 | Law et al. | .................. | 430/58.15 |
| 7,419,728 | B2 | 9/2008 | Ren et al. | | |
| 7,429,426 | B2 | 9/2008 | Brown et al. | | |
| 7,431,997 | B2 * | 10/2008 | Hwang et al. | ................. | 428/690 |
| 7,479,357 | B2 * | 1/2009 | Law et al. | .................. | 430/58.15 |
| 7,501,216 | B2 * | 3/2009 | Jubran et al. | ............... | 430/58.35 |
| 7,553,560 | B2 | 6/2009 | Lamansky et al. | | |
| 7,674,795 | B2 * | 3/2010 | Mailliet et al. | ........... | 514/252.04 |
| 7,737,627 | B2 * | 6/2010 | Hwang et al. | ................. | 313/504 |
| 7,745,016 | B2 | 6/2010 | Matsuura et al. | | |
| 8,198,801 | B2 * | 6/2012 | Kim et al. | ..................... | 313/504 |
| 2002/0051895 | A1 * | 5/2002 | Cho et al. | ...................... | 428/690 |
| 2002/0107405 | A1 * | 8/2002 | Lin et al. | ....................... | 548/439 |
| 2002/0182441 | A1 | 12/2002 | Lamansky et al. | | |
| 2003/0207188 | A1 * | 11/2003 | Jubran et al. | ............... | 430/58.15 |
| 2004/0147742 | A1 * | 7/2004 | Wong et al. | ................... | 544/230 |
| 2004/0214036 | A1 * | 10/2004 | Bentsen et al. | ............... | 428/690 |
| 2004/0253389 | A1 * | 12/2004 | Suzuki et al. | .................. | 428/1.1 |
| 2005/0221124 | A1 * | 10/2005 | Hwang et al. | ................. | 428/690 |
| 2005/0225235 | A1 * | 10/2005 | Kim et al. | ..................... | 313/504 |
| 2005/0236977 | A1 * | 10/2005 | Yamada et al. | .............. | 313/504 |
| 2006/0088728 | A1 | 4/2006 | Kwong et al. | | |
| 2006/0134456 | A1 | 6/2006 | Ikeda et al. | | |
| 2006/0177693 | A1 | 8/2006 | Funahashi | | |
| 2006/0257684 | A1 | 11/2006 | Arakane et al. | | |
| 2006/0269784 | A1 | 11/2006 | Ren et al. | | |
| 2007/0051922 | A1 * | 3/2007 | Nakatani et al. | ......... | 252/301.35 |
| 2007/0054151 | A1 * | 3/2007 | Iwakuma et al. | ............. | 428/690 |
| 2007/0116982 | A1 | 5/2007 | Nakamura et al. | | |
| 2007/0172698 | A1 | 7/2007 | Iwakuma et al. | | |
| 2007/0222373 | A1 | 9/2007 | Arakane et al. | | |
| 2007/0232841 | A1 * | 10/2007 | Igawa et al. | ..................... | 585/27 |
| 2008/0007161 | A1 * | 1/2008 | Kamatani et al. | ............. | 313/504 |
| 2008/0093980 | A1 * | 4/2008 | Stoessel et al. | ............... | 313/504 |
| 2008/0193796 | A1 * | 8/2008 | Arakane et al. | ............... | 428/690 |
| 2009/0009074 | A1 | 1/2009 | Ikeda et al. | | |
| 2014/0077200 | A1 | 3/2014 | Yabunouchi et al. | | |

FOREIGN PATENT DOCUMENTS

| | | | |
|---|---|---|---|
| JP | 2003-313547 | A | 11/2003 |
| JP | 2004-506305 | A | 2/2004 |
| JP | 2004-204140 | A | 7/2004 |
| JP | 2006-052323 | A | 2/2006 |
| JP | 2006-073581 | A | 3/2006 |
| JP | 2007-084458 | A | 4/2007 |
| TW | 200533239 | A | 10/2005 |
| TW | 200628430 | A | 8/2006 |
| TW | 200735711 | A | 9/2007 |
| WO | WO-2004/016575 | A1 | 2/2004 |
| WO | WO-2004/034751 | A1 | 4/2004 |
| WO | WO-2006/130598 | A2 | 12/2006 |
| WO | WO-2007/029403 | A1 | 3/2007 |
| WO | WO-2007/123256 | A1 | 11/2007 |
| WO | WO-2007/127069 | A1 | 11/2007 |

OTHER PUBLICATIONS

Vinich Promarak, Synthesis and properties of stable amorphous hole-transporting molecules for electroluminescent devices, 2006, Tetrahedron Letters 47 (2006) 8949-8952.*

Zhong Hui Li, Synthesis and Functional Properties of End-Dendronized Oligo(9,9-diphenyl)fluorenes, 2006, vol. 8, No. 7 1499-1502.*

D. F. O'Brian et al., "Improved energy transfer in electrophosphorescent devices," Applied Physics Letters, vol. 74, No. 3, Jan. 18, 1999, pp. 442-444.

International Search Report mailed Mar. 3, 2009 received in PCT/JP2008/071267.

M. A. Baldo et al., "Very high-efficiency green organic light-emitting devices based on electrophosphorescence," Applied Physics Letters, vol. 75, No. 1, Jul. 5, 1999, pp. 4-6.

Office Action in U.S. Appl. No. 12/744,178 dated Dec. 8, 2011.

Office Action in U.S. Appl. No. 12/744,178 dated May 11, 2012.

Communication (Supplementary EP Search Report) in EP Appln No. 08851932.7 dated Mar. 20, 2012.

First Notification of Examiner's Opinion in Taiwanese Application No. 097145348 dated Jan. 29, 2014.

Non-final Office Action U.S. Appl. No. 12/744,178 dated Apr. 16, 2013.

Non-Final Office Action issued in U.S. Appl. No. 14/063,701 dated Jun. 30, 2014.

* cited by examiner

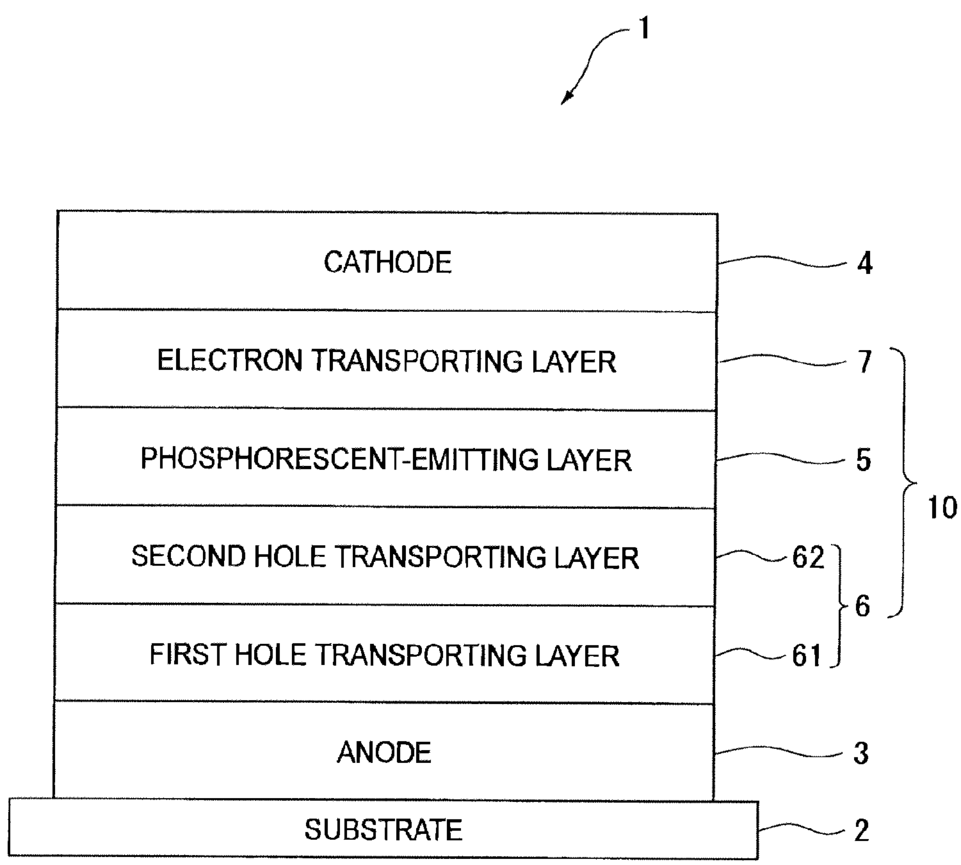
1
CATHODE
4
ELECTRON TRANSPORTING LAYER
7
PHOSPHORESCENT-EMITTING LAYER
5
10
SECOND HOLE TRANSPORTING LAYER
62
6
FIRST HOLE TRANSPORTING LAYER
61
ANODE
3
SUBSTRATE
2

ORGANIC ELECTROLUMINESCENCE DEVICE

CROSS-REFERENCE TO RELATED PATENT APPLICATIONS

This application is a Continuation of U.S. application Ser. No. 12/744,178, which was a National Stage Application of International Application number PCT/JP2008/071267, filed Nov. 21, 2008, which claims priority to Japan Application No. 2007-303713, filed Nov. 22, 2007, all of which are incorporated herein by reference in their entirety.

TECHNICAL FIELD

The present invention relates to an organic electroluminescence device. Particularly, the present invention relates to an organic electroluminescence device provided with a phosphorescent-emitting layer including a host and a phosphorescent dopant.

BACKGROUND ART

An organic electroluminescence device, which includes an organic emitting layer between an anode and a cathode, has been known to emit light using exciton energy generated by a recombination of holes and electrons that have been injected into the organic emitting layer.

Such an organic electroluminescence device, which has the advantages as a self-emitting device, is expected to serve as an emitting device excellent in luminous efficiency, image quality, power consumption and thin design.

For usage of an emitting layer in the organic electroluminescence device, a doping method, according to which an emitting material (dopant material) is doped to a host material, has been known as a usable method.

In this method, in order to efficiently generate excitons from the injected holes and electrons and efficiently convert the generated exciton energy into emission, exciton energy generated in the host is transferred to the dopant and the dopant emits light.

A typical emitting material used for an organic electroluminescence device is a fluorescent material that emits fluorescent light by a singlet exciton. However, recently, it is suggested to use a phosphorescent material that emits phosphorescent light by a triplet exciton instead of the fluorescent material (see, for instance, non-Patent Documents 1 and 2).

Since the internal quantum efficiency can be enhanced up to approximately 100% in theory by using such a phosphorescent material, an organic electroluminescence device having high efficiency and consuming less power can be obtained.

In order to intermolecularly transfer the energy from a phosphorescent host to a phosphorescent dopant (phosphorescent material) in a phosphorescent-emitting layer formed by the phosphorescent material being doped, triplet energy gap Eg(T) of the phosphorescent host is required to be larger than triplet energy gap Eg(T) of the phosphorescent dopant.

CBP is typically known as a material having an effectively large Eg(T).

By using CBP as the phosphorescent host, energy can be transferred from the phosphorescent host to the phosphorescent dopant exhibiting a predetermined emission wavelength (e.g., green, red), by which a phosphorescent-emitting device of high efficiency can be obtained (see, for instance, Patent Document 1).

However, although an organic electroluminescence device in which CBP is used as the host material exhibits much higher luminous efficiency due to phosphorescent emission, the organic electroluminescence device has such a short emission lifetime as to be practically inapplicable.

On the other hand, a variety of host materials for fluorescent dopants are known. Various proposals have been made on a fluorescent host, with a combination of a fluorescent dopant, excellent in luminous efficiency and emission lifetime.

However, although the fluorescent host has larger singlet energy Eg(S) than the fluorescent dopant, the fluorescent host does not necessarily have a large Eg(T). Accordingly, it is not successful to simply apply the fluorescent host to the phosphorescent material.

Well-known examples of such a fluorescent host are an anthracene derivative, pyrene derivative, naphthacene derivative and the like. However, for instance, the anthracene derivative has Eg(T) of approximately 1.9 eV, which is insufficient for emitting light of a wavelength in a visible light range of 450 nm to 750 nm. Accordingly, the anthracene derivative is not suitable as the phosphorescent host.

When electrons injected into the emitting layer are insufficient in volume, holes injected from the anode to the emitting layer is not recombined with electrons in the emitting layer and are possibly transferred into the cathode.

In order to solve such a problem, there has been known a method of forming an electron injecting/transporting layer from a material of a higher Ip (e.g., BAlq:Aluminum (III) bis(2-methyl-8-quinolinate)4-phenylphenolate) than the host material of the emitting layer and trapping holes in the emitting layer.

With this arrangement, hole blocking of the electron injecting/transporting layer can enhance probability of recombination of charges in the emitting layer, thereby providing phosphorescent emission with high efficiency.

However, on hole blocking, the holes concentrate on an interface between the emitting layer and the electron injecting/transporting layer. The concentration of the holes may promote degradation of the materials and reduce lifetime of the device. Accordingly, the electron injecting/transporting layer needs to be highly tolerant of the holes.

[Patent Document 1] JP-T-2004-506305

[non-Patent Document 1] Applied Physics letters Vol. 74 No. 3, pp 442-444

[non-Patent Document 2] Applied Physics letters Vol. 75 No. 1, pp 4-6

DISCLOSURE OF THE INVENTION

Problems to be Solved by the Invention

As described above, no phosphorescent host has been known to be capable of efficiently transferring energy to the phosphorescent dopant while providing such a long-life phosphorescent-emitting layer as to be practically applicable, which has hindered a practical realization of an organic electroluminescence device in which a phosphorescent material is used.

Moreover, although an electron injecting/transporting layer of a phosphorescent organic electroluminescence device needs to have hole blocking capability and hole tolerance, such an electron injecting/transporting material has not been developed.

An object of the invention is to solve the above problems and provide an organic electroluminescence device to emit phosphorescence of high efficiency and long lifetime.

Means for Solving the Problems

After conducting concentrated studies, the inventors have found that a compound having a polycyclic fused aromatic skeleton can be suitably used as a host material to a phosphorescent dopant.

Moreover, the inventors have found that nitrogen-containing heterocyclic derivatives represented by the following formulae (1) to (3) are excellent in electron injecting capability, which is effective for lowering a voltage to the organic electroluminescence device.

The inventors have found that a phosphorescent organic electroluminescence device with high efficiency and a long lifetime can be obtained with using these materials and reached the invention.

An organic electroluminescence device according to an aspect of the invention includes an anode, a cathode, and an organic thin-film layer interposed between the anode and the cathode, in which the organic thin-film layer includes a phosphorescent-emitting layer containing a host and a phosphorescent dopant, and an electron transporting layer that is provided closer to the cathode than the phosphorescent-emitting layer, and the host contains a substituted or unsubstituted polycyclic fused aromatic skeleton.

According to the aspect of the invention, the polycyclic fused aromatic skeleton is preferably selected from the group consisting of substituted or unsubstituted phenanthrene-diyl, chrysene-diyl, fluoranthene-diyl and triphenylene-diyl.

Moreover, the polycyclic fused aromatic skeleton is preferably substituted by a group having phenanthrene, chrysene, fluoranthene and triphenylene.

In the aspect of the invention, the polycyclic fused aromatic skeleton is preferably represented by one of formulae (12) to (15) below.

[Chemical Formula 1]

(12)

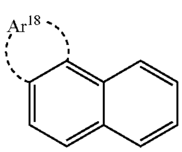

(13)

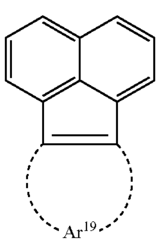

(14)

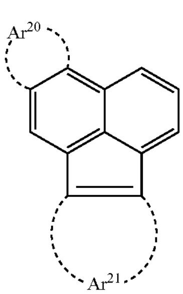

-continued (15)

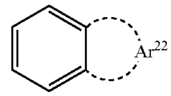

In the formulae (12) to (15), $Ar^{18}$ to $Ar^{22}$ represent a substituted or unsubstituted fused ring structure having 4 to 10 ring-forming carbon atoms (not counting atom(s) of substituent(s)).

Examples of the compounds represented by the above formula (12) are substituted or unsubstituted phenanthrene and chrysene.

Examples of the compounds represented by the above formula (13) are substituted or unsubstituted acenaphthylene, acenaphthene and fluoranthene.

An example of the compounds represented by the above formula (14) is substituted or unsubstituted benzofluoranthene.

An example of the compounds represented by the above formula (15) is substituted or unsubstituted naphthalene.

In the aspect of the invention, the polycyclic fused aromatic skeleton is preferably an elementary substance or a derivative of phenanthrene represented by a formula (50) below.

[Chemical Formula 2]

(50)

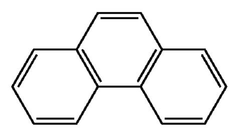

Examples of a substituent of the phenanthrene derivative are an alkyl group, cycloalkyl group, aralkyl group, alkenyl group, cycloalkenyl group, alkynyl group, hydroxyl group, mercapto group, alkoxy group, alkylthio group, arylether group, arylthioether group, aryl group, heterocyclic group, halogen, haloalkane, haloalkene, haloalkyne, cyano group, aldehyde group, carbonyl group, carboxyl group, ester group, amino group, nitro group, silyl group and siloxanyl group.

An Example of the phenanthrene derivative is represented by a formula (50A) below.

[Chemical Formula 3]

(50A)

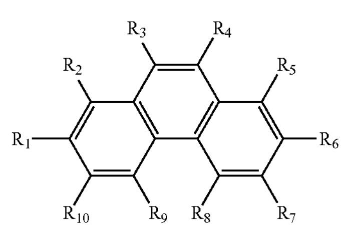

In the formula (50A), $R_1$ to $R_{10}$ each independently represent: a hydrogen atom; or a substituent consisting of one of or a combination of two or more of substituted or unsubstituted aryl group having 5 to 30 ring-forming carbon atoms (not counting carbon atoms(s) of substituent(s)), branched or linear alkyl group having 1 to 30 carbon atoms and substituted or unsubstituted cycloalkyl group having 3 to 20 carbon atoms.

Examples of the phenanthrene derivative represented by the formula (50) are as follows.

[Chemical Formula 4]
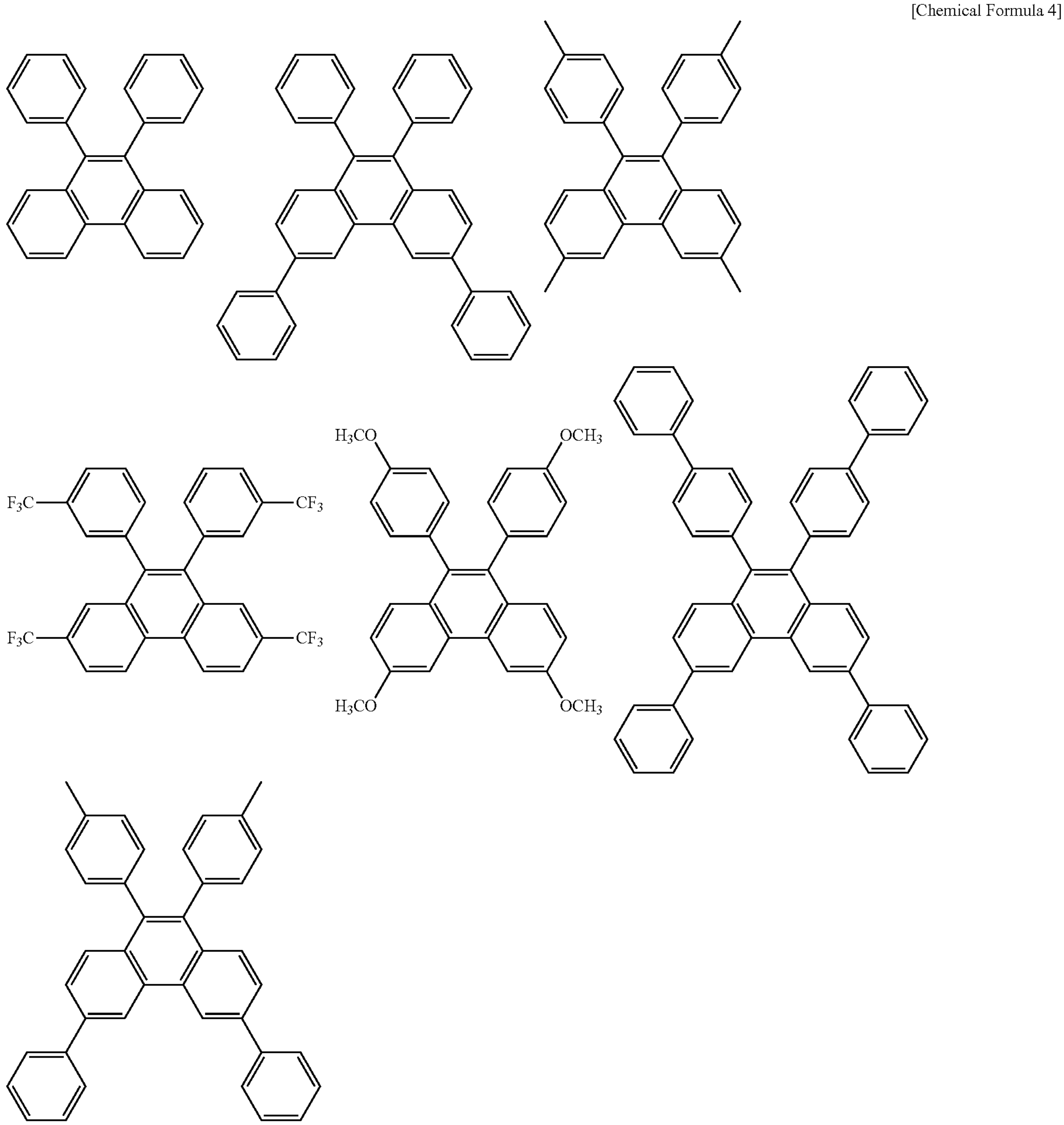
[Chemical Formula 5]
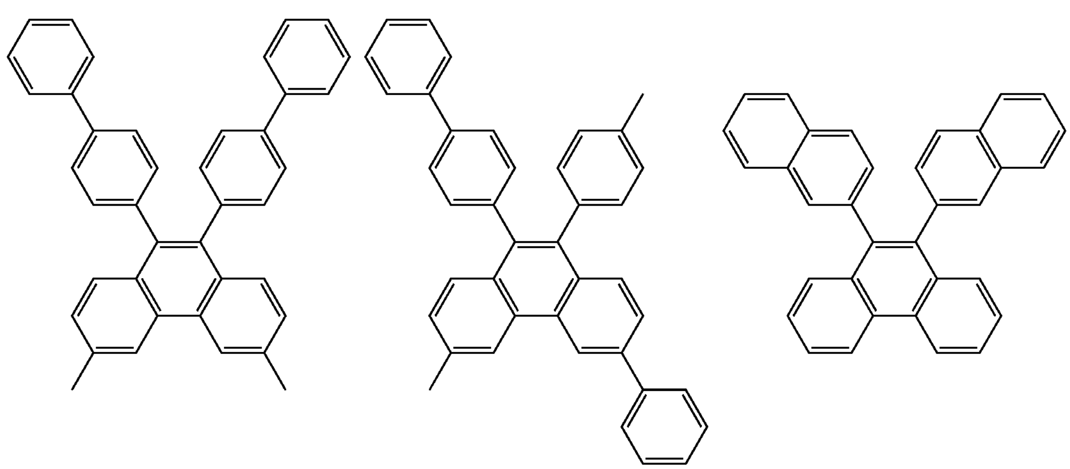

-continued
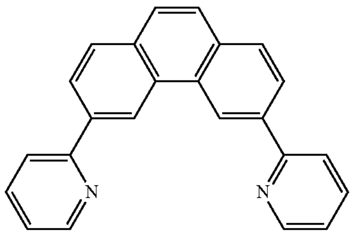
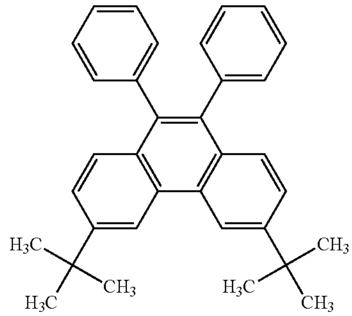
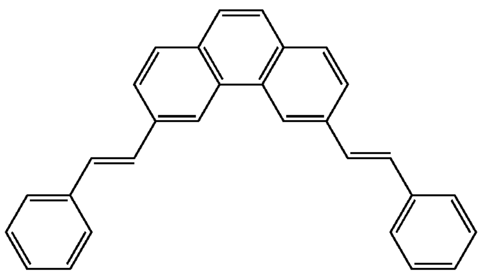
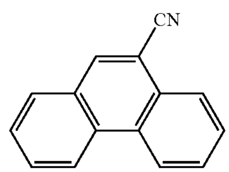
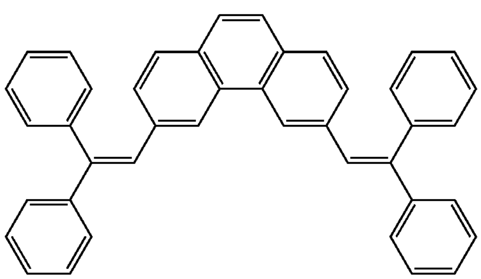
[Chemical Formula 6]
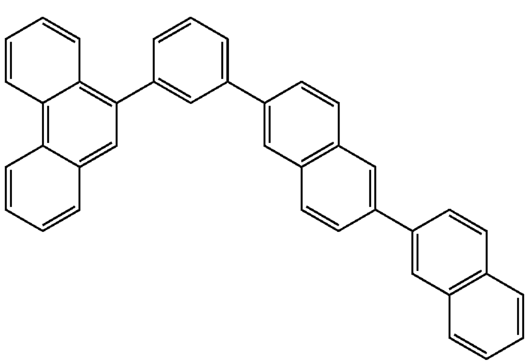
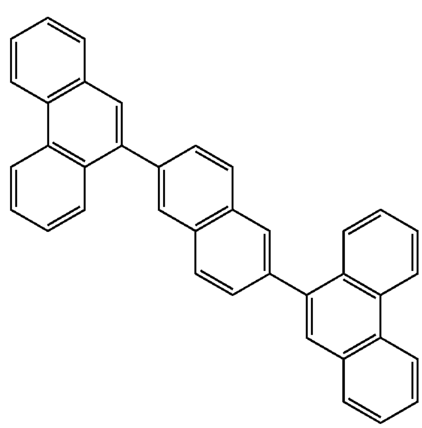

-continued
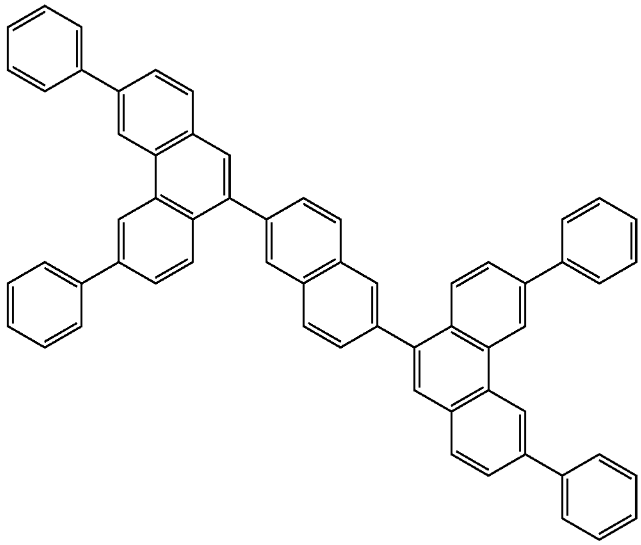
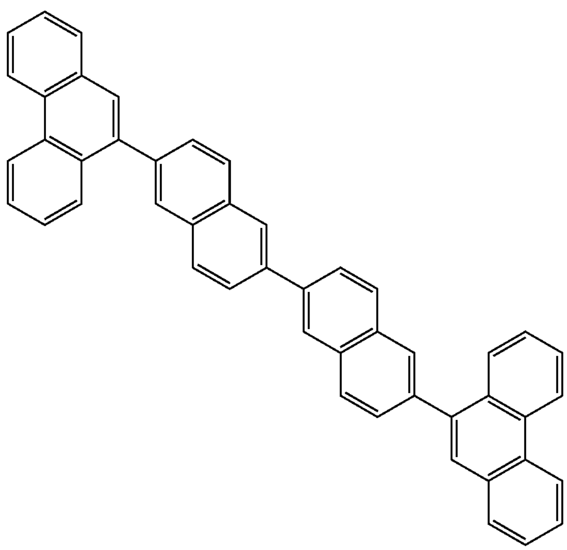
[Chemical Formula 7]
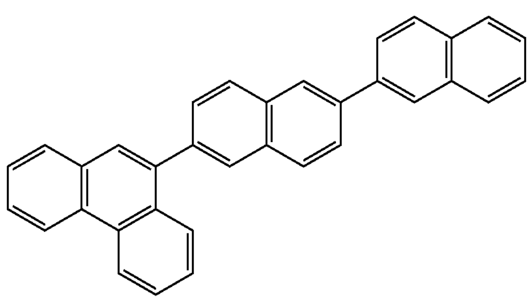
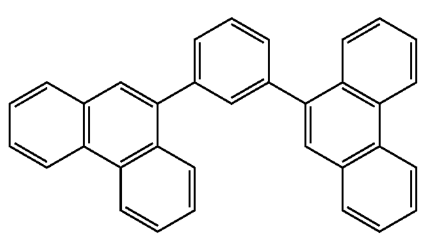

-continued
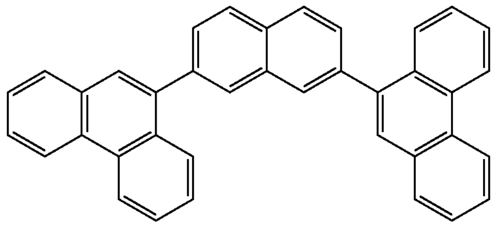
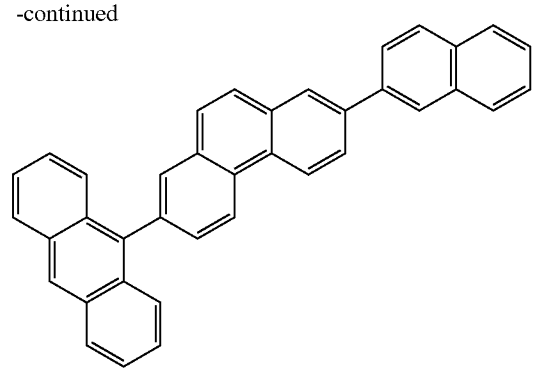
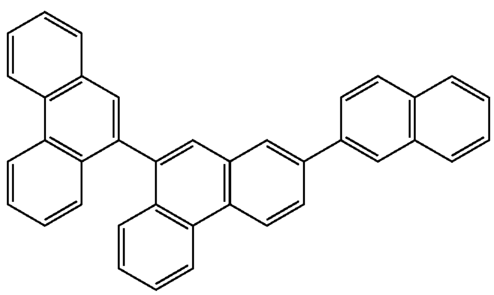
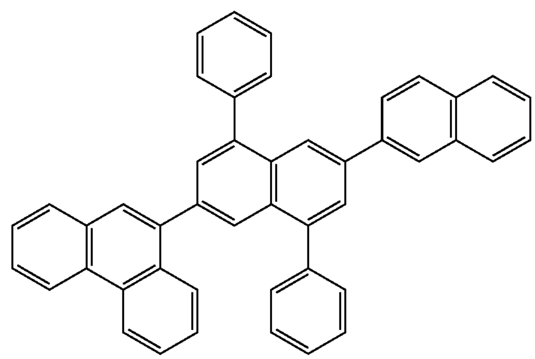
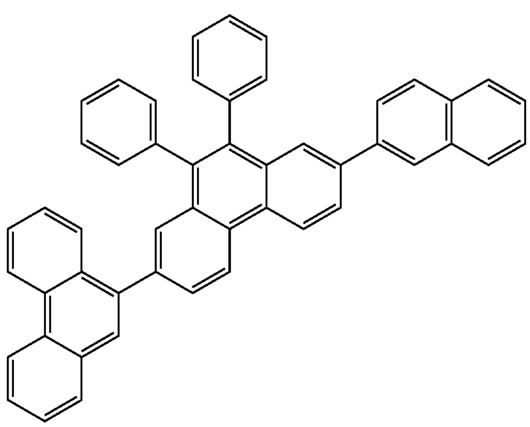
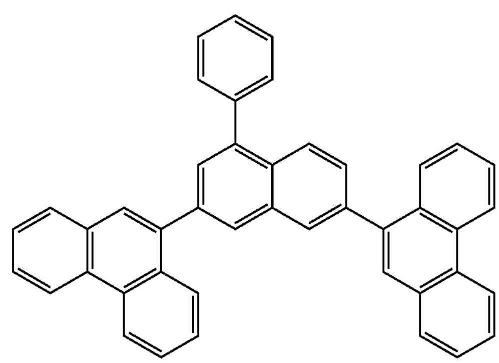
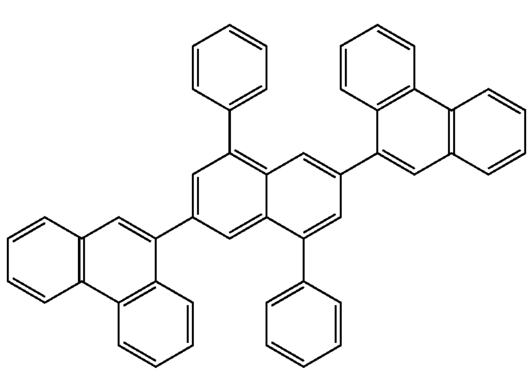
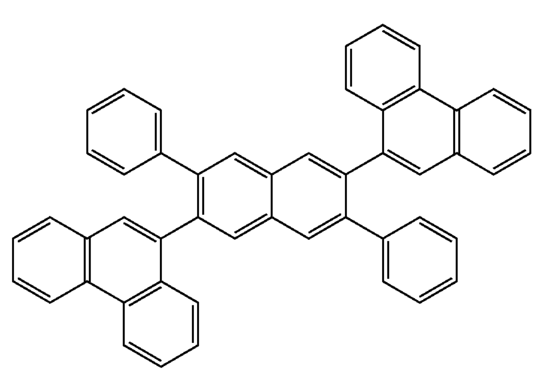

-continued
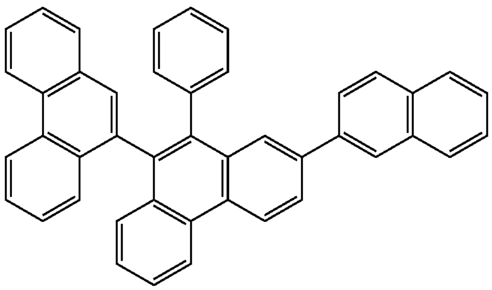
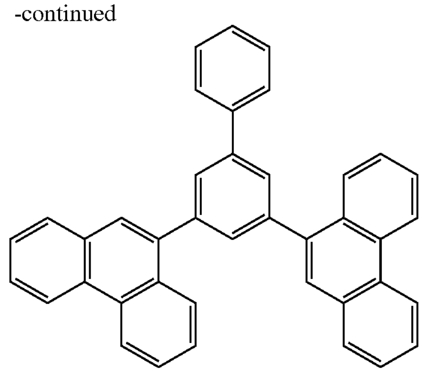
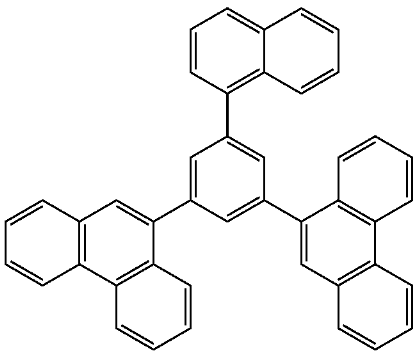
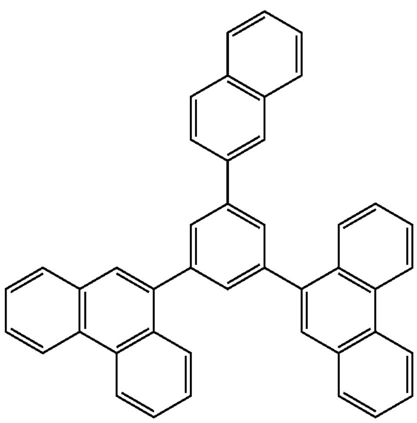
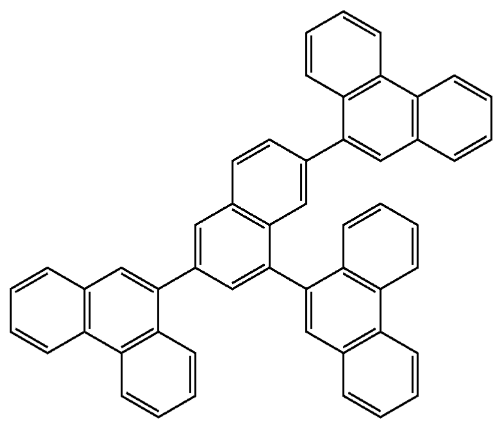
[Chemical Formula 8]
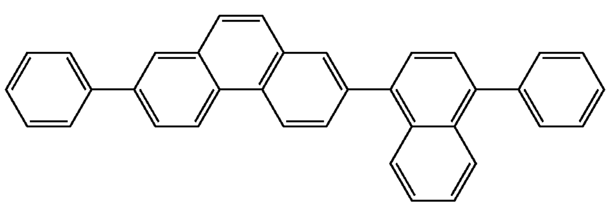
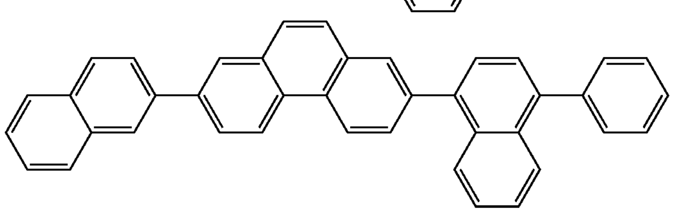
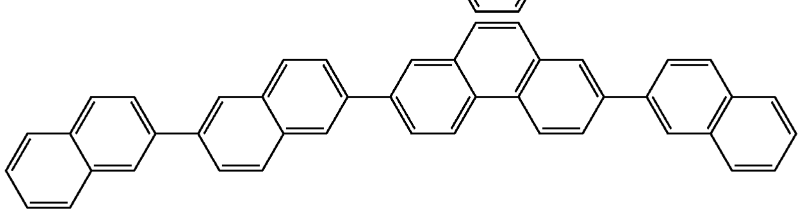

-continued
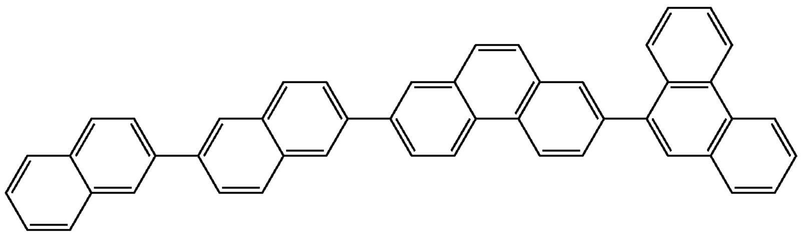
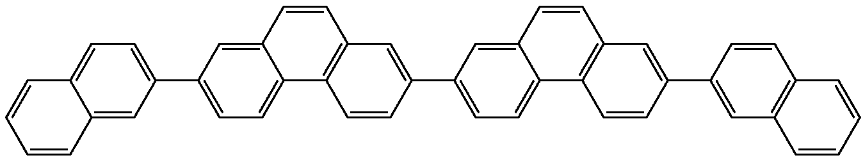
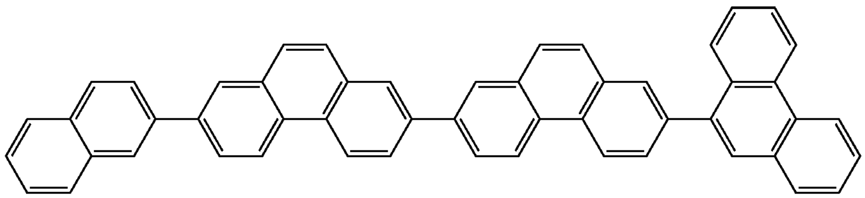
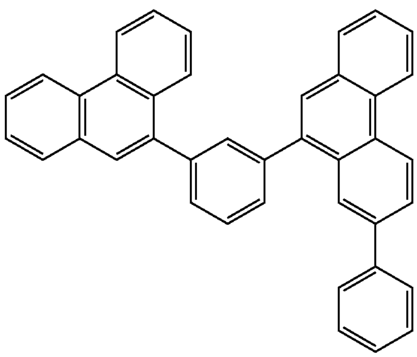
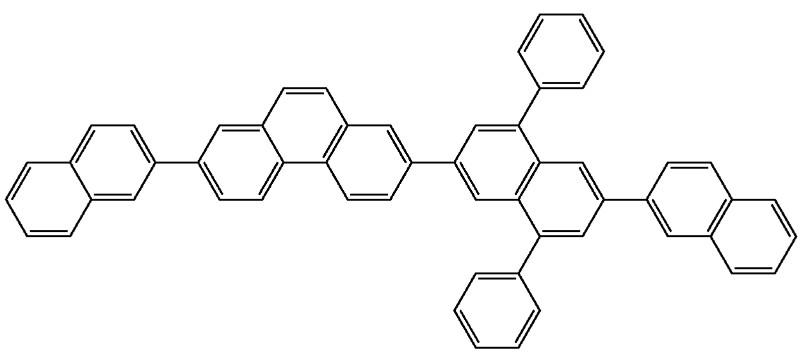
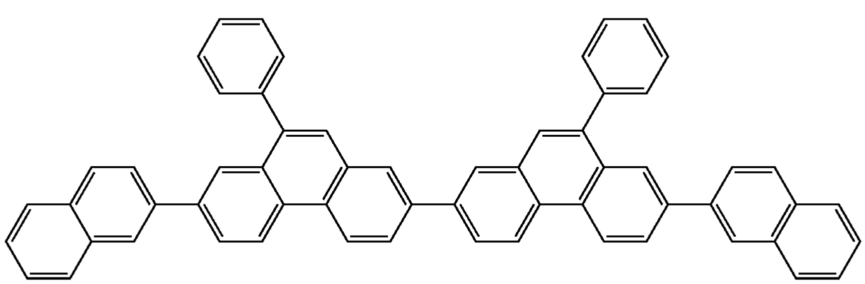

-continued
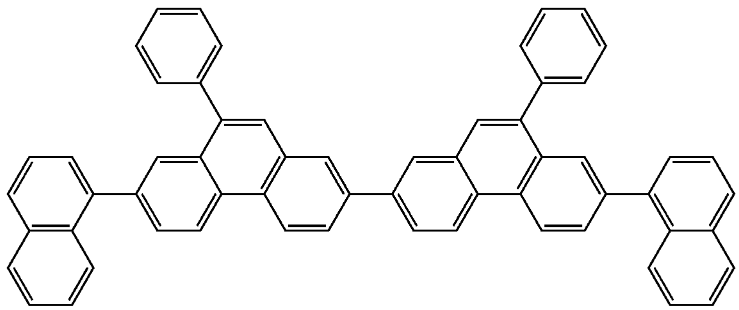
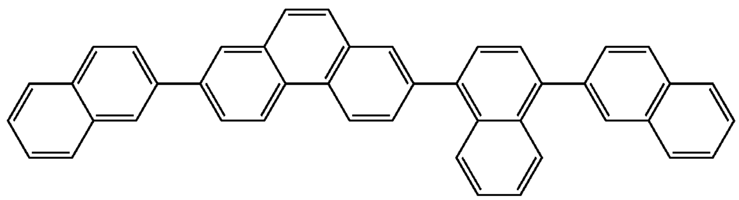
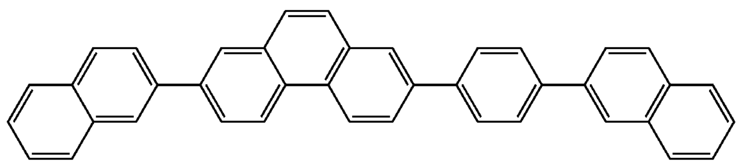
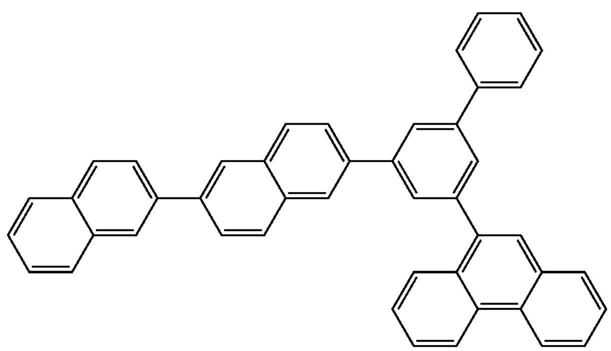
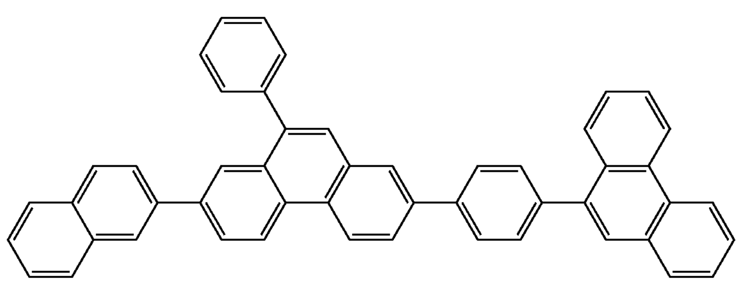
[Chemical Formula 9]
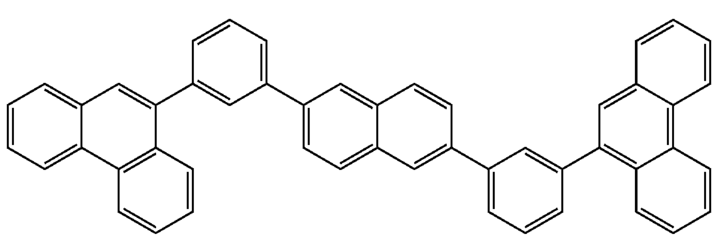

-continued
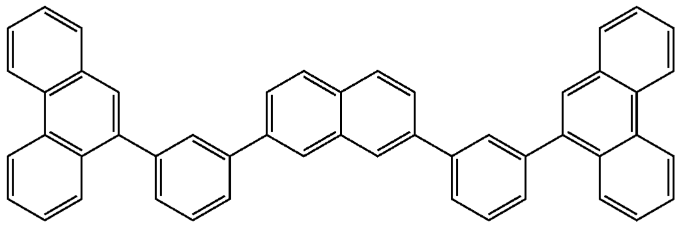
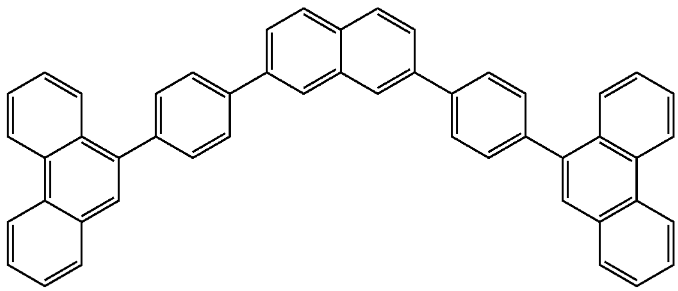
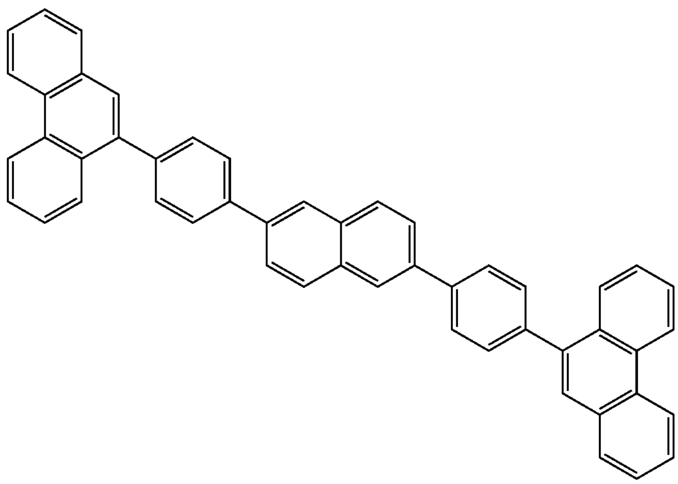
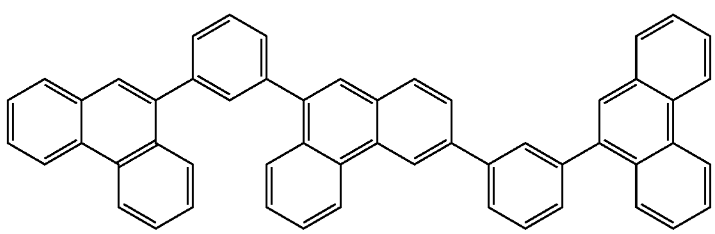
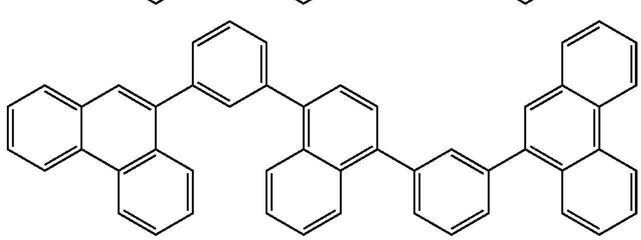
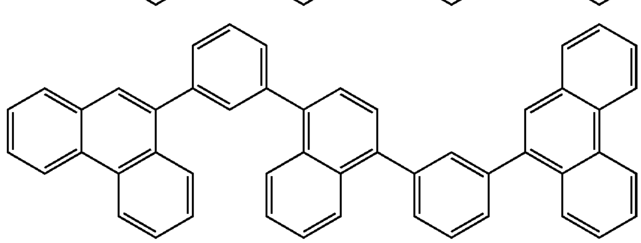

-continued
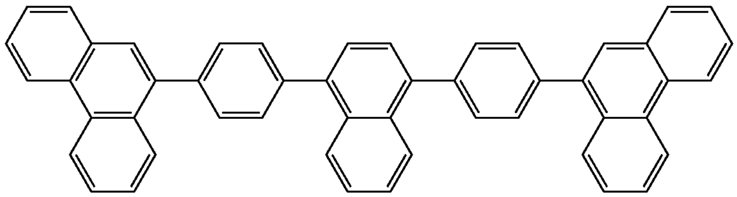
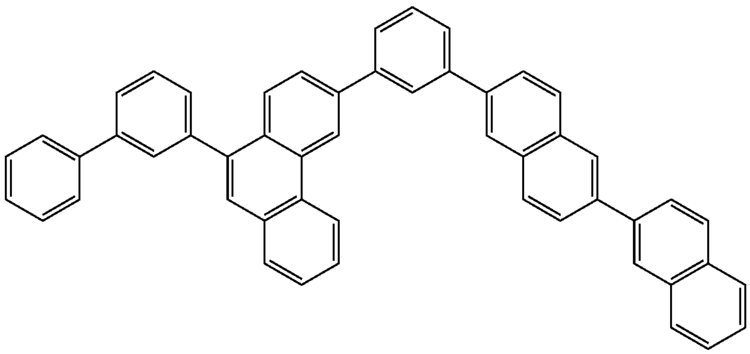
[Chemical Formula 10]
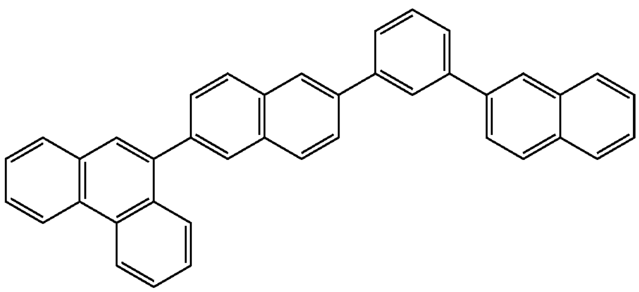
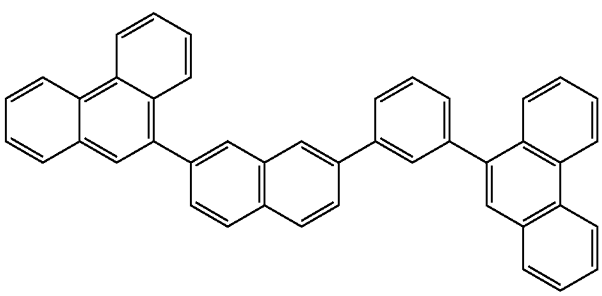
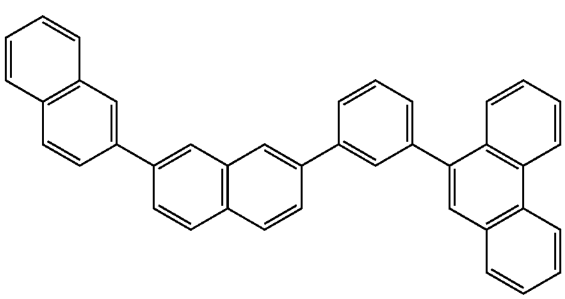
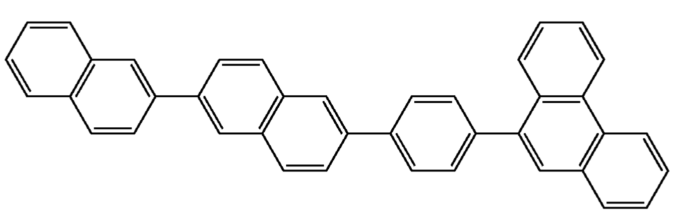

-continued
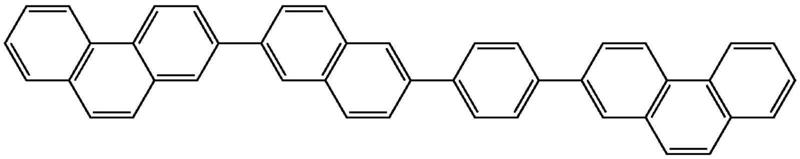
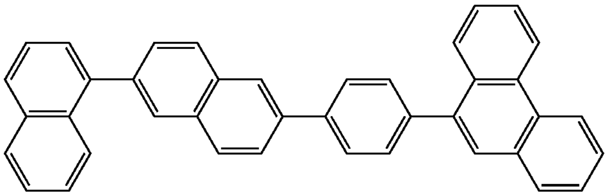
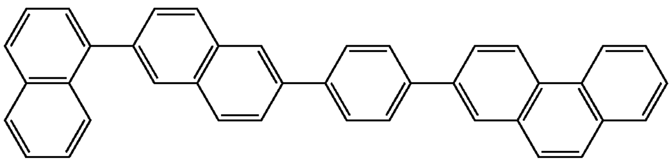
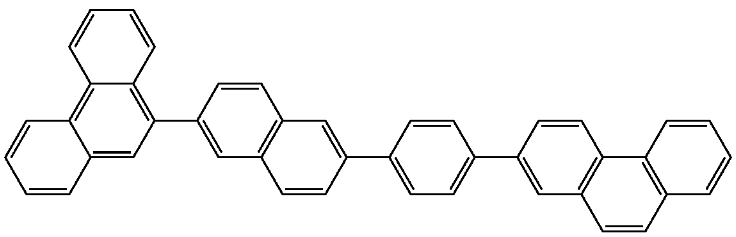
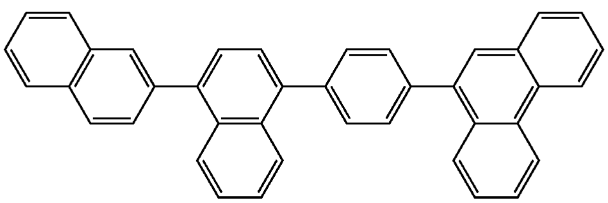
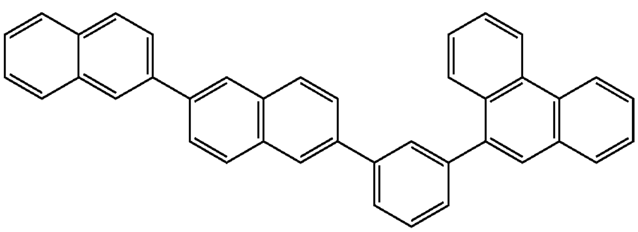
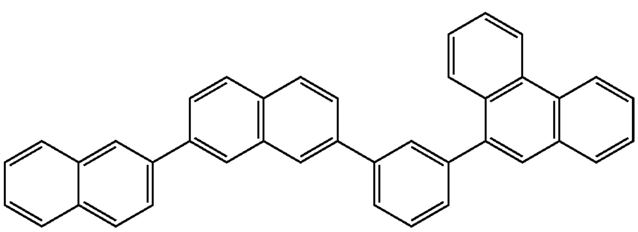
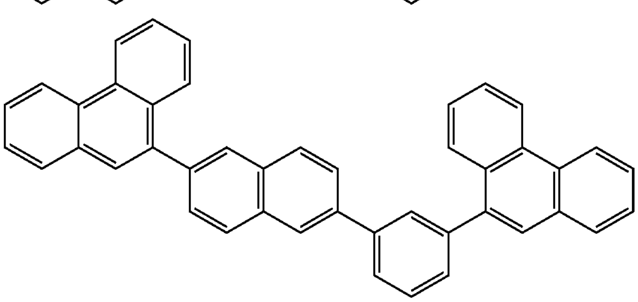

-continued
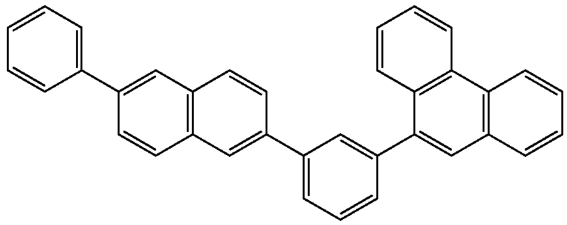
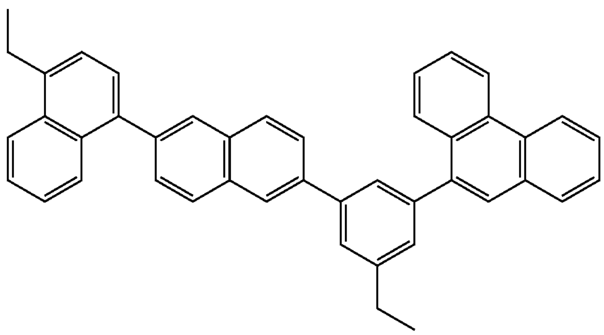
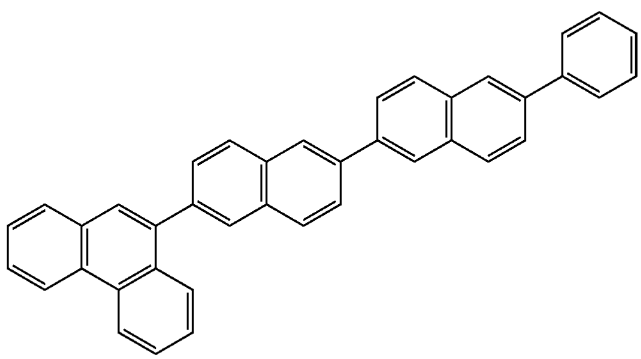
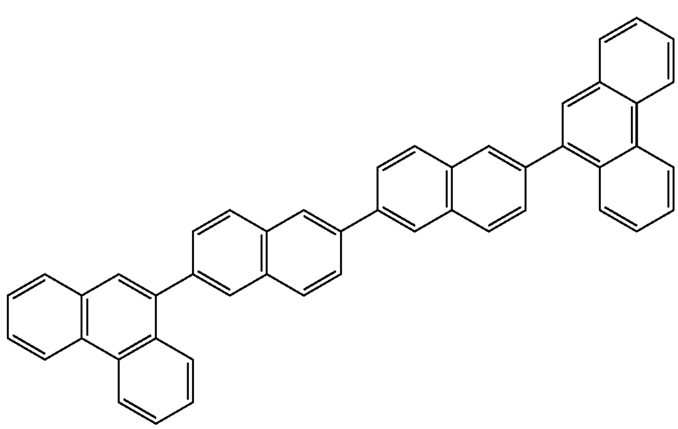

-continued
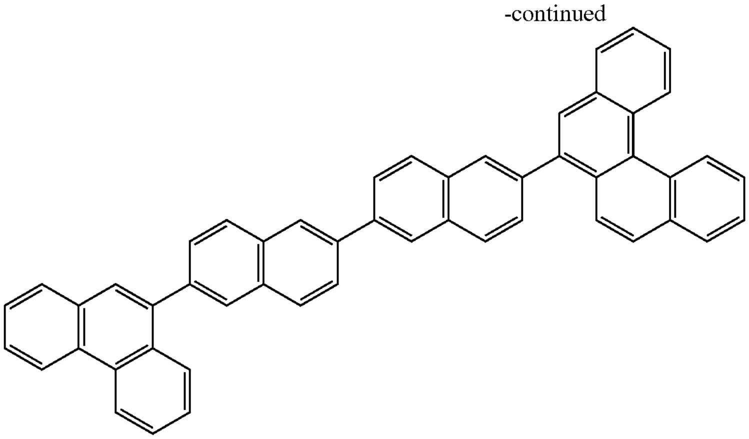
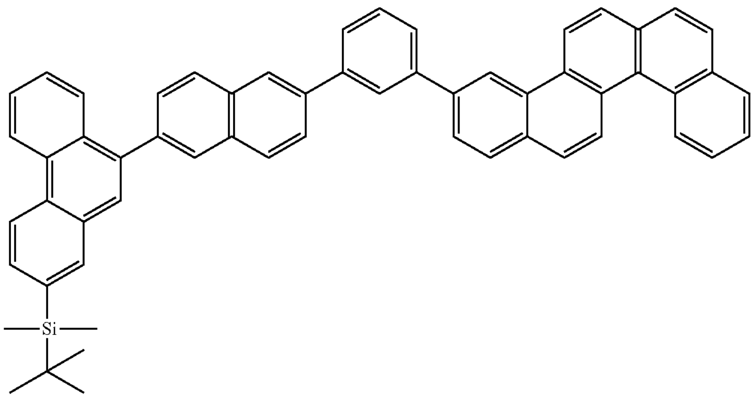
[Chemical Formula 11]
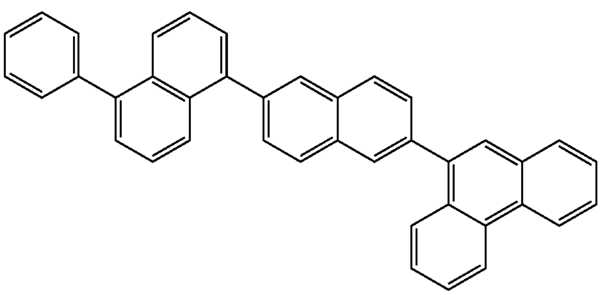
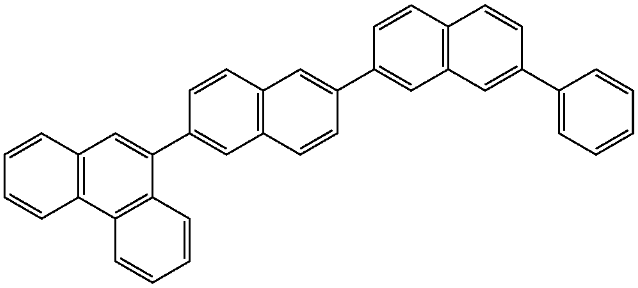

-continued
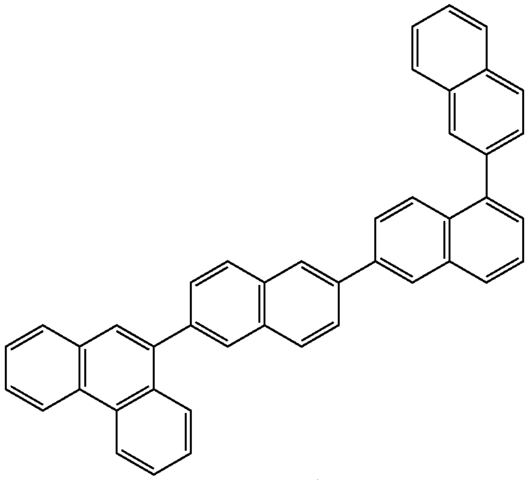
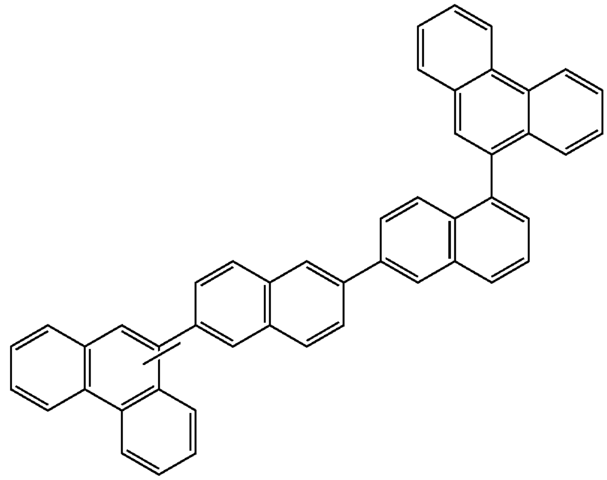
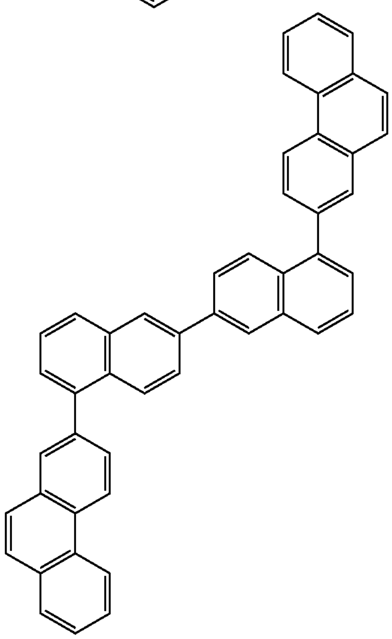
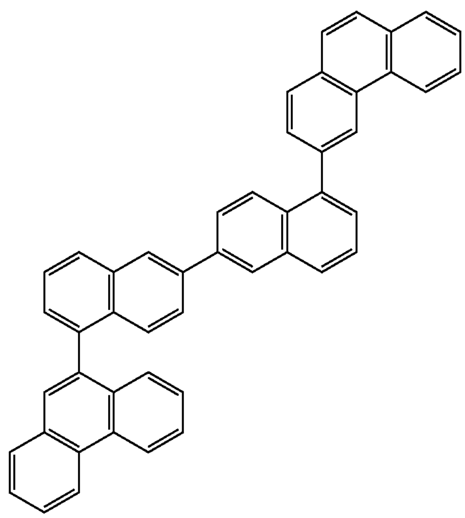
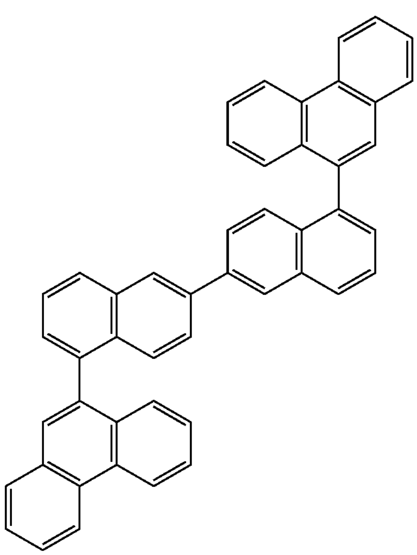
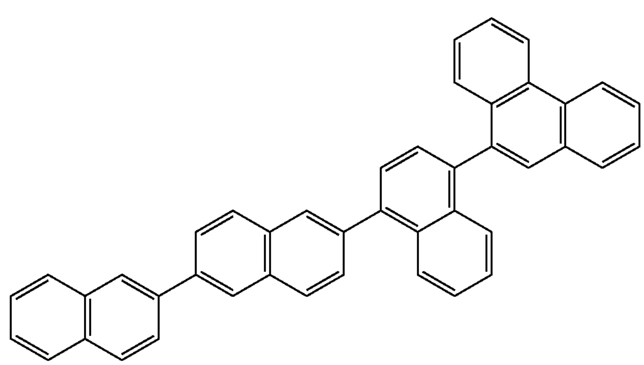

-continued
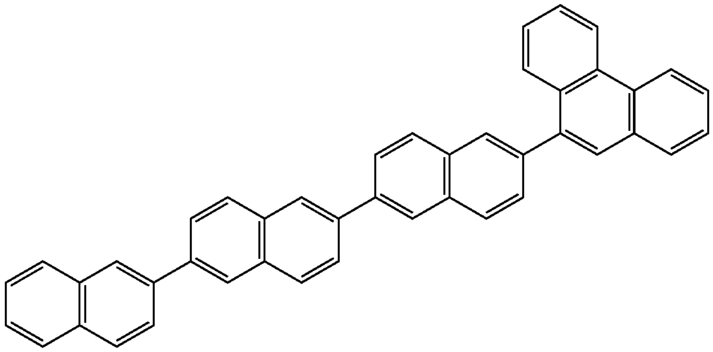
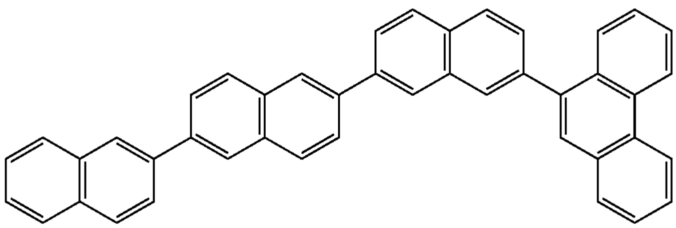
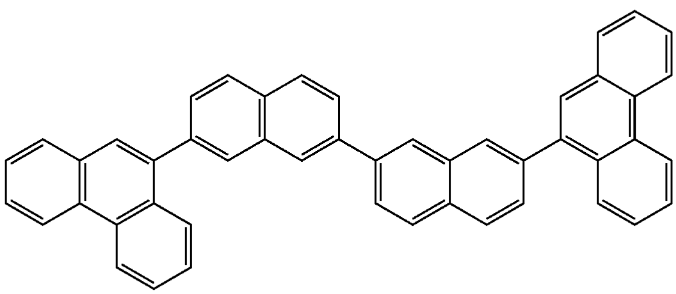
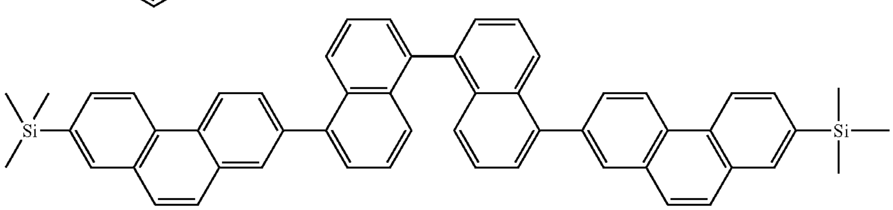
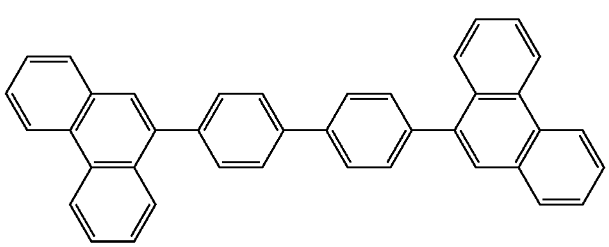
[Chemical Formula 12]
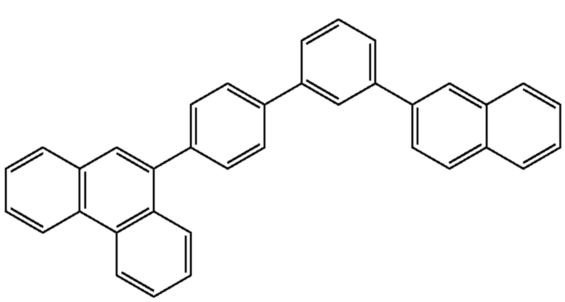

-continued
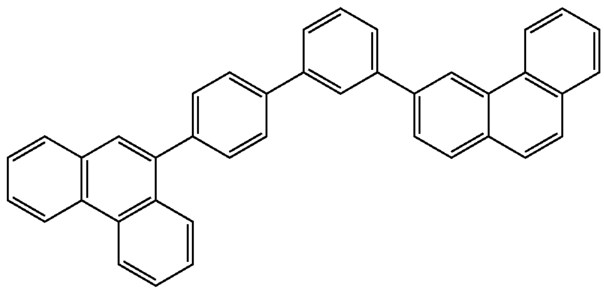
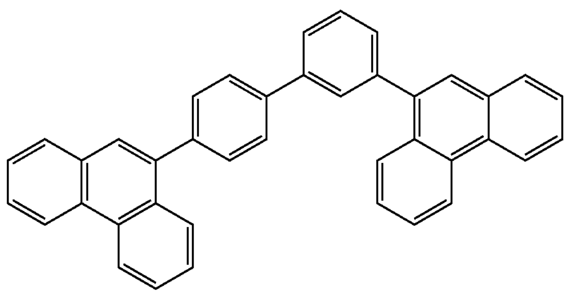
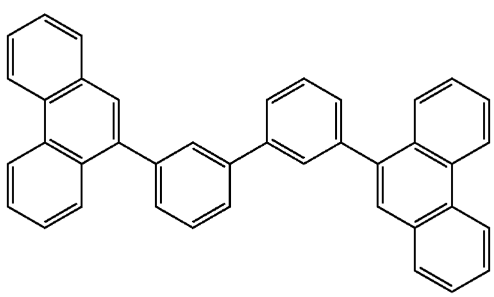
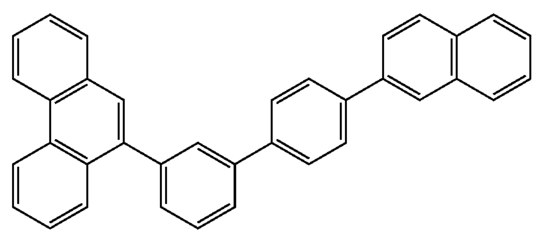
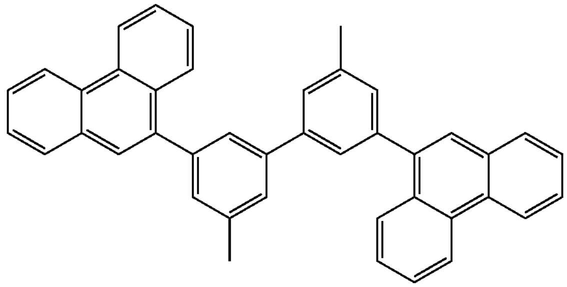
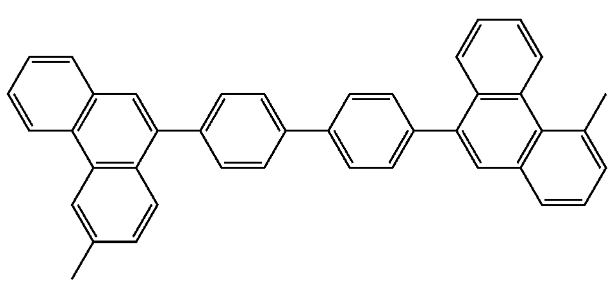

-continued
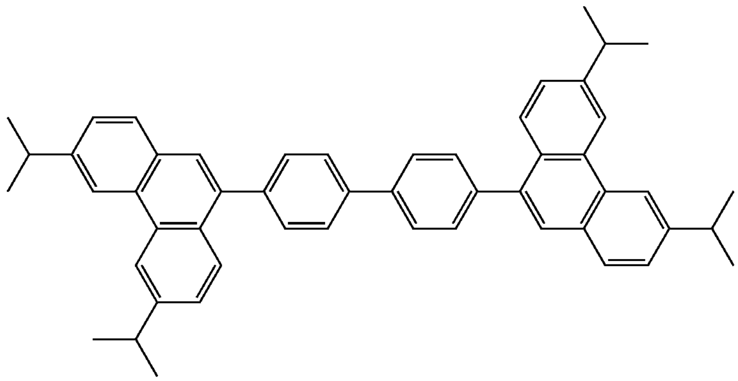
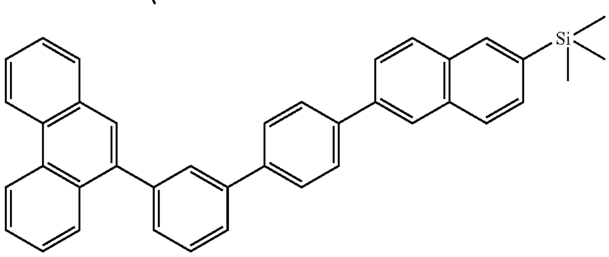
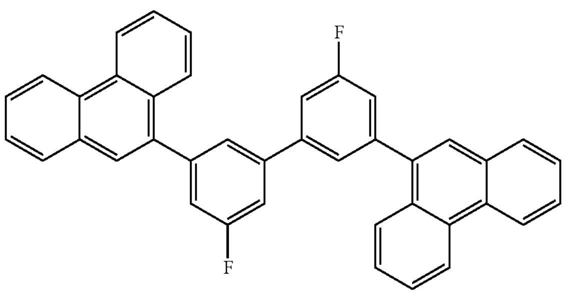
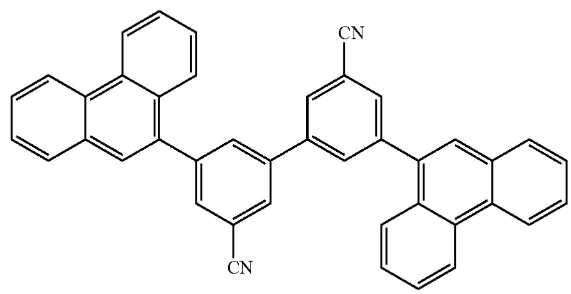
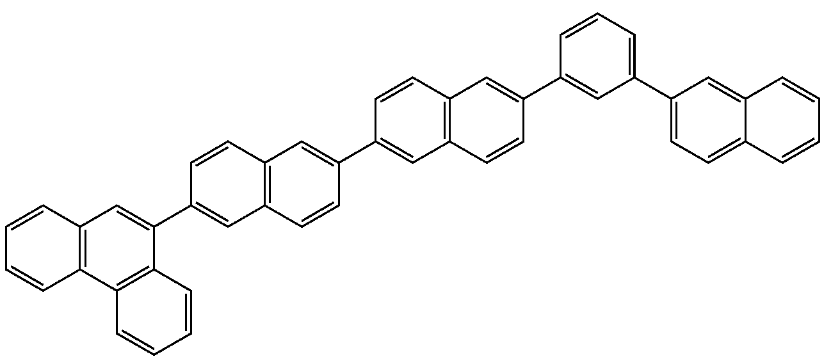
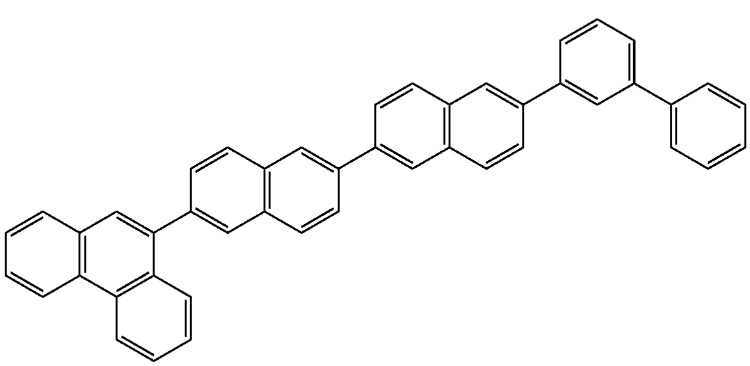

-continued
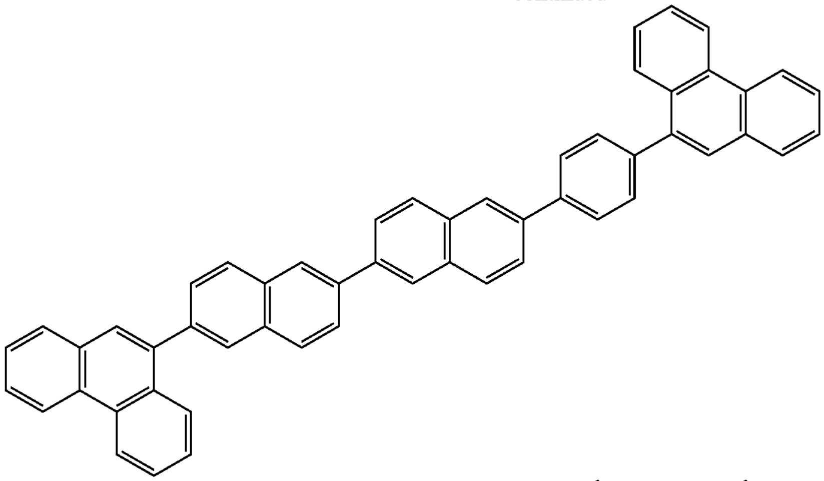
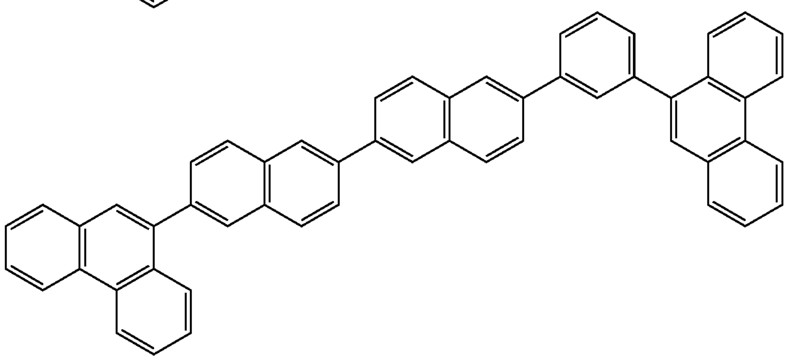
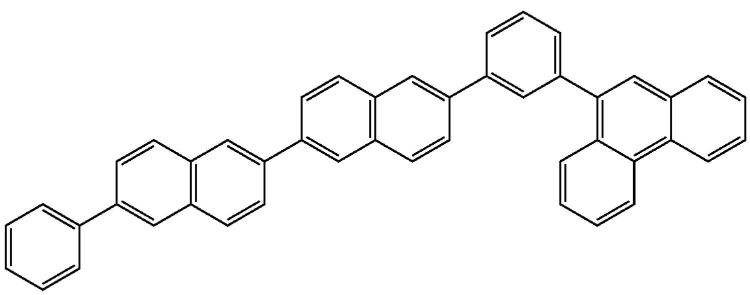
In the aspect of the invention, the polycyclic fused aromatic skeleton is preferably an elementary substance or a derivative of chrysene represented by a formula (51) below.
[Chemical Formula 13]
(51)
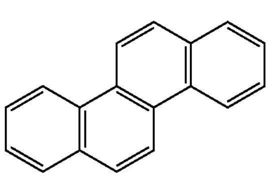
An Example of the chrysene derivative is represented by a formula (51A) below.
[Chemical Formula 14]
(51A)
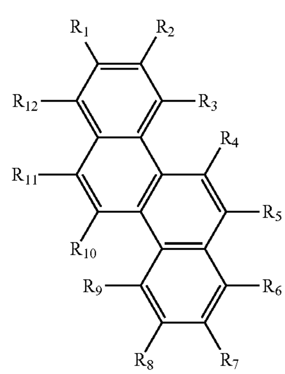

In the formula (51A), $R_1$ to $R_{12}$ each independently represent: a hydrogen atom; or a substituent consisting of one of or a combination of two or more of substituted or unsubstituted aryl group having 5 to 30 ring-forming carbon atoms (not counting carbon atoms(s) of substituent(s)), branched or linear alkyl group having 1 to 30 carbon atoms and substituted or unsubstituted cycloalkyl group having 3 to 20 carbon atoms.

Examples of the chrysene derivative represented by the formula (51) are as follows.

[Chemical Formula 15]

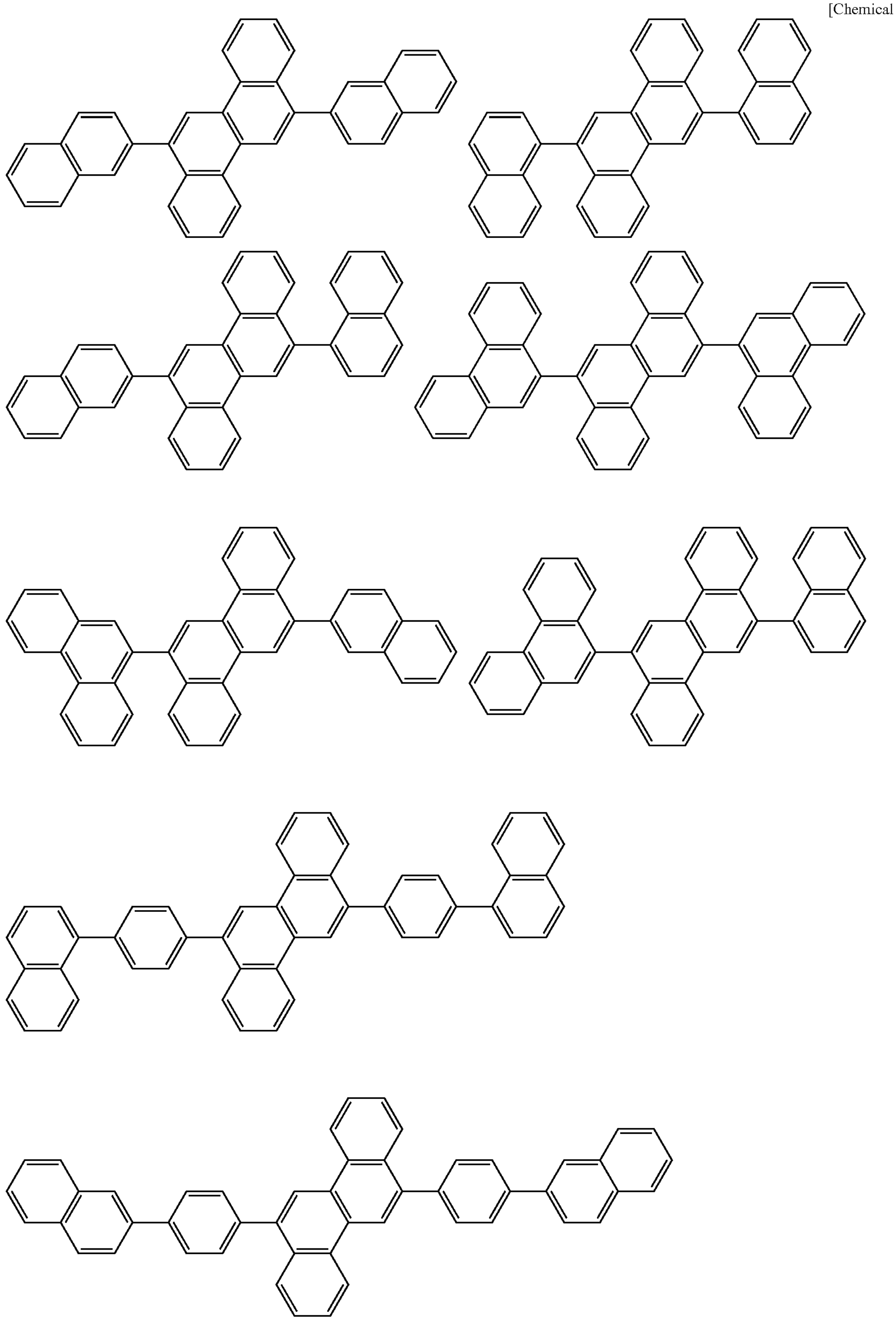

-continued
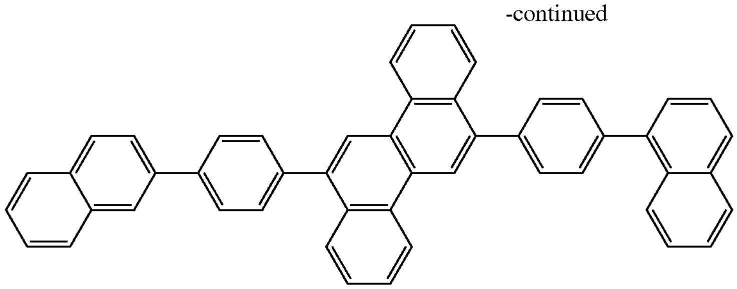
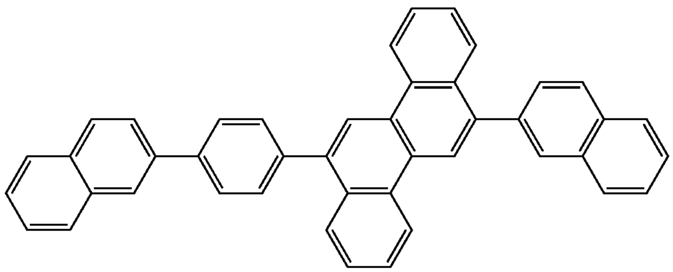
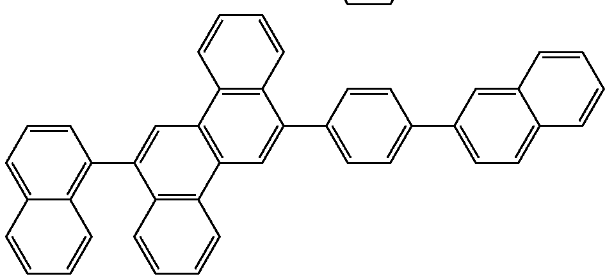
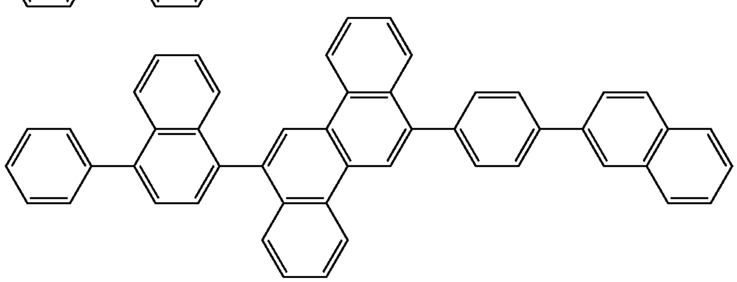
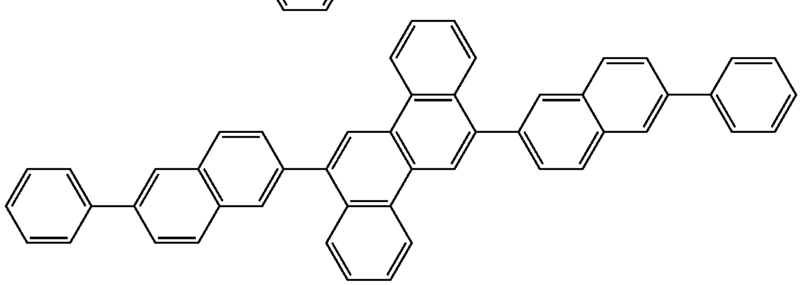
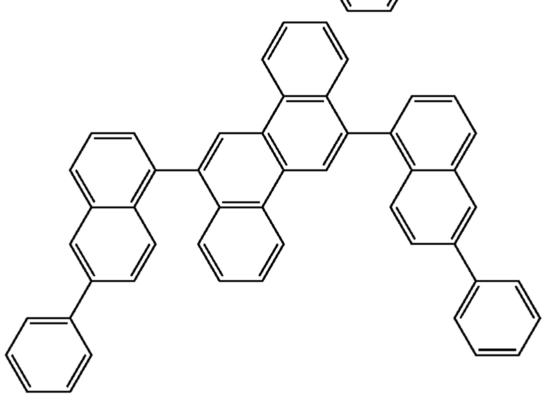

-continued
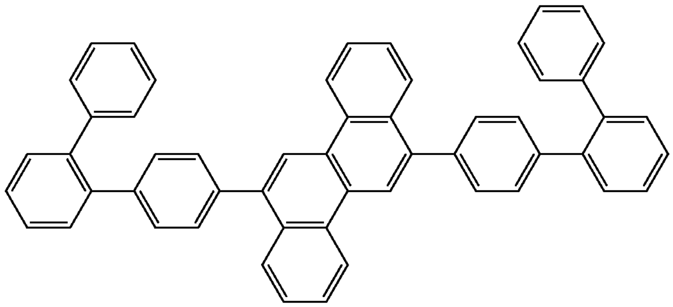
[Chemical Formula 16]
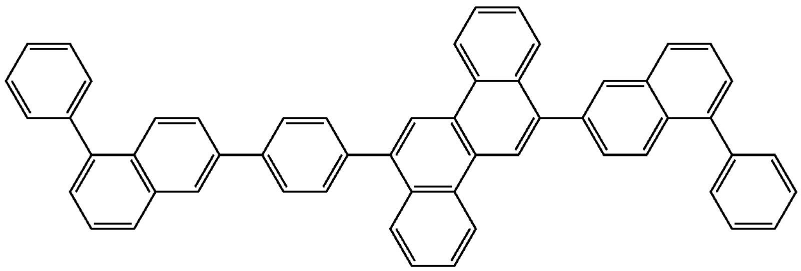
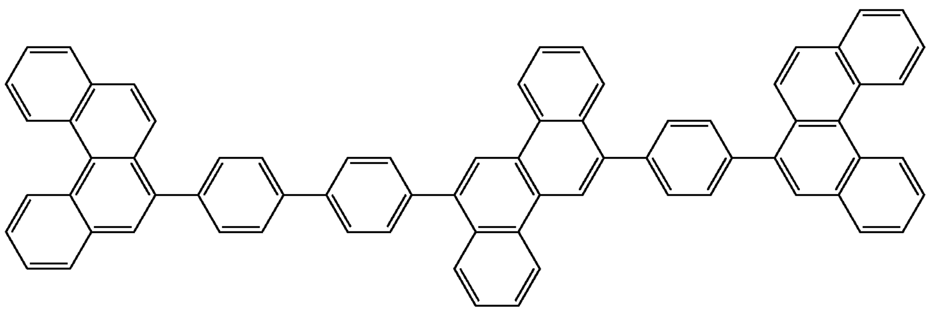
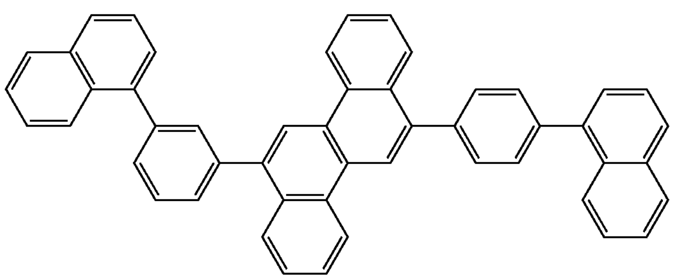
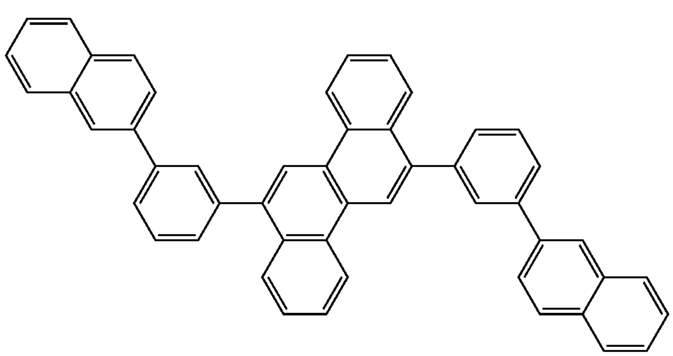

-continued
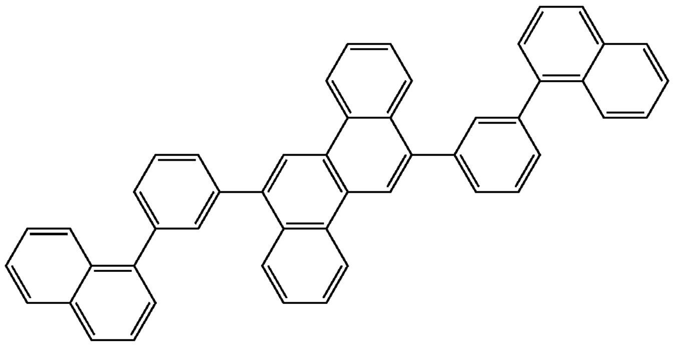
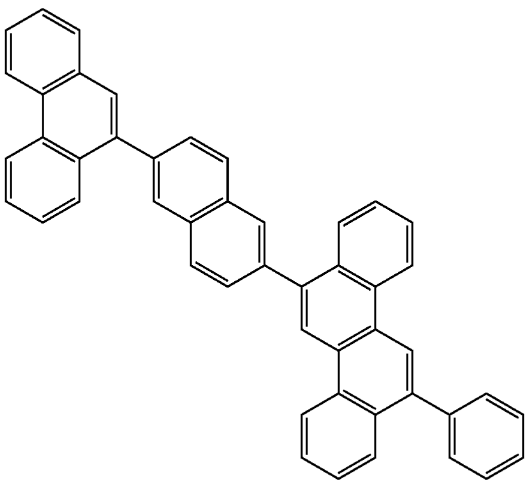
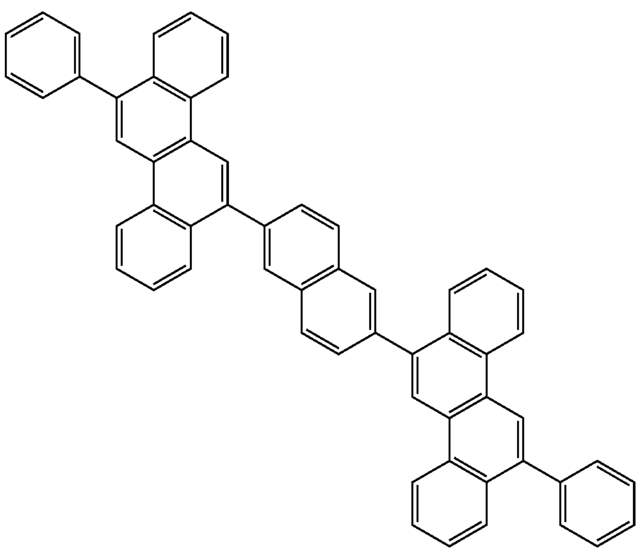
[Chemical Formula 17]
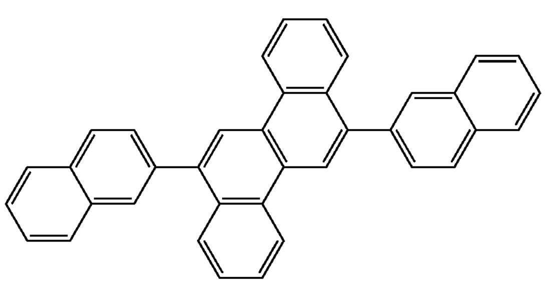
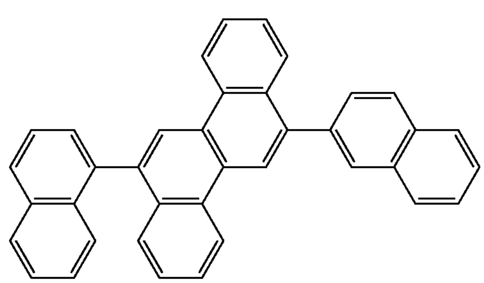

-continued
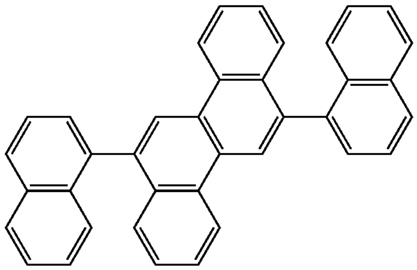
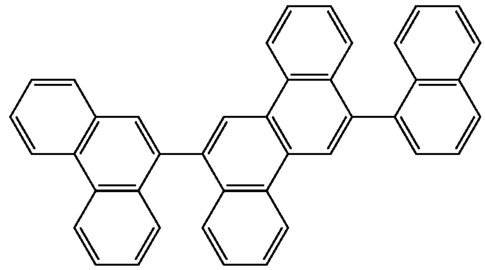
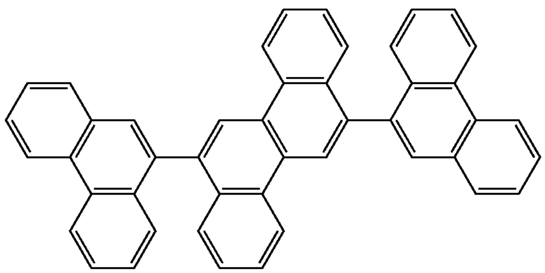
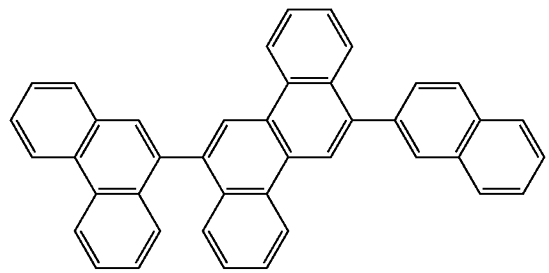
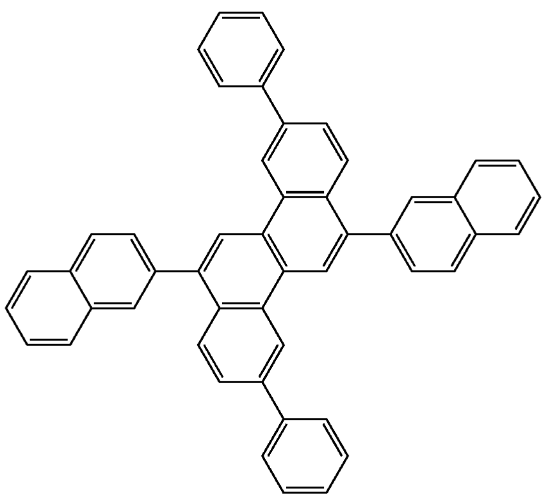
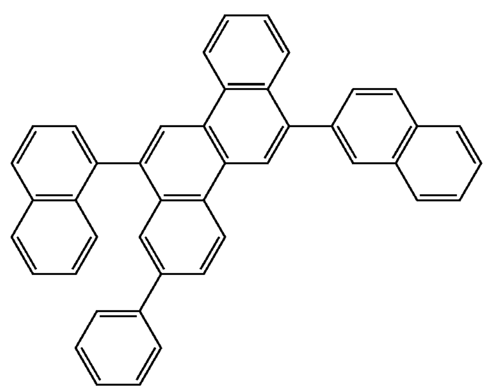
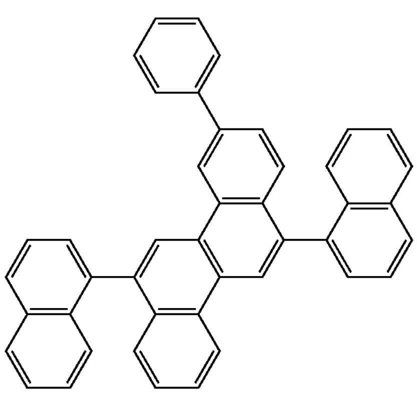
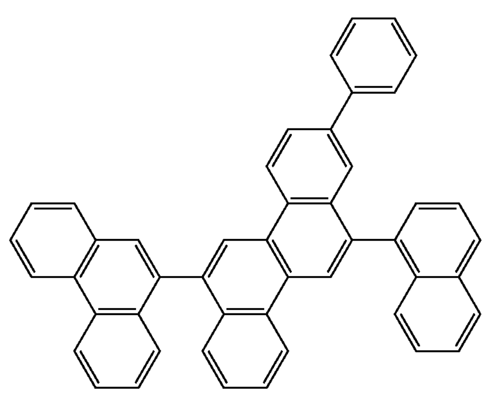

-continued
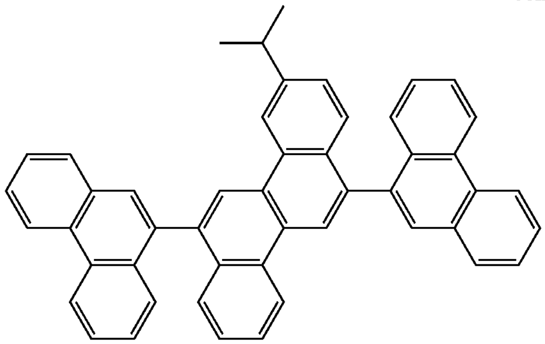
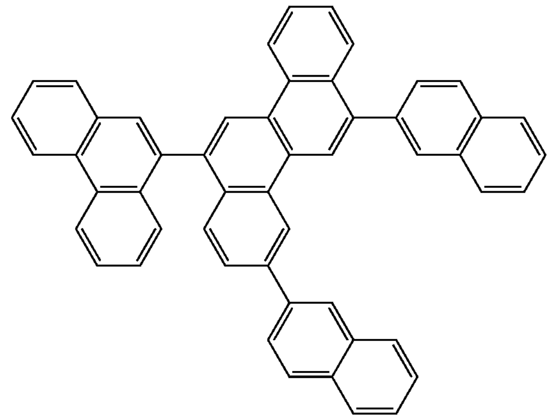
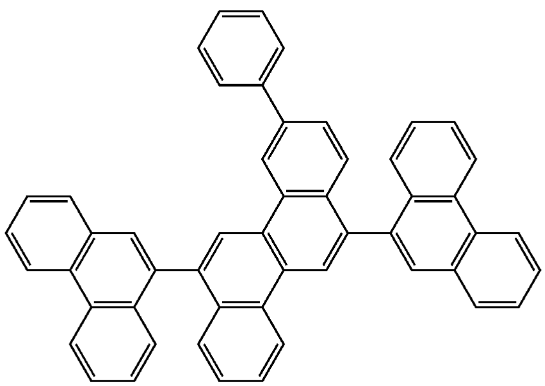
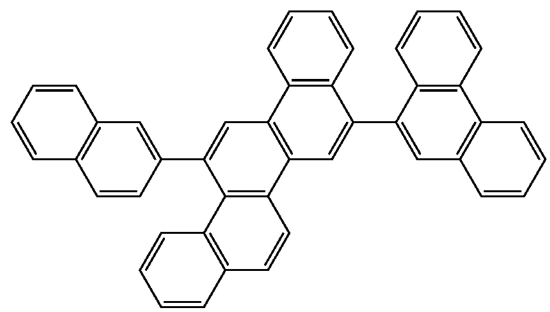
[Chemical Formula 18]
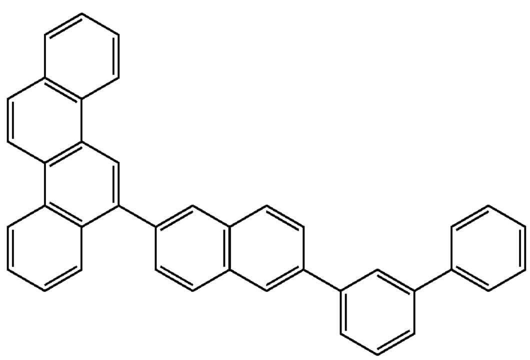
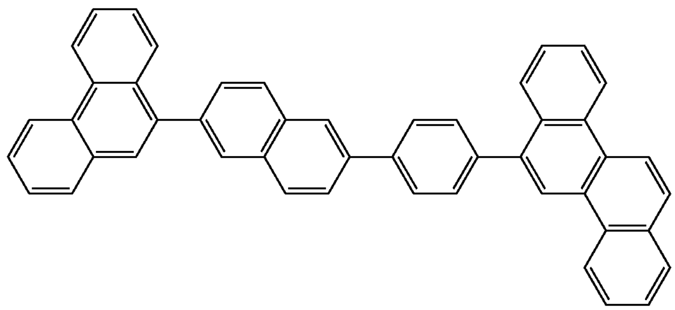

-continued
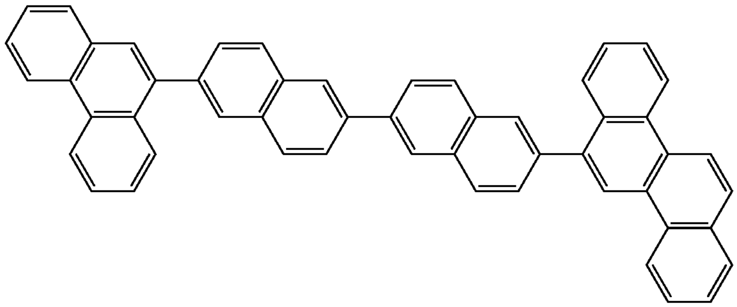
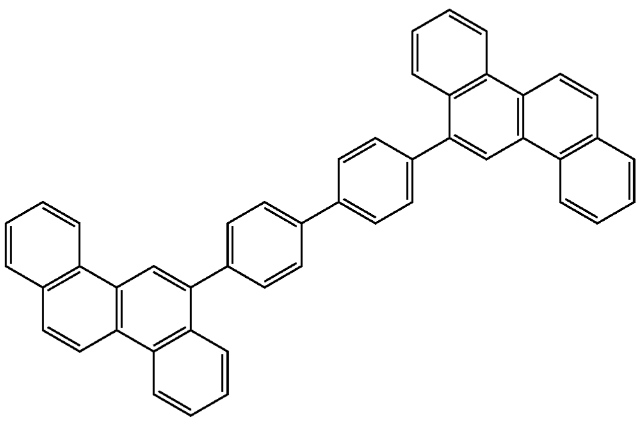
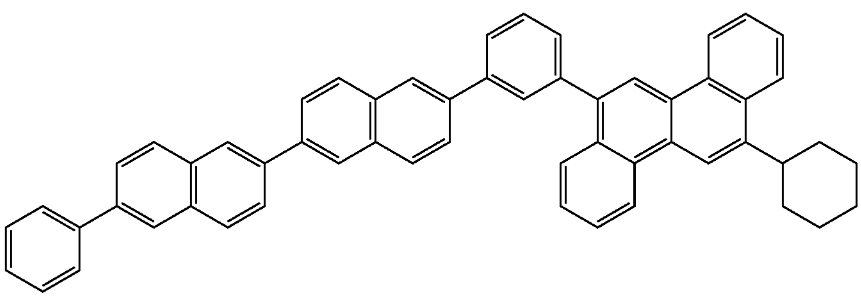
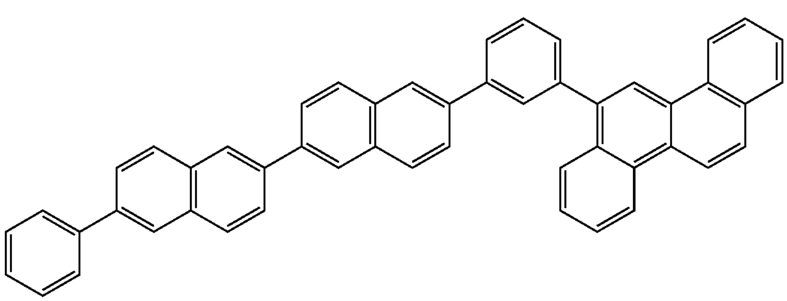

-continued

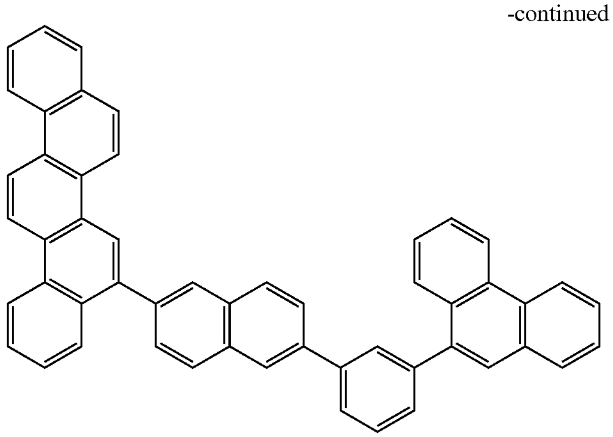

In the aspect of the invention, the polycyclic fused aromatic skeleton is preferably, an elementary substance or a derivative of a compound (benzo[c]phenanthrene) represented by a formula (52) below.

[Chemical Formula 19]

(52)

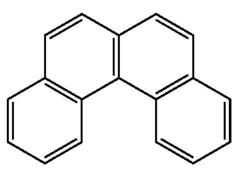

An example of the benzo[c]phenanthrene derivative is represented by a formula (52A) below.

[Chemical Formula 20]

(52A)

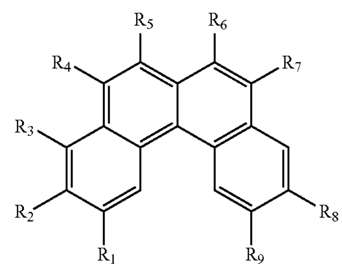

In the formula (52A), $R_1$ to $R_9$ each independently represent: a hydrogen atom; or a substituent consisting of one of or a combination of two or more of substituted or unsubstituted aryl group having 5 to 30 ring-forming carbon atoms (not counting carbon atoms(s) of substituent(s)), branched or linear alkyl group having 1 to 30 carbon atoms and substituted or unsubstituted cycloalkyl group having 3 to 20 carbon atoms.

Examples of the benzo[c]phenanthrene derivative represented by the formula (52) are as follows.

[Chemical Formula 21]

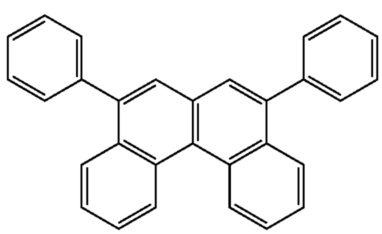

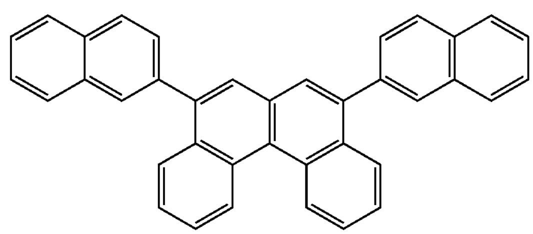

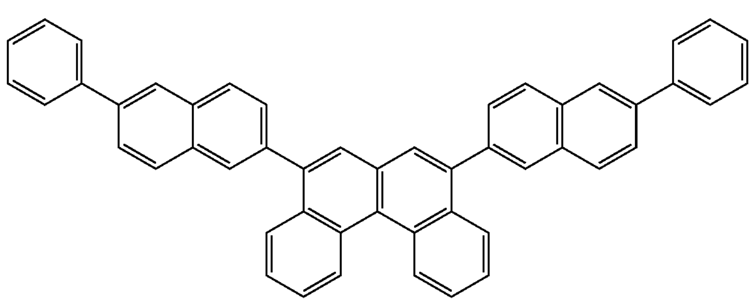

-continued
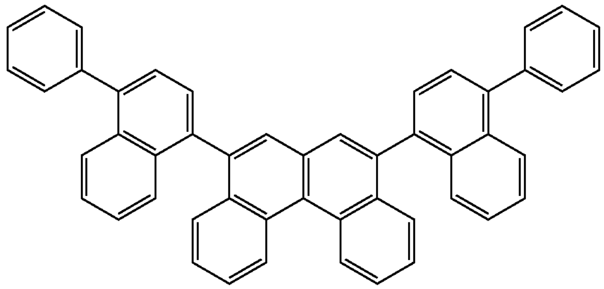
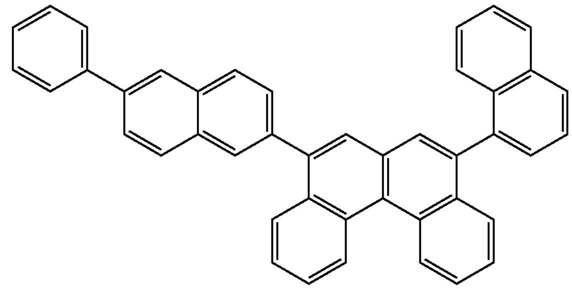
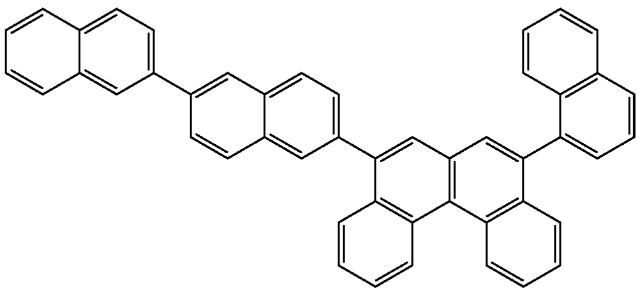
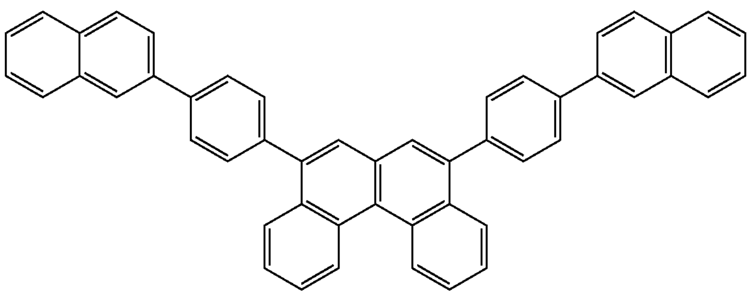
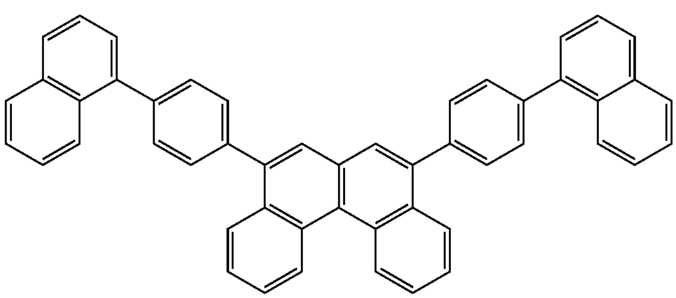
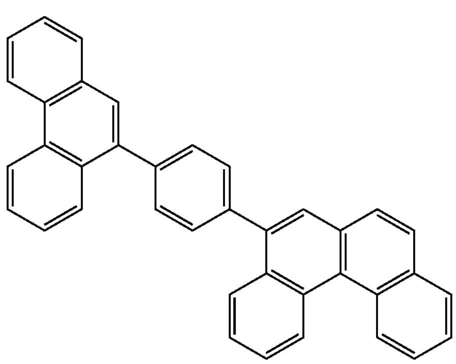
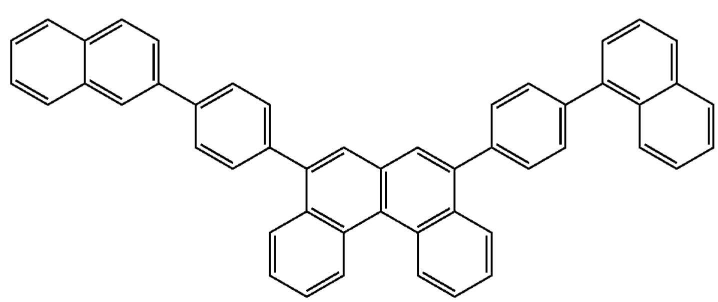

-continued
[Chemical Formula 22]
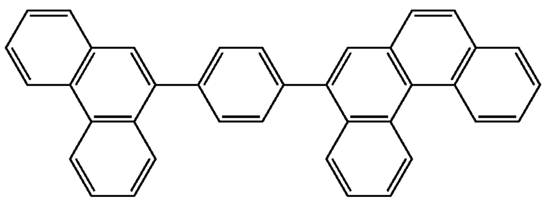
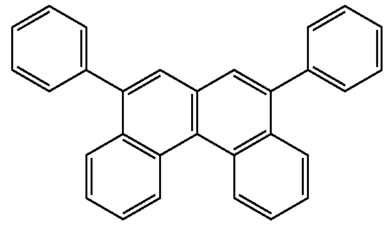
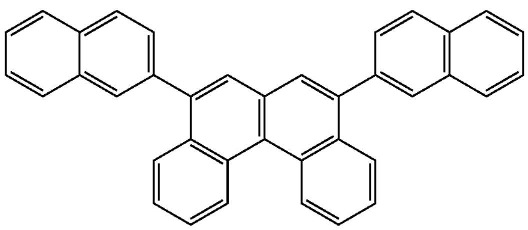
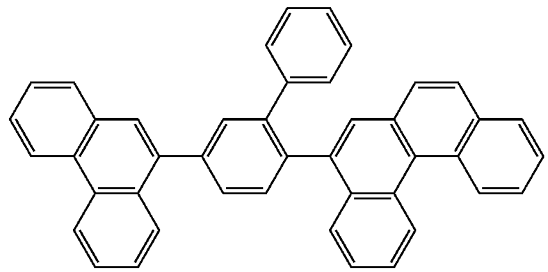
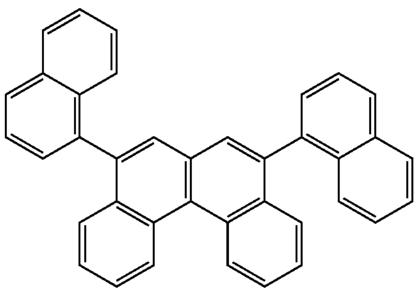
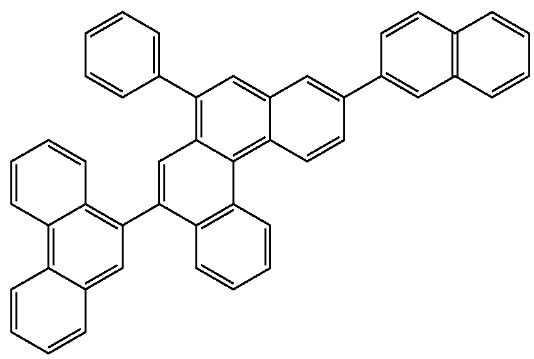
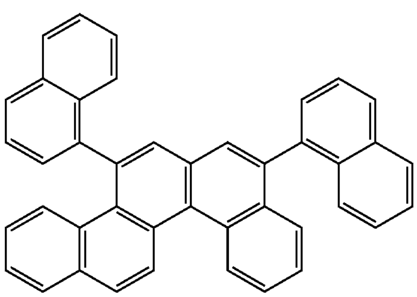
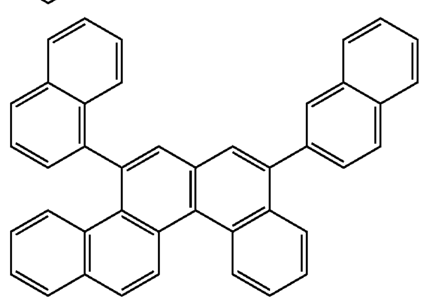
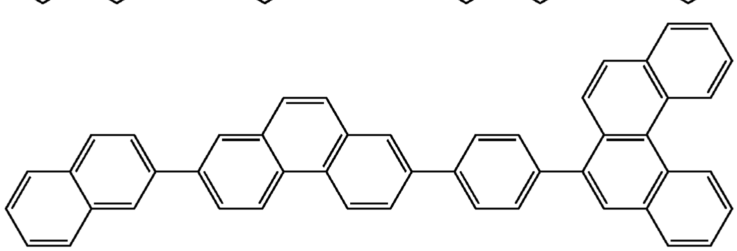
[Chemical Formula 23]
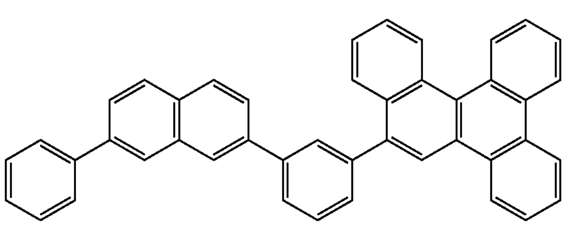

-continued
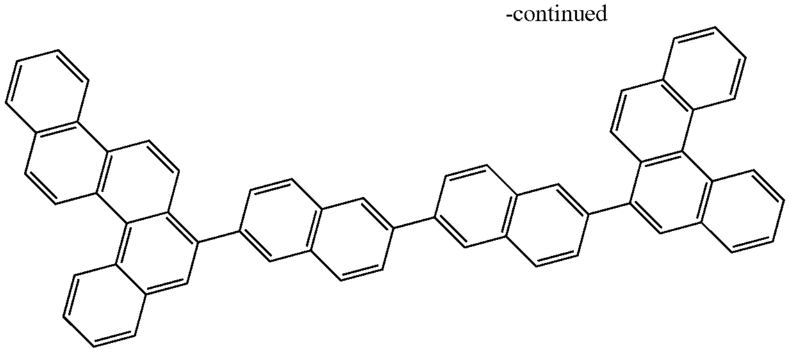
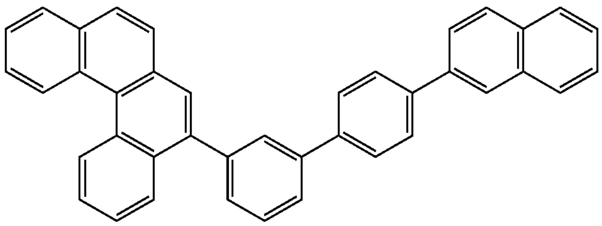
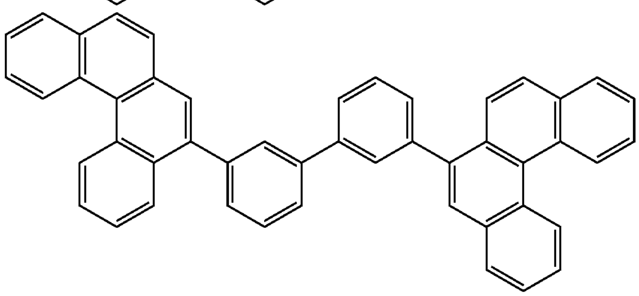
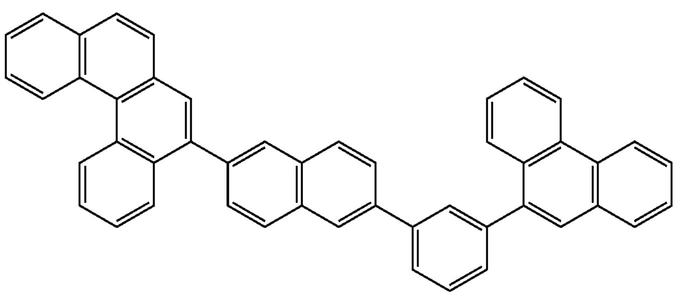
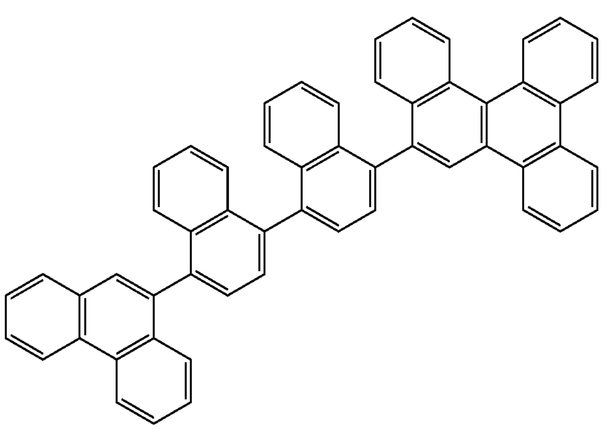

-continued

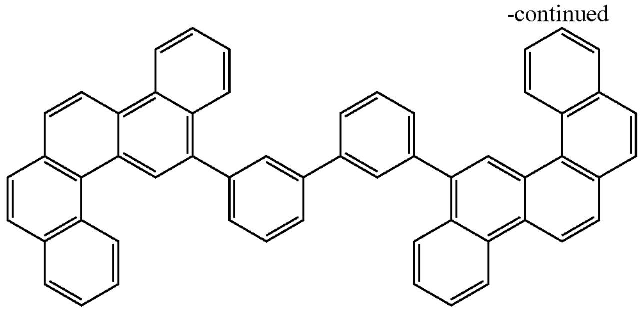

In the aspect of the invention, the polycyclic fused aromatic skeleton is preferably an elementary substance or a derivative of a compound (benzo[c]chrysene) represented by a formula (53) below.

[Chemical Formula 24]

(53)

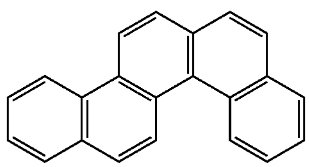

An example of the benzo[c]chrysene derivative is represented by a formula (53A) below.

[Chemical Formula 25]

(53A)

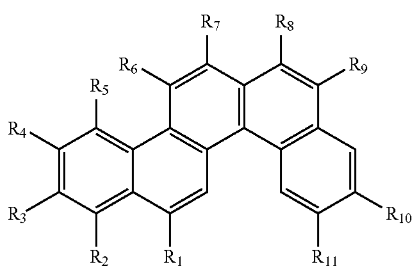

In the formula (53A), $R_1$ to $R_{11}$ each independently represent: a hydrogen atom; or a substituent consisting of one of or a combination of two or more of substituted or unsubstituted aryl group having 5 to 30 ring-forming carbon atoms (not counting carbon atoms(s) of substituent(s)), branched or linear alkyl group having 1 to 30 carbon atoms and substituted or unsubstituted cycloalkyl group having 3 to 20 carbon atoms.

Examples of the benzo[c]chrysene derivative represented by the formula (53) are as follows.

[Chemical Formula 26]

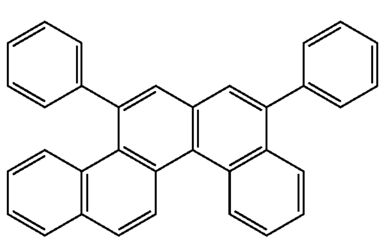

-continued

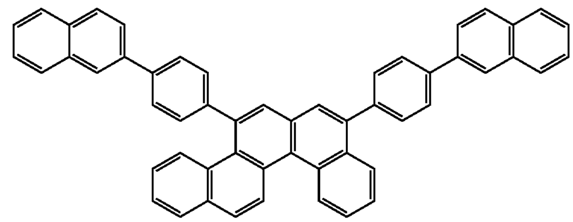

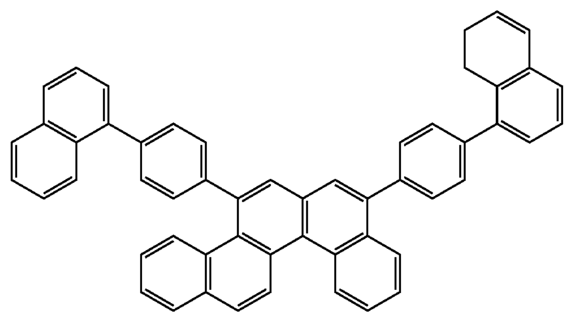

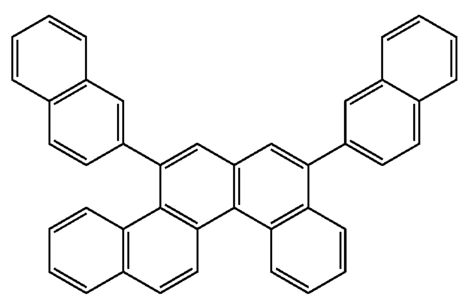

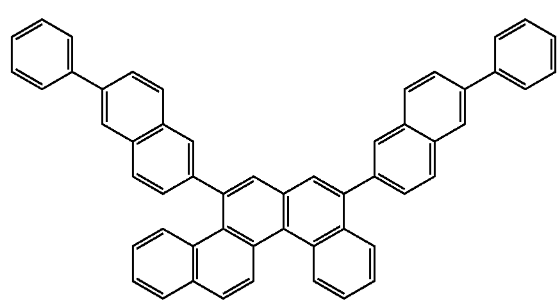

In the aspect of the invention, the polycyclic fused aromatic skeleton is preferably an elementary substance or a derivative of a compound (benzo[c,g]phenanthrene) represented by a formula (54) below.

[Chemical Formula 27]

(54)

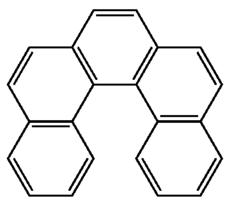

Examples of the benzo[c,g]phenanthrene derivative are as follows.

[Chemical Formula 28]

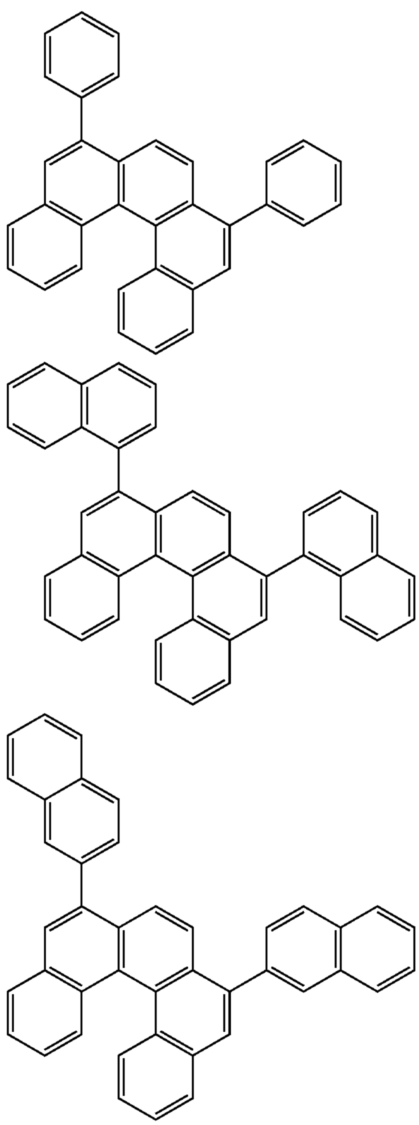

In the aspect of the invention, the polycyclic fused aromatic skeleton is preferably an elementary substance or a derivative of fluoranthene represented by a formula (55) below.

(55)

[Chemical Formula 27]

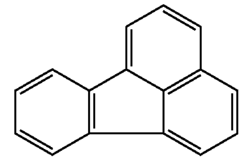

An example of the fluoranthene derivative is represented by a formula (55A) below.

[Chemical Formula 30]

(55A)

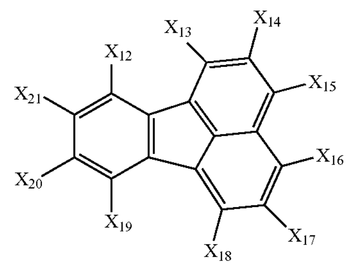

In the formula (55A), $X_{12}$ to $X_{21}$ each represent a hydrogen atom; halogen atom; linear, branched or cyclic alkyl group; linear, branched or cyclic alkoxy group; or substituted or unsubstituted aryl group.

The aryl group represents carbocyclic aromatic group such as a phenyl group and naphthyl group and heterocyclic aromatic group such as a furyl group, thienyl group and pyridyl group.

Preferably, $X_{12}$ to $X_{21}$ each represent a hydrogen atom; halogen atom (e.g., fluorine atom, chlorine atom and bromine atom); linear, branched or cyclic alkyl group having a 1 to 16 carbon atoms (e.g., a methyl group, ethyl group, n-propyl group, isopropyl group, n-butyl group, isobutyl group, sec-butyl group, tert-butyl group, n-pentyl group, isopentyl group, neopentyl group, tert-pentyl group, cyclopentyl group, n-hexyl group, 3,3-dimethylbutyl group, cyclohexyl group, n-heptyl group, cyclohexylmethyl group, n-octyl group, tert-octyl group, 2-ethylhexyl group, n-nonyl group, n-decyl group, n-dodecyl group, n-tetradecyl group and n-hexadecyl group); linear, branched or cyclic alkoxy group having a 1 to 16 carbon atoms (e.g., a methoxy group, ethoxy group, n-propoxy group, isopropoxy group, n-butoxy group, isobutoxy group, sec-butoxy group, n-pentyloxy group, neopentyloxy group, cyclopentyloxy group, n-hexyloxy group, 3,3-dimethylbutyloxy group, cyclohexyloxy group, n-heptyloxy group, n-octyloxy group, 2-ethylhexyloxy group, n-nonyloxy group, n-decyloxyl group, n-dodecyloxyl group, n-tetradecyloxyl group and n-hexadecyloxyl group), or substituted or unsubstituted aryl group having 4 to 16 carbon atoms (e.g., a phenyl group, 2-methylphenyl group, 3-methylphenyl group, 4-methylphenyl group, 4-ethylphenyl group, 4-n-propylphenyl group, 4-isopropylphenyl group, 4-n-butylphenyl group, 4-tert-butylphenyl group, 4-isopentylphenyl group, 4-tert-pentylphenyl group, 4-n-hexylphenyl group, 4-cyclohexylphenyl group, 4-n-octyl phenyl group, 4-n-decylphenyl group, 2,3-dimethylphenyl group, 2,4-dimethylphenyl group, 2,5-dimethylphenyl group, 3,4-dimethylphenyl group, 5-indanyl group, 1,2,3,4-tetrahydro-5-naphthyl group, 1,2,3,4-tetrahydro-6-naphthyl group, 2-methoxyphenyl group, 3-methoxyphenyl group, 4-methoxyphenyl group, 3-ethoxyphenyl group, 4-ethoxyphenyl group, 4-n-propoxyphenyl group, 4-isopropoxyphenyl group, 4-n-butoxyphenyl group, 4-n-pentyloxyphenyl group, 4-n-hexyloxyphenyl group, 4-cyclohexyloxyphenyl group, 4-n-heptyloxyphenyl group, 4-n-octyloxyphenyl group, 4-n-decyloxyphenyl group, 2,3-dimethoxyphenyl group, 2,5-dimethoxyphenyl group, 3,4-dimethoxyphenyl group, 2-methoxy-5-methylphenyl group, 3-methyl-4-methoxyphenyl group, 2-fluorophenyl group, 3-fluorophenyl group, 4-fluorophenyl group, 2-chlorophenyl group, 3-chlorophenyl group, 4-chlorophenyl group, 4-bromophenyl group, 4-trifluoromethylphenyl group, 3,4-dichlorophenyl group, 2-methyl-4-chlorophenyl group, 2-chloro-4-methylphenyl group, 3-chloro-4-methylphenyl group, 2-chloro-4-methoxyphenyl group, 4-phenylphenyl group, 3-phenylphenyl group, 4-(4'-methylphenyl)phenyl group, 4-(4'-methoxyphenyl)phenyl group, 1-naphthyl group, 2-naphthyl group, 4-ethoxy-1-naphthyl group, 6-methoxy-2-naphthyl group, 7-ethoxy-2-naphthyl group, 2-furyl group, 2-thienyl group, 3-thienyl group, 2-pyridyl group, 3-pyridyl group and 4-pyridyl group); more preferably, a hydrogen atom, fluorine atom, chlorine atom, alkyl group having 1 to 10 carbon atoms, alkoxy group having 1 to 10 carbon atoms or aryl group having 6 to 12 carbon atoms; further preferably, a hydrogen atom, fluorine atom, chlorine atom, alkyl group having 1 to 6 carbon atoms, alkoxy group having 1 to 6 carbon atoms or carbocyclic aromatic group having 6 to 10 carbon atoms.

Examples of the fluoranthene derivative represented by the formula (55) are as follows.

[Chemical Formula 31]

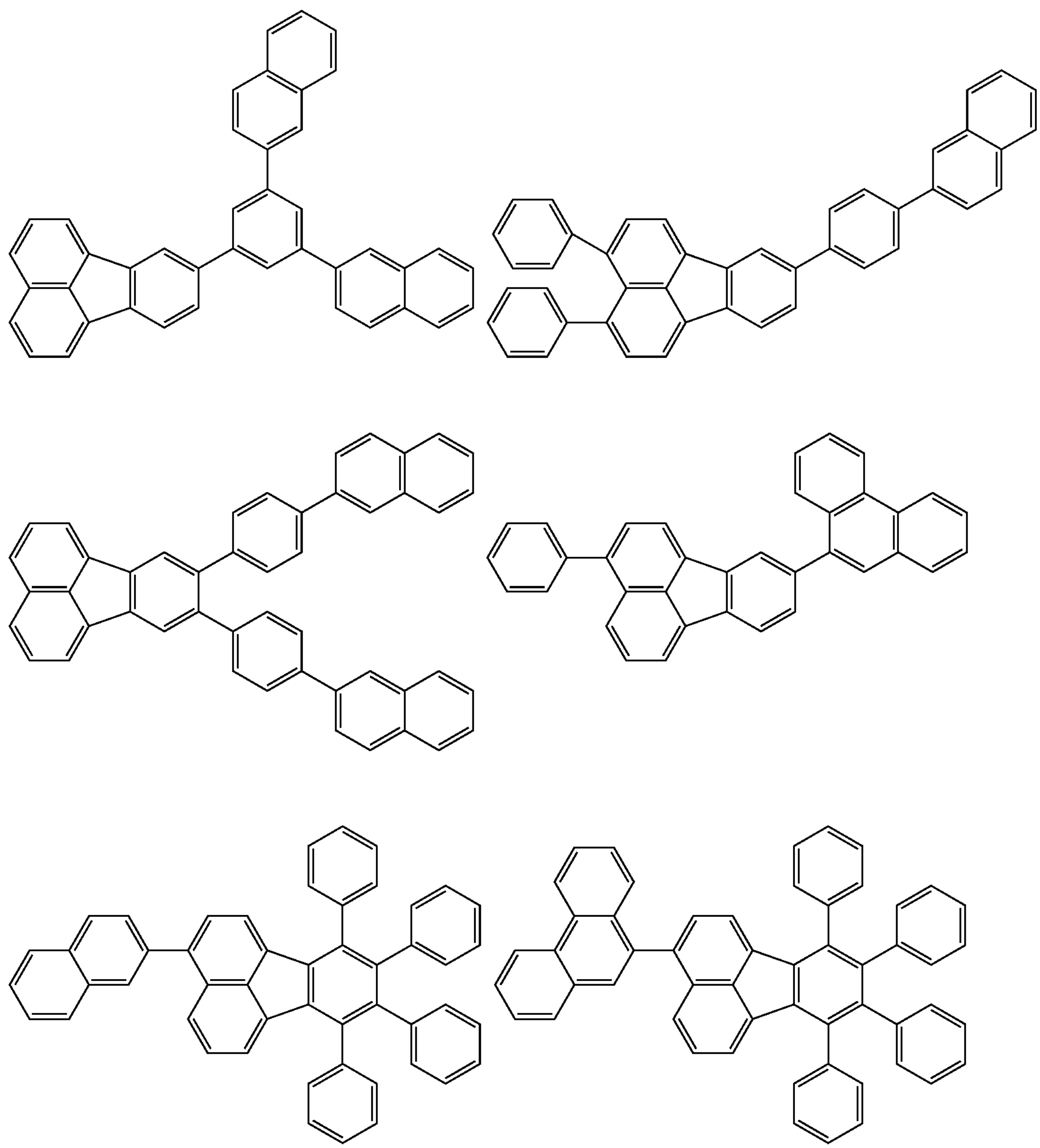

-continued
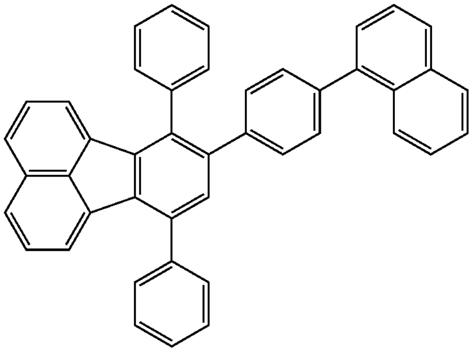
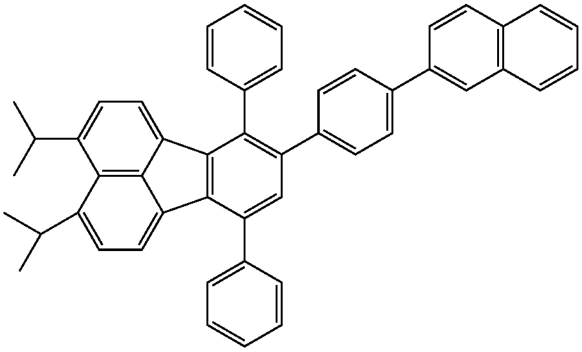
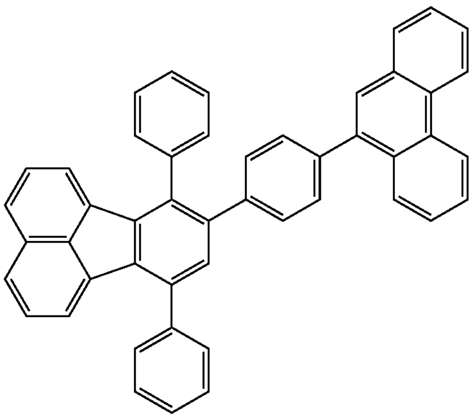
[Chemical Formula 32]
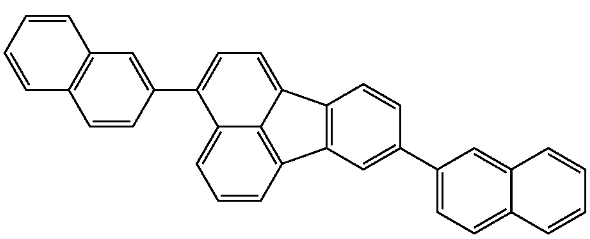
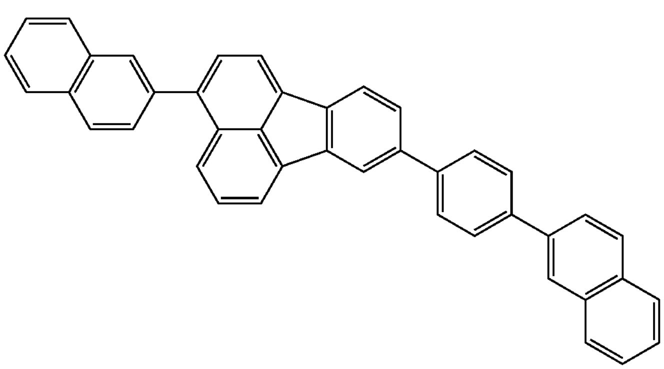

-continued
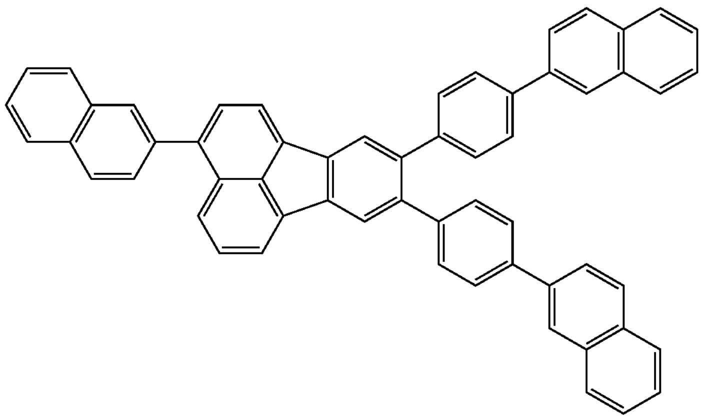
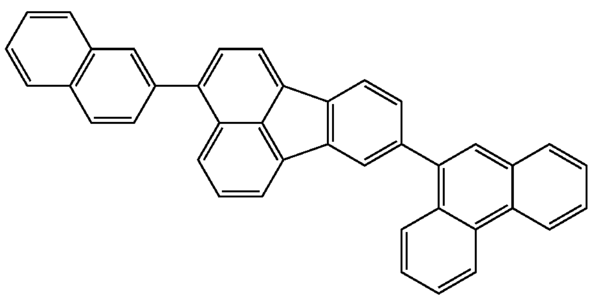
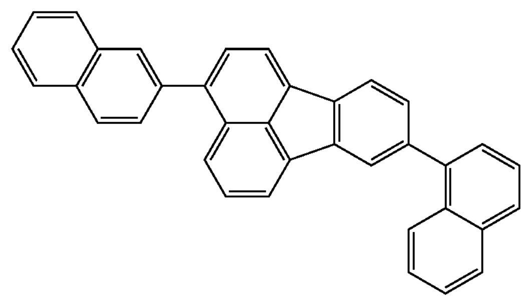
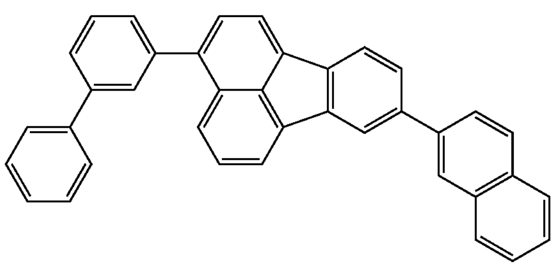
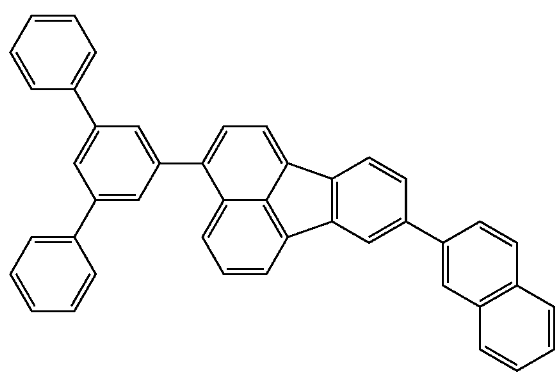
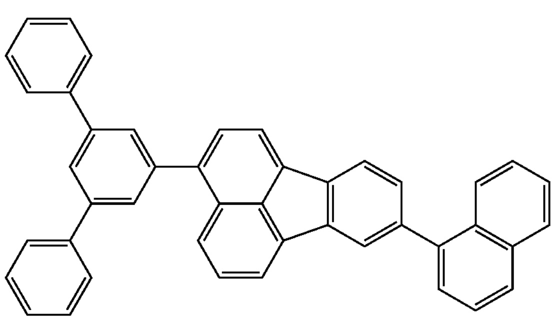
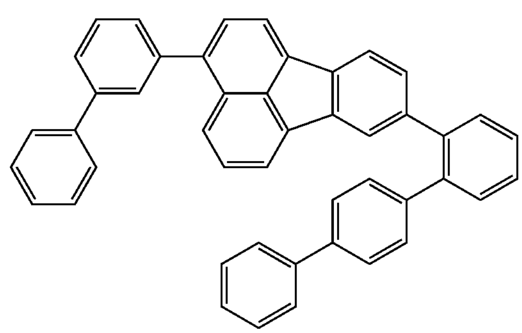

-continued
[Chemical Formula 33]
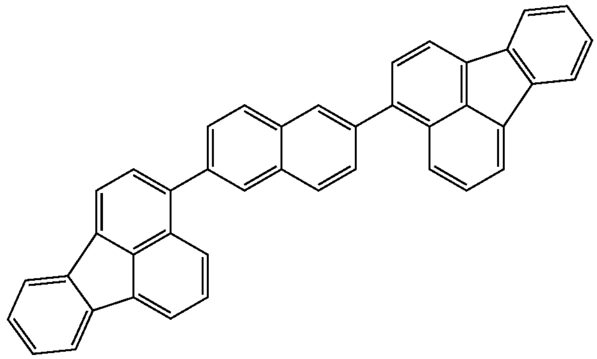
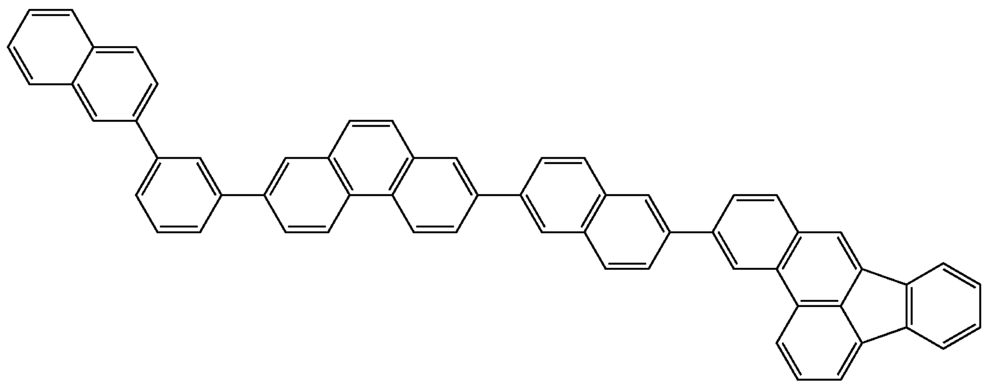
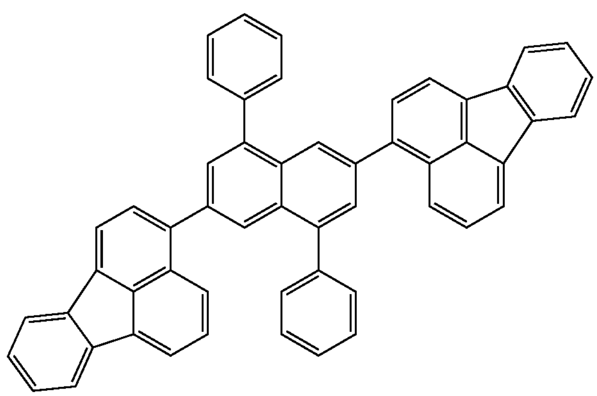
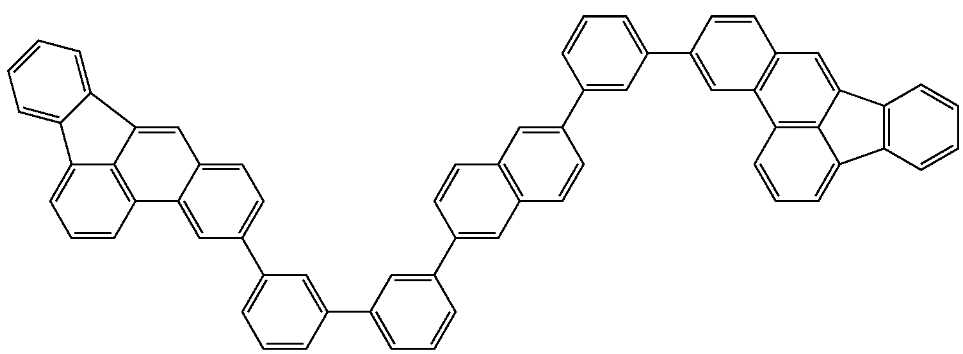

-continued
[Chemical Formula 34]
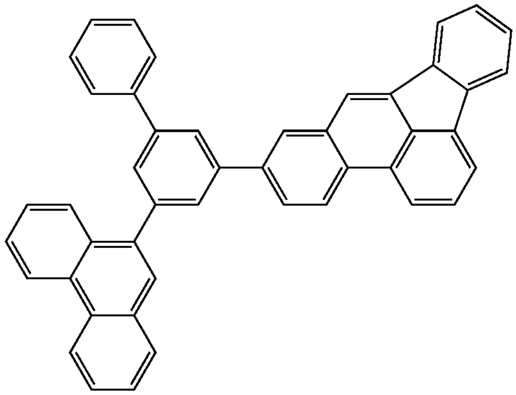
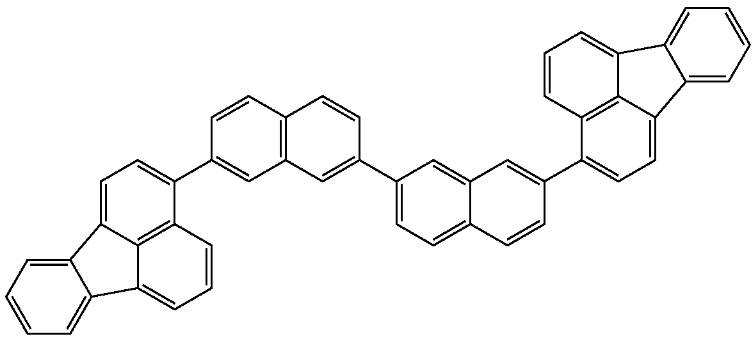
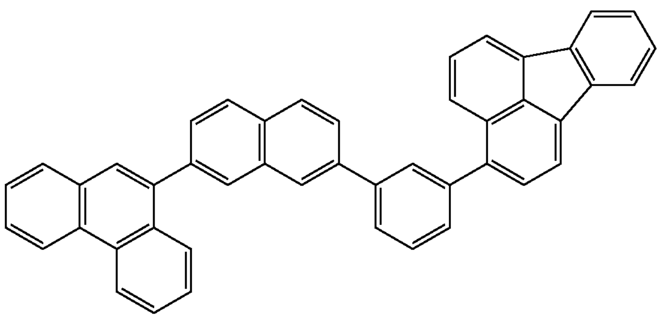
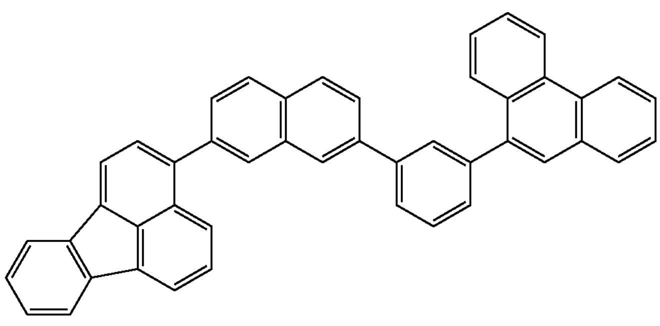
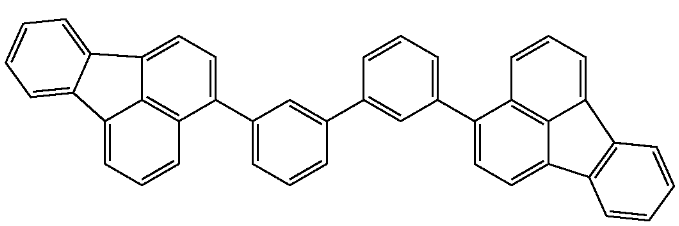

-continued

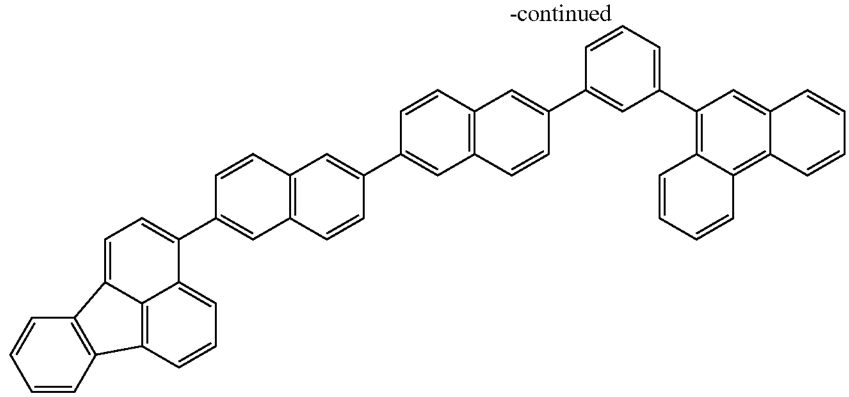

[Chemical Formula 36]

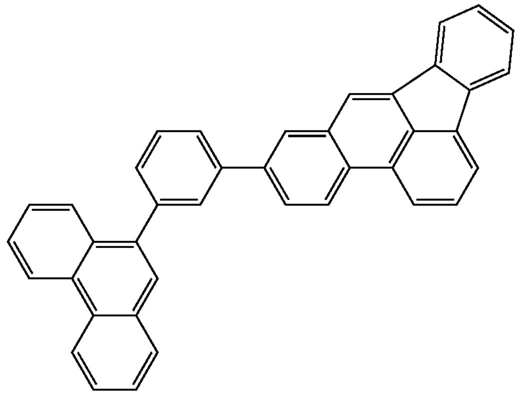

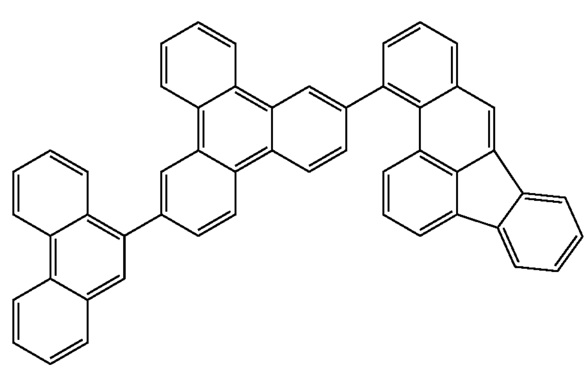

Examples of substituted or unsubstituted benzofluoranthene are an elementary substance or a derivative of benzo[b]fluoranthene represented by a formula (551) below and an elementary substance or a derivative of benzo[k]fluoranthene represented by a formula (552) below.

[Chemical Formula 36]

(551)

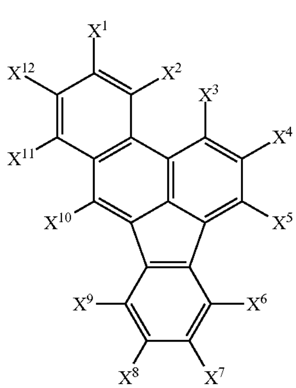

-continued (552)

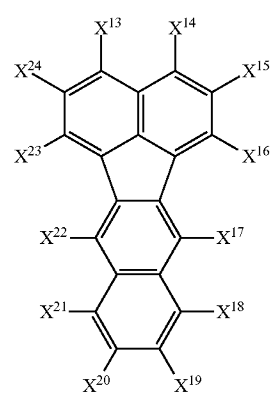

In the formulae (551) and (552), $X^1$ to $X^{24}$ each represent a hydrogen atom; halogen atom; linear, branched or cyclic alkyl group; linear, branched or cyclic alkoxy group; or substituted or unsubstituted aryl group.

The aryl group represents carbocyclic aromatic group such as a phenyl group and naphthyl group and heterocyclic aromatic group such as a furyl group, thienyl group and pyridyl group.

Preferably, $X^1$ to $X^{24}$ each represent a hydrogen atom; halogen atom (e.g., fluorine atom, chlorine atom and bromine atom); linear, branched or cyclic alkyl group having a 1 to 16 carbon atoms (e.g., a methyl group, ethyl group, n-propyl group, isopropyl group, n-butyl group, isobutyl group, sec-butyl group, tert-butyl group, n-pentyl group, isopentyl group, neopentyl group, tert-pentyl group, cyclopentyl group, n-hexyl group, 3,3-dimethylbutyl group, cyclohexyl group, n-heptyl group, cyclohexylmethyl group, n-octyl group, tert-octyl group, 2-ethylhexyl group, n-nonyl group, n-decyl group, n-dodecyl group, n-tetradecyl group and n-hexadecyl group); linear, branched or cyclic alkoxy group having a 1 to 16 carbon atoms (e.g., a methoxy group, ethoxy group, n-propoxy group, isopropoxy group, n-butoxy group, isobutoxy group, sec-butoxy group, n-pentyloxy group, neopentyloxy group, cyclopentyloxy group, n-hexyloxy group, 3,3-dimethylbutyloxy group, cyclohexyloxy group, n-heptyloxy group, n-octyloxy group, 2-ethylhexyloxy group, n-nonyloxy group, n-decyloxyl group, n-dodecyloxyl group, n-tetradecyloxyl group and n-hexadecyloxyl group), or substituted or unsubstituted aryl group having 4 to 16 carbon atoms (e.g., a phenyl group, 2-methylphenyl group, 3-methylphenyl group, 4-methylphenyl group, 4-ethylphenyl group, 4-n-propylphenyl group, 4-isopropylphenyl group, 4-n-butylphenyl group, 4-tert-butylphenyl group, 4-isopentylphenyl group, 4-tert-pentylphenyl group, 4-n-hexylphenyl group, 4-cyclohexylphenyl group, 4-n-octyl phenyl group, 4-n-decylphenyl group, 2,3-dimethylphenyl group, 2,4-dimethylphenyl group, 2,5-dimethylphenyl group, 3,4-dimethylphenyl group, 5-indanyl group, 1,2,3,4-tetrahydro-5-naphthyl group, 1,2,3,4-tetrahydro-6-naphthyl group, 2-methoxyphenyl group, 3-methoxyphenyl group, 4-methoxyphenyl group, 3-ethoxyphenyl group, 4-ethoxyphenyl group, 4-n-propoxyphenyl group, 4-isopropoxyphenyl group, 4-n-butoxyphenyl group, 4-n-pentyloxyphenyl group, 4-n-hexyloxyphenyl group, 4-cyclohexyloxyphenyl group, 4-n-heptyloxyphenyl group, 4-n-octyloxyphenyl group, 4-n-decyloxyphenyl group, 2,3-dimethoxyphenyl group, 2,5-dimethoxyphenyl group, 3,4-dimethoxyphenyl group, 2-methoxy-5-methylphenyl group, 3-methyl-4-methoxyphenyl group, 2-fluorophenyl group, 3-fluorophenyl group, 4-fluorophenyl group, 2-chlorophenyl group, 3-chlorophenyl group, 4-chlorophenyl group, 4-bromophenyl group, 4-trifluoromethylphenyl group, 3,4-dichlorophenyl group, 2-methyl-4-chlorophenyl group, 2-chloro-4-methylphenyl group, 3-chloro-4-methylphenyl group, 2-chloro-4-methoxyphenyl group, 4-phenylphenyl group, 3-phenylphenyl group, 4-(4'-methylphenyl)phenyl group, 4-(4'-methoxyphenyl)phenyl group, 1-naphthyl group, 2-naphthyl group, 4-ethoxy-1-naphthyl group, 6-methoxy-2-naphthyl group, 7-ethoxy-2-naphthyl group, 2-furyl group, 2-thienyl group, 3-thienyl group, 2-pyridyl group, 3-pyridyl group and 4-pyridyl group); more preferably, a hydrogen atom, fluorine atom, chlorine atom, alkyl group having 1 to 10 carbon atoms, alkoxy group having 1 to 10 carbon atoms or aryl group having 6 to 12 carbon atoms; further preferably, a hydrogen atom, fluorine atom, chlorine atom, alkyl group having 1 to 6 carbon atoms, alkoxy group having 1 to 6 carbon atoms or carbocyclic aromatic group having 6 to 10 carbon atoms.

Examples of the benzo[b]fluoranthene derivative represented by the formula (551) are as follows.

[Chemical Formula 37]

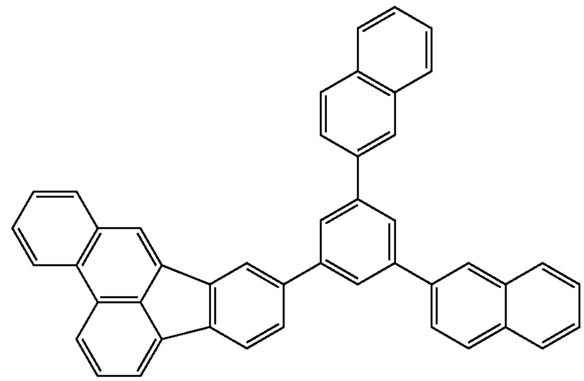

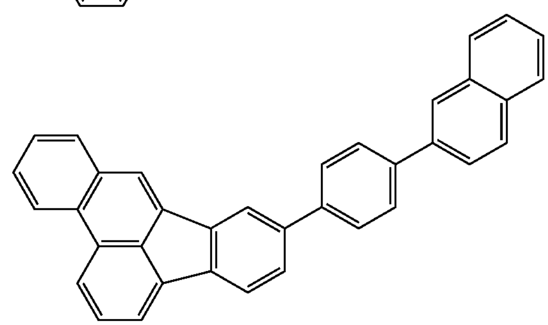

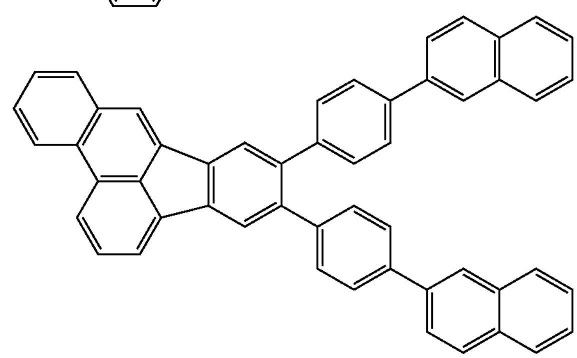

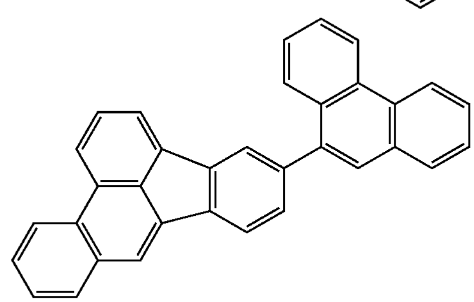

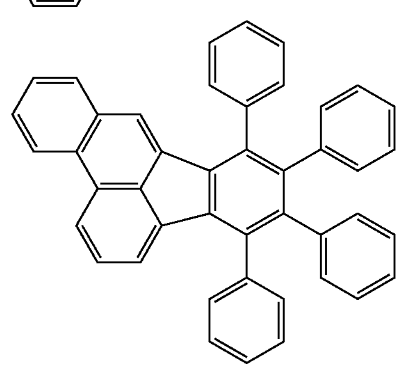

-continued
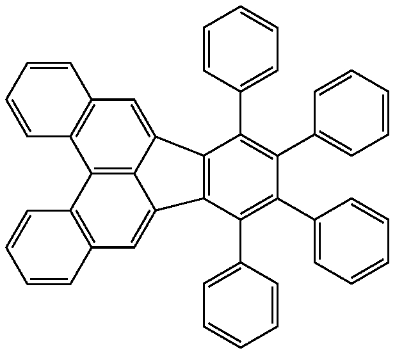
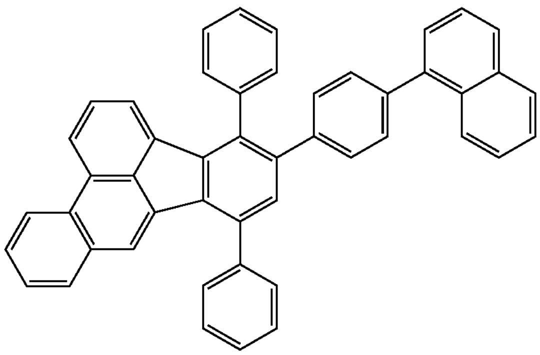
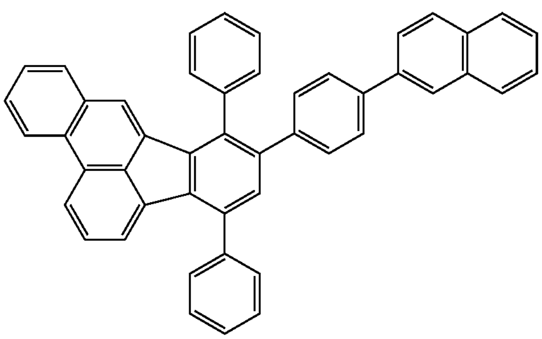
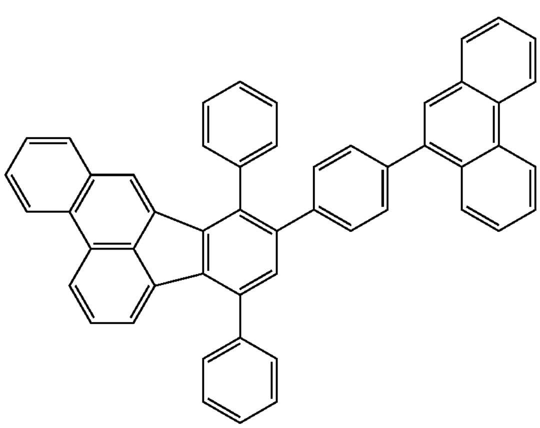
-continued
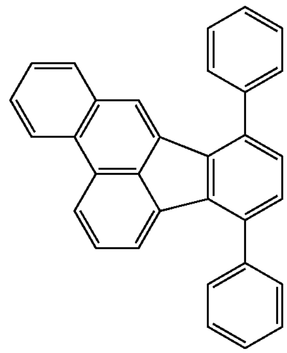
Examples of the benzo[k]fluoranthene derivative represented by the formula (552) are as follows.
[Chemical Formula 38]
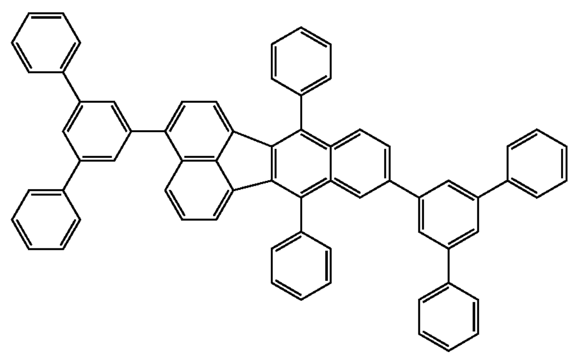
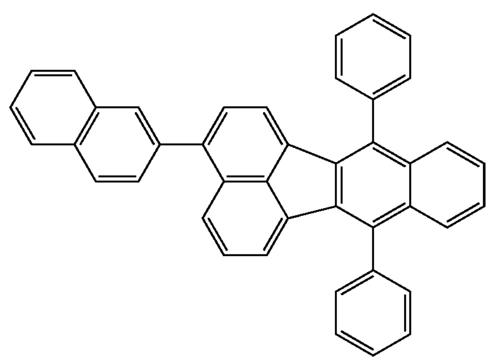
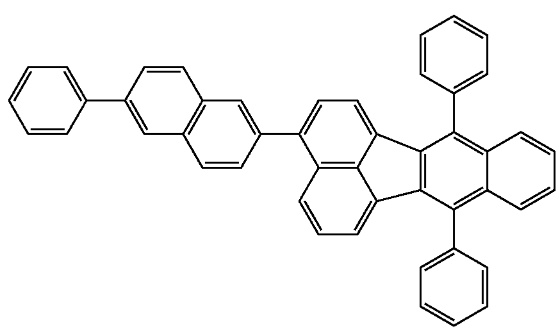

-continued

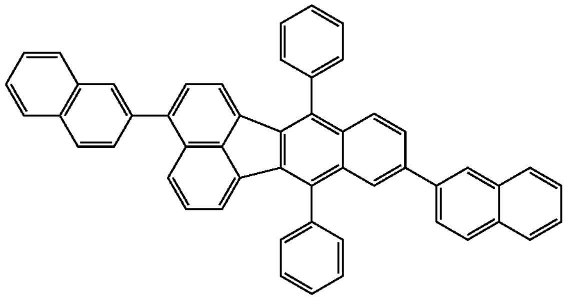

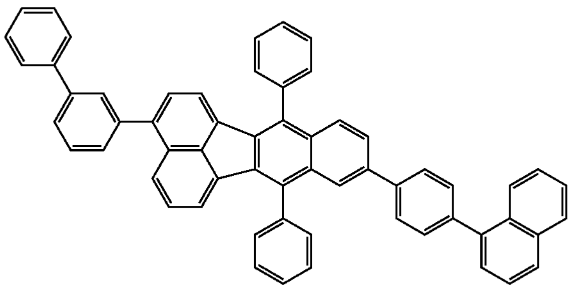

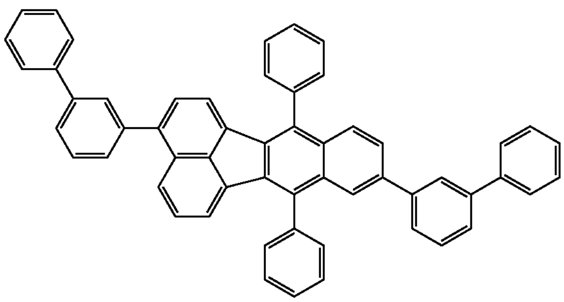

In the aspect of the invention, the polycyclic fused aromatic skeleton is preferably an elementary substance or a derivative of triphenylene represented by a formula (56) below.

[Chemical Formula 39]

(56)

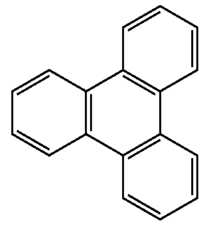

An example of the triphenylene derivative is represented by a formula (56A) below.

[Chemical Formula 40]

(56A)

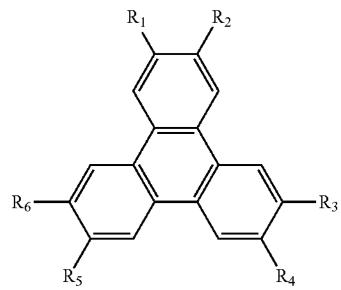

In the formula (56A), $R_1$ to $R_6$ each independently represent: a hydrogen atom; or a substituent consisting of one of or a combination of two or more of substituted or unsubstituted aryl group having 5 to 30 ring-forming carbon atoms (not counting carbon atoms(s) of substituent(s)), branched or linear alkyl group having 1 to 30 carbon atoms and substituted or unsubstituted cycloalkyl group having 3 to 20 carbon atoms.

Examples of the triphenylene derivative represented by the formula (56) are as follows.

[Chemical Formula 41]

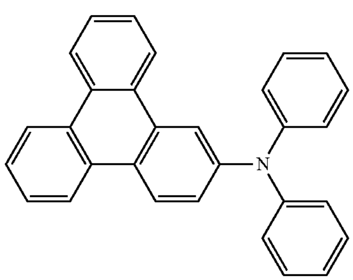

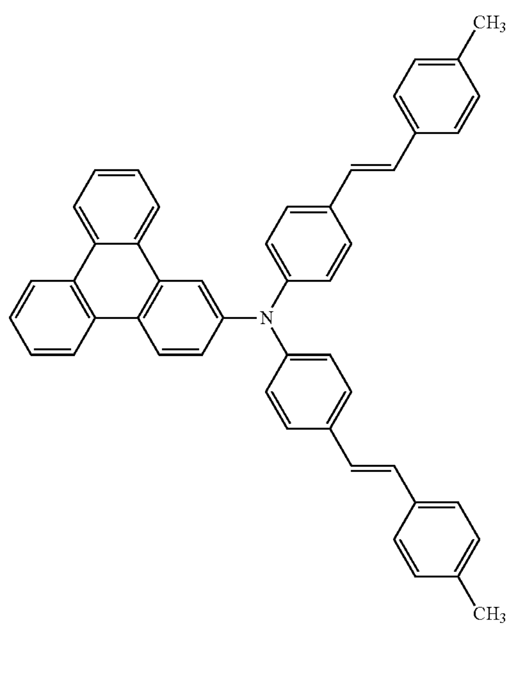

-continued
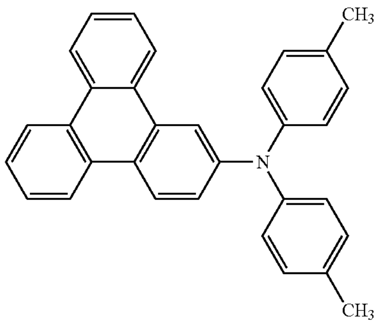
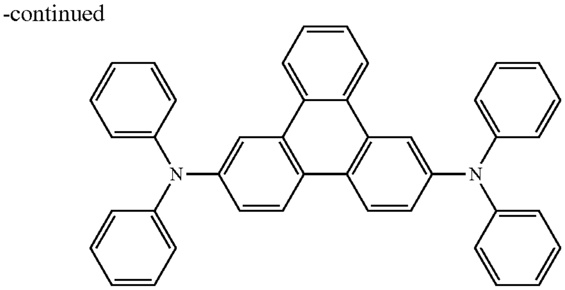
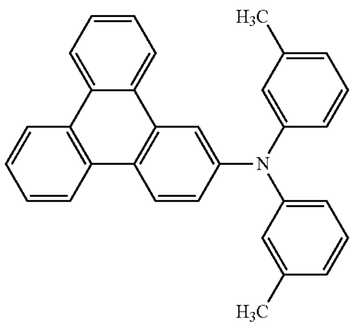
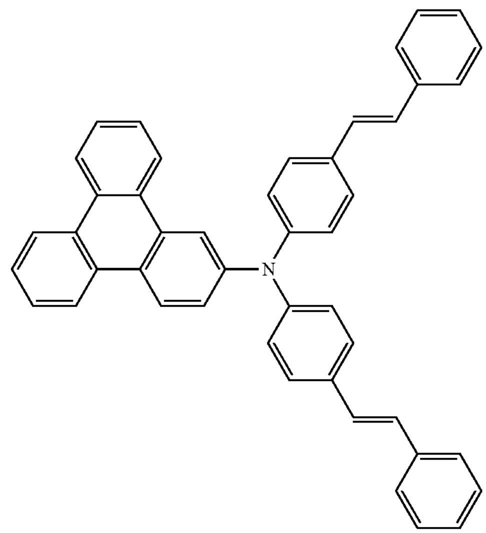
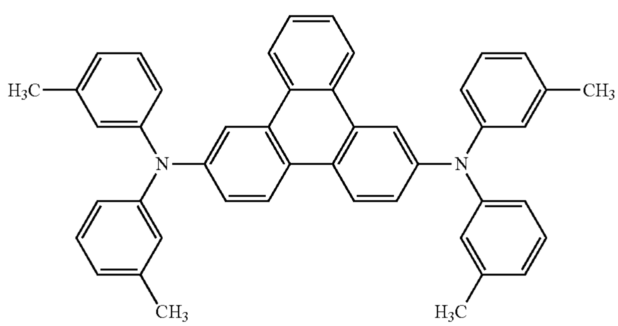
[Chemical Formula 42]
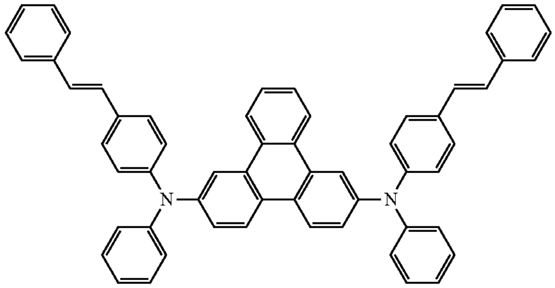
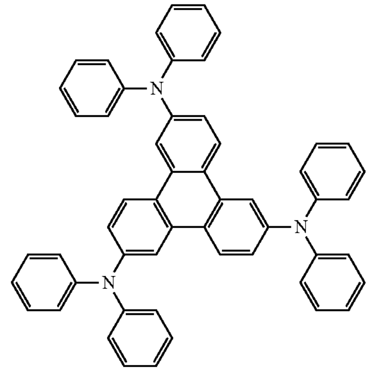

-continued
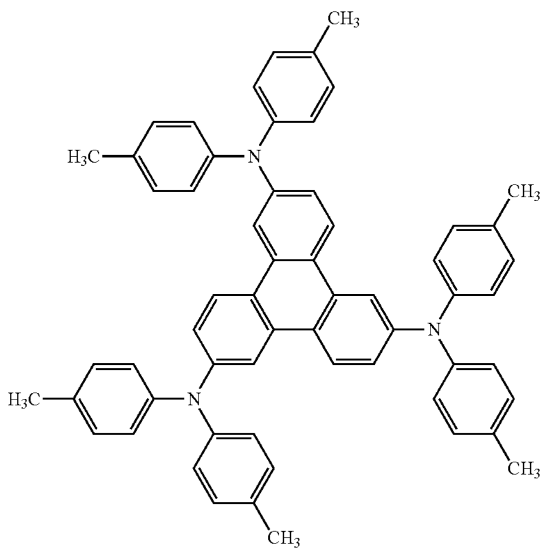
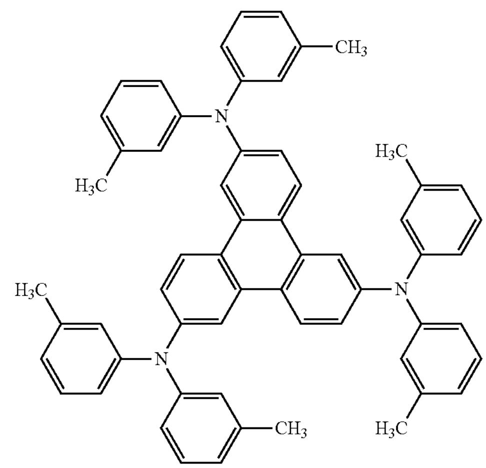
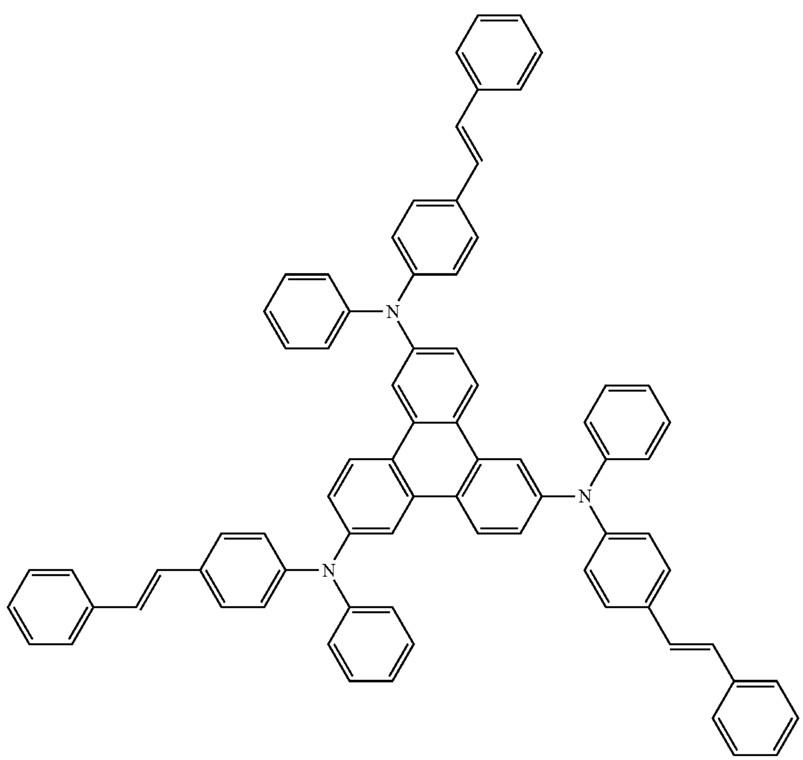

-continued
[Chemical Formula 43]
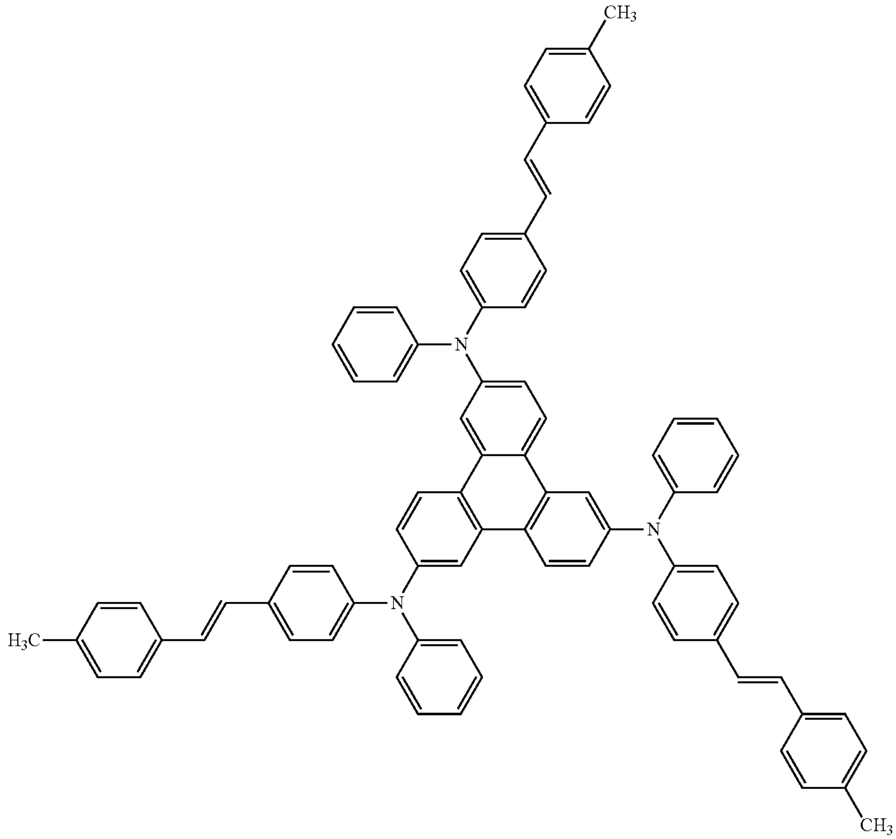
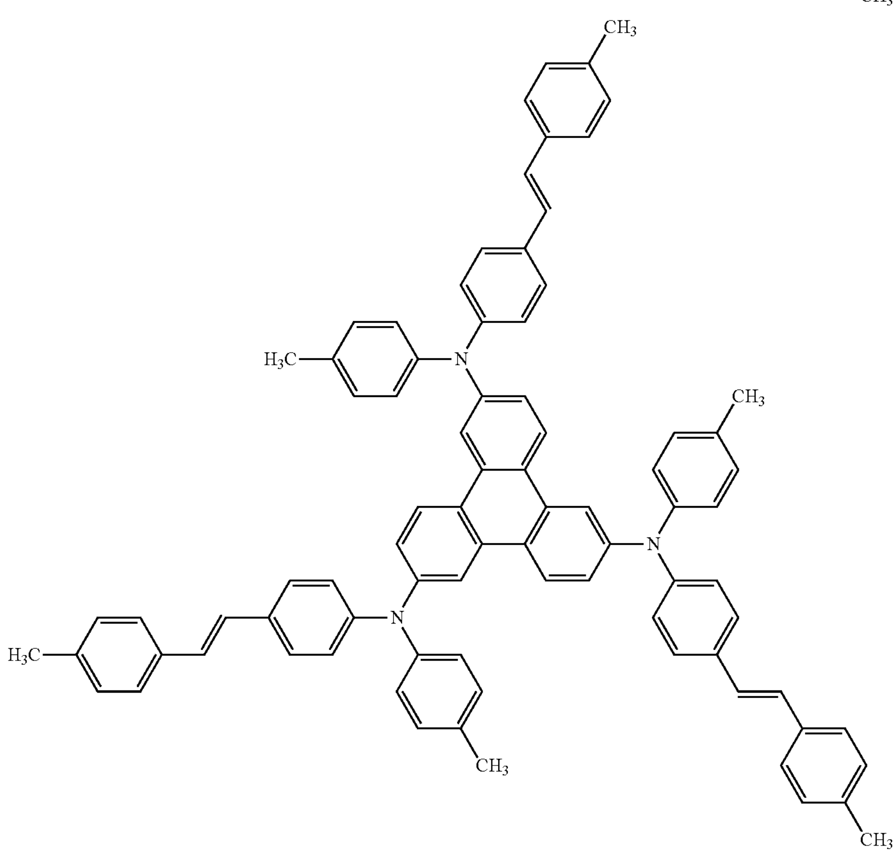

-continued
[Chemical Formula 44]
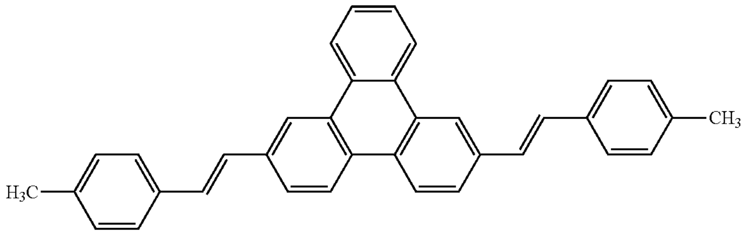
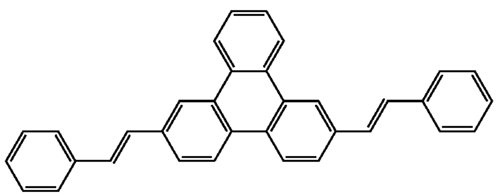
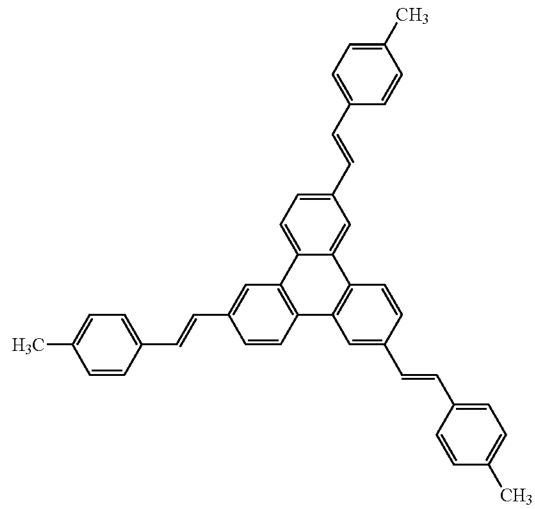
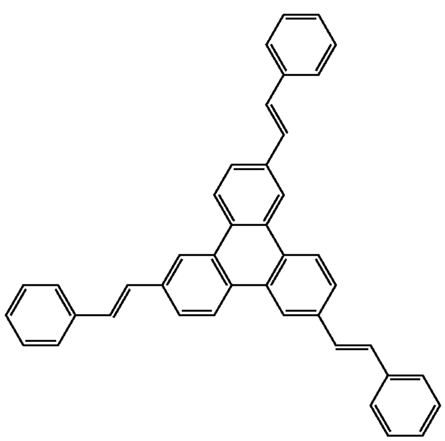
[Chemical Formula 45]
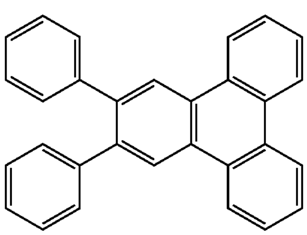
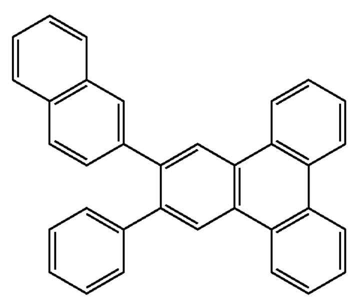

-continued
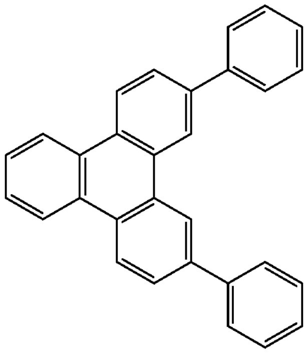
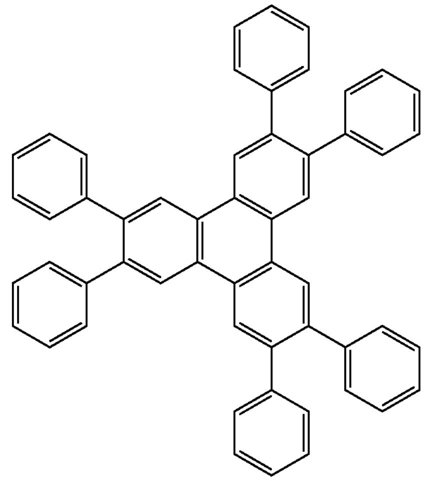
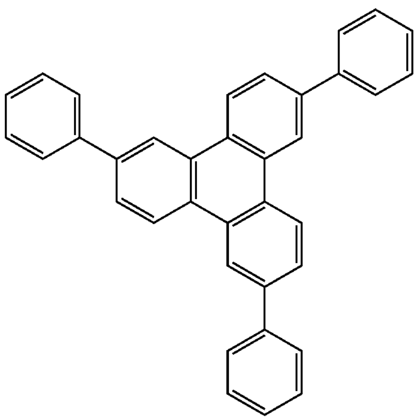
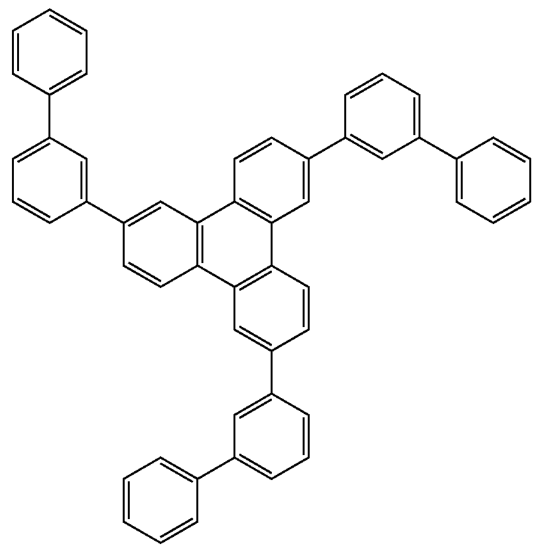
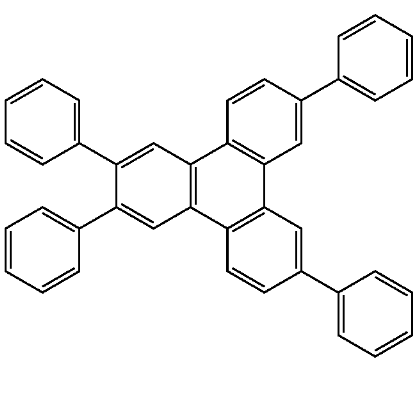

-continued
[Chemical Formula 46]
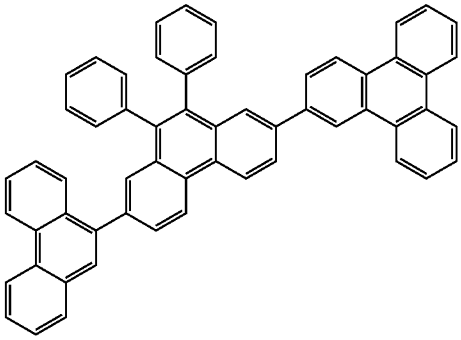
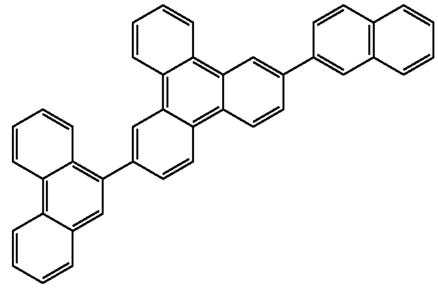
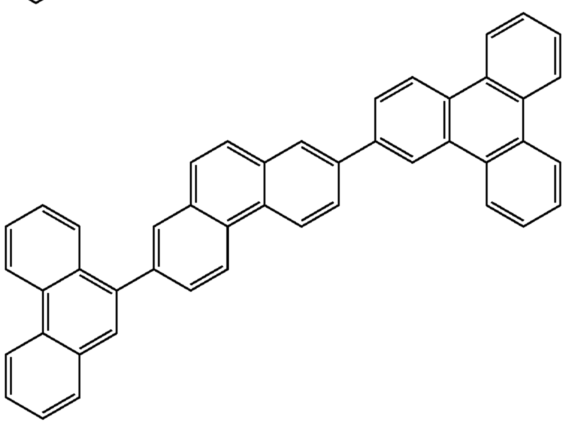
[Chemical Formula 47]
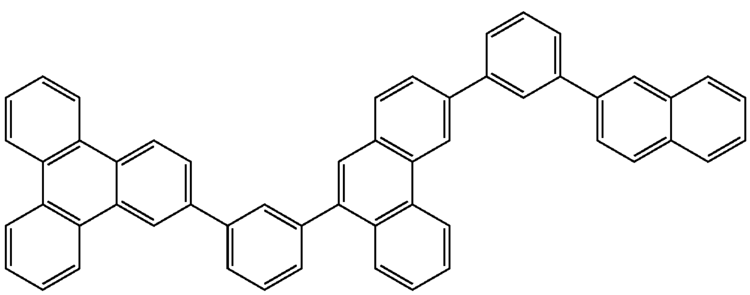
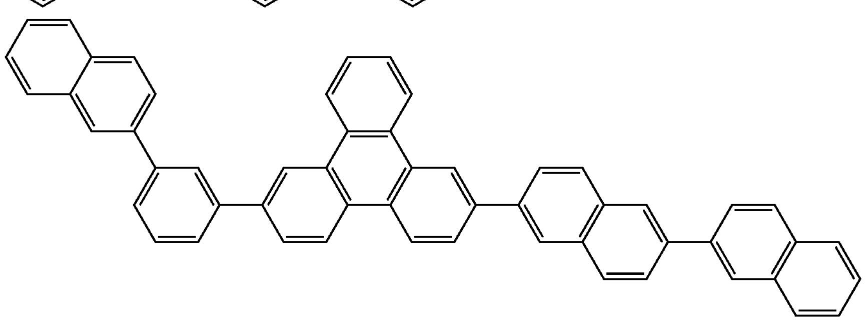
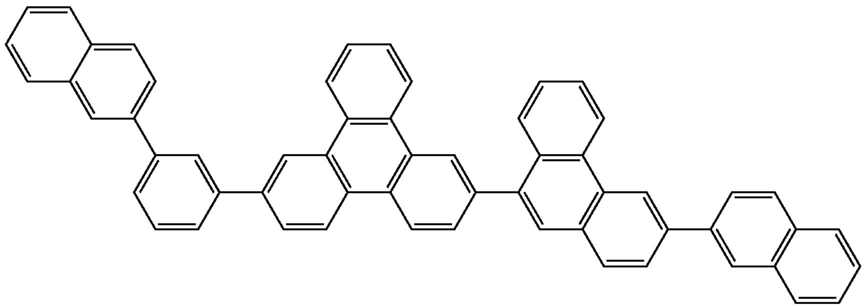

-continued
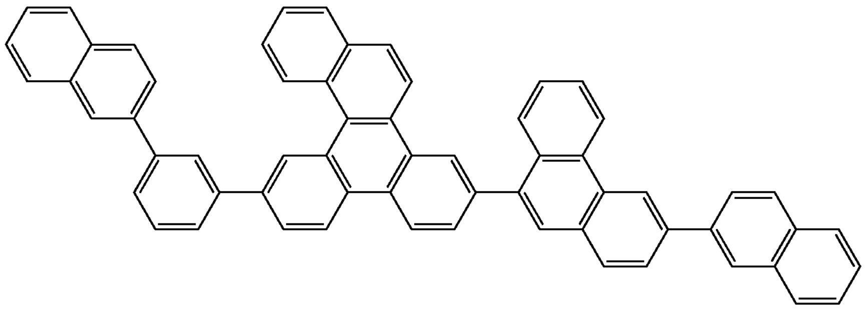
[Chemical Formula 48]
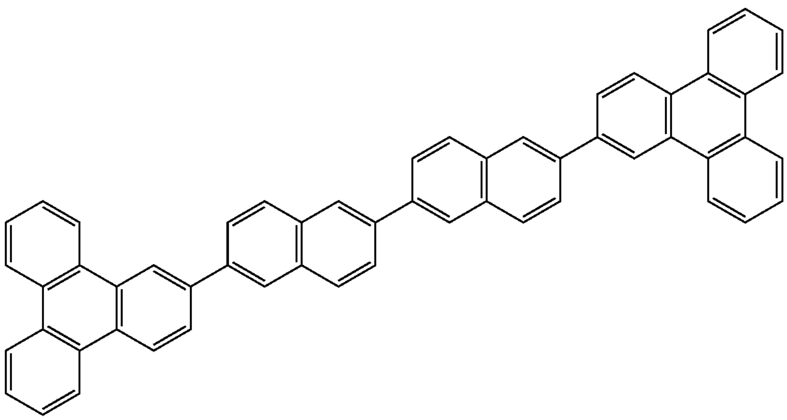
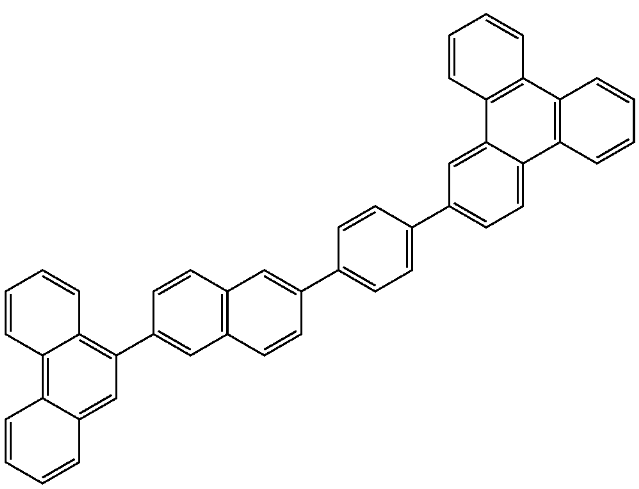
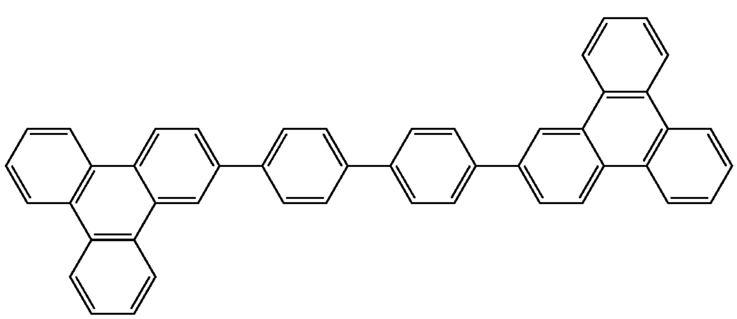

-continued

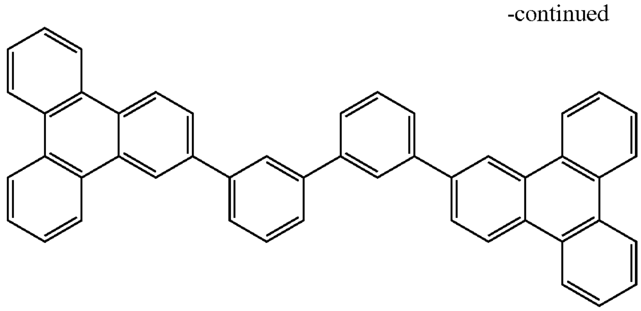

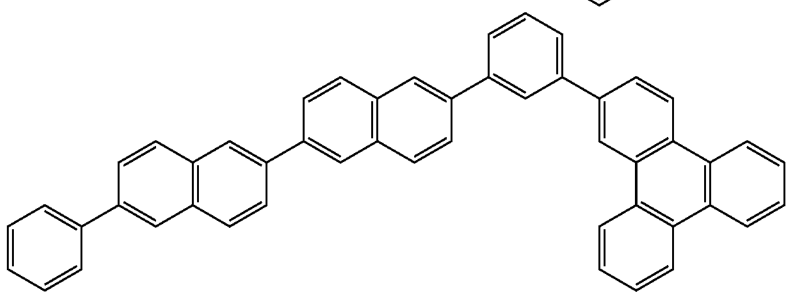

According to the aspect of the invention, the polycyclic fused aromatic skeleton is preferably an elementary substance or a derivative of naphthalene.

An example of the naphthalene derivative is represented by a formula (57A) below.

[Chemical Formula 49]

(57A)

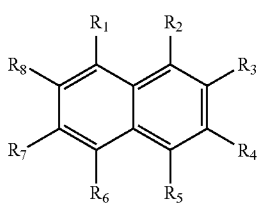

In the formula (57A), $R_1$ to $R_8$ each independently represent: a hydrogen atom; or a substituent consisting of one of or a combination of two or more of substituted or unsubstituted aryl group having 5 to 30 ring-forming carbon atoms (not counting carbon atoms(s) of substituent(s)), branched or linear alkyl group having 1 to 30 carbon atoms and substituted or unsubstituted cycloalkyl group having 3 to 20 carbon atoms.

Examples of the naphthalene derivative are as follows.

[Chemical Formula 50]

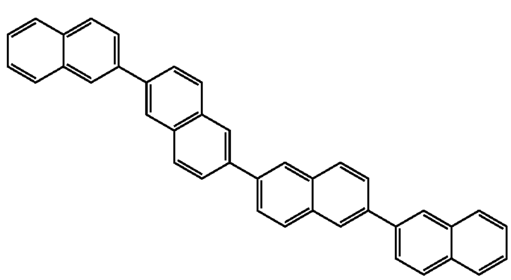

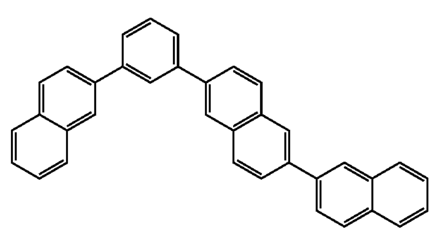

-continued
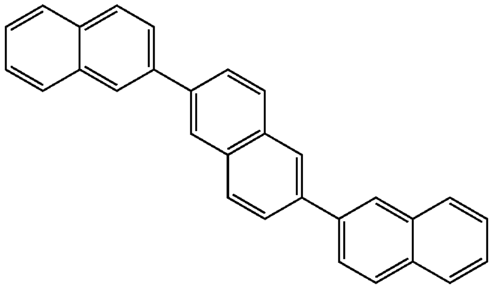
[Chemical Formula 51]
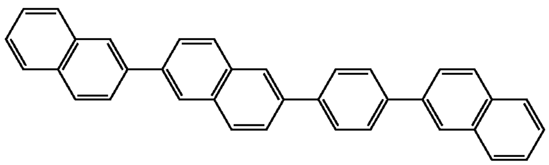
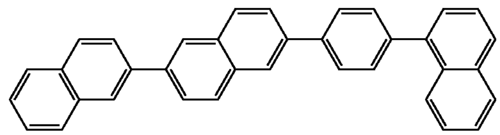
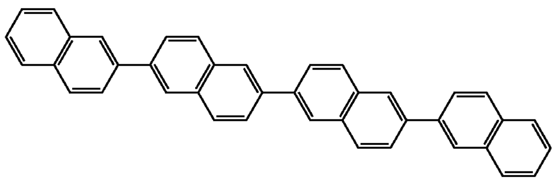
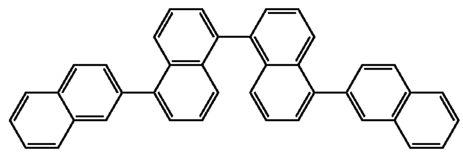
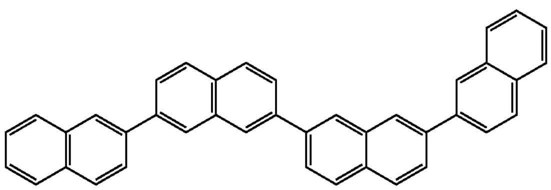
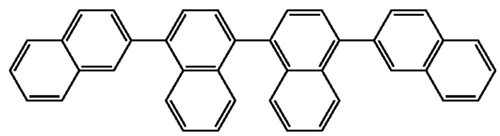
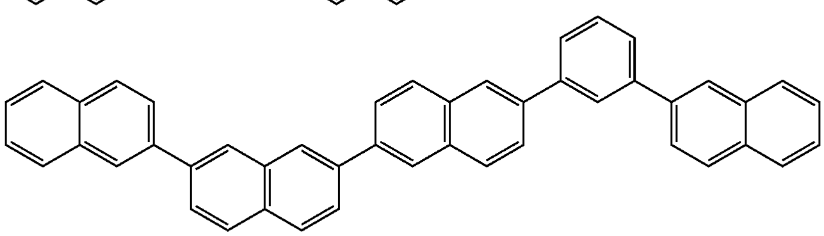
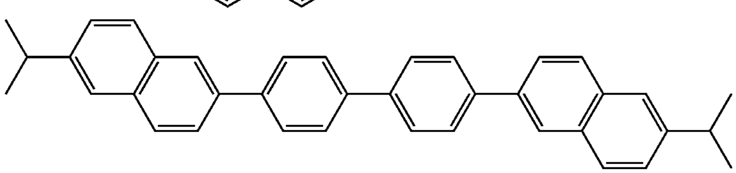
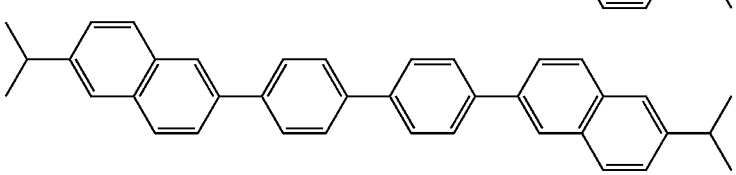
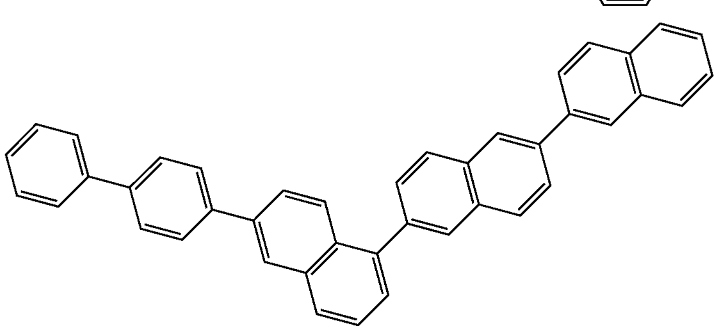

-continued
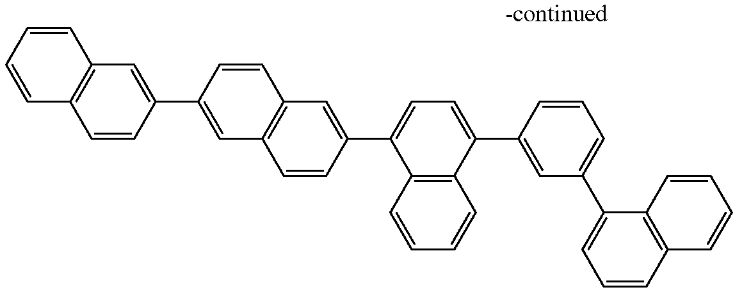
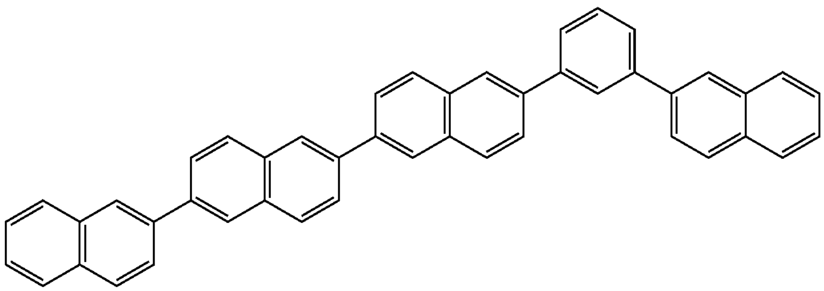
The polycyclic fused aromatic skeleton may include a nitrogen atom, examples of which may be as follows.
[Chemical Formula 52]
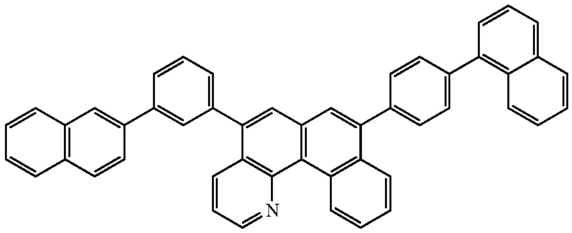
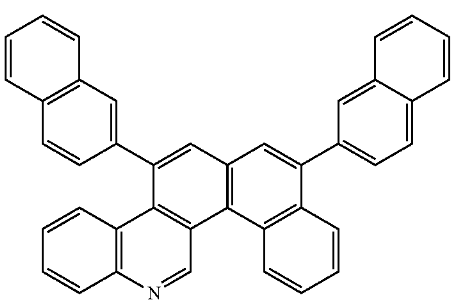
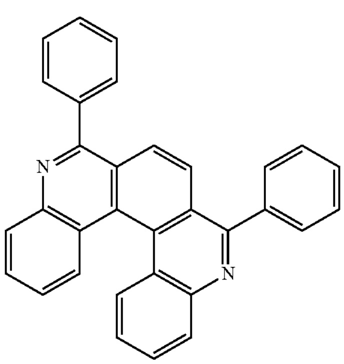
-continued
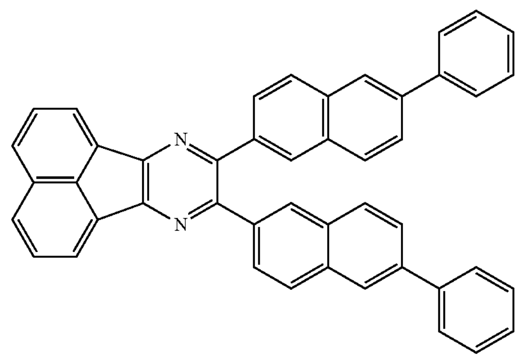
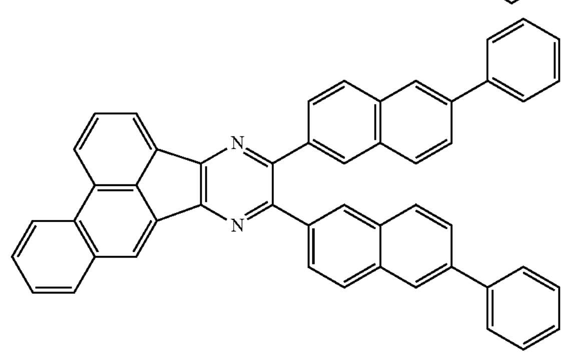
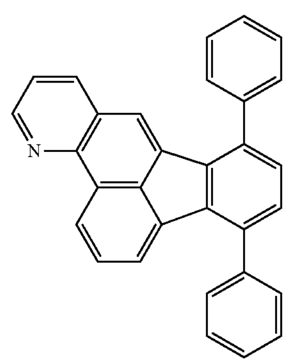 [SMILES: c1ccc(-c2ccc(-c3ccccc3)c3c2-c2cccc4c2c-3cc2cccnc24)cc1]

According to the aspect of the invention, the polycyclic fused aromatic skeleton is preferably substituted or unsubstituted phenanthrene or chrysene.

Examples of phenanthrene or chrysene are as described above.

When the polycyclic fused aromatic skeleton is substituted or unsubstituted phenanthrene or chrysene, a difference between Eg(S) and Eg(T) is small, so that voltage-lowering and long lifetime of the organic electroluminescence device are achievable.

In the aspect of the invention, the electron transporting layer preferably contains an electron transporting material having an electron mobility of $10^{-5}$ $cm^2/Vs$ or more.

Since conventional phosphorescent devices requires high voltage and have luminous efficiency (lm/W) equivalent to that of fluorescent devices, the phosphorescent devices have not been practically applied. When electron transporting materials of high electron mobility are combined for voltage-lowering, electrons are injected from conventional phosphorescent hosts exhibiting excessive electron mobility into a hole transporting material exhibiting weak electron blocking capability, resulting in reduction in a lifetime of the device.

The polycyclic fused ring host according to the aspect of the invention, which exhibits higher hole transporting capability than the conventional phosphorescent hosts (BAlq, Zn complex), can provide voltage-lowering and long lifetime of the organic electroluminescence device by a combination of the electron transporting materials of high electron mobility.

Moreover, in the aspect of the invention, the electron transporting layer preferably contains at least one of nitrogen-containing heterocycle derivatives represented by formulae (1) to (3) below.

[Chemical Formula 53]

(1)

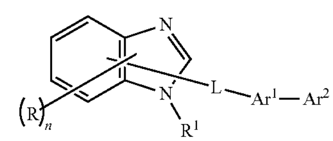

(2)

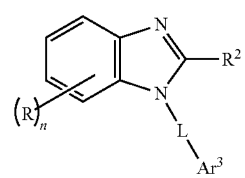

(3)

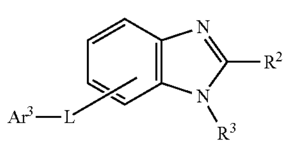

In the formulae (1) to (3): R represents a hydrogen atom, a substituted or unsubstituted aryl group having 6 to 60 carbon atoms, a substituted or unsubstituted pyridyl group, a substituted or unsubstituted quinolyl group, a substituted or unsubstituted alkyl group having 1 to 20 carbon atoms, or a substituted or unsubstituted alkoxy group having 1 to 20 carbon atoms; n is an integer of 0 to 4;

$R^1$ represents a substituted or unsubstituted aryl group having 6 to 60 carbon atoms, a substituted or unsubstituted pyridyl group, a substituted or unsubstituted quinolyl group, a substituted or unsubstituted alkyl group having 1 to 20 carbon atoms, or an alkoxy group having 1 to 20 carbon atoms;

$R^2$ and $R^3$ each independently represent a hydrogen atom, a substituted or unsubstituted aryl group having 6 to 60 carbon atoms, a substituted or unsubstituted pyridyl group, a substituted or unsubstituted quinolyl group, a substituted or unsubstituted alkyl group having 1 to 20 carbon atoms, or a substituted or unsubstituted alkoxy group having 1 to 20 carbon atoms;

L represents a substituted or unsubstituted arylene group having 6 to 60 carbon atoms, a substituted or unsubstituted pyridinylene group, a substituted or unsubstituted quinolinylene group, or a substituted or unsubstituted fluorenylene group;

$Ar^1$ represents a substituted or unsubstituted arylene group having 6 to 60 carbon atoms, a substituted or unsubstituted pyridinylene group, or a substituted or unsubstituted quinolinylene group;

$Ar^2$ represents a substituted or unsubstituted aryl group having 6 to 60 carbon atoms, a substituted or unsubstituted pyridyl group, a substituted or unsubstituted quinolyl group, a substituted or unsubstituted alkyl group having 1 to 20 carbon atoms, or a substituted or unsubstituted alkoxy group having 1 to 20 carbon atoms; and $Ar^3$ represents a substituted or unsubstituted aryl group having 6 to 60 carbon atoms, a substituted or unsubstituted pyridyl group, a substituted or unsubstituted quinolyl group, a substituted or unsubstituted alkyl group having 1 to 20 carbon atoms, a substituted or unsubstituted alkoxy group having 1 to 20 carbon atoms, or a group represented by $—Ar^1—Ar^2$ ($Ar^1$ and $Ar^2$ may be the same as the above ($—Ar^3=—Ar^1—Ar^2$)), wherein the substituent of each of $Ar^1$, $Ar^2$ and $Ar^3$ is preferably an aryl group having 6 to 20 carbon atoms, pyridyl group, quinolyl group and alkyl group, and $Ar^1$ and $Ar^2$ are respectively bonded to L and $Ar^1$ at either substitution position when L and $Ar^1$ are asymmetric.

According to the aspect of the invention, a phosphorescent dopant is added to a host containing a host compound having a polycyclic fused aromatic skeleton, thereby forming a phosphorescent-emitting layer.

This phosphorescent dopant is a phosphorescent material that emits light by energy transfer from the host, or a material that emits light by generating triplet excitons directly on the phosphorescent dopant.

According to the aspect of the invention, since the host compound has a polycyclic fused aromatic skeleton, the stability of molecules can be further enhanced, and the emission lifetime of the device can be prolonged.

In the disclosure of JP-A-2004-75567, an oligoarylene derivative that has a fused aromatic ring having 14 to 20 ring-forming carbon atoms (not including carbon atoms of the substituent), which is similar to the host compound according to the aspect of the invention, is applicable as a host of a blue emitting layer.

However, in the organic electroluminescence device disclosed in JP-A-2004-75567, the oligoarylene derivative is used as a fluorescent host of a fluorescent layer, which is completely different from the aspect of the invention that provides a phosphorescent organic electroluminescence device having high efficiency and long lifetime.

The organic electroluminescence device according to the aspect of the invention includes an electron transporting layer containing at least one of nitrogen-containing heterocycle derivatives represented by the formulae (1) to (3).

Since the nitrogen-containing heterocyclic derivatives represented by the formulae (1) to (3) are excellent in electron injecting capability, voltage-lowering of the organic electroluminescence device is achievable.

Moreover, since a sufficient volume of electrons can be injected into the emitting layer owing to the improvement of the electron injecting capability, holes need not to be blocked by the electron transporting layer and trapped in the emitting layer. Accordingly, the holes do not concentrate on an interface between the emitting layer and the electron injecting/transporting layer, which is different from the conventional electron injecting/transporting layer formed of BAlq or the like, so that a lifetime of the organic electroluminescence device is considerably improved.

It is important that the phosphorescent device is in a triplet state. However, the triplet state lasts long to damage a material of the device, which is one of reasons why the phosphorescent device has a shorter lifetime than the fluorescent device.

In comparison between the host material and the electron transporting material of the organic electroluminescence device of the invention in terms of Eg(T), combinations of the host material and the electron transporting material can be grouped into: (I) a combination of Eg(T) of the host material >Eg(T) of the electron transporting material; and (II) a combination of Eg(T) of the electron transporting material >Eg (T) of the host material.

In comparison between the above combinations in terms of a size of π conjugated systems in the aspect of the invention, the combination of (I) shows π conjugated system of the host material <π conjugated system of the electron transporting material and the combination of (II) shows π conjugated system of the electron transporting material <π conjugated system of the host material.

In other words, in the above combinations of the organic electroluminescence device according to the aspect of the invention, the combination of (I) shows that the device is energetically stable because π conjugated system of the electron transporting material is larger than that of the host material even when the triplet excitons are transported from the host material to the electron transporting material, so that lifetime of the device can be prolonged. In the combination of (II), the triplet excitons are not transported to the electron transporting material and remain in the host. When the host material is stable, lifetime of the device can be prolonged since the host material is more stable than the electron transporting material. Consequently, the lifetime of the organic electroluminescence device can be considerably prolonged in the both combinations.

In the formulae (1) to (3), R represents a hydrogen atom, a substituted or unsubstituted aryl group having 6 to 60 carbon atoms, a substituted or unsubstituted pyridyl group, substituted or unsubstituted quinolyl group, a substituted or unsubstituted alkyl group having 1 to 20 carbon atoms, or a substituted or unsubstituted alkoxy group having 1 to 20 carbon atoms.

The aryl group having 6 to 60 carbon atom is preferably an aryl group having 6 to 40 carbon atoms, more preferably an aryl group having 6 to 20 carbon atoms. Examples of such an aryl group are a phenyl group, naphthyl group, anthryl group, phenanthryl group, naphthacenyl group, chrysenyl group, pyrenyl group, biphenyl group, terphenyl group, tolyl group, t-butylphenyl group, (2-phenylpropyl)phenyl group, fluoranthenyl group, fluorenyl group, a monovalent group formed of spirobifluorene, perfluorophenyl group, perfluoronaphthyl group, perfluoroanthryl group, perfluorobiphenyl group, a monovalent group formed of 9-phenylanthracene, a monovalent group formed of 9-(1'-naphthyl) anthracene, a monovalent group formed of 9-(2'-naphthyl) anthracene, a monovalent group formed of 6-phenylchrysene, and a monovalent group formed of 9-[4-(diphenylamino)phenyl]anthracene, among which a phenyl group, naphthyl group, biphenyl group, terphenyl group, 9-(10-phenyl)anthryl group, 9-[10-(1'-naphthyl)]anthryl group and 9-[10-(2'-naphthyl)]anthryl group are preferable.

The alkyl group having 1 to 20 carbon atoms is preferably an alkyl group having 1 to 6 carbon atoms. Examples of such an alkyl group are a methyl group, ethyl group, propyl group, butyl group, pentyl group, hexyl group, and a haloalkyl group such as trifluoromethyl group. When such an alkyl group has 3 or more carbon atoms, the alkyl group may be linear, cyclic or branched.

The alkoxy group having 1 to 20 carbon atoms is preferably an alkoxy group having 1 to 6 carbon atoms. Examples of such an alkoxy group are a methoxy group, ethoxy group, propoxy group, butoxy group, pentyloxy group, and hexyloxy group. When such an alkoxy group has 3 or more carbon atoms, the alkoxy group may be linear, cyclic or branched.

Examples of a substituent for the group represented by R are a halogen atom, a substituted or unsubstituted alkyl group having 1 to 20 carbon atoms, a substituted or unsubstituted alkoxy group having 1 to 20 carbon atoms, a substituted or unsubstituted aryloxy group having 6 to 40 carbon atoms, a substituted or unsubstituted aryl group having 6 to 40 carbon atoms, and a substituted or unsubstituted heteroaryl group having 3 to 40 carbon atoms.

Examples of the halogen atom are fluorine, chlorine, bromine and iodine.

Examples for each of the alkyl group having 1 to 20 carbon atoms, the alkoxy group having 1 to 20 carbon atoms, and an aryl group having 6 to 40 carbon atoms may be the same as the above examples.

Examples of the aryloxy group having 6 to 40 carbon atoms are a phenoxy group and a biphenyloxy group.

Examples of the heteroaryl group having 3 to 40 carbon atoms are a pyroryl group, furyl group, thienyl group, silolyl group, pyridyl group, quinolyl group, isoquinolyl group, benzofuryl group, imidazolyl group, pyrimidyl group, carbazolyl group, selenophenyl group, oxadiazolyl group and triazolyl group.

n is an integer in a range of 0 to 4, preferably 0 to 2.

In the formulae (1), $R^1$ represents a substituted or unsubstituted aryl group having 6 to 60 carbon atoms, a substituted or unsubstituted pyridyl group, substituted or unsubstituted quinolyl group, a substituted or unsubstituted alkyl group having 1 to 20 carbon atoms, or an alkoxy group having 1 to 20 carbon atoms.

Examples for each of the groups, the preferable number of carbon atoms contained in each of the groups, and preferable examples of the substituent for each of the groups are the same as those described in relation to R.

In the formulae (2) and (3), $R^2$ and $R^3$ each independently represent a hydrogen atom, a substituted or unsubstituted aryl group having 6 to 60 carbon atoms, a substituted or unsubstituted pyridyl group, substituted or unsubstituted quinolyl group, a substituted or unsubstituted alkyl group having 1 to 20 carbon atoms, or a substituted or unsubstituted, alkoxy group having 1 to 20 carbon atoms.

Examples for each of the groups, the preferable number of carbon atoms contained in each of the groups, and preferable examples of the substituent for each of the groups are the same as those described in relation to R.

In the formulae (1) to (3), L represents a substituted or unsubstituted arylene group having 6 to 60 carbon atoms, a substituted or unsubstituted pyridinylene group, a substituted or unsubstituted quinolinylene group, or a substituted or unsubstituted fluorenylene group.

The arylene group having 6 to 60 carbon atoms is preferably an arylene group having 6 to 40 carbon atoms, more preferably an arylene group having 6 to 20 carbon atoms. An example of such an arylene group is a divalent group formed by removing one hydrogen atom from the aryl group having been described in relation to R. Examples of a substituent for the group represented by L are the same as those described in relation to R.

Alternatively, L is preferably a group selected from the group consisting of the following.

[Chemical Formula 54]

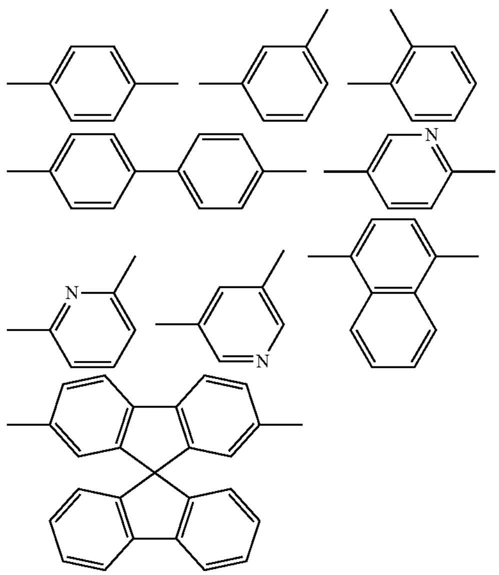

In the formula (1), $Ar^1$ represents a substituted or unsubstituted arylene group having 6 to 60 carbon atoms, a substituted or unsubstituted pyridinylene group, or a substituted or unsubstituted quinolinylene group. Examples of a substituent for each of the groups represented by $Ar^1$ and $Ar^3$ are the same as those described in relation to R.

Alternatively, $Ar^1$ is preferably selected from the group consisting of fused ring groups represented by the following formulae (101) to (110).

[Chemical Formula 55]

(101)

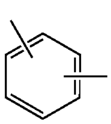

(102)

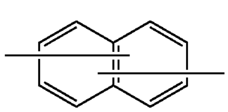

(103)

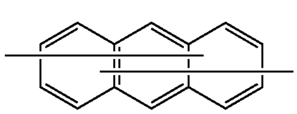

-continued (104)

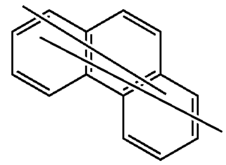

(105)

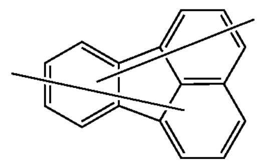

(106)

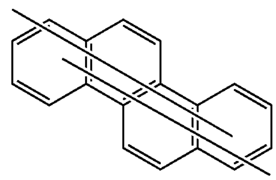

(107)

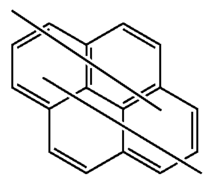

(108)

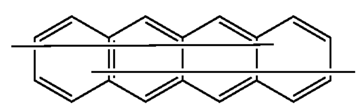

(109)

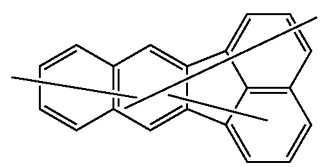

(110)

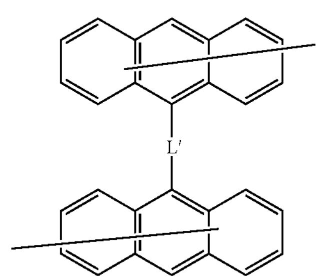

In the formulae (101) to (110), the fused rings each may be linked with a link group formed of a halogen atom, a substituted or unsubstituted alkyl group having 1 to 20 carbon atoms, a substituted or unsubstituted alkoxy group having 1 to 20 carbon atoms, a substituted or unsubstituted aryloxy group having 6 to 40 carbon atoms, a substituted or unsubstituted aryl group having 6 to 40 carbon atoms or a substituted or unsubstituted heteroaryl group having 3 to 40 carbon atoms. When the rings each are linked with plural link groups, the plural link groups may be mutually the same or different. Examples for each of the groups are the same as those described above.

[Chemical Formula 56]
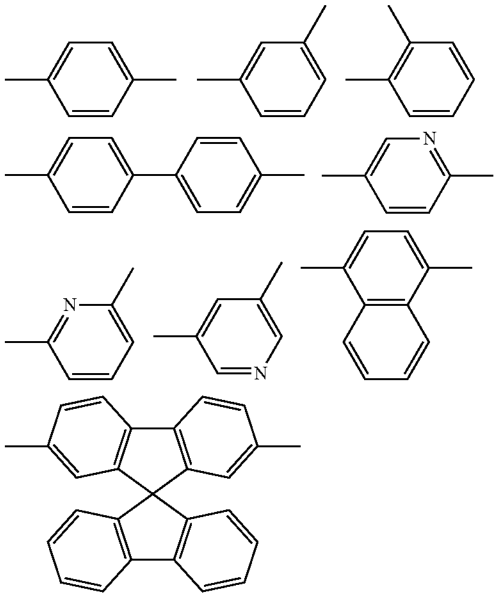
In the formula (110), L' represents a single bond, or a group selected from the group consisting of the above.
The structure of $Ar^1$ represented by the formula (103) is preferably a fused ring group represented by any one of the following formulae (111) to (125).
[Chemical Formula 57]
(111)
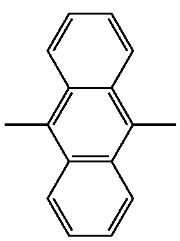
(112)
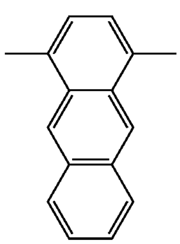
(113)
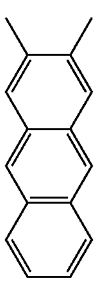
-continued
(114)
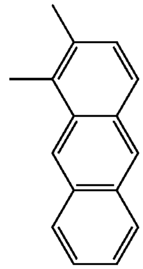
(115)
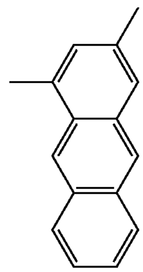
(116)
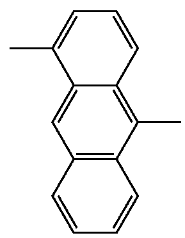
(117)
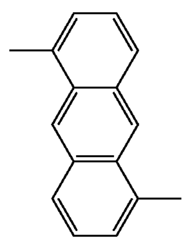
(118)
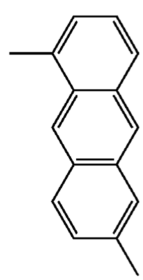
(119)
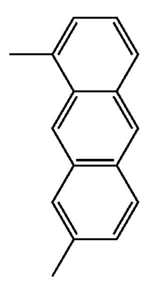

-continued (120)

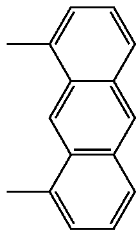

(121)

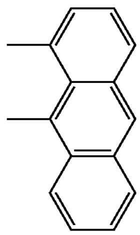

(122)

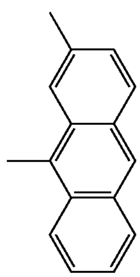

(123)

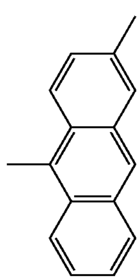

(124)

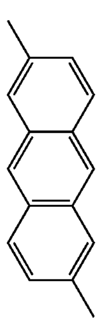

-continued (125)

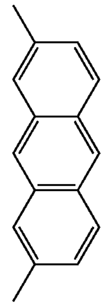

In the formulae (111) to (125), the fused rings each may be linked with a link group formed of a halogen atom, a substituted or unsubstituted alkyl group having 1 to 20 carbon atoms, a substituted or unsubstituted alkoxy group having 1 to 20 carbon atoms, a substituted or unsubstituted aryloxy group having 6 to 40 carbon atoms, a substituted or unsubstituted aryl group having 6 to 40 carbon atoms or a substituted or unsubstituted heteroaryl group having 3 to 40 carbon atoms. When the rings each are linked with plural link groups, the plural link groups may be mutually the same or different. Examples for each of the groups are the same as those described above.

In the formula (1), $Ar^2$ represents a substituted or unsubstituted aryl group having 6 to 60 carbon atoms, a substituted or unsubstituted pyridyl group, substituted or unsubstituted quinolyl group, a substituted or unsubstituted alkyl group having 1 to 20 carbon atoms, or a substituted or unsubstituted alkoxy group having 1 to 20 carbon atoms.

Examples for each of the groups, the preferable number of carbon atoms contained in each of the groups, and preferable examples of the substituent for each of the groups are the same as those described in relation to R.

In the formulae (2) and (3), $Ar^3$ represents a substituted or unsubstituted aryl group having 6 to 60 carbon atoms, a substituted or unsubstituted pyridyl group, a substituted or unsubstituted quinolyl group, a substituted or unsubstituted alkyl group having 1 to 20 carbon atoms, a substituted or unsubstituted alkoxy group having 1 to 20 carbon atoms, or a group represented by $—Ar^1—Ar^2$ ($Ar^1$ and $Ar^2$ may be the same as the above).

Examples for each of the groups, the preferable number of carbon atoms contained in each of the groups, and preferable examples of the substituent for each of the groups are the same as those described in relation to R.

Alternatively, $Ar^3$ is preferably selected from the group consisting of fused ring groups respectively represented by the following formulae (126) to (135).

[Chemical Formula 58]

(126)

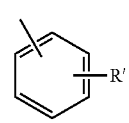

(127)

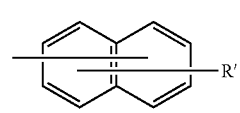

-continued (128)

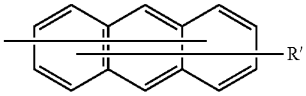

(129)

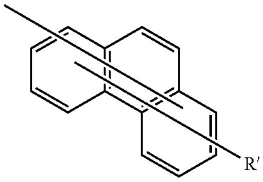

(130)

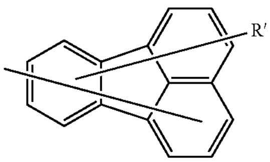

(131)

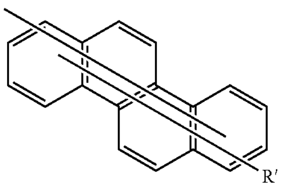

(132)

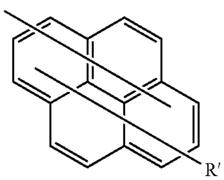

(133)

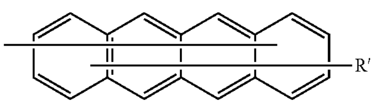

(134)

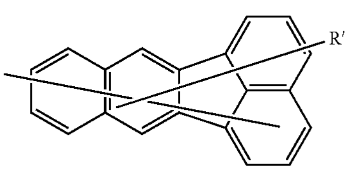

(135)

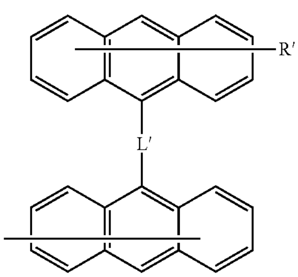

In the formulae (126) to (135), the fused rings each may be linked with a link group formed of a halogen atom, a substituted or unsubstituted alkyl group having 1 to 20 carbon atoms, a substituted or unsubstituted alkoxy group having 1 to 20 carbon atoms, a substituted or unsubstituted aryloxy group having 6 to 40 carbon atoms, a substituted or unsubstituted aryl group having 6 to 40 carbon atoms or a substituted or unsubstituted heteroaryl group having 3 to 40 carbon atoms. When the rings each are linked with plural link groups, the plural link groups may be mutually the same or different. Examples for each of the groups are the same as those described above.

In the formula (135), L' represents the same as the above.

In the formulae (126) to (135), R' represents a hydrogen atom, a substituted or unsubstituted alkyl group having 1 to 20 carbon atoms, a substituted or unsubstituted aryl group having 6 to 40 carbon atoms, or substituted or unsubstituted heteroaryl group having 3 to 40 carbon atoms. Examples for each of the groups are the same as those described above.

The structure of $Ar^1$ represented by the formula (128) is preferably a fused ring group represented by any one of the following formulae (136) to (158).

[Chemical Formula 59]

(136)

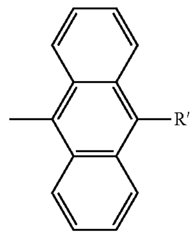

(137)

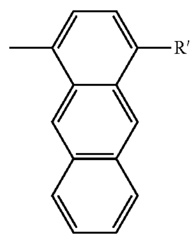

(138)

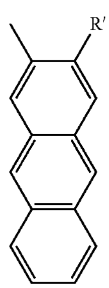

(139)

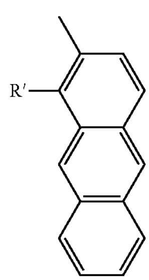

-continued
(140)
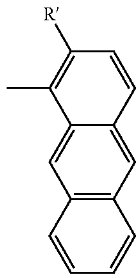
(141)
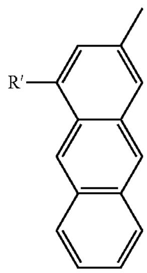
(142)
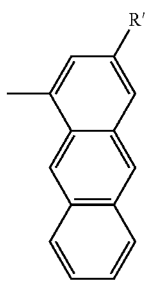
(143)
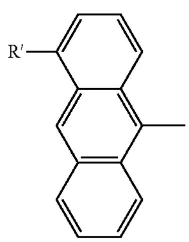
(144)
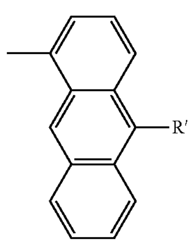
(145)
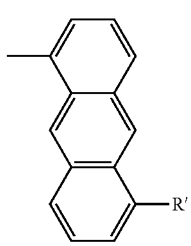
-continued
(146)
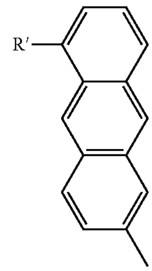
(147)
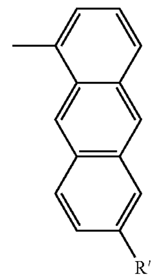
(148)
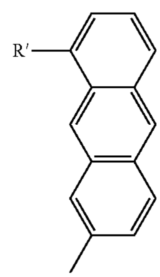
(149)
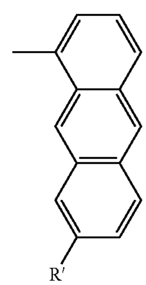
(150)
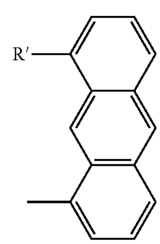
(151)
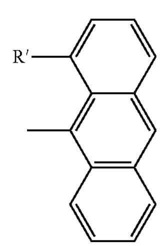

-continued (152)

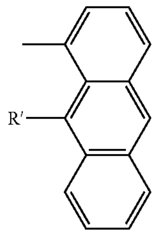

(153)

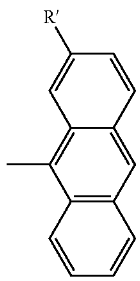

(154)

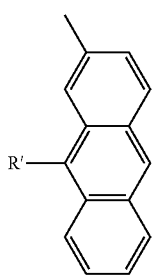

(155)

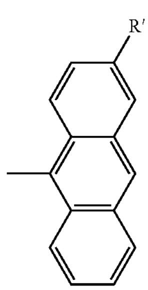

(156)

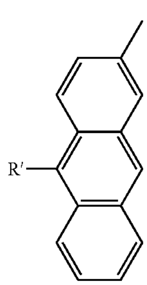

-continued (157)

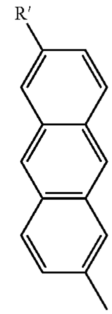

(158)

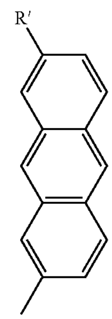

In the formulae (136) to (158), the fused rings each may be linked with a link group formed of a halogen atom, a substituted or unsubstituted alkyl group having 1 to 20 carbon atoms, a substituted or unsubstituted alkoxy group having 1 to 20 carbon atoms, a substituted or unsubstituted aryloxy group having 6 to 40 carbon atoms, a substituted or unsubstituted aryl group having 6 to 40 carbon atoms or a substituted or unsubstituted heteroaryl group having 3 to 40 carbon atoms. When the rings each are linked with plural link groups, the plural link groups may be mutually the same or different. Examples for each of the groups are the same as those described above. R' is the same as the above.

[Chemical Formula 60]

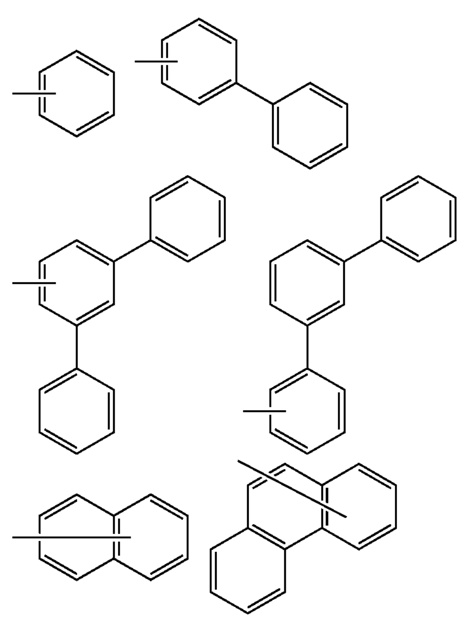

-continued

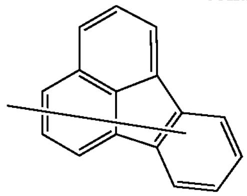

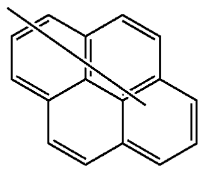

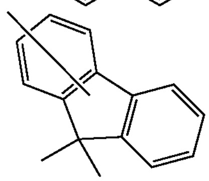

Alternatively, $Ar^2$ and $Ar^3$ each independently represent a group selected from the group consisting of the above.

Examples of the nitrogen-containing heterocyclic derivative represented by any one of the formulae (1) to (3) according to the aspect of the invention will be shown below. However, the invention is not limited to the exemplary compounds shown below.

In the Tables shown below, HAr represents any one of the following structures respectively in the structures represented by the formulae (1) to (3).

[Chemical Formula 61]

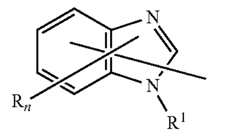

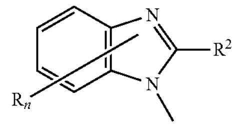

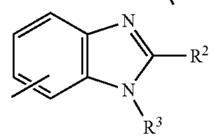

In the following exemplary compounds, exemplary compounds 1-1 to 1-17, 2-1 to 2-9, 3-1 to 3-6, 4-1 to 4-12, 5-1 to 5-6, 6-1 to 6-5 and 8-1 to 8-13 correspond to the compounds represented by the formula (1), exemplary compounds 9-1 to 9-17, 10-1 to 10-9, 11-1 to 11-6, 12-1 to 12-11, 13-1 to 13-6 and 14-1 to 14-5 correspond to the compounds represented by the formula (2) and exemplary compounds 7-1 to 7-10, 15-1 to 15-13, 16-1 to 16-8 and 17-1 to 17-8 correspond to the compounds represented by the formula (3).

[Chemical Formula 62]

HAr—L—$Ar^1$—$Ar^2$

| | HAr | L | $Ar^1$ | $Ar^2$ |
|---|---|---|---|---|
| 1-1 | 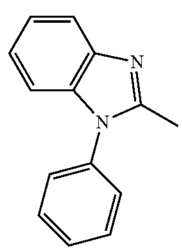 | 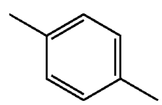 | 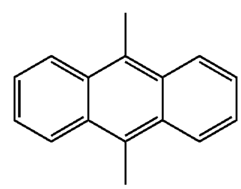 | 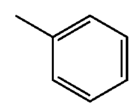 |
| 2 | 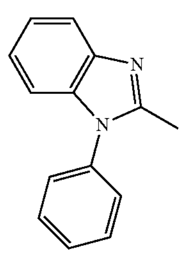 | 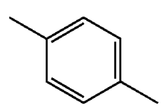 | 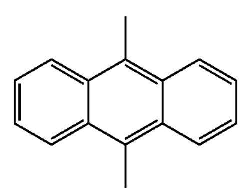 | 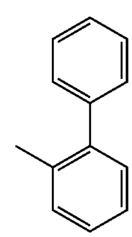 |
| 3 | 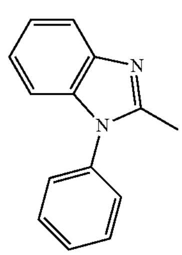 | 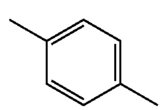 | 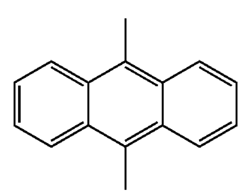 | 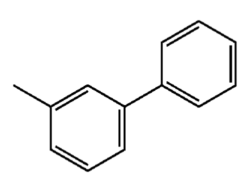 |

-continued
| | |
|---|---|
| 4 | 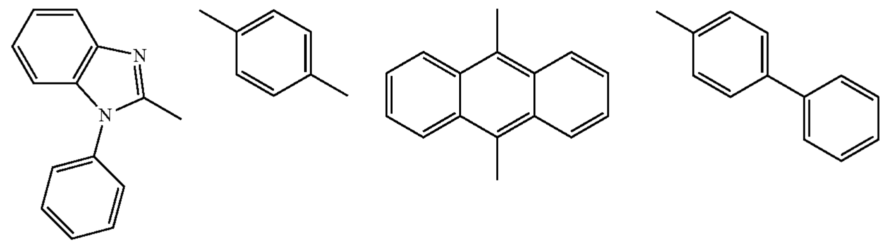 |
| 5 | 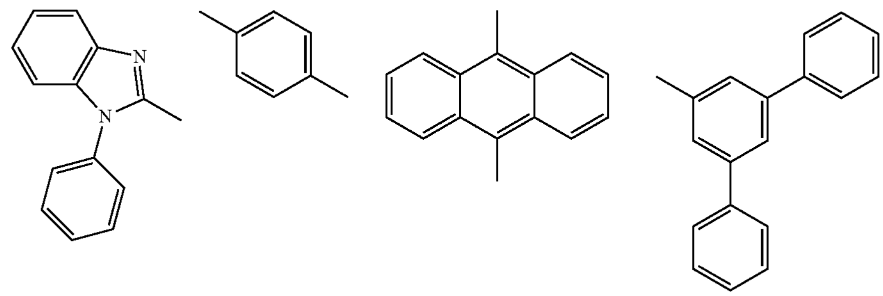 |
| 6 | 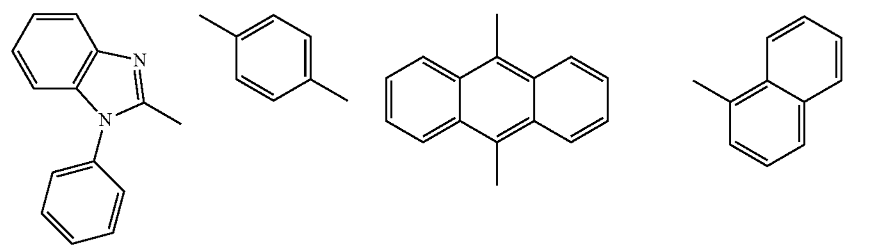 |
| 7 | 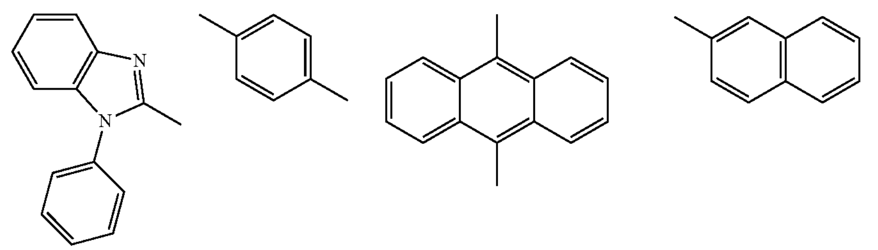 |
| 8 | 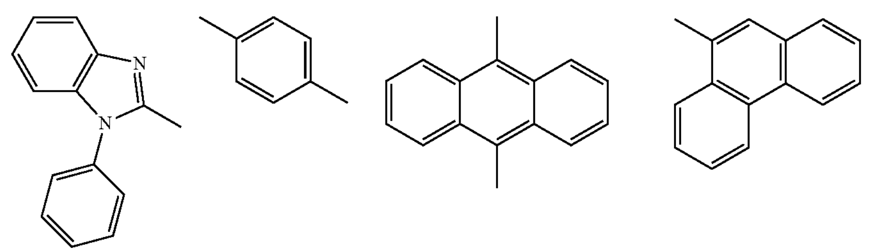 |
| 9 | 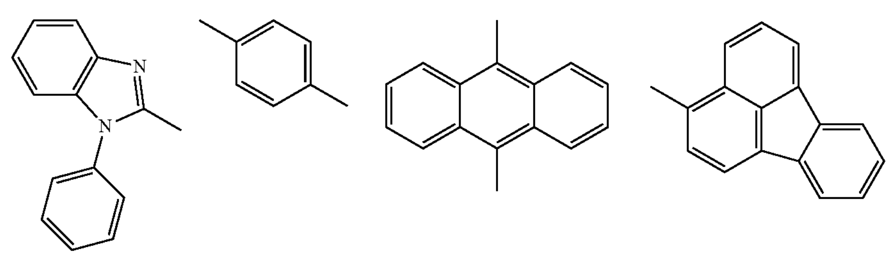 |

-continued
| | | | | |
|---|---|---|---|---|
| 10 | 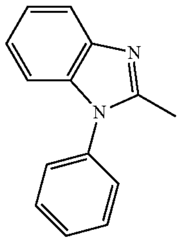 | 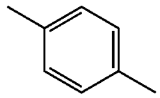 | 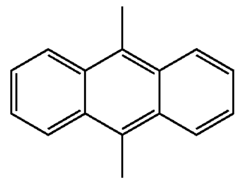 | 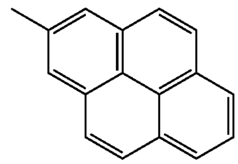 |
| 11 | 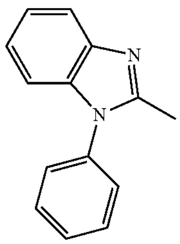 | 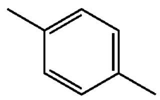 | 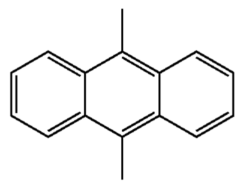 | 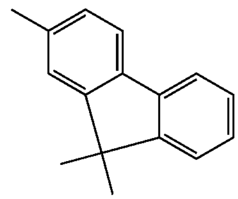 |
| 12 | 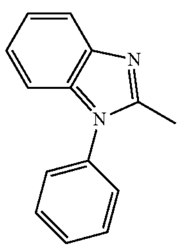 | 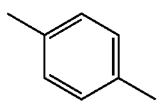 | 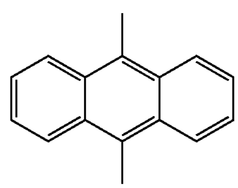 | 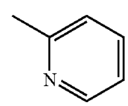 |
| 13 | 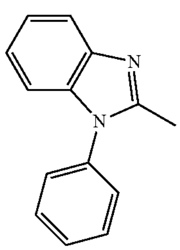 | 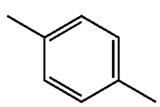 | 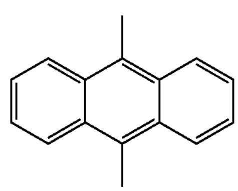 | 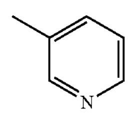 |
| 14 | 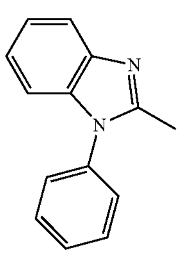 | 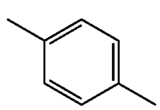 | 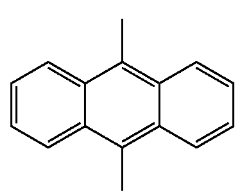 | 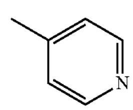 |

-continued
[Chemical Formula 63]
$HAr—L—Ar^1—Ar^2$
| | HAr | L | $Ar^1$ | $Ar^2$ |
|---|---|---|---|---|
| 1-15 | 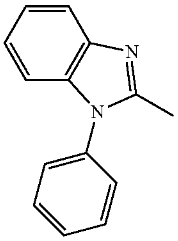 | 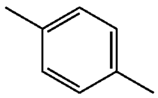 | 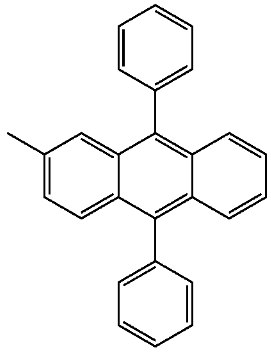 | — |
| 16 | 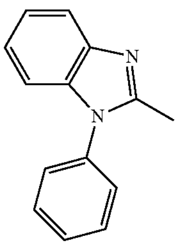 | 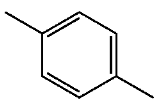 | 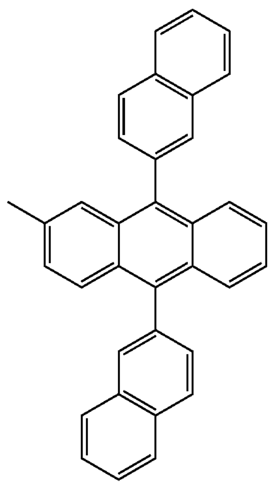 | — |
| 17 | 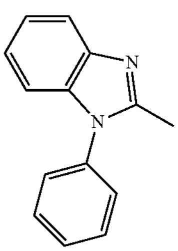 | 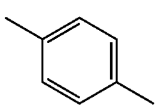 | 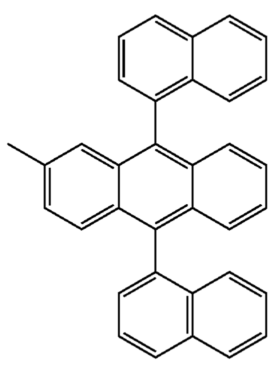 | — |

[Chemical Formula 64]
HAr—L—$Ar^1$—$Ar^2$
| | HAr | L | $Ar^1$ | $Ar^2$ |
|---|---|---|---|---|
| 2-1 | 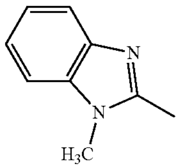 | 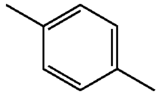 | 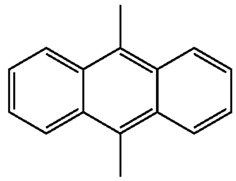 | 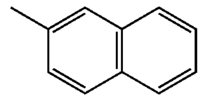 |
| 2 | 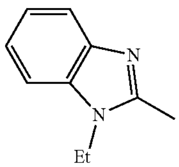 | 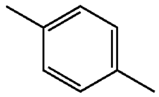 | 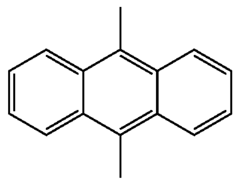 | 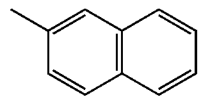 |
| 3 | 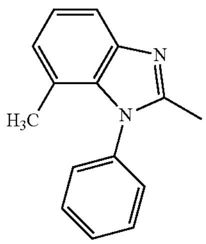 | 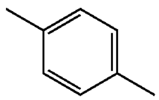 | 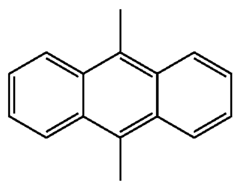 | 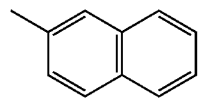 |
| 4 | 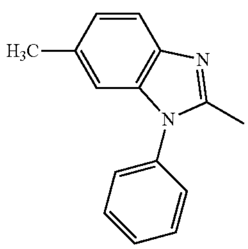 | 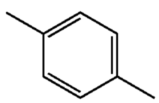 | 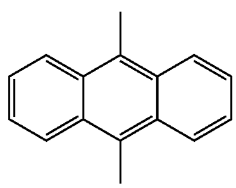 | 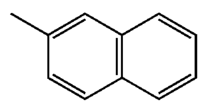 |
| 5 | 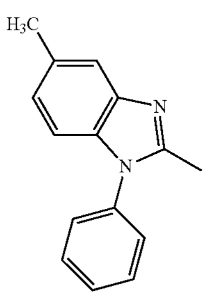 | 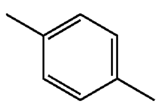 | 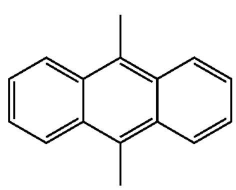 | 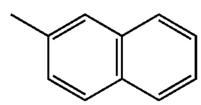 |
| 6 | 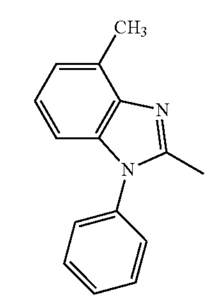 | 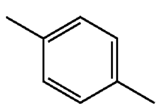 | 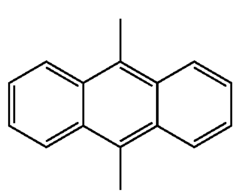 | 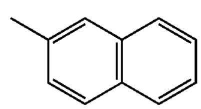 |

-continued
[Chemical Formula 64]
$HAr—L—Ar^1—Ar^2$
| | HAr | L | $Ar^1$ | $Ar^2$ |
|---|---|---|---|---|
| 7 | 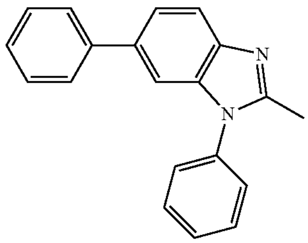 | 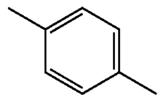 | 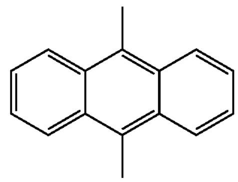 | 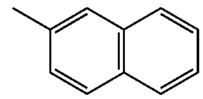 |
| 8 | 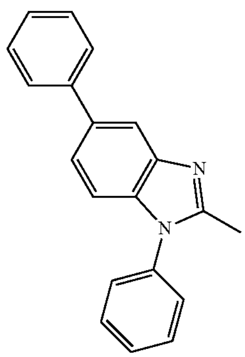 | 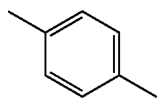 | 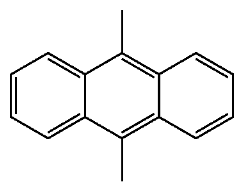 | 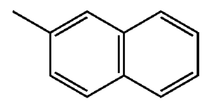 |
| 9 | 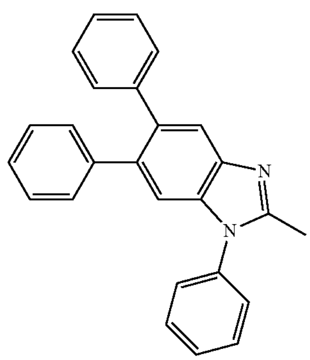 | 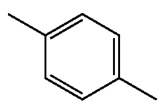 | 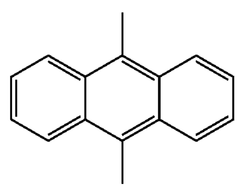 | 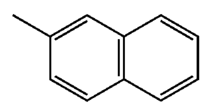 |
[Chemical Formula 65]
$HAr—L—Ar^1—Ar^2$
| | HAr | L | $Ar^1$ | $Ar^2$ |
|---|---|---|---|---|
| 3-1 | 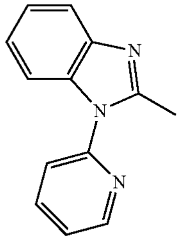 | 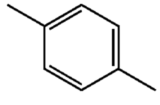 | 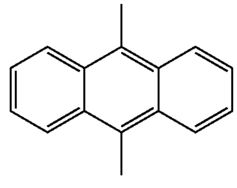 | 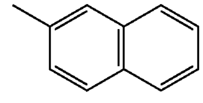 |

-continued
[Chemical Formula 65]
$HAr—L—Ar^1—Ar^2$
| | HAr | L | $Ar^1$ | $Ar^2$ |
|---|---|---|---|---|
| 2 | 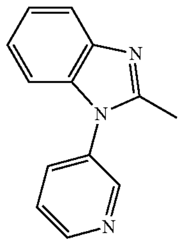 | 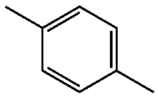 | 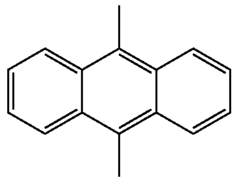 | 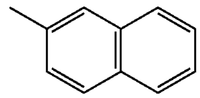 |
| 3 | 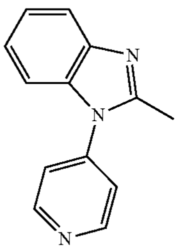 | 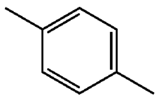 | 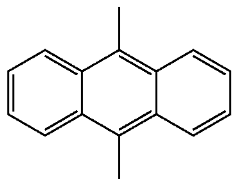 | 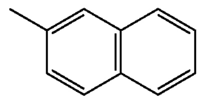 |
| 4 | 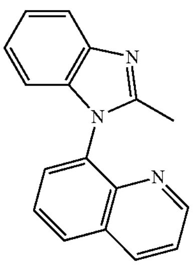 | 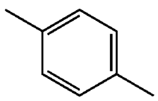 | 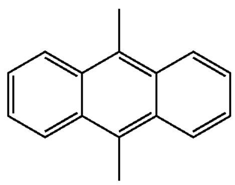 | 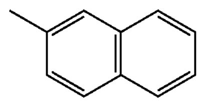 |
| 5 | 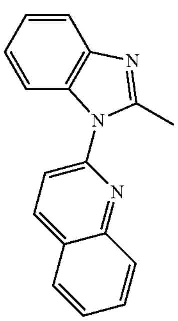 | 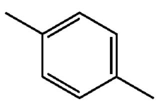 | 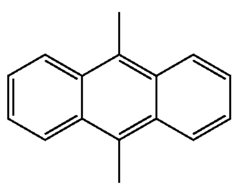 | 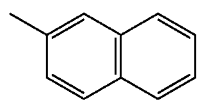 |
| 6 | 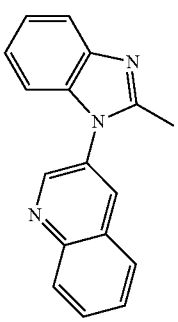 | 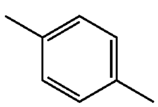 | 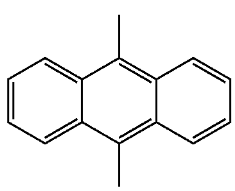 | 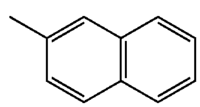 |

[Chemical Formula 66]
HAr—L—$Ar^1$—$Ar^2$
| | HAr | L | $Ar^1$ | $Ar^2$ |
|---|---|---|---|---|
| 4-1 | 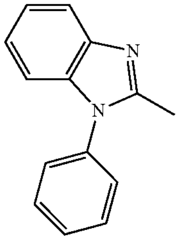 | 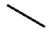 | 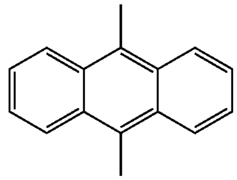 | 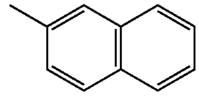 |
| 2 | 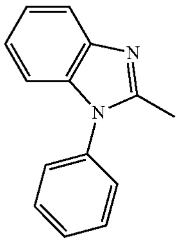 | 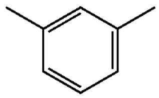 | 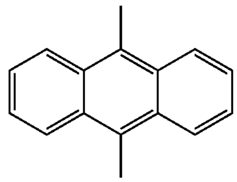 | 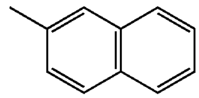 |
| 3 | 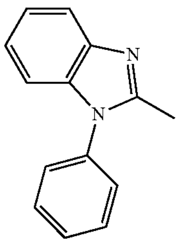 | 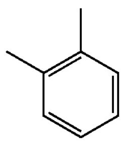 | 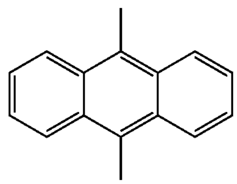 | 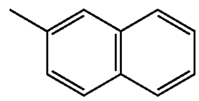 |
| 4 | 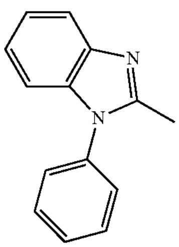 | 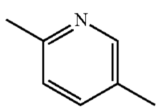 | 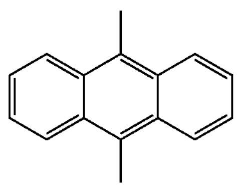 | 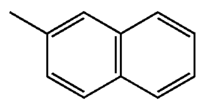 |
| 5 | 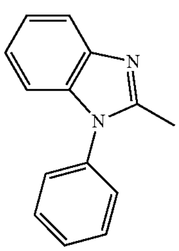 | 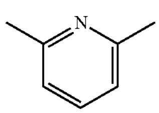 | 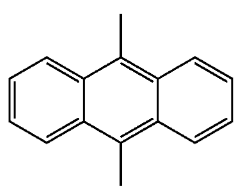 | 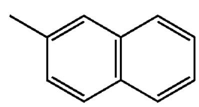 |
| 6 | 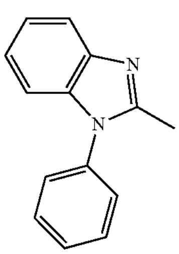 | 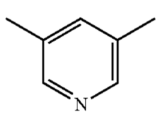 | 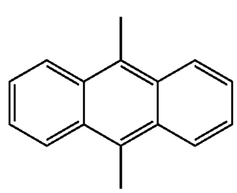 | 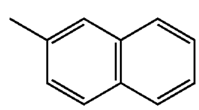 |

-continued
[Chemical Formula 66]
$HAr—L—Ar^1—Ar^2$
| | HAr | L | $Ar^1$ | $Ar^2$ |
|---|---|---|---|---|
| 7 | 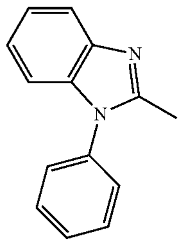 | 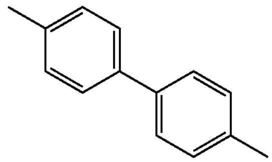 | 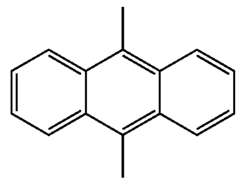 | 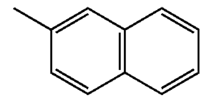 |
| 8 | 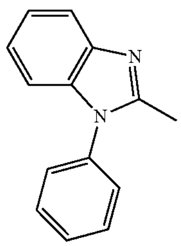 | 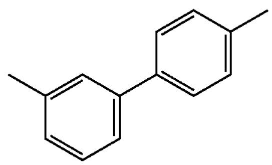 | 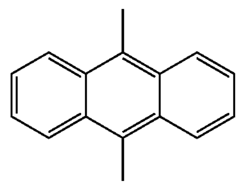 | 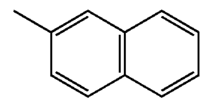 |
| 9 | 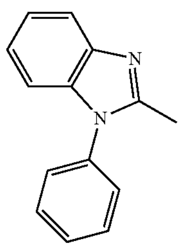 | 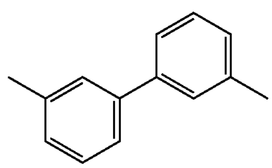 | 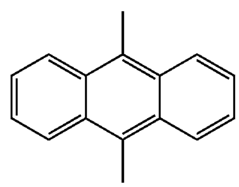 | 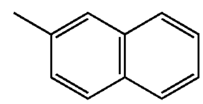 |
| 10 | 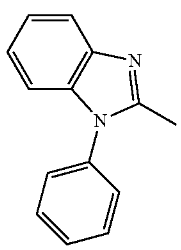 | 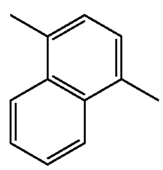 | 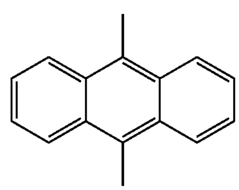 | 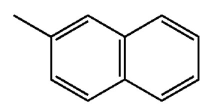 |
| 11 | 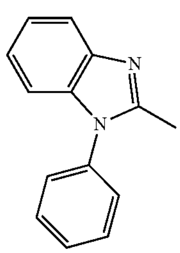 | 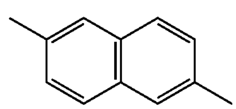 | 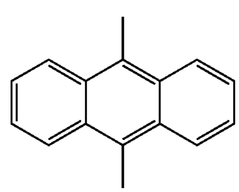 | 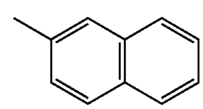 |
| 12 | 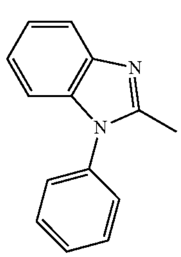 | 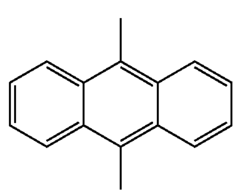 | 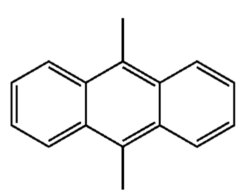 | 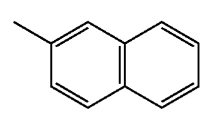 |

[Chemical Formula 67]
HAr—L—$Ar^1$—$Ar^2$
| | HAr | L | $Ar^1$ | $Ar^2$ |
|---|---|---|---|---|
| 5-1 | 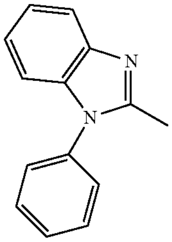 | 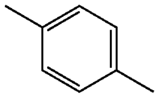 | 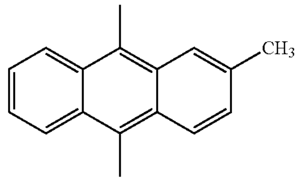 | 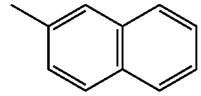 |
| 2 | 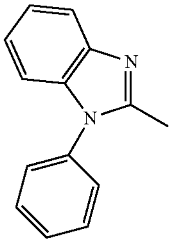 | 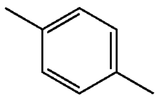 | 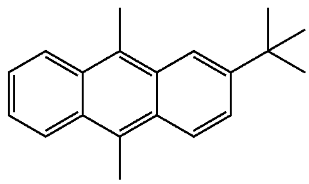 | 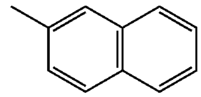 |
| 3 | 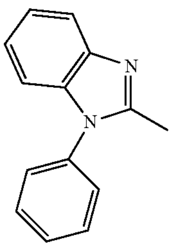 | 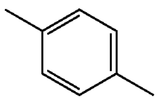 | 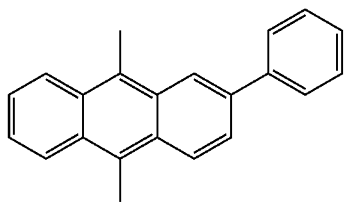 | 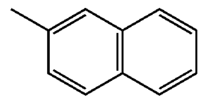 |
| 4 | 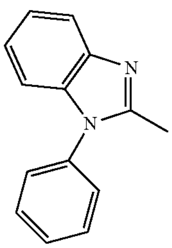 | 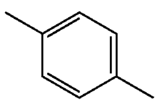 | 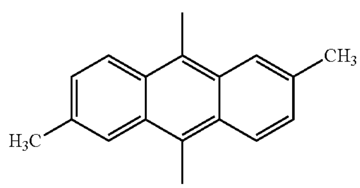 | 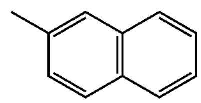 |
| 5 | 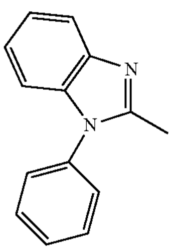 | 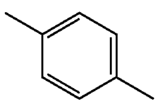 | 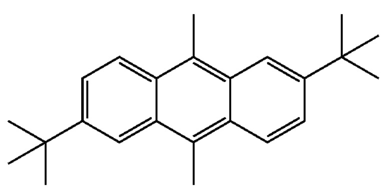 | 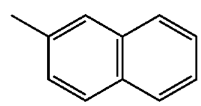 |
| 6 | 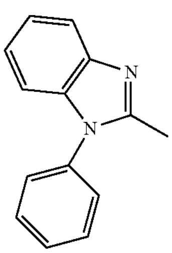 | 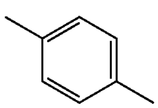 | 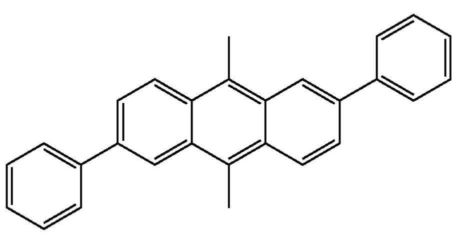 | 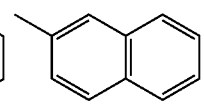 |

[Chemical Formula 68]
HAr—L—$Ar^1$—$Ar^2$
| | HAr | L | $Ar^1$ | $Ar^2$ |
|---|---|---|---|---|
| 6-1 | 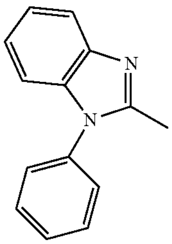 | 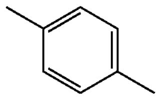 | 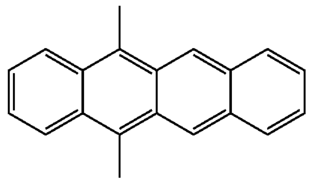 | 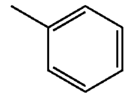 |
| 2 | 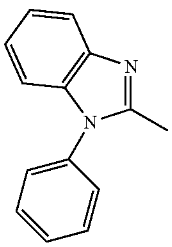 | 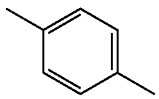 | 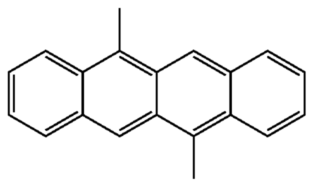 | 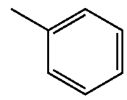 |
| 3 | 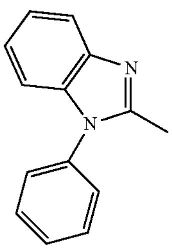 | 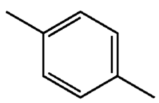 | 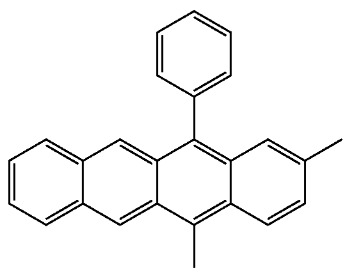 | 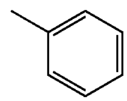 |
| 4 | 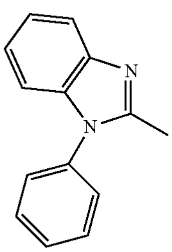 | 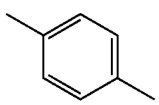 | 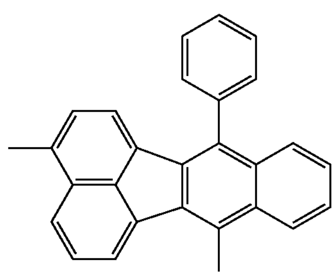 | 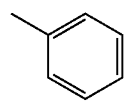 |
| 5 | 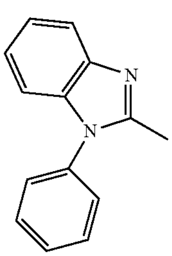 | 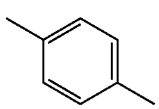 | 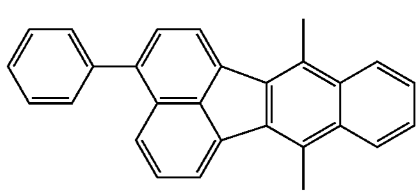 | 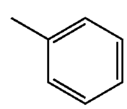 |

[Chemical Formula 69]
HAr—L—Ar[3](—Ar[3]═—Ar[1]—Ar[2])
| | HAr | L | $Ar^1$ | $Ar^2$ |
|---|---|---|---|---|
| 7-1 | 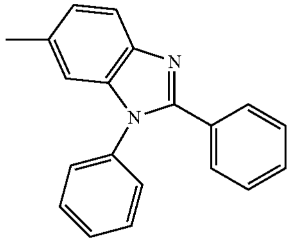 | 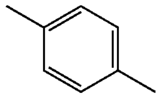 | 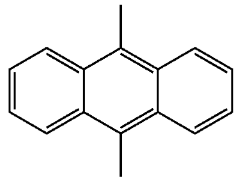 | 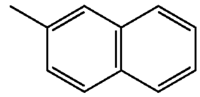 |
| 2 | 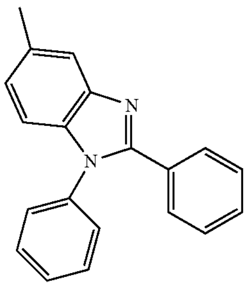 | 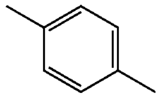 | 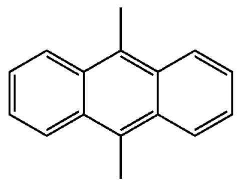 | 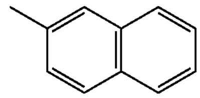 |
| 3 | 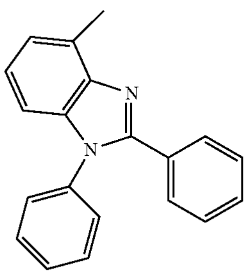 | 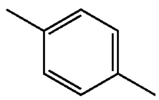 | 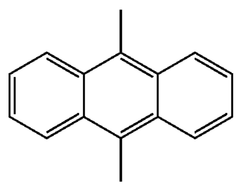 | 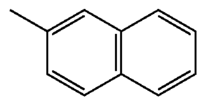 |
| 4 | 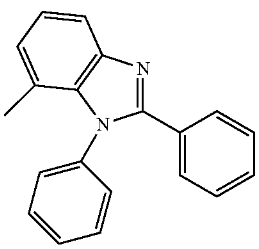 | 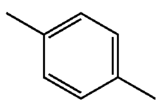 | 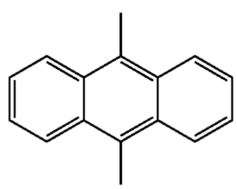 | 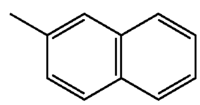 |
| 5 | 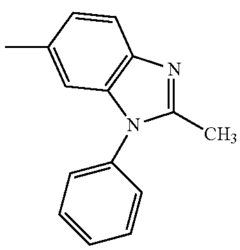 | 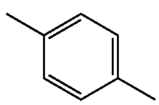 | 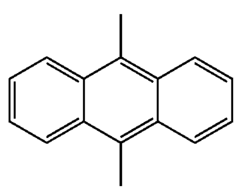 | 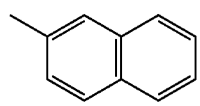 |
| 6 | 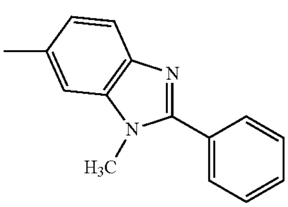 | 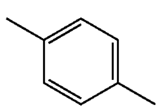 | 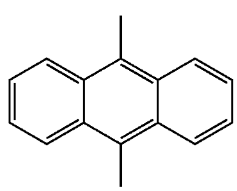 | 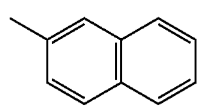 |

-continued
[Chemical Formula 69]
$HAr—L—Ar^3(—Ar^3=—Ar^1—Ar^2)$
| | HAr | L | $Ar^1$ | $Ar^2$ |
|---|---|---|---|---|
| 7 | 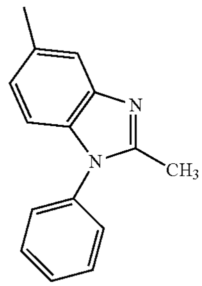 | 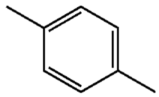 | 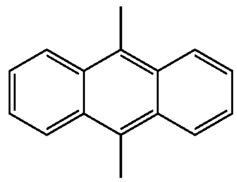 | 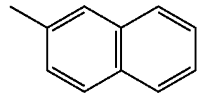 |
| 8 | 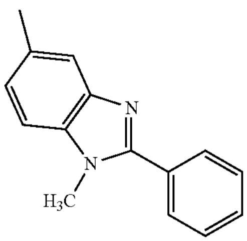 | 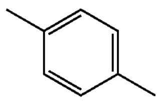 | 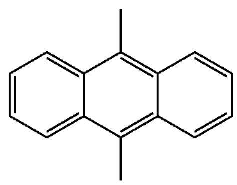 | 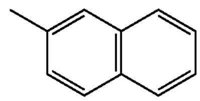 |
| 9 | 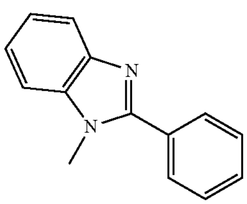 | 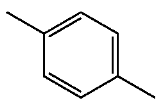 | 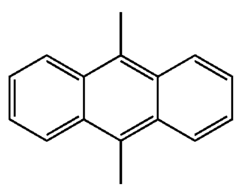 | 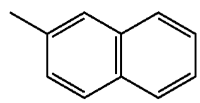 |
| 10 | 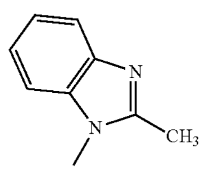 | 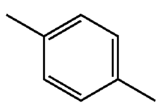 | 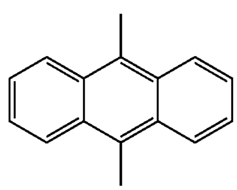 | 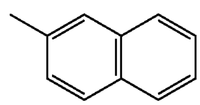 |
[Chemical Formula 70]
$HAr—L—Ar^1—Ar^2$
| | HAr | L | $Ar^1$ | $Ar^2$ |
|---|---|---|---|---|
| 8-1 | 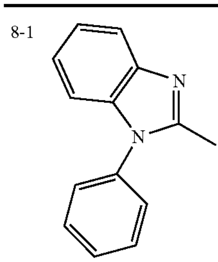 | 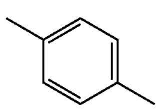 | 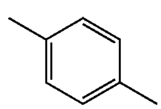 | 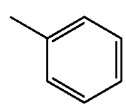 |

-continued
[Chemical Formula 70]
HAr—L—$Ar^1$—$Ar^2$
| | HAr | L | $Ar^1$ | $Ar^2$ |
|---|---|---|---|---|
| 2 | 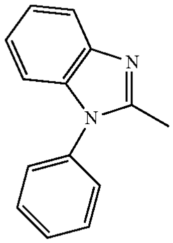 | 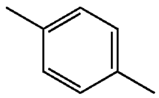 | 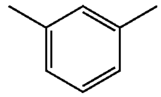 | 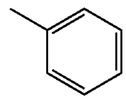 |
| 3 | 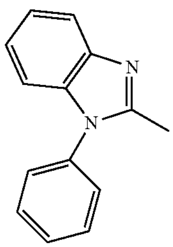 | 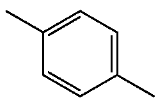 | 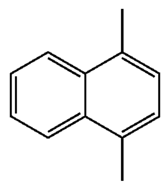 | 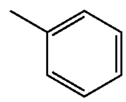 |
| 4 | 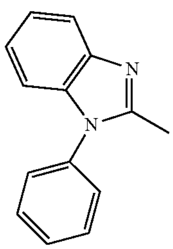 | 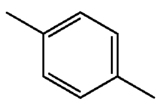 | 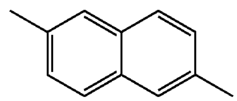 | 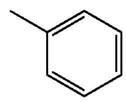 |
| 5 | 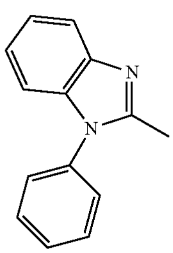 | 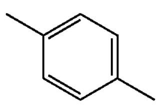 | 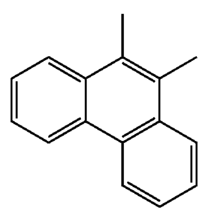 | 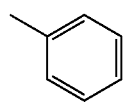 |
| 6 | 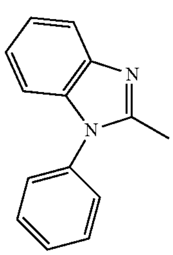 | 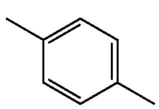 | 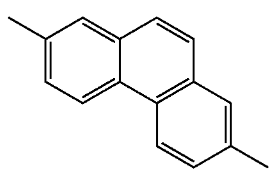 | 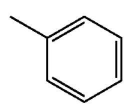 |
| 7 | 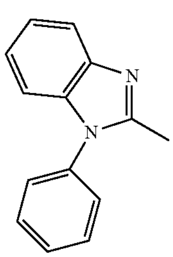 | 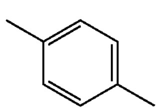 | 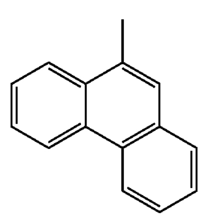 | —H |

-continued
[Chemical Formula 70]
HAr—L—$Ar^1$—$Ar^2$
| | HAr | L | $Ar^1$ | $Ar^2$ |
|---|---|---|---|---|
| 8 | 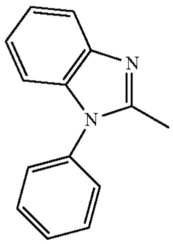 | 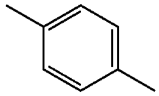 | 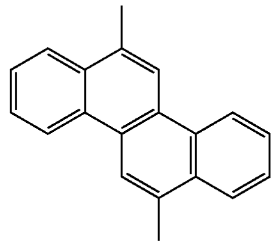 | 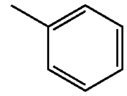 |
| 9 | 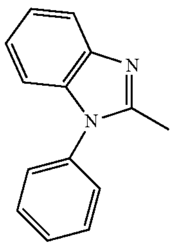 | 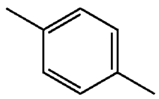 | 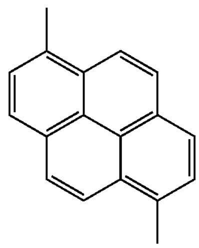 | 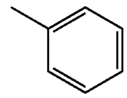 |
| 10 | 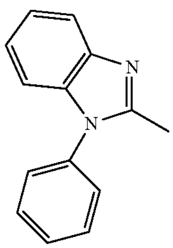 | 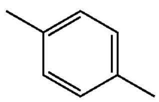 | 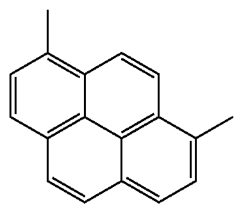 | 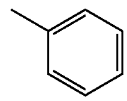 |
| 11 | 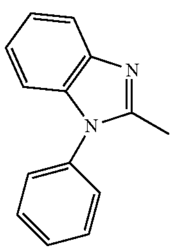 | 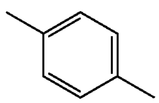 | 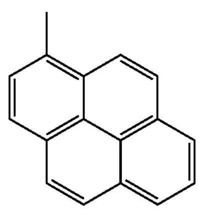 | H |
| 12 | 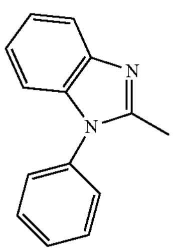 | 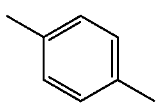 | 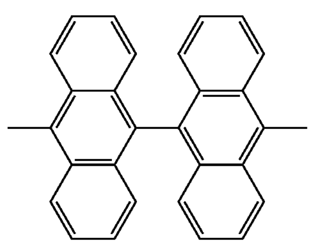 | 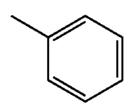 |
| 13 | 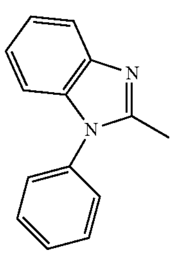 | 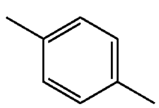 | 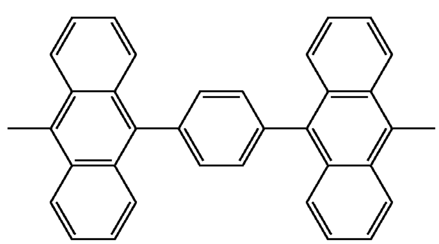 | 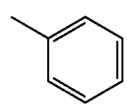 |

[Chemical Formula 71]
HAr—L—Ar$^3$(—Ar$^3$═—Ar$^1$—Ar$^2$)
| | HAr | L | $Ar^1$ | $Ar^2$ |
|---|---|---|---|---|
| 9-1 | 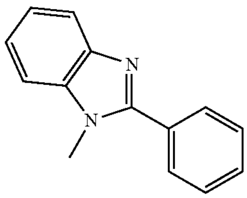 | 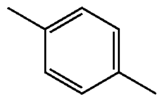 | 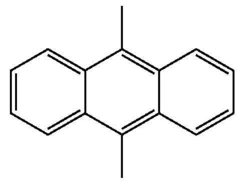 | 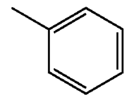 |
| 2 | 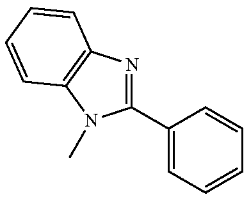 | 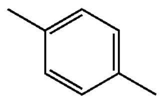 | 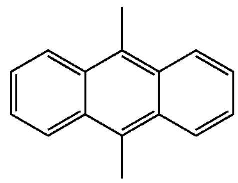 | 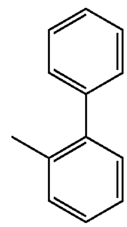 |
| 3 | 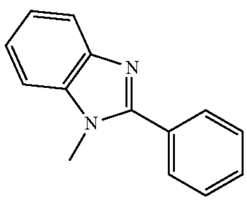 | 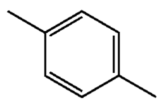 | 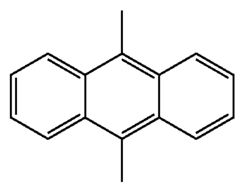 | 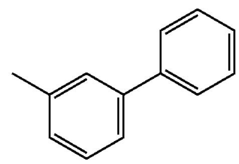 |
| 4 | 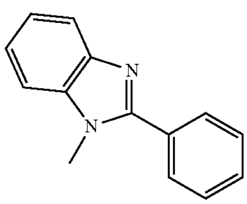 | 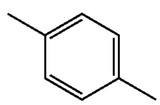 | 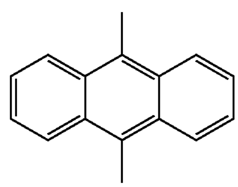 | 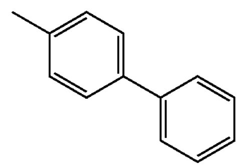 |
| 5 | 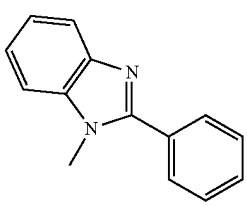 | 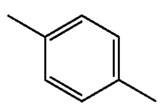 | 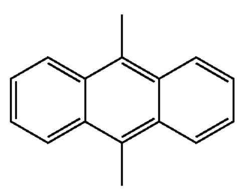 | 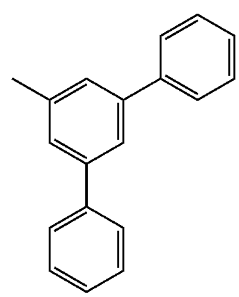 |
| 6 | 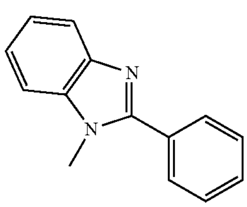 | 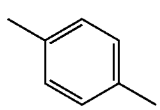 | 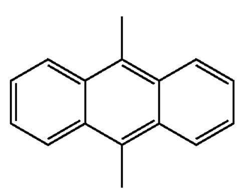 | 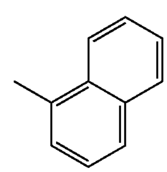 |
| 7 | 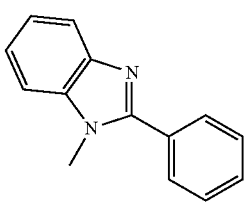 | 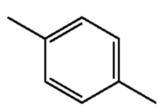 | 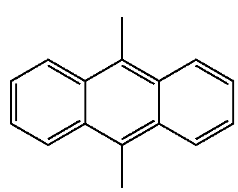 | 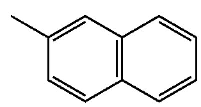 |

-continued
[Chemical Formula 71]
$HAr—L—Ar^3(—Ar^3=—Ar^1—Ar^2)$
| | HAr | L | $Ar^1$ | $Ar^2$ |
|---|---|---|---|---|
| 8 | 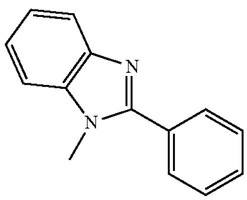 | 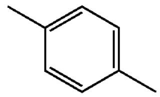 | 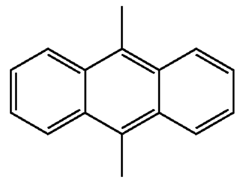 | 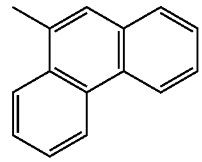 |
| 9 | 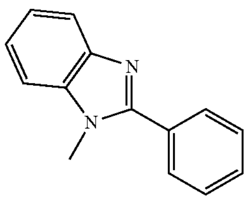 | 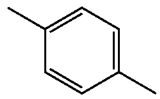 | 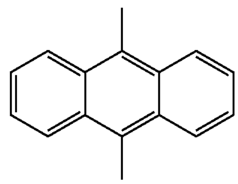 | 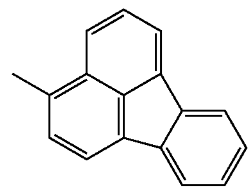 |
| 10 | 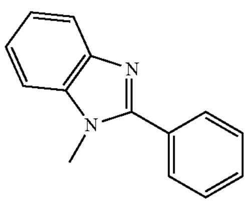 | 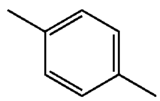 | 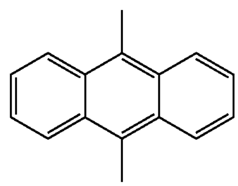 | 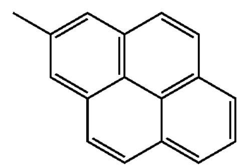 |
| 11 | 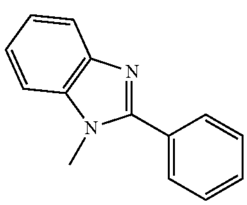 | 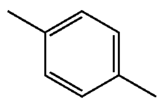 | 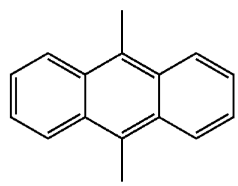 | 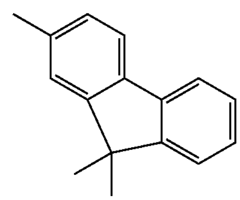 |
| 12 | 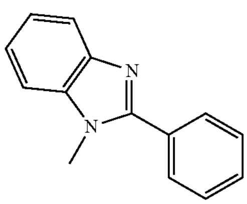 | 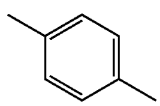 | 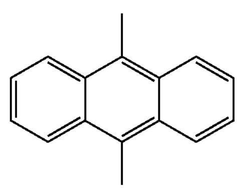 | 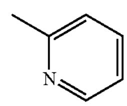 |
| 13 | 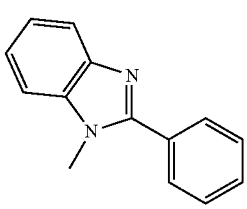 | 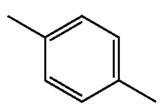 | 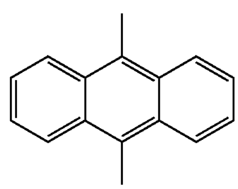 | 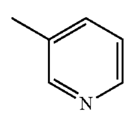 |
| 14 | 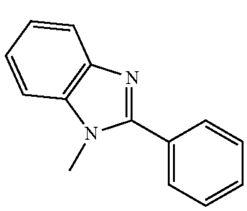 | 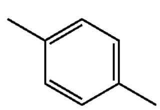 | 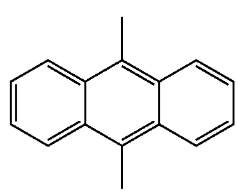 | 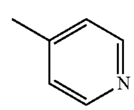 |

| [Chemical Formula 72] HAr—L—Ar$^3$(—Ar$^3$═—Ar$^1$—Ar$^2$) | | | | |
|---|---|---|---|---|
| | HAr | L | Ar$^1$ | Ar$^2$ |
| 9-15 | 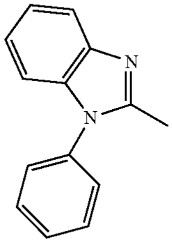 | 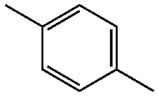 | 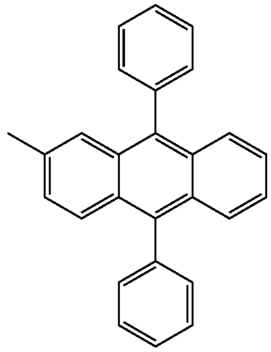 | — |
| 16 | 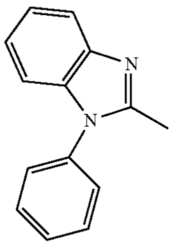 | 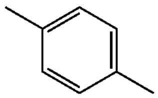 | 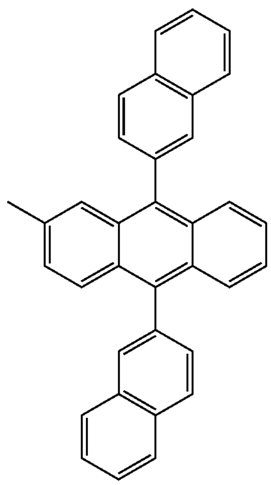 | — |
| 17 | 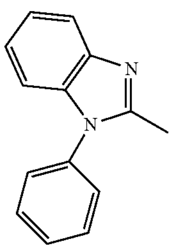 | 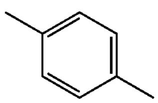 | 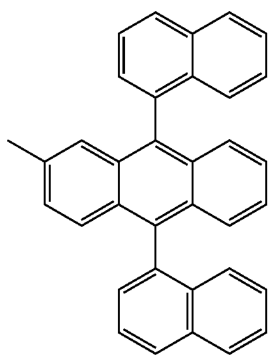 | — |
| [Chemical Formula 73] HAr—L—Ar$^3$(—Ar$^3$═—Ar$^1$—Ar$^2$) | | | | |
|---|---|---|---|---|
| | HAr | L | Ar$^1$ | Ar$^2$ |
| 10-1 | 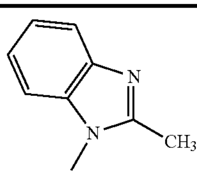 | 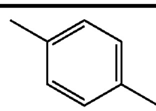 | 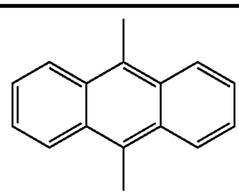 | 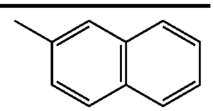 |

-continued
[Chemical Formula 73]
$HAr—L—Ar^3(—Ar^3=—Ar^1—Ar^2)$
| | HAr | L | $Ar^1$ | $Ar^2$ |
|---|---|---|---|---|
| 2 | 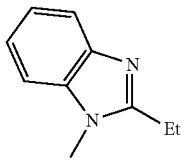 | 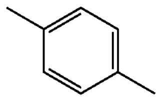 | 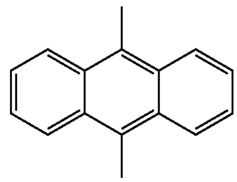 | 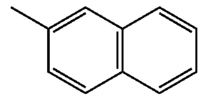 |
| 3 | 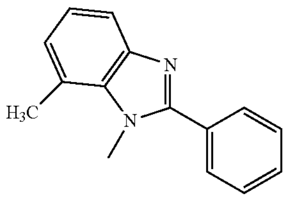 | 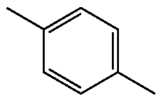 | 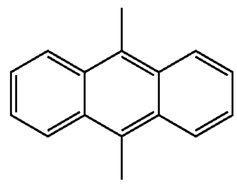 | 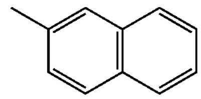 |
| 4 | 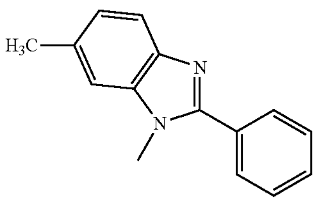 | 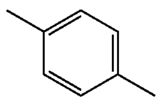 | 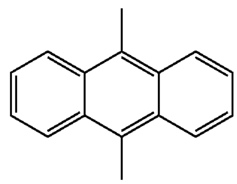 | 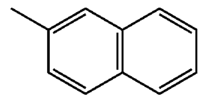 |
| 5 | 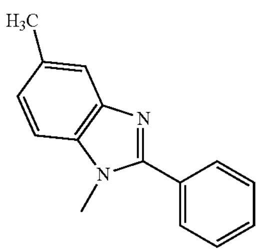 | 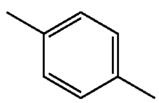 | 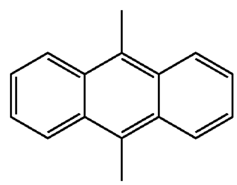 | 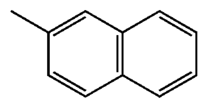 |
| 6 | 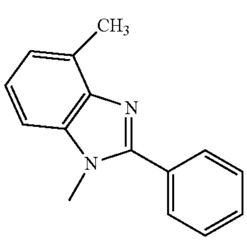 | 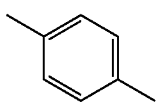 | 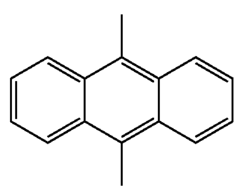 | 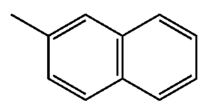 |
| 7 | 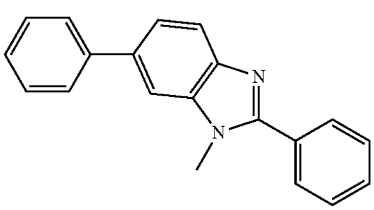 | 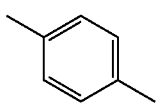 | 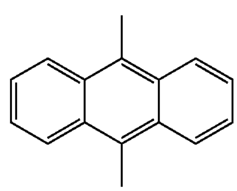 | 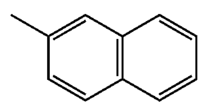 |

-continued
[Chemical Formula 73]
HAr—L—Ar$^3$(—Ar$^3$═—Ar$^1$—Ar$^2$)
| | HAr | L | Ar$^1$ | Ar$^2$ |
|---|---|---|---|---|
| 8 | 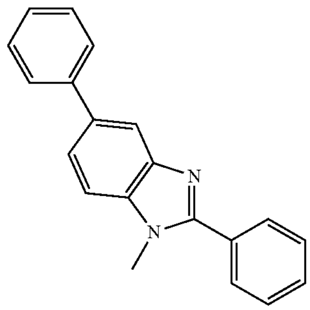 | 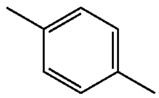 | 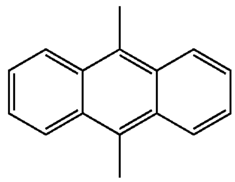 | 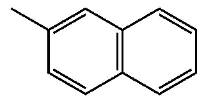 |
| 9 | 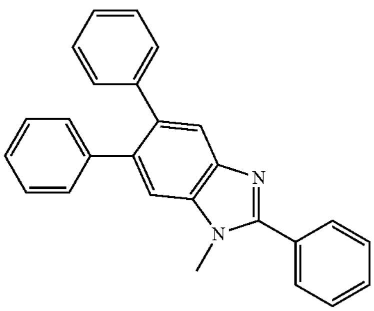 | 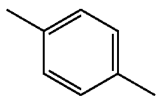 | 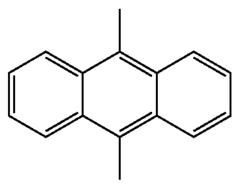 | 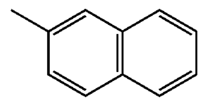 |
[Chemical Formula 74]
HAr—L—Ar$^3$(—Ar$^3$═—Ar$^1$—Ar$^2$)
| | HAr | L | Ar$^1$ | Ar$^2$ |
|---|---|---|---|---|
| 11-1 | 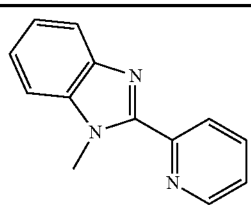 | 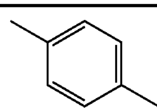 | 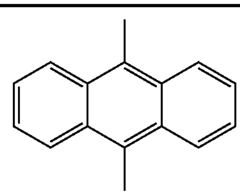 | 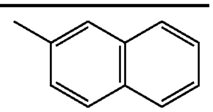 |
| 2 | 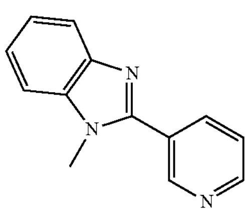 | 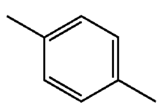 | 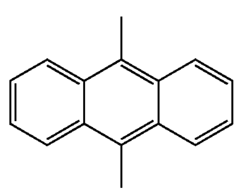 | 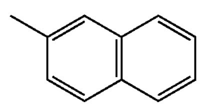 |
| 3 | 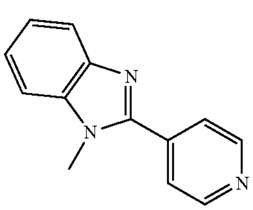 | 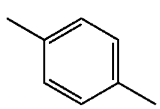 | 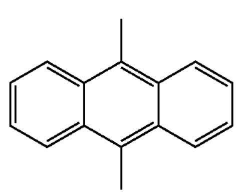 | 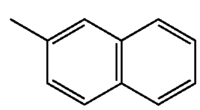 |

-continued
[Chemical Formula 74]
HAr—L—$Ar^3$(—$Ar^3$═—$Ar^1$—$Ar^2$)
| | HAr | L | $Ar^1$ | $Ar^2$ |
|---|---|---|---|---|
| 4 | 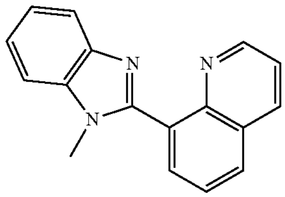 | 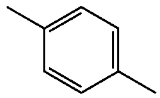 | 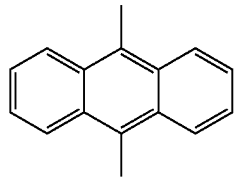 | 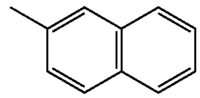 |
| 5 | 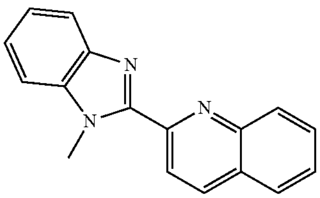 | 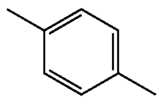 | 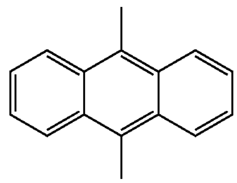 | 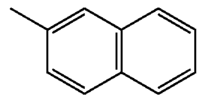 |
| 6 | 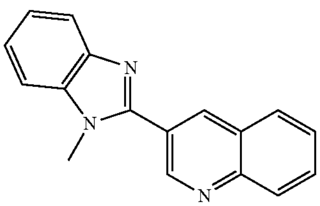 | 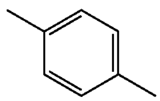 | 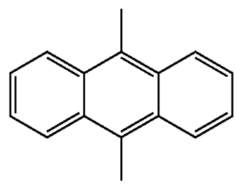 | 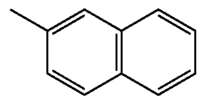 |
[Chemical Formula 75]
HAr—L—$Ar^3$(—$Ar^3$═—$Ar^1$—$Ar^2$)
| | HAr | L | $Ar^1$ | $Ar^2$ |
|---|---|---|---|---|
| 12-1 | 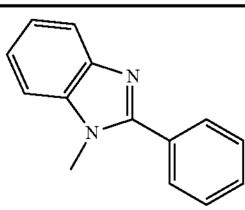 |  | 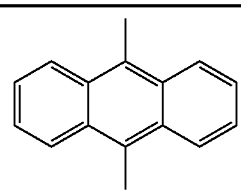 | 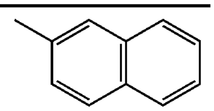 |
| 2 | 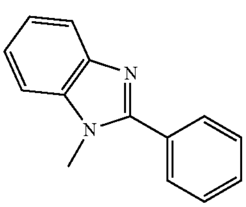 | 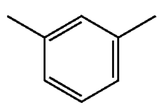 | 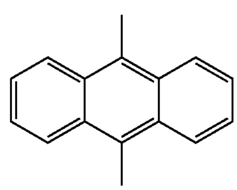 | 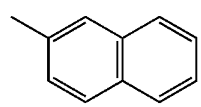 |
| 3 | 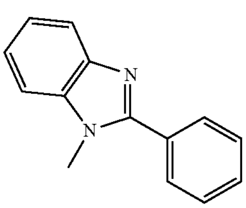 | 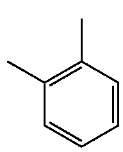 | 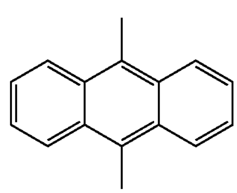 | 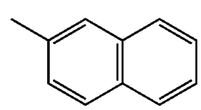 |

-continued
[Chemical Formula 75]
HAr—L—Ar³(—Ar³==—Ar¹—Ar²)
| | HAr | L | Ar¹ | Ar² |
|---|---|---|---|---|
| 4 | 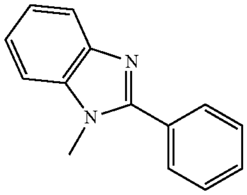 | 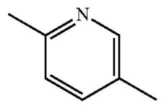 | 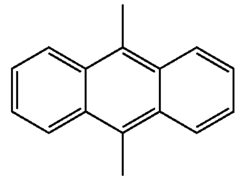 | 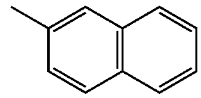 |
| 5 | 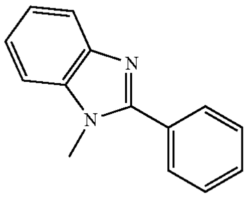 | 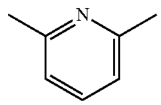 | 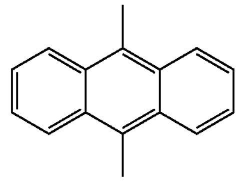 | 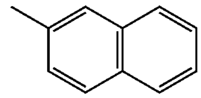 |
| 6 | 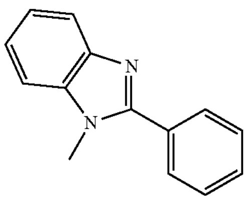 | 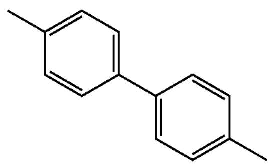 | 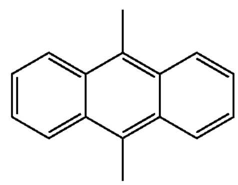 | 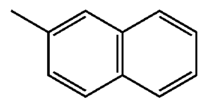 |
| 7 | 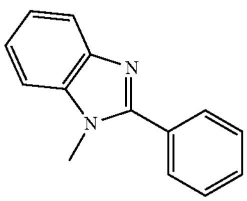 | 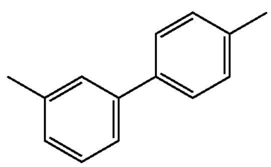 | 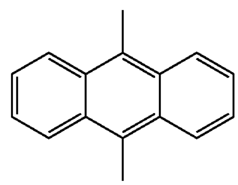 | 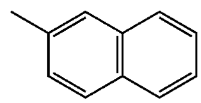 |
| 8 | 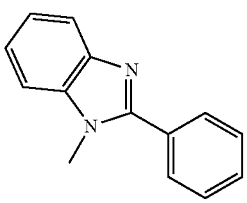 | 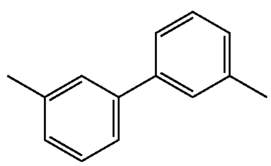 | 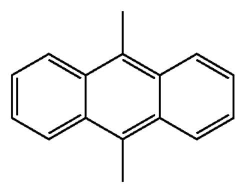 | 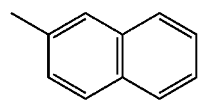 |
| 9 | 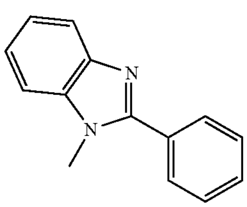 | 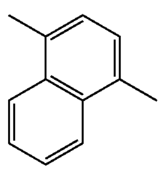 | 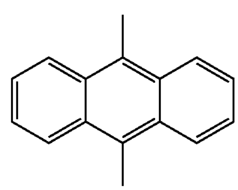 | 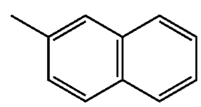 |
| 10 | 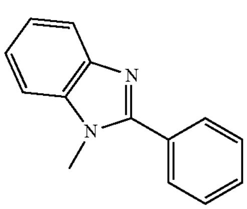 | 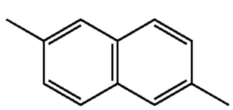 | 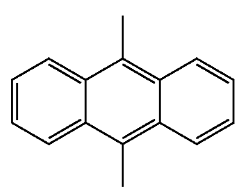 | 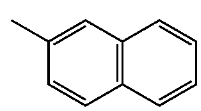 |

-continued
[Chemical Formula 75]
$HAr—L—Ar^3(—Ar^3{=}—Ar^1—Ar^2)$
| | HAr | L | $Ar^1$ | $Ar^2$ |
|---|---|---|---|---|
| 11 | 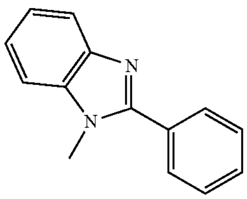 | 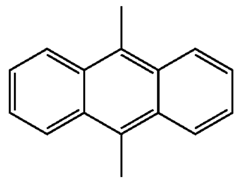 | 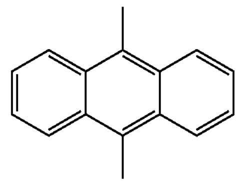 | 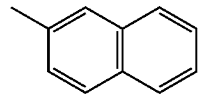 |
[Chemical Formula 76]
$HAr—L—Ar^3(—Ar^3{=}—Ar^1—Ar^2)$
| | HAr | L | $Ar^1$ | $Ar^2$ |
|---|---|---|---|---|
| 13-1 | 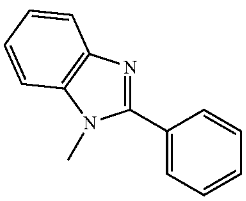 | 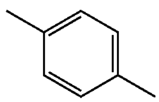 | 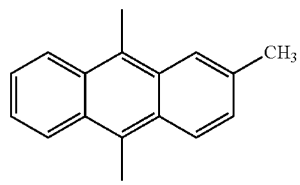  | 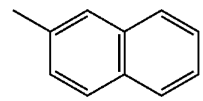 |
| 2 | 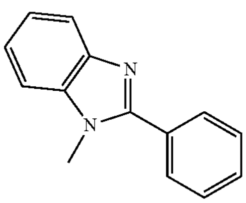 | 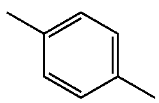 | 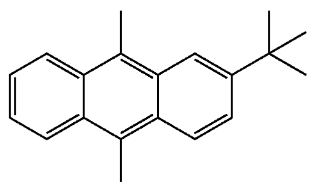 | 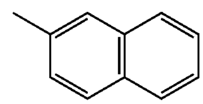 |
| 3 | 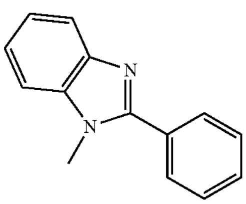 | 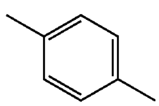 | 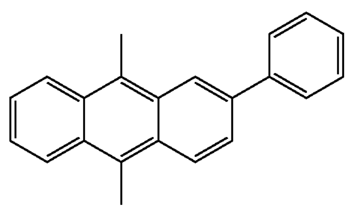 | 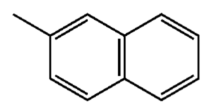 |
| 4 | 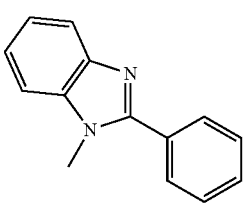 | 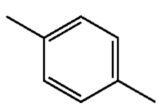 | 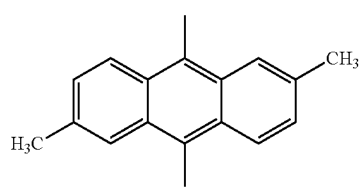  | 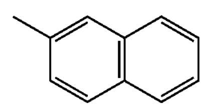 |
| 5 | 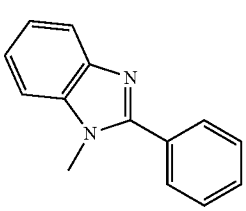 | 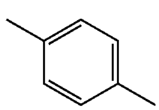 | 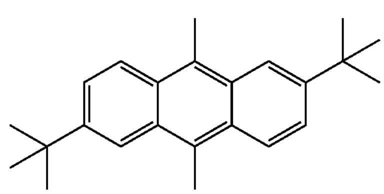 | 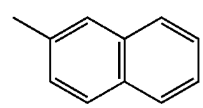 |

-continued
[Chemical Formula 76]
$HAr—L—Ar^3(—Ar^3═—Ar^1—Ar^2)$
| | HAr | L | $Ar^1$ | $Ar^2$ |
|---|---|---|---|---|
| 6 | 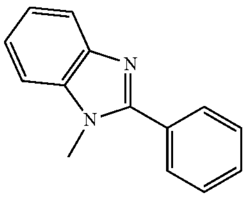 | 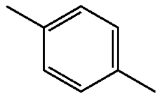 | 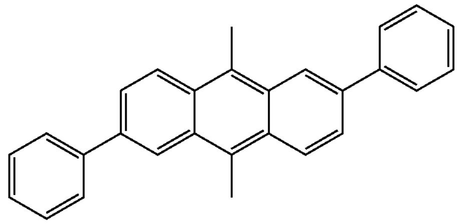 | 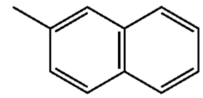 |
[Chemical Formula 77]
$HAr—L—Ar^3(—Ar^3═—Ar^1—Ar^2)$
| | HAr | L | $Ar^1$ | $Ar^2$ |
|---|---|---|---|---|
| 14-1 | 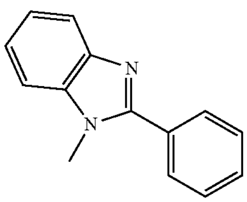 | 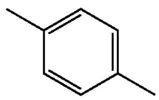 | 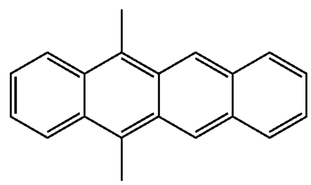 | 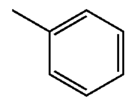 |
| 2 | 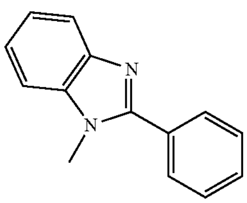 | 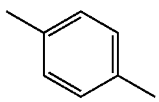 | 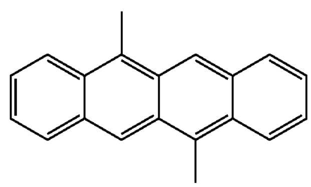 | 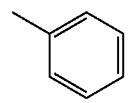 |
| 3 | 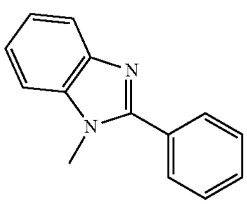 | 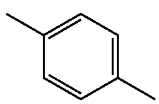 | 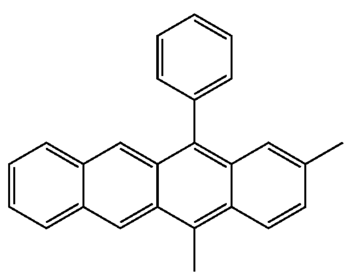 | 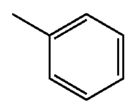 |
| 4 | 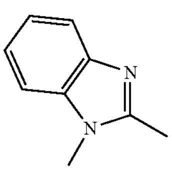 | 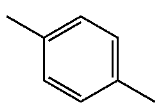 | 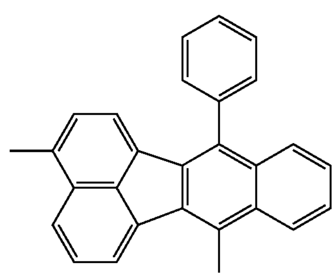 | 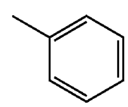 |

-continued
| [Chemical Formula 77] HAr—L—Ar$^3$(—Ar$^3$═—Ar$^1$—Ar$^2$) | | | | |
|---|---|---|---|---|
| | HAr | L | Ar$^1$ | Ar$^2$ |
| 5 | 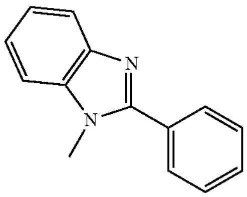 | 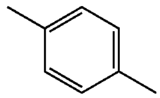 | 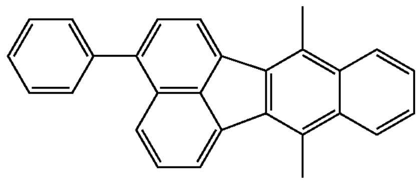 | 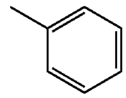 |
| [Chemical Formula 78] HAr—L—Ar$^3$(—Ar$^3$═—Ar$^1$—Ar$^2$) | | | | |
|---|---|---|---|---|
| | HAr | L | Ar$^1$ | Ar$^2$ |
| 15-1 | 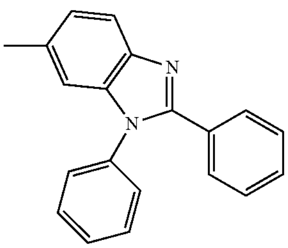 |  | 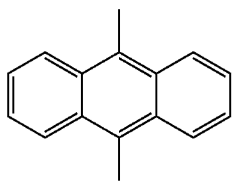 | 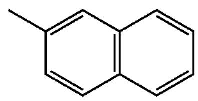 |
| 2 | 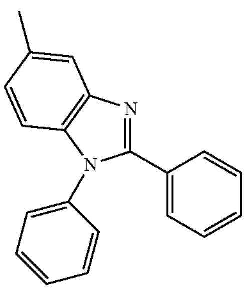 | 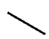 | 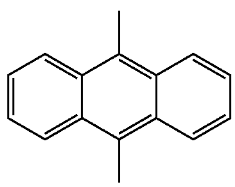 | 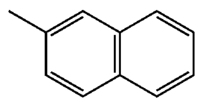 |
| 3 | 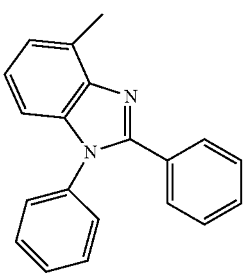 |  | 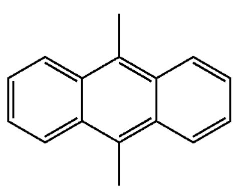 | 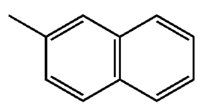 |
| 4 | 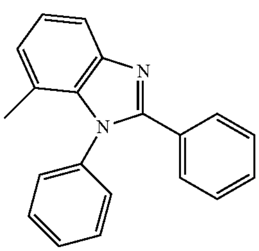 |  | 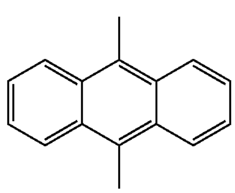 | 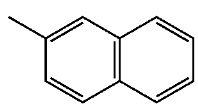 |

-continued
[Chemical Formula 78]
$HAr—L—Ar^3(—Ar^3═—Ar^1—Ar^2)$
| | HAr | L | $Ar^1$ | $Ar^2$ |
|---|---|---|---|---|
| 5 | 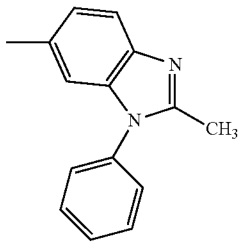 |  | 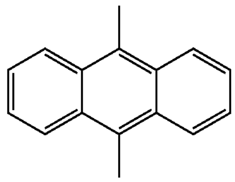 | 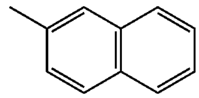 |
| 6 | 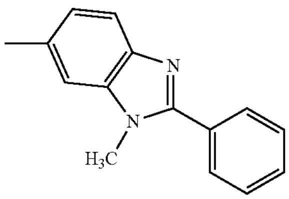 |  | 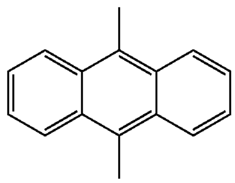 | 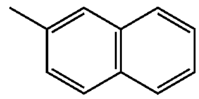 |
| 7 | 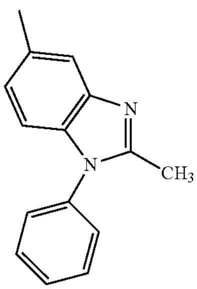 | 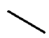 | 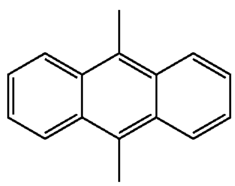 | 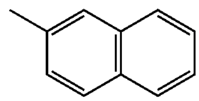 |
| 8 | 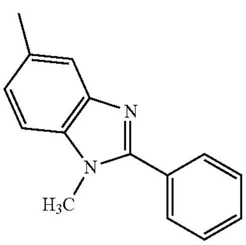 | 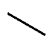 | 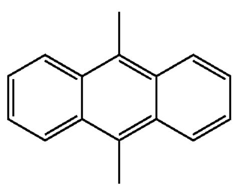 | 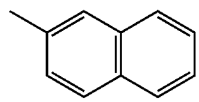 |
| 9 | 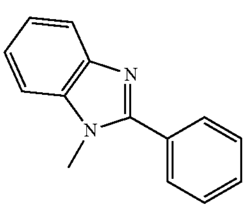 | 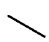 | 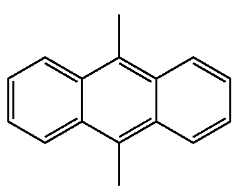 | 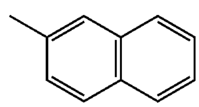 |
| 10 | 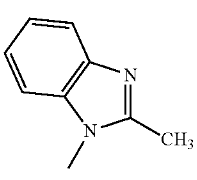 |  | 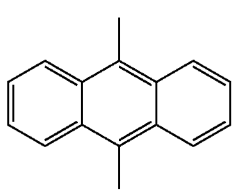 | 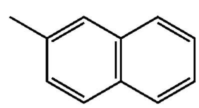 |

[Chemical Formula 79]
HAr—L—$Ar^3$(—$Ar^3$═—$Ar^1$—$Ar^2$)
| | HAr | L | $Ar^1$ | $Ar^2$ |
|---|---|---|---|---|
| 15-11 | 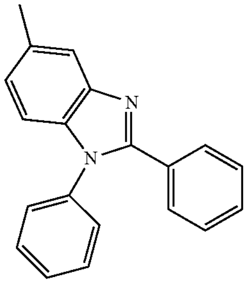 | 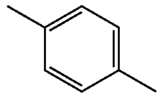 | 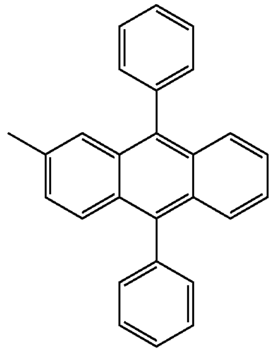 | — |
| 12 | 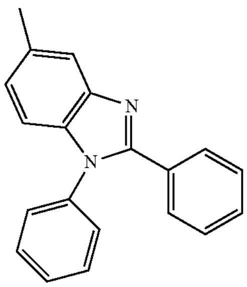 | 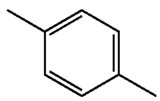 | 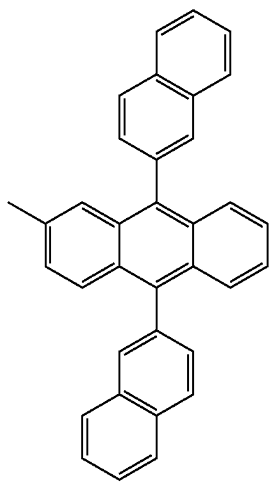 | — |
| 13 | 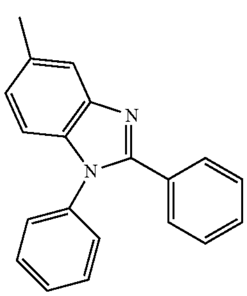 | 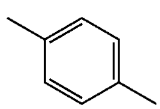 | 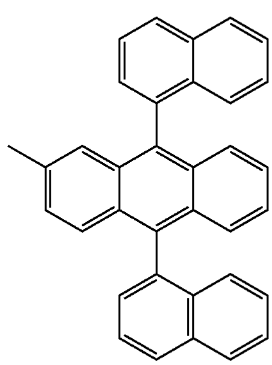 | — |

[Chemical Formula 80]
HAr—L—$Ar^3$(—$Ar^3$=—$Ar^1$—$Ar^2$)
| | HAr | L | $Ar^1$ | $Ar^2$ |
|---|---|---|---|---|
| 16-1 | 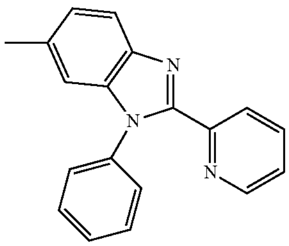 |  | 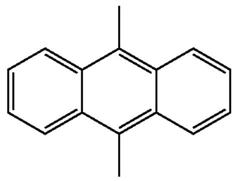 | 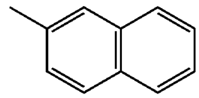 |
| 2 | 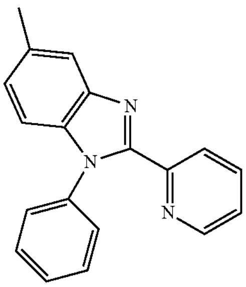 |  | 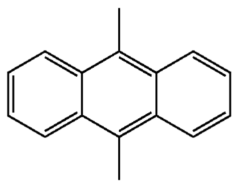 | 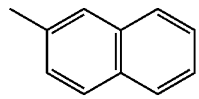 |
| 3 | 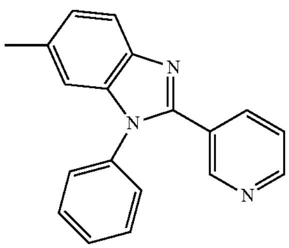 |  | 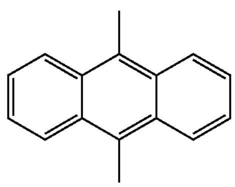 | 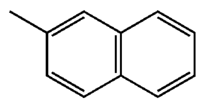 |
| 4 | 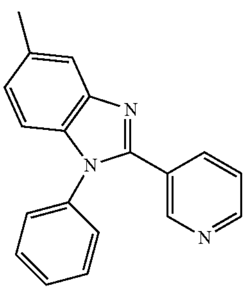 | 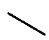 | 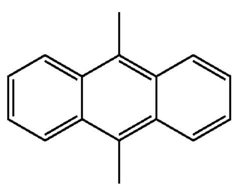 | 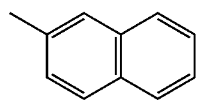 |
| 5 | 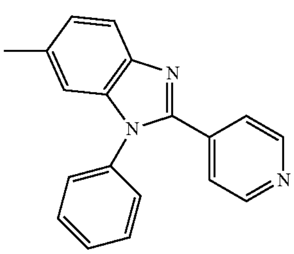 |  | 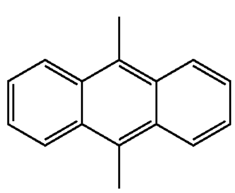 | 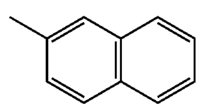 |

-continued
[Chemical Formula 80]
$HAr—L—Ar^3(—Ar^3=—Ar^1—Ar^2)$
| | HAr | L | Ar¹ | Ar² |
|---|---|---|---|---|
| 6 | 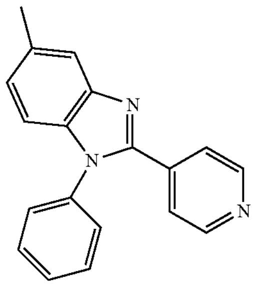 |  | 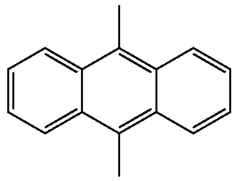 | 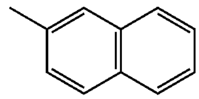 |
| 7 | 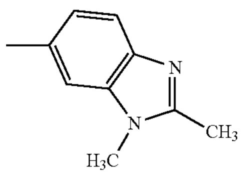 |  | 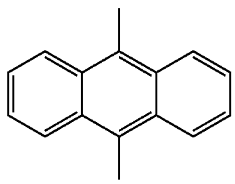 | 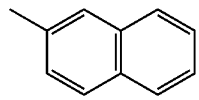 |
| 8 | 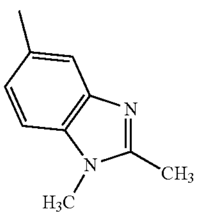 |  | 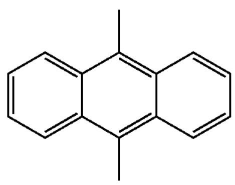 | 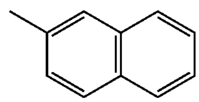 |
[Chemical Formula 81]
$HAr—L—Ar^3(—Ar^3=—Ar^1—Ar^2)$
| | HAr | L | Ar¹ | Ar² |
|---|---|---|---|---|
| 17-1 | 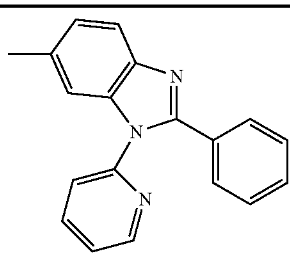 |  | 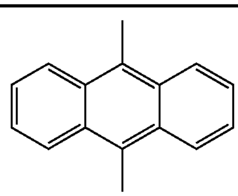 | 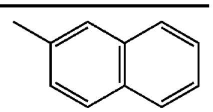 |
| 2 | 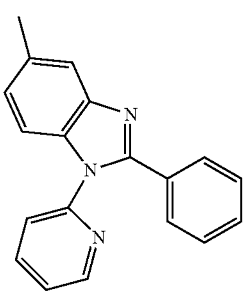 |  | 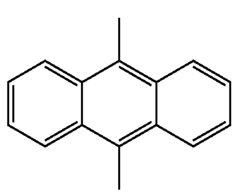 | 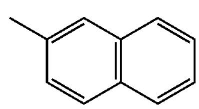 |

-continued
[Chemical Formula 81]
HAr—L—$Ar^3$(—$Ar^3$==—$Ar^1$—$Ar^2$)
| | HAr | L | $Ar^1$ | $Ar^2$ |
|---|---|---|---|---|
| 3 | 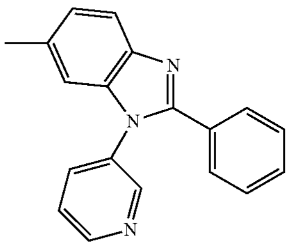 | 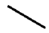 | 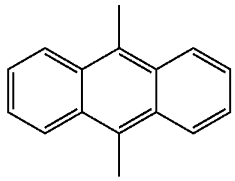 | 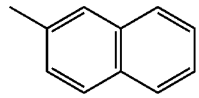 |
| 4 | 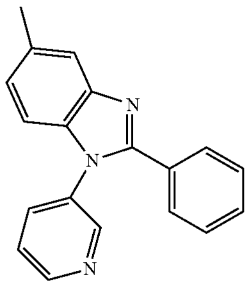 |  | 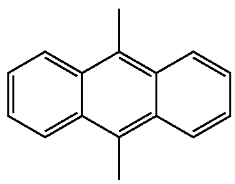 | 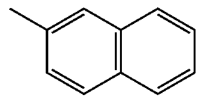 |
| 5 | 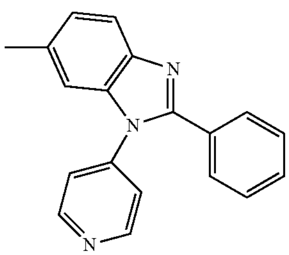 | 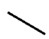 | 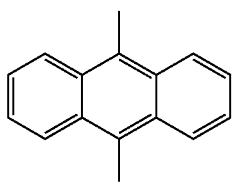 | 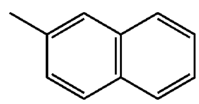 |
| 6 | 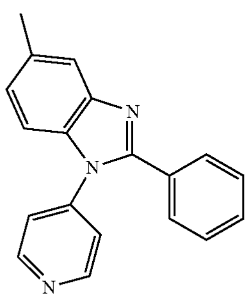 |  | 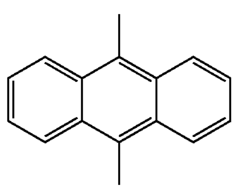 | 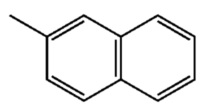 |
| 7 | 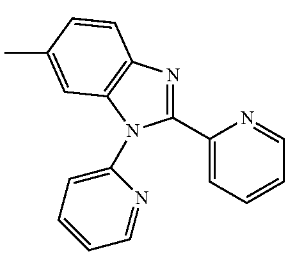 |  | 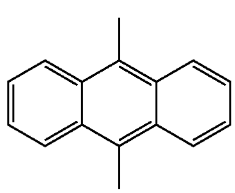 | 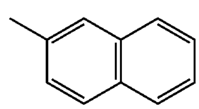 |

-continued

[Chemical Formula 81]

$HAr—L—Ar^3(—Ar^3=—Ar^1—Ar^2)$

| | HAr | L | $Ar^1$ | $Ar^2$ |
|---|---|---|---|---|
| 8 | 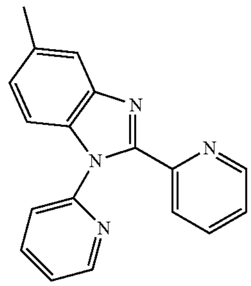 |  | 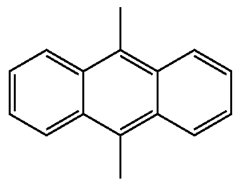 | 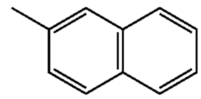 |

Among the above examples, examples (1-1), (1-5), (1-7), (2-1), (3-1), (4-2), (4-6), (7-2), (7-7), (7-8), (7-9), (9-7) and (9-7) are particularly preferred.

It should be noted that a "fluorescent host" and a "phosphorescent host" herein respectively mean a host combined with a fluorescent dopant and a host combined with a phosphorescent dopant, and that a distinction between the fluorescent host and phosphorescent host is not unambiguously derived only from a molecular structure of the host in a limited manner.

In other words, the fluorescent host herein means a material for forming a fluorescent-emitting layer containing a fluorescent dopant, and does not mean a host that is only usable as a host of a fluorescent material. Likewise, the phosphorescent host herein means a material for forming a phosphorescent-emitting layer containing a phosphorescent dopant, and does not mean a host that is only usable as a host of a phosphorescent material.

An organic electroluminescence device according to another aspect of the invention includes an anode, a cathode, and an organic thin-film layer interposed between the anode and the cathode, in which the organic thin-film layer includes a phosphorescent-emitting layer containing a host and a phosphorescent dopant, and an electron transporting layer that is provided closer to the cathode than the phosphorescent-emitting layer, and the host contains a host compound having a substituted or unsubstituted polycyclic fused aromatic skeleton, in which the electron transporting layer contains at least one of compounds represented by formulae (4) and (5) below.

[Chemical Formula 82]

$$[X]_q—Y \quad (4)$$

In the formula (4), X is a fused ring containing a nitrogen atom or sulfur atom; Y is selected from one of or a combination of a single bond, alkyl chain, alkylene chain, cycloalkyl chain, aryl chain, heterocyclic chain, silyl chain, ether chain or thioether chain; and q is an integer of 2 or more.

A molecular weight of the compound represented by the formula (4) is 480 or more.

X, which is an electron transporting unit, preferably has a lone pair. X also preferably contains a nitrogen atom and a sulfur atom. Moreover, it is preferable to bond a plurality of the electron transporting units for increasing the molecular weight. In order to bond the electron transporting units, it is preferable to use covalent bond in term of stability of molecules although a method of forming a complex with coordinate bond is known. Y is a bonding chain for bonding, which is a single bond, alkyl chain, alkylene chain, cycloalkyl chain, aryl chain, heterocyclic chain, silyl chain, ether chain or thioether chain. The electron transporting units are preferably coupled for enhancing electron transporting capability. Y is preferably a single bond, alkylene chain, aryl chain such as phenylene chain and biphenylene chain, heterocyclic ring such as pyridine ring, thiophene ring, silole ring or silyl chain, but not limited thereto.

The electron transporting unit X is not particularly limited to the following, but preferably a pyridine ring, quinoxaline ring, triazole ring, triazine ring, oxadiazole ring, thiophene ring or diphenyl boron, which may be substituted or unsubstituted. Examples of the substituent are preferably an alkyl group and aryl group, but the substituent is not limited thereto. Further, an aromatic ring may be fused to the electron transporting unit X. For instance, to a pyridine derivative, benzene may be fused to form a quinoline derivative, naphthalene may be fused to form a benzoquinoline ring, and quinoline may be fused to form a phenanthroline ring.

Since the phosphorescent material emits light by a mechanism different from that of the fluorescent material, more preferable example to be combined with the phosphorescent material is substituted or unsubstituted quinoline. Among the substituted or unsubstituted quinoline, substituted or unsubstituted benzoquinoline ring or phenanthroline ring is more preferable in terms of enhanced heat resistance. The substituent is the same as described above.

Examples of the electron transporting material represented by the formula (4) are shown below, but the electron transporting material is not limited to the following.

[Chemical Formula 83]
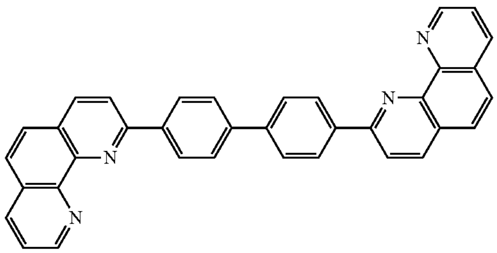
Mol. Wt.: 510.59
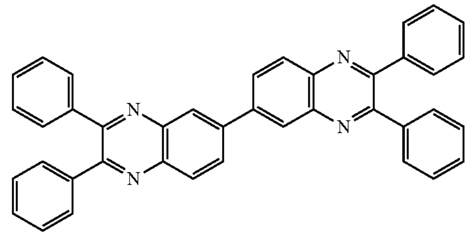
Mol. Wt.: 562.66
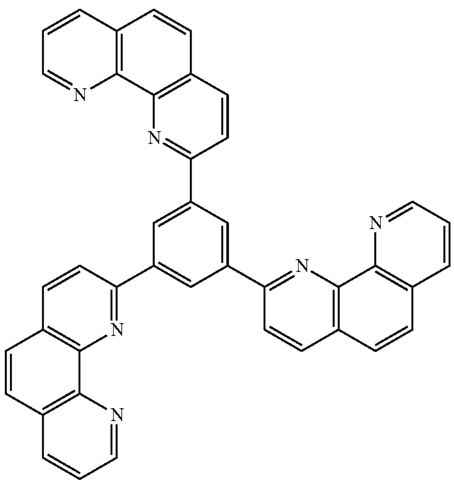
Mol. Wt.: 612.68
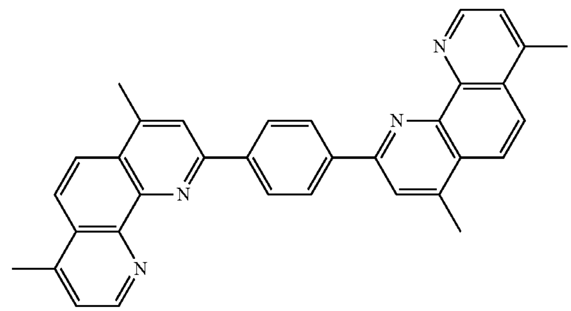
Mol. Wt.: 490.60
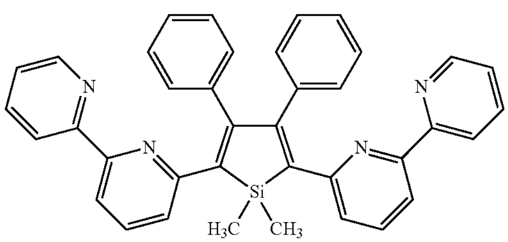
Mol. Wt.: 570.76
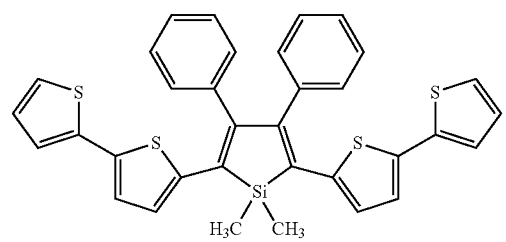
Mol. Wt.: 590.92
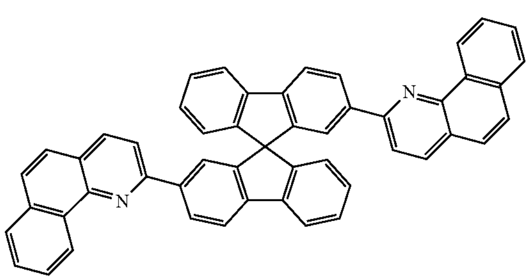
Mol. Wt.: 670.80
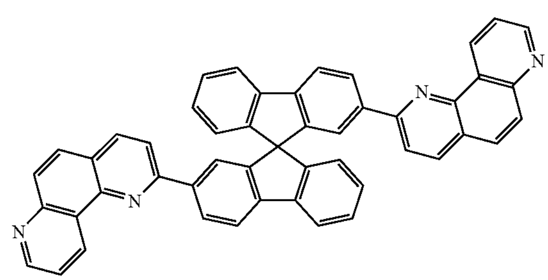
Mol. Wt.: 672.77

-continued
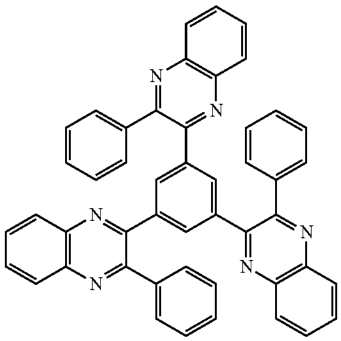
Mol. Wt.: 690.79
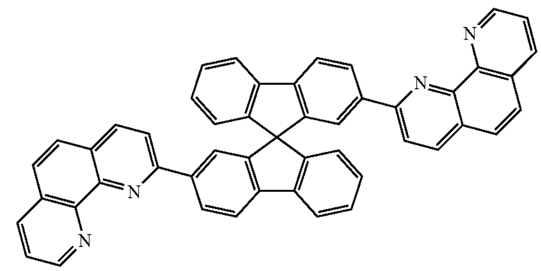
Mol. Wt.: 672.77
[Chemical Formula 84]
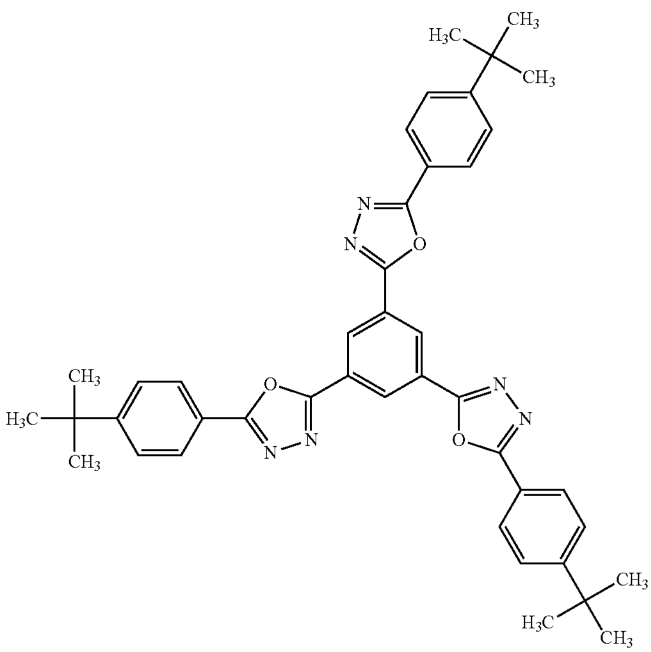
Mol. Wt.: 678.82
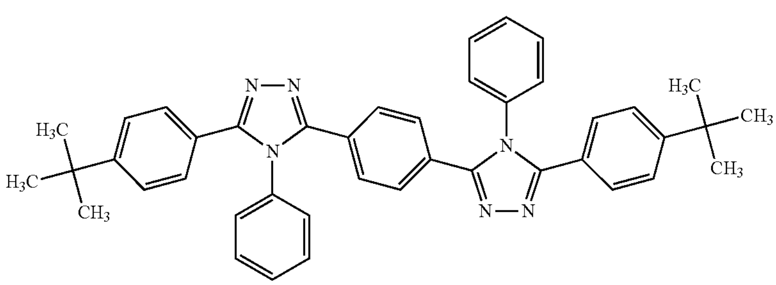
Mol. Wt.: 628.81

-continued
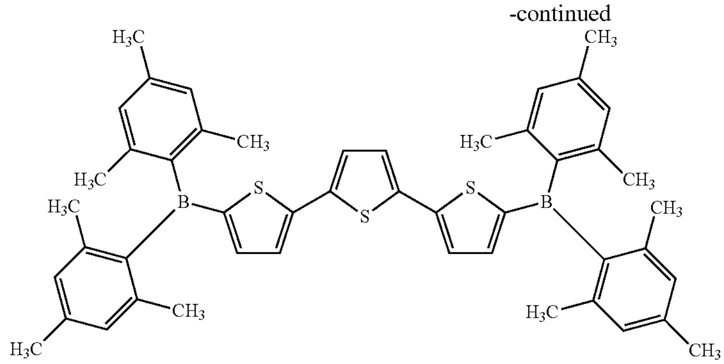
Mol. Wt.: 744.73
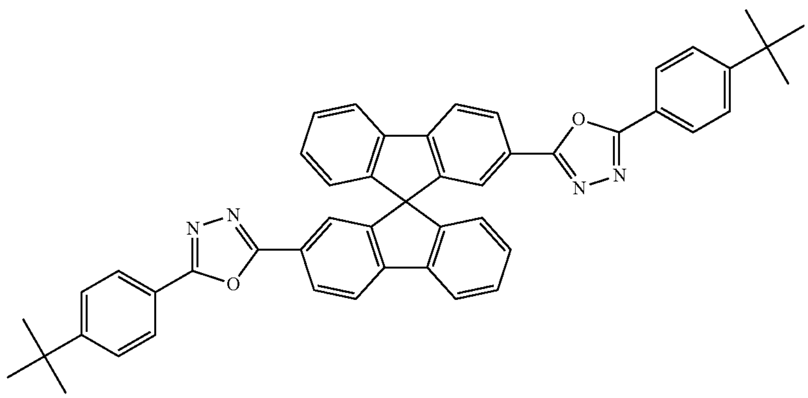
Mol. Wt.: 716.87
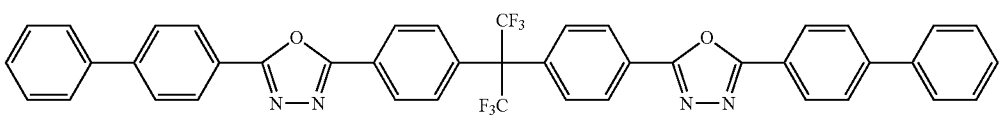
Mol. Wt.: 744.68
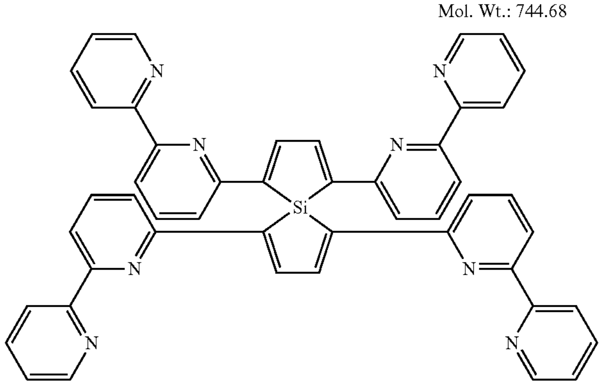
Mol. Wt.: 748.91
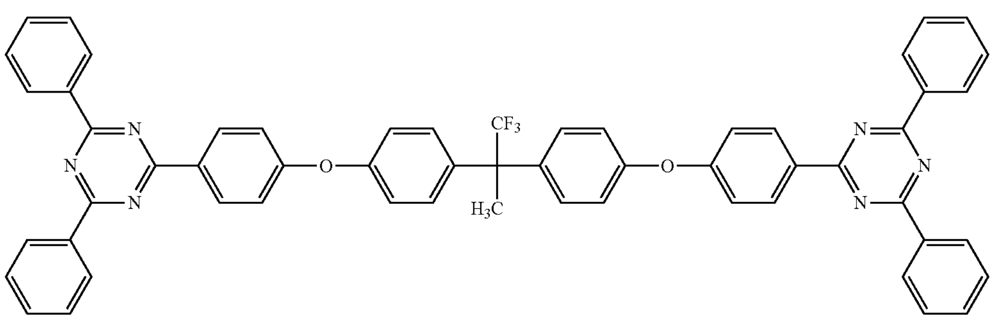
Mol. Wt.: 842.98

-continued

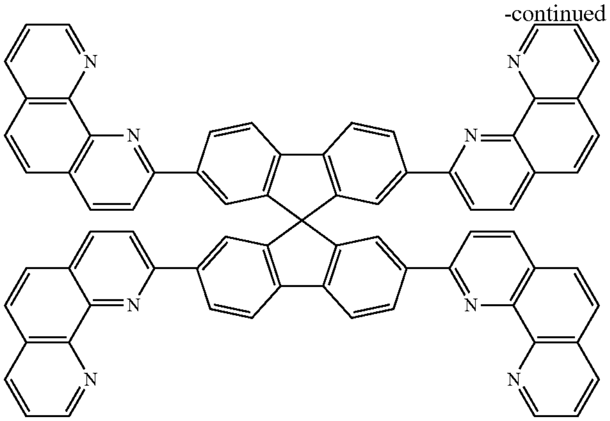

Mol. Wt.: 1029.15

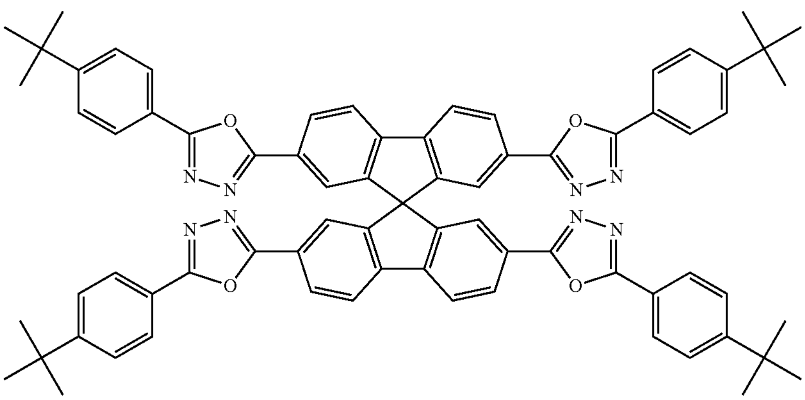

Mol. Wt.: 1117.34

[Chemical Formula 85]

$$[A]_p\text{—}B \quad (5)$$

In the formula (5), A represents a substituent having a phenanthroline skeleton or benzoquinoline skeleton. B is a p-valent organic group having a structure represented by a formula (5A) below. p is an integer of 2 or more.

[Chemical Formula 86]

(5A)

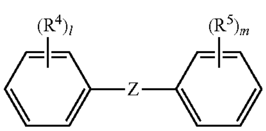

In the formula (5A), $R^4$ and $R^5$ each independently represent an alkyl group or aryl group (which includes an aryl group fused to a phenyl group). l and m each independently represent an integer from 0 to 5. Z is at least one compound selected from compounds represented by a formula (5B) below.

[Chemical Formula 87]

(5B)

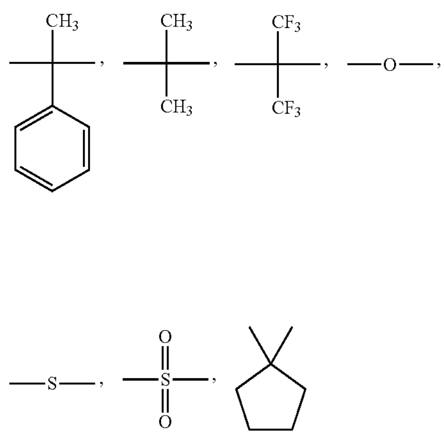

X is preferably at least one compound selected from compounds represented by a formula (5C) below.

[Chemical Formula 88]

(5C)

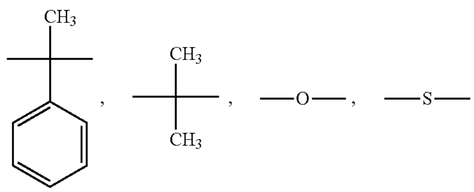

In the formula (5), A and B may be bonded in any substitution position, but is preferably bonded at an aryl group in terms of thermal stability during vacuum deposition. In the formula (5A), examples of the alkyl group are a linear saturated aliphatic hydrocarbon group such as methyl group, ethyl group, n-propyl group, i-propyl group, n-butyl, i-butyl group and t-butyl group, and a cyclic saturated aliphatic hydrocarbon group such as cyclopentyl group and cyclohexyl group. An example of the aryl group is an aromatic hydrocarbon group such as phenyl group, tolyl group, biphenyl group, naphthyl group, phenanthryl group and anthryl group. A may be the same or different.

Higher carrier mobility is desirable for maintaining low driving voltage of the organic electroluminescence device. Accordingly, a substituent having 1,10-phenanthroline skeleton is more preferably used as A of the formula (5). Since an excessively large molecular weight increases sublimation temperature, thermal decomposition is highly likely during vacuum deposition. On the other hand, when the molecular weight is excessively small, thin-film formation capability are often poor. Accordingly, although p represents an integer of 2 or more in the formula (5), more preferably, p is 2 in the formula (5).

When the molecular weight is excessively large, thermal decomposition may occur during sublimation purification or during deposition in the organic electroluminescence device manufacturing. Accordingly, p is preferably 4 or less.

Next, preferable examples of the compounds represented by the formula (5) are shown below, but the compounds are not limited to the following.

[Chemical Formula 89]

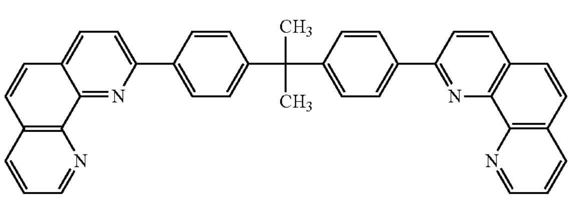

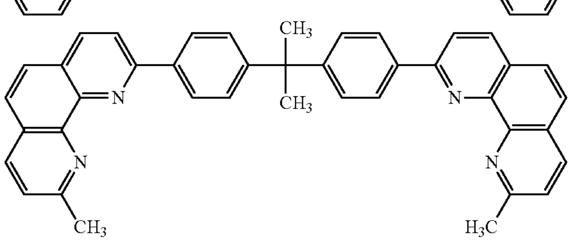

-continued

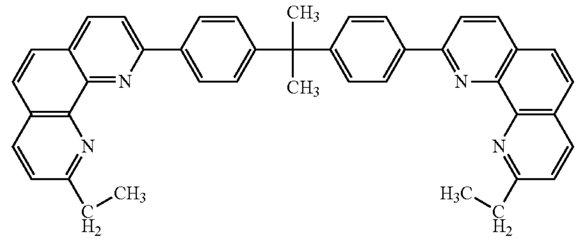

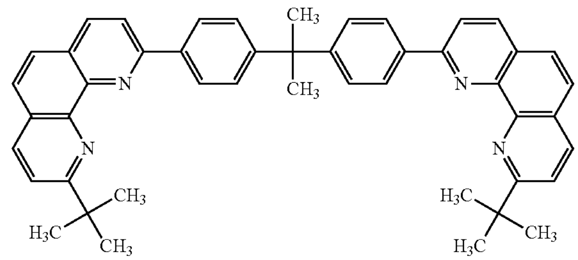

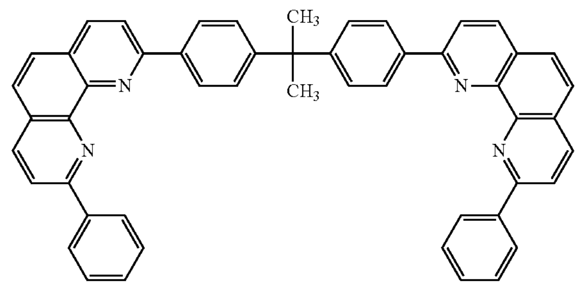

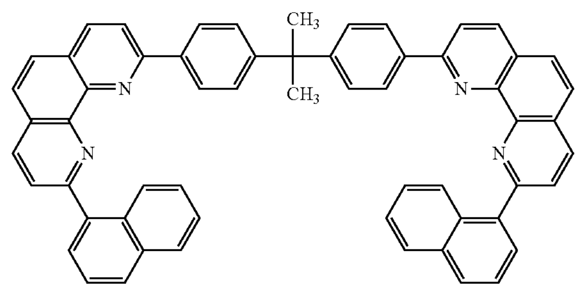

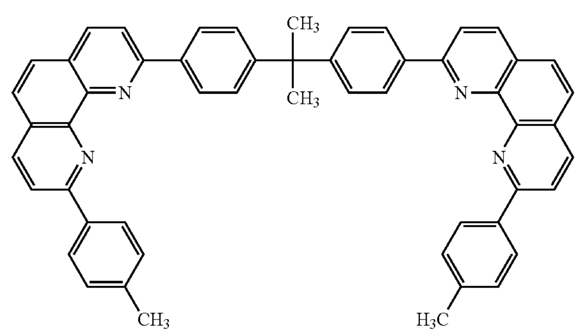

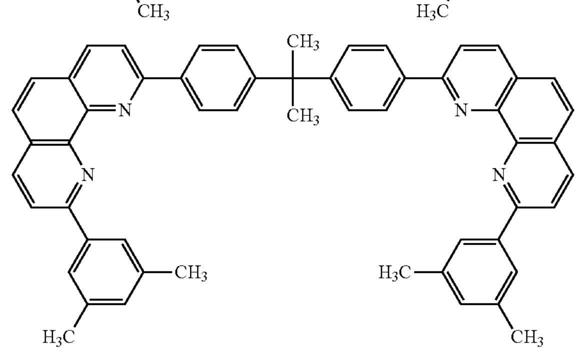

-continued
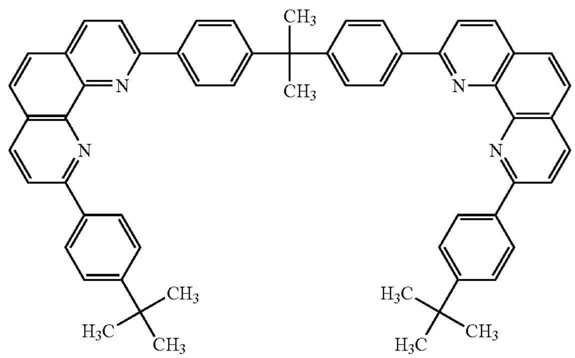
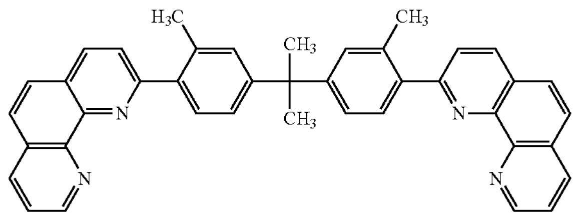
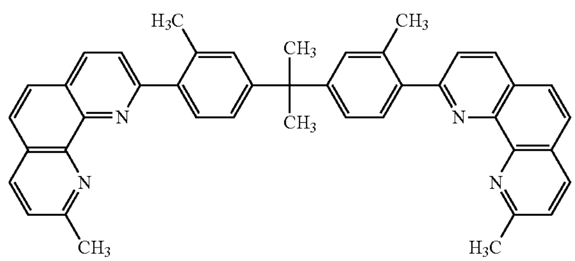
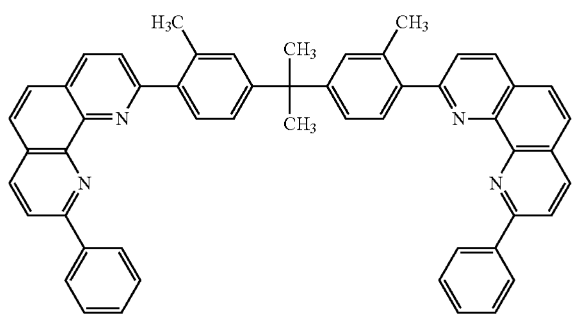
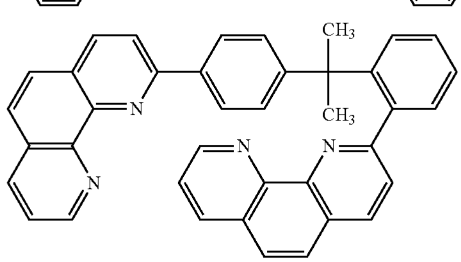
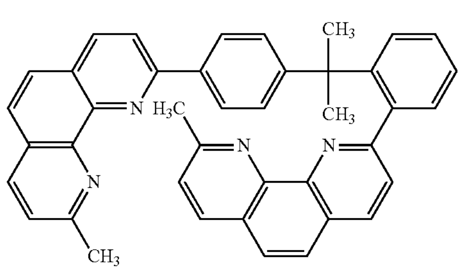
-continued
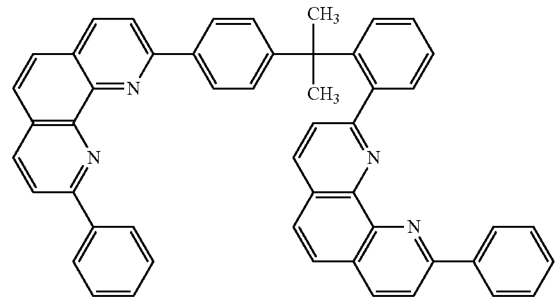
[Chemical Formula 90]
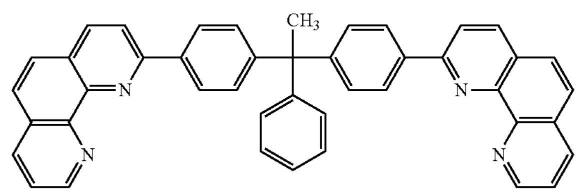
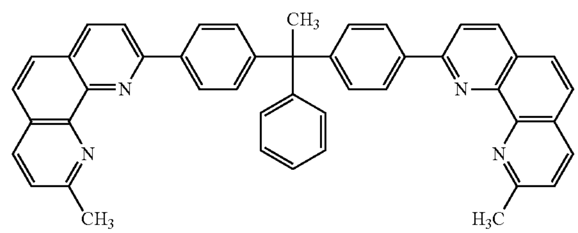
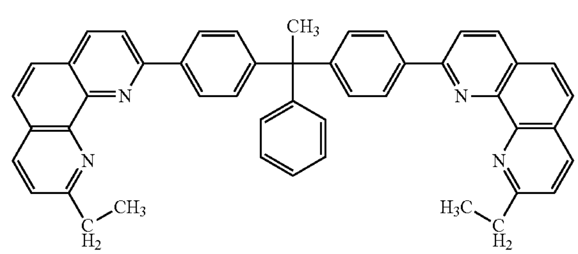
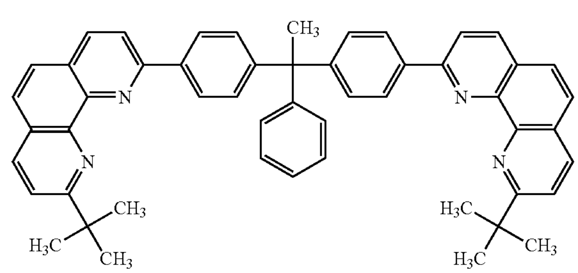
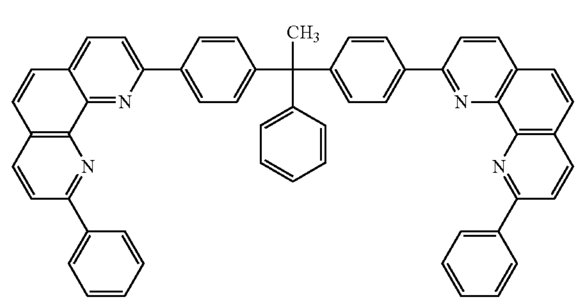

-continued
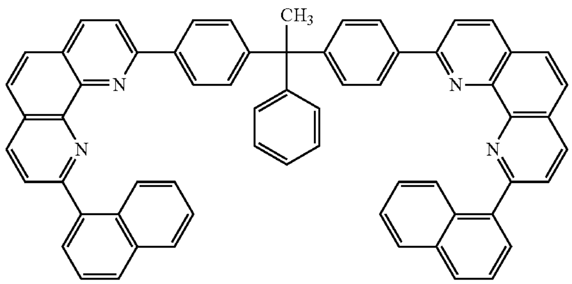
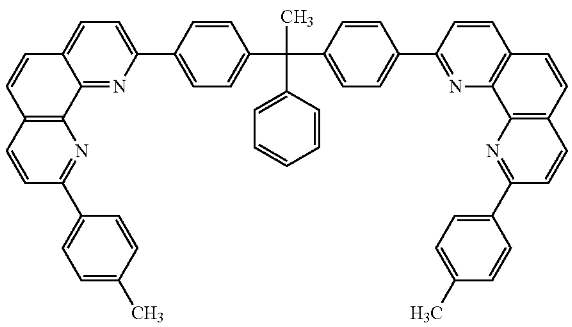
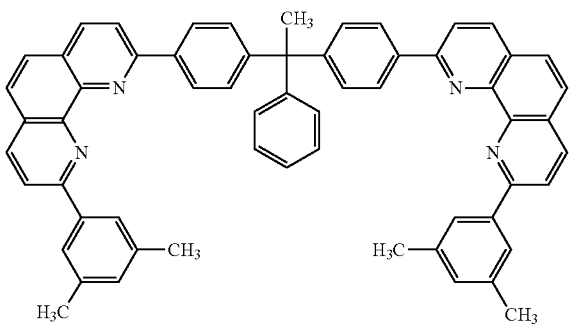
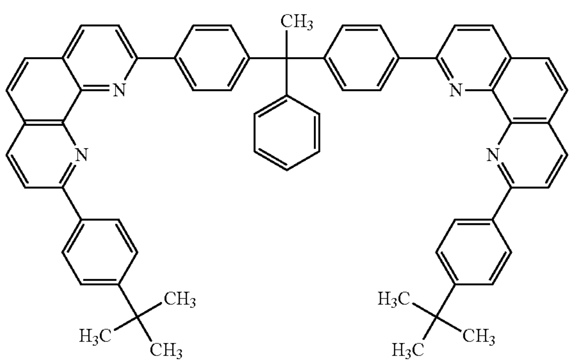
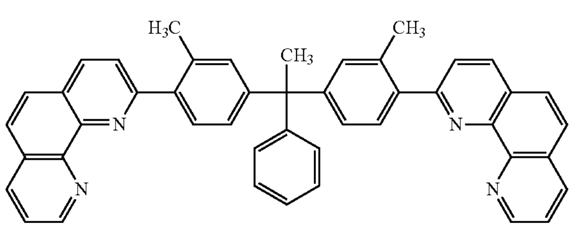
-continued
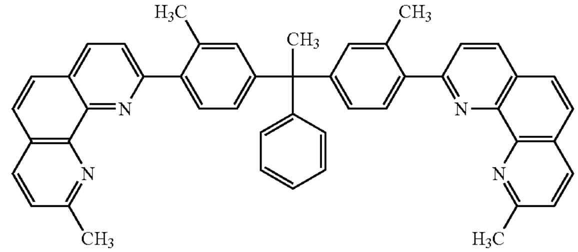
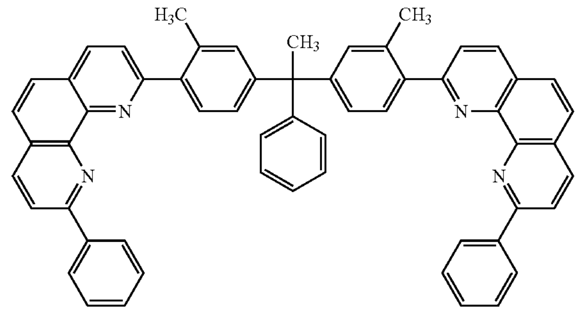
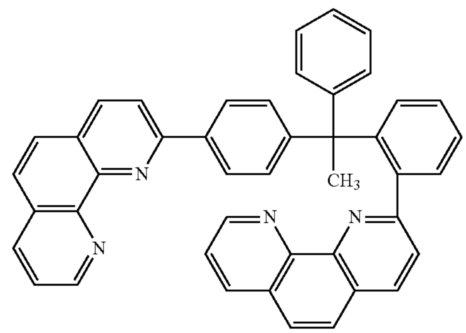
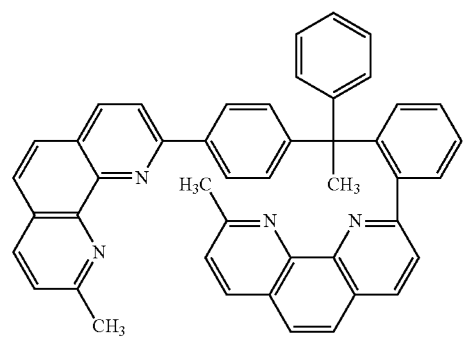
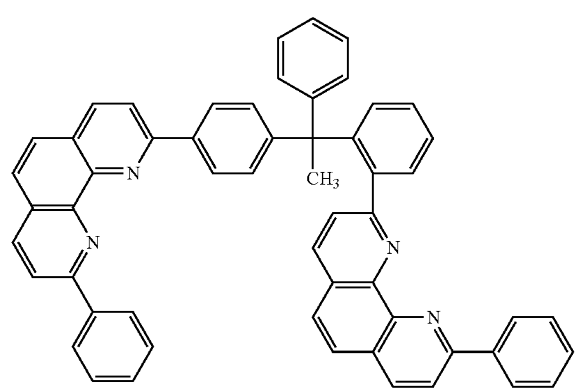

-continued
[Chemical Formula 91]
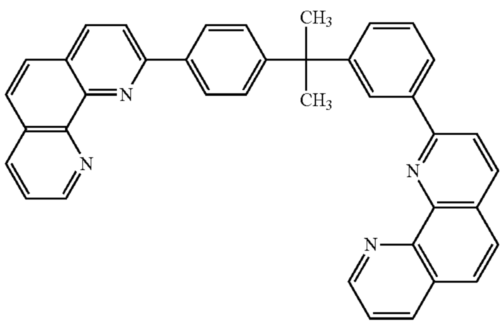
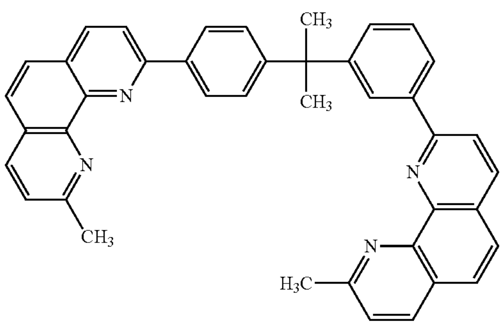
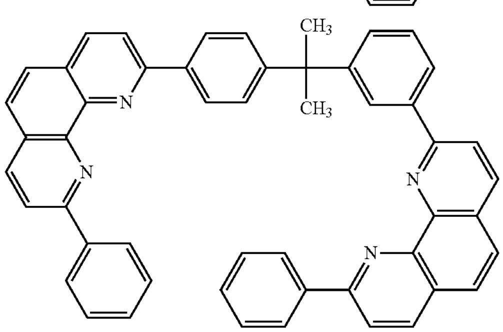
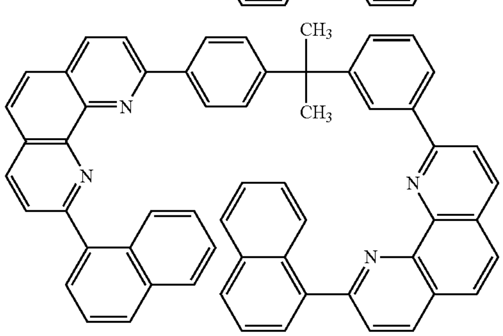
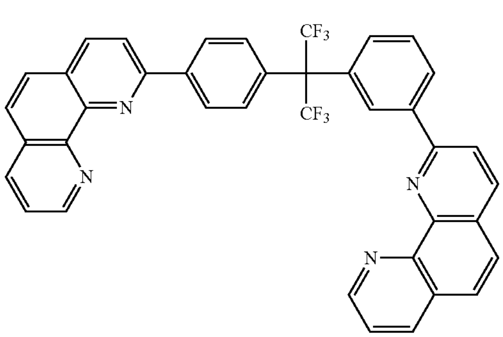
-continued
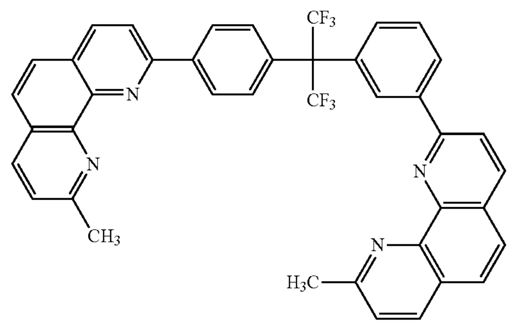
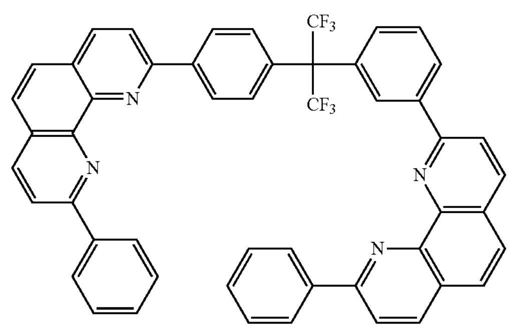
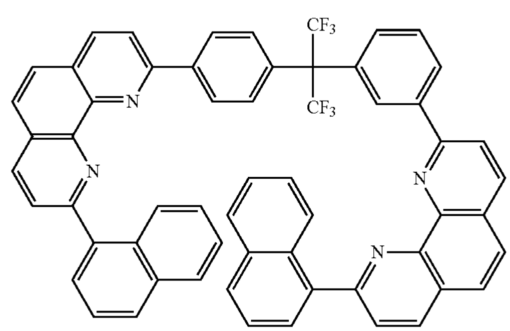
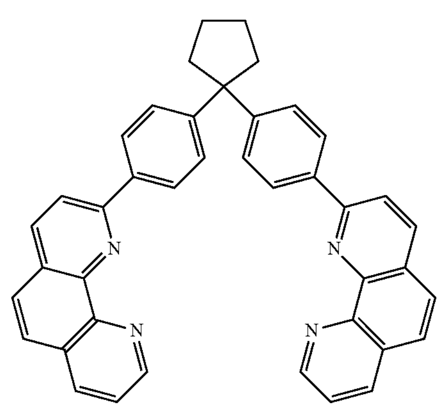

-continued
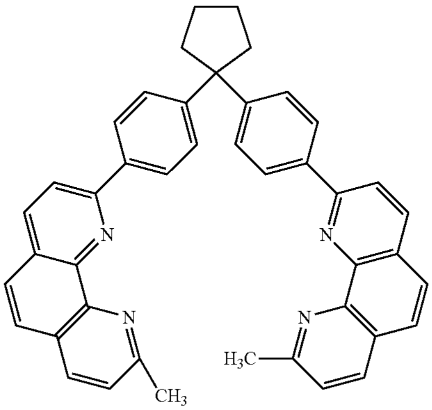
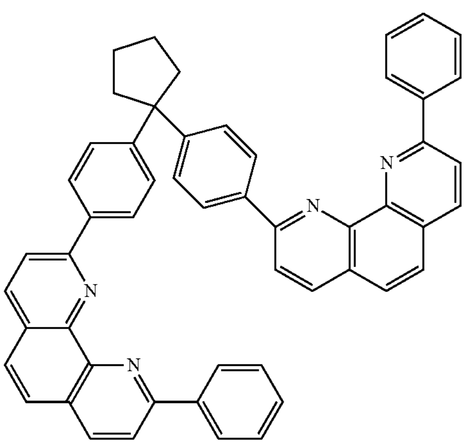
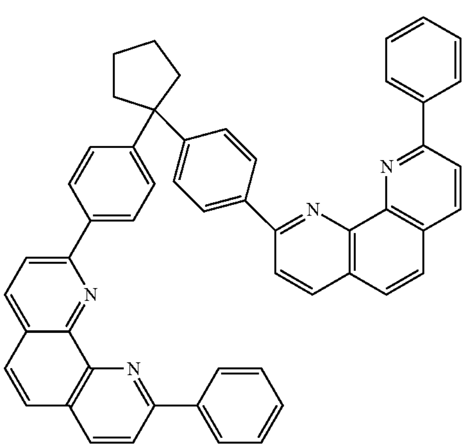
-continued
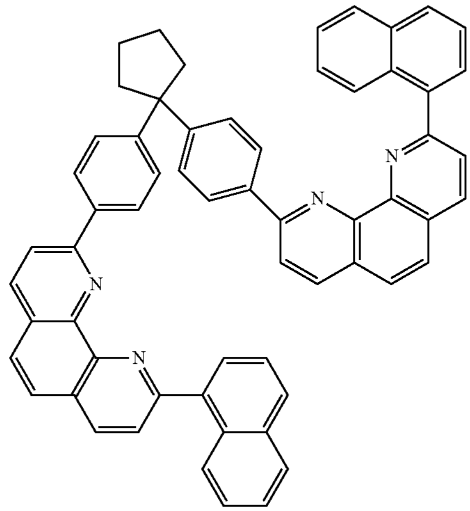
[Chemical Formula 92]
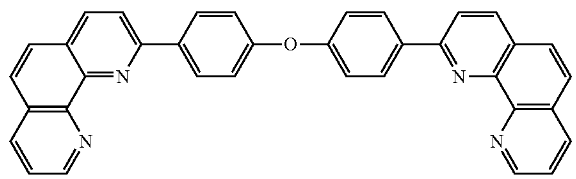
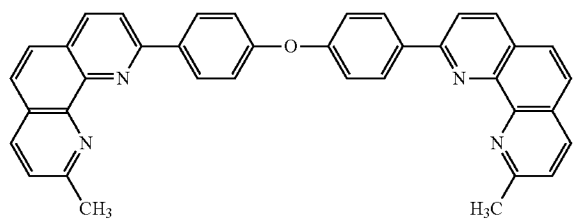
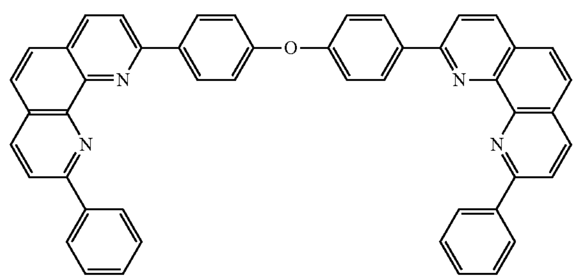
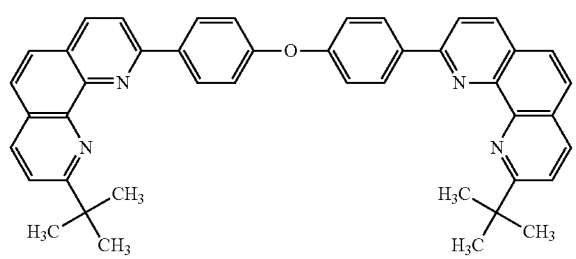

-continued
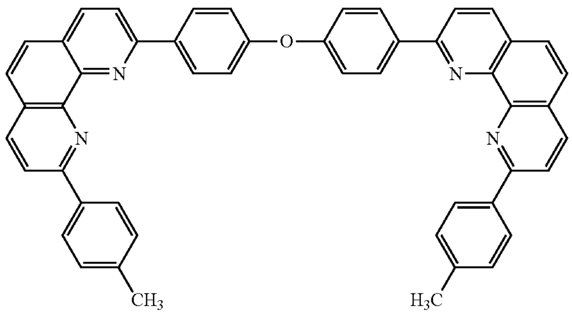
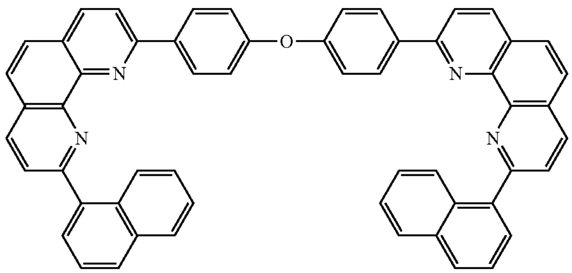
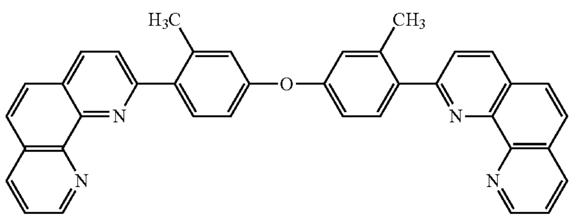
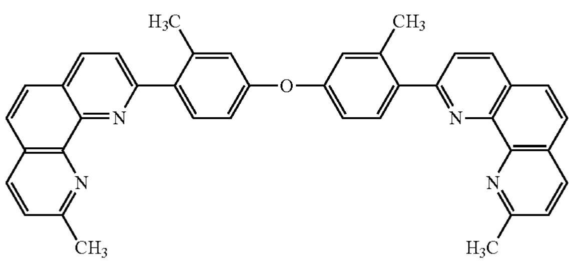
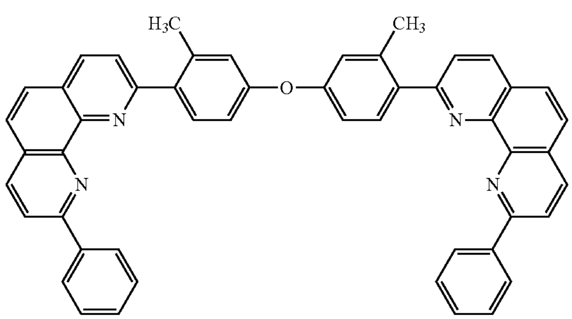
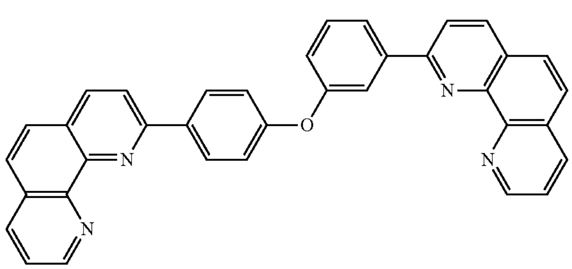
-continued
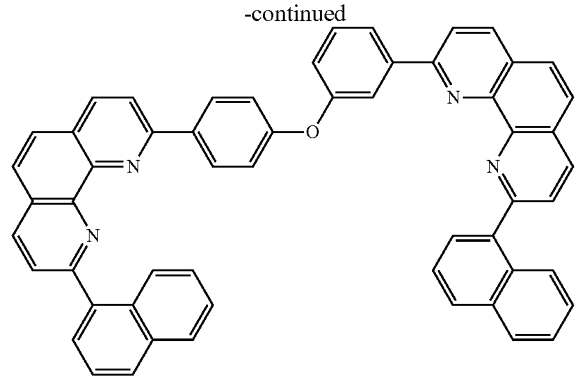
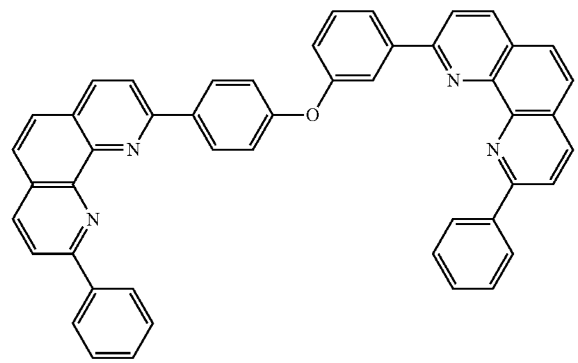
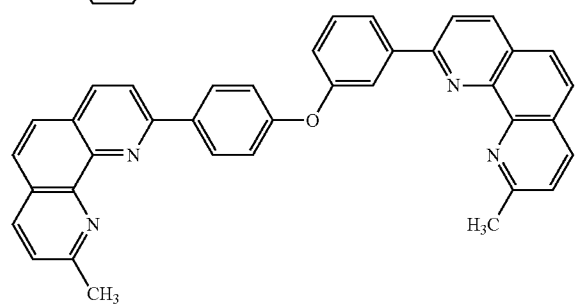
[Chemical Formula 93]
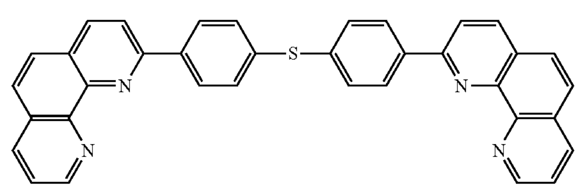
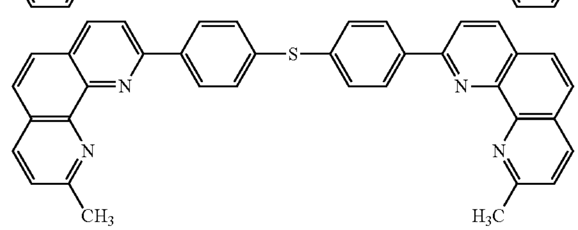
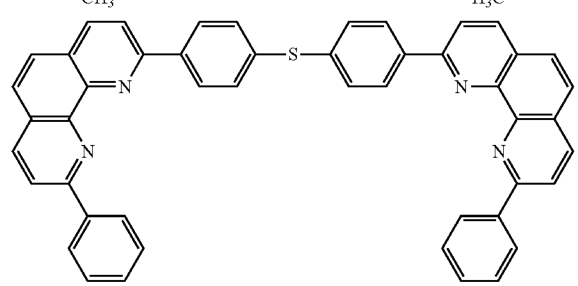

-continued
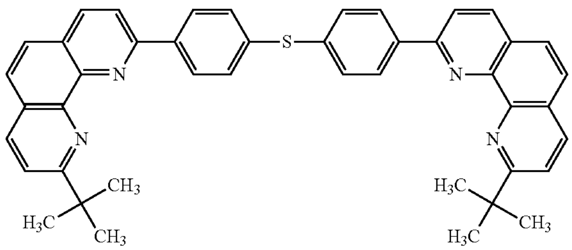
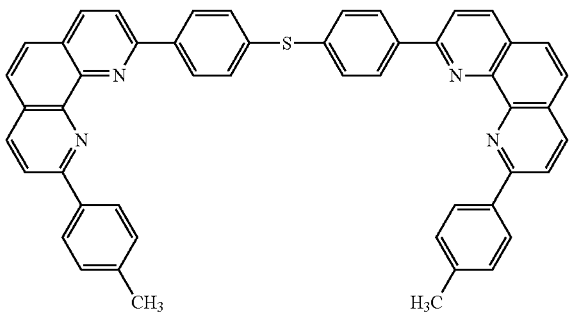
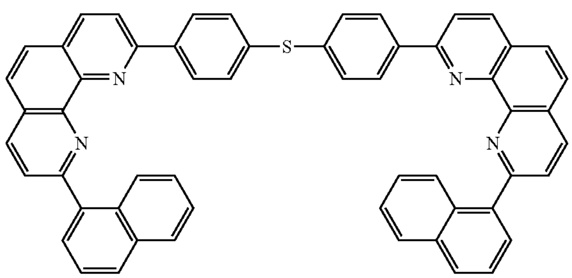
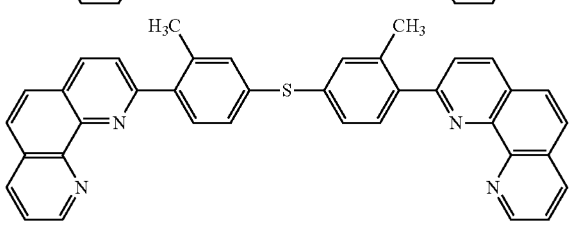
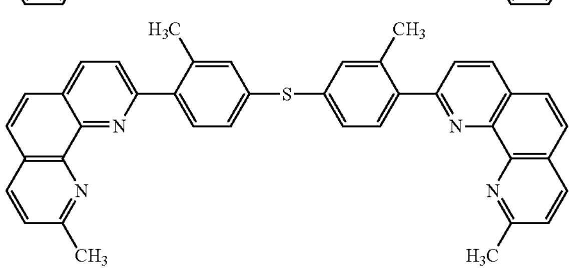
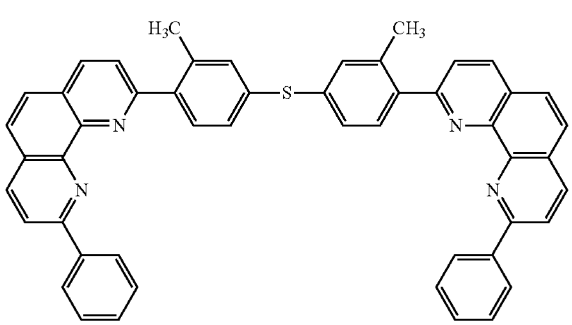
-continued
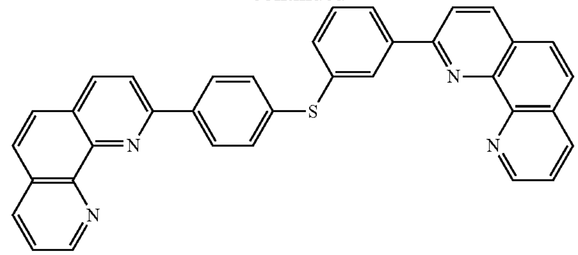
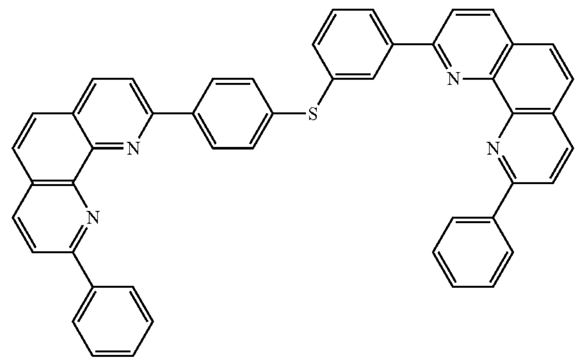
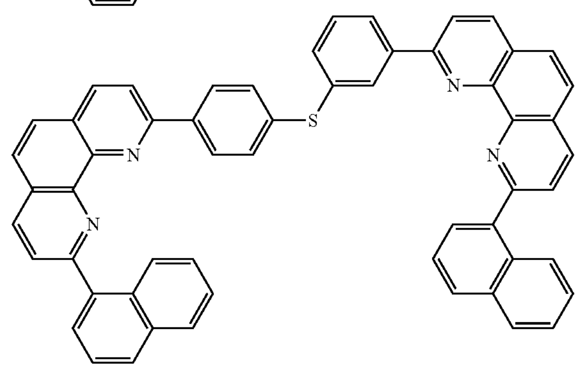
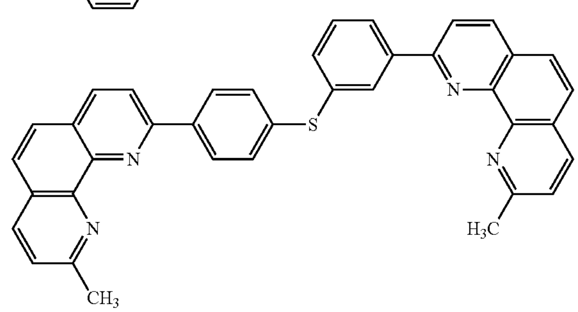
[Chemical Formula 94]
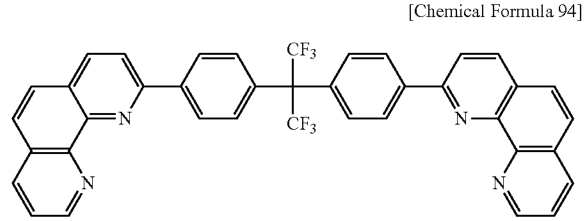
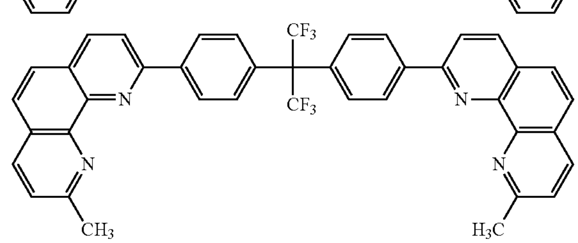

-continued
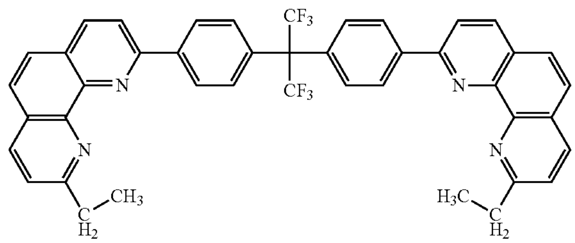
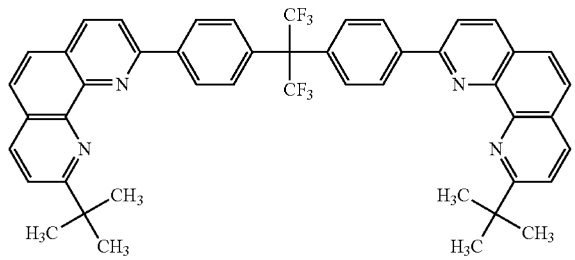
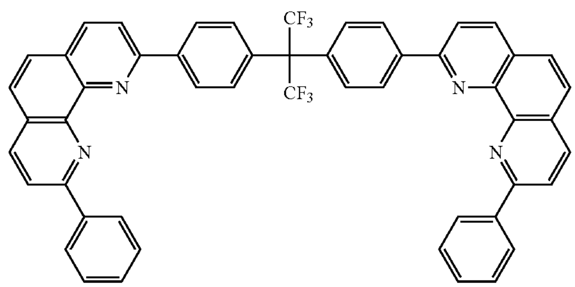
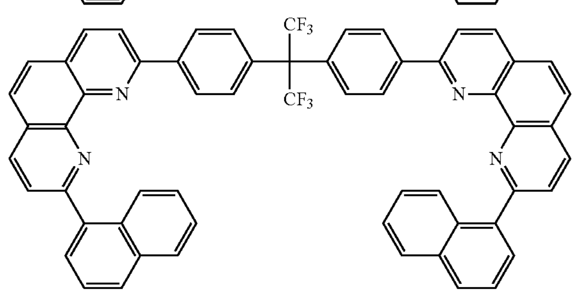
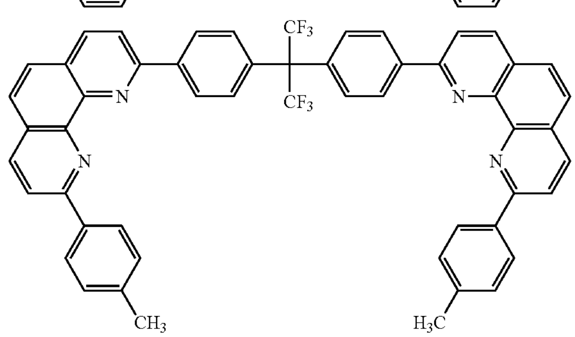
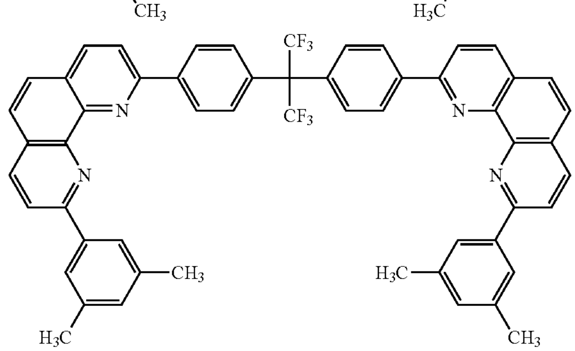
-continued
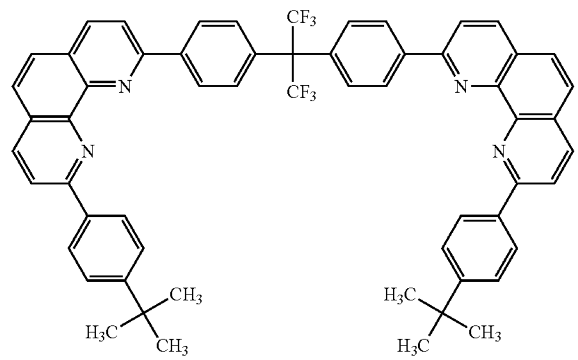
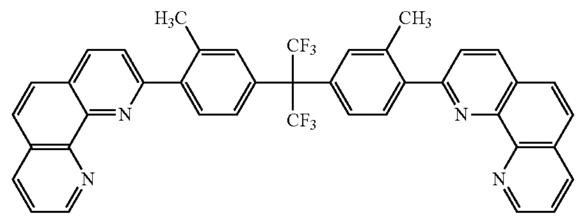
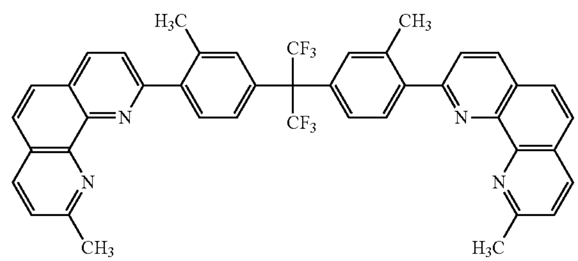
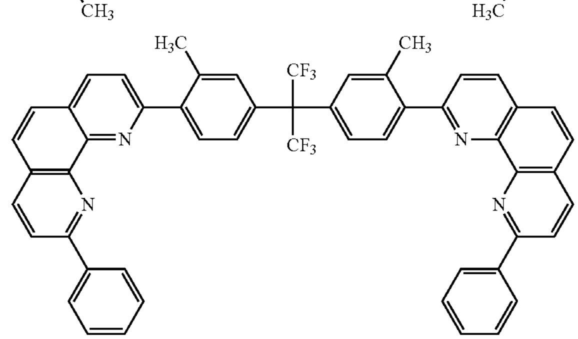
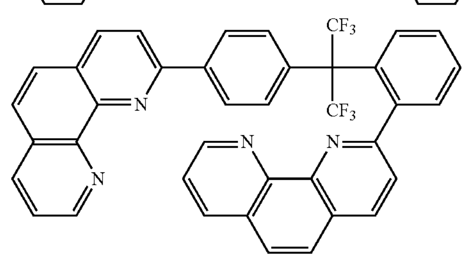
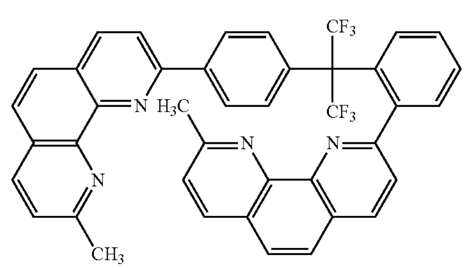

-continued
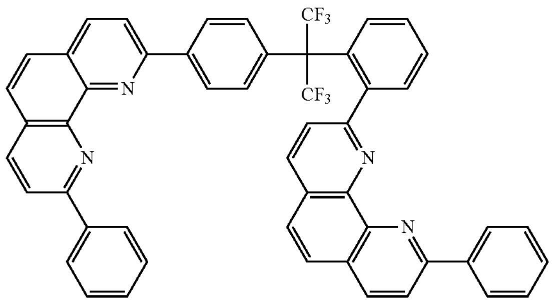
[Chemical Formula 95]
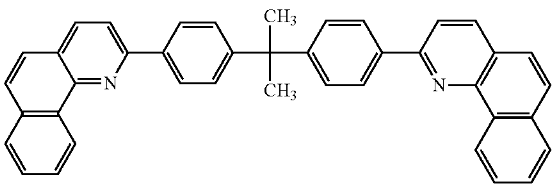
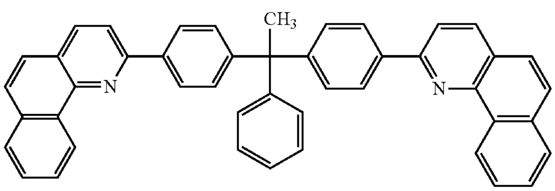
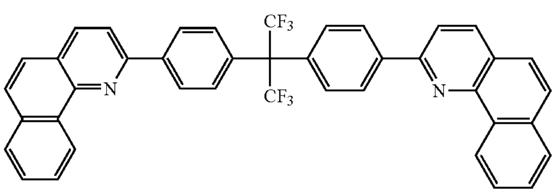
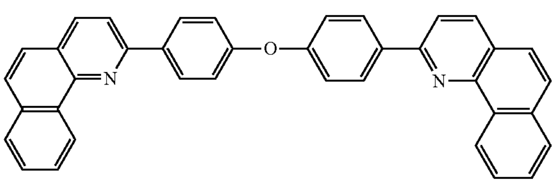
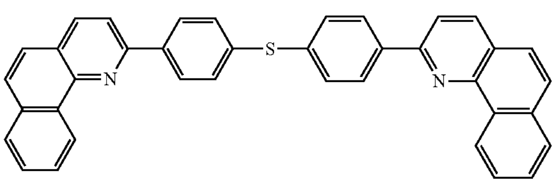
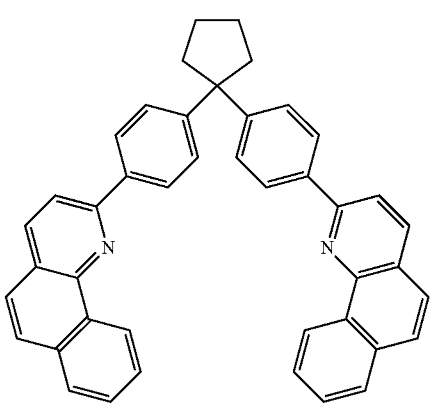
-continued
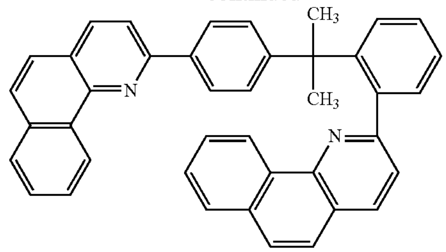
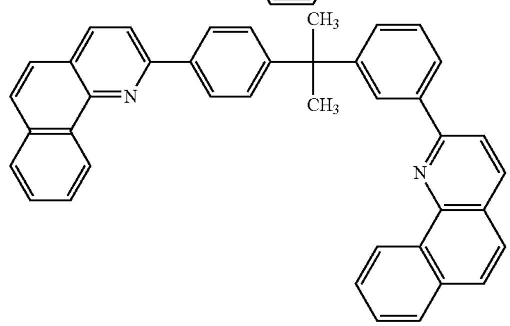
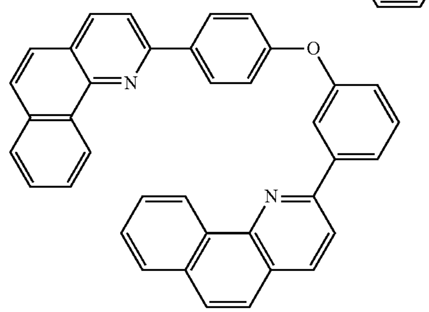
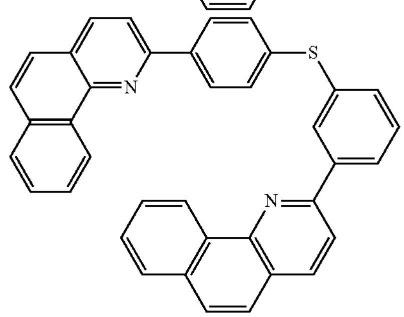
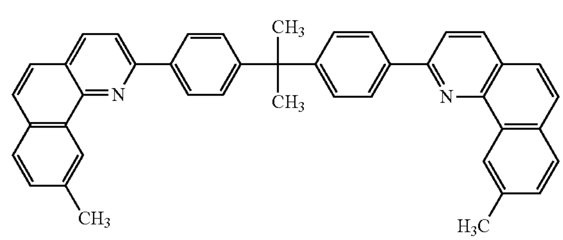
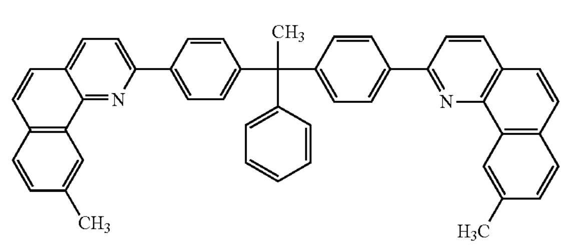

-continued

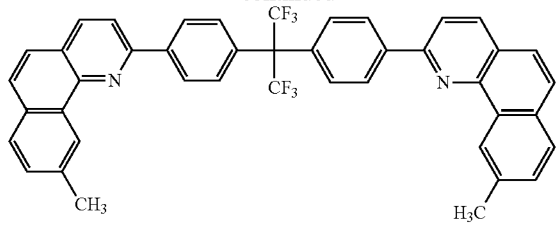

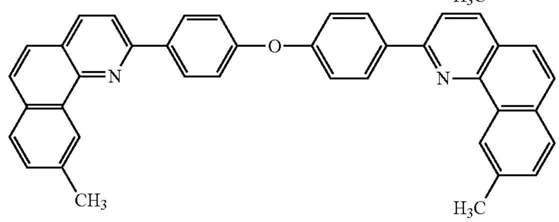

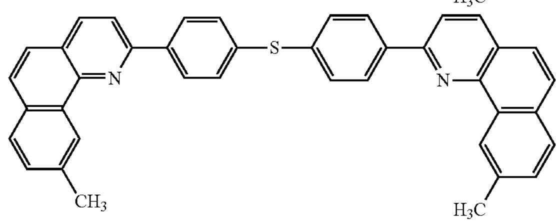

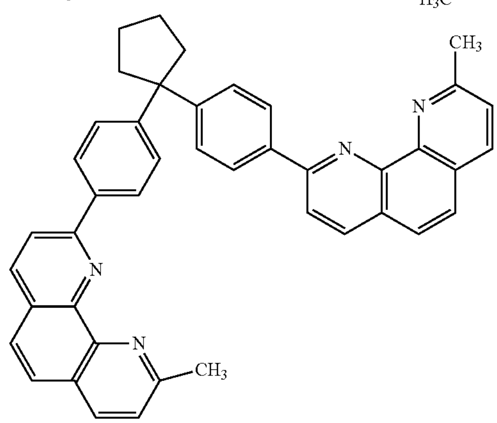

An organic electroluminescence device according to still another aspect of the invention includes an anode, a cathode, and an organic thin-film layer interposed between, the anode and the cathode, in which the organic thin-film layer includes a phosphorescent-emitting layer containing a host and a phosphorescent dopant, and an electron transporting layer that is provided closer to the cathode than the phosphorescent-emitting layer, and the host contains a host compound having a substituted or unsubstituted polycyclic fused aromatic skeleton, in which the electron transporting layer contains a phosphine oxide compound represented by a formula (6) below.

[Chemical Formula 96]

(6)

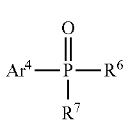

In the formula (6), $R^6$ and $R^7$ may be the same as or different from each other. $R^6$ and $R^7$ are respectively selected from hydrogen, an alkyl group, cycloalkyl group, heterocyclic group, alkenyl group, cycloalkenyl group, alkynyl group, alkoxy group, alkylthio group, arylether group, arylthioether group, aryl group, heteroaryl group, cyano group, carbonyl group, ester group, carbamoyl group, amino group, silyl group and a fused ring formed between adjacent substituents. $Ar^4$ represents an aryl group or heteroaryl group.

Among these substituents, the alkyl group represents a saturated aliphatic hydrocarbon group such as a methyl group, ethyl group, propyl group and butyl group, which may be substituted or unsubstituted. When the alkyl group is substituted by a substituent, the substituent is not particularly limited. Examples of the substituent include an alkyl group, aryl group and heteroaryl group. This also applies to the following description. The number of carbon atoms of the alkyl group is not particularly limited, but typically in a range of 1 to 20 in term of availability and cost.

The cycloalkyl group represents a saturated alicyclic hydrocarbon group such as cyclopropyl, cyclohexyl, norbornyl and adamanthyl, which may be substituted or unsubstituted. The number of carbon atoms of the alkyl group is not particularly limited, but typically in a range of 3 to 20.

The heterocyclic group represents a group formed of an aliphatic ring such as a pyrane ring, piperidine ring and cyclic amido, in which an atom other than carbon is contained. The heterocyclic group may be substituted or unsubstituted. The number of carbon atoms of the heterocyclic group is not particularly limited, but typically in a range of 2 to 20.

The alkenyl group represents an unsaturated aliphatic hydrocarbon group containing a double bond such as a vinyl group, allyl group and butadienyl group, which may be substituted or unsubstituted. The number of carbon atoms of the alkenyl group is not particularly limited, but typically in a range of 2 to 20.

The cycloalkenyl group represents an unsaturated alicyclic hydrocarbon group containing a double bond such as a cyclopentenyl group, cyclopentadienyl group, cyclohexenyl group, which may be substituted or unsubstituted.

The alkynyl group represents an unsaturated aliphatic hydrocarbon group containing a triple bond such as an ethynyl group, which may be substituted or unsubstituted. The number of carbon atoms of the alkynyl group is not particularly limited, but typically in a range of 2 to 20.

The alkoxy group represents an aliphatic hydrocarbon group interposing an ether bond such as methoxy group, which may be substituted or unsubstituted. The number of carbon atoms of the alkoxy group is not particularly limited, but typically in a range of 1 to 20.

The alkylthio group is formed by an oxygen atom of the ether bond being substituted by a sulfur atom in an alkoxy group.

The arylether group represents an aromatic hydrocarbon group interposing an ether bond such as phenoxy group, which may be substituted or unsubstituted. The number of carbon atoms of the arylether group is not particularly limited, but typically in a range of 6 to 40.

The arylthioether group is formed by an oxygen atom of the ether bond being substituted by a sulfur atom in an arylether group.

The aryl group represents an aromatic hydrocarbon group such as a phenyl group, naphthyl group, biphenyl group, phenanthryl group, terphenyl group and pyrenyl group. The aryl group may be substituted or unsubstituted. The number of carbon atoms of the aryl group is not particularly limited, but typically in a range of 6 to 40.

Among the above aryl groups, a fused polycyclic aryl group particularly represents a group formed by two or more aromatic rings being fused. Examples of the fused polycyclic aryl group are a naphthyl group, phenanthryl group, pyrenyl group and pentacene residue, which may be substituted or unsubstituted.

The heteroaryl group represents an aromatic group such as a furanyl group, thiophenyl group, oxazolyl group, pyridyl group, quinolinyl group and carbazolyl group in which an atom other than carbon is contained. The heteroaryl group may be substituted or unsubstituted. The number of carbon atoms of the heteroaryl group is not particularly limited, but typically in a range of 2 to 30.

Among the above heteroaryl groups, a fused polycyclic heteroaryl group represents a group formed by 2 or more aromatic rings being fused. Examples of the fused polycyclic heteroaryl group are a quinolinyl group, phenanthroline residue, benzofuranyl group, benzooxazolyl group and carbazolyl group, which may be substituted or unsubstituted.

A carbonyl group, ester group, carbamoyl group and amino group may be substituted or unsubstituted. Examples of a substituent are an alkyl group, cycloalkyl group, aryl group and heteroaryl group, which may be further substituted.

The silyl group represents a silicon compound group such as a trimethylsilyl group, which may be substituted or unsubstituted. The number of carbon atoms of the silyl group is not particularly limited, but typically in a range of 3 to 20. Silicon atoms are typically in a range of 1 or 6.

With reference to the formula (6), the fused ring formed between the adjacent substituents represents a conjugated or unconjugated fused ring that is formed between $R^6$ and $R^7$, $R^7$ and $Ar^4$, or $R^6$ and $Ar^4$. The fused ring may include a nitrogen atom, oxygen atom and sulfur atom in the ring structure, and may be further fused to another ring.

In the phosphine oxide compound represented by the formula (6), $R^6$ and $R^7$ are preferably an aryl group or heteroaryl group in terms of thin-film formation. Further, it is more preferable in terms of charge transporting capability that at least one of $R^6$, $R^7$ and $Ar^4$ contains the fused polycyclic aryl group or fused polycyclic heteroaryl group. When $R^6$ or $R^7$ is a fused polycyclic aryl group or fused polycyclic heteroaryl group, $R^6$ or $R^7$ may be bonded to a phosphorus atom directly or through another substituent. The number of carbon atoms of the fused polycyclic aryl group and that of the fused polycyclic heteroaryl group are not particularly limited, but typically in a range of 6 to 40 and 2 to 30 respectively.

Examples of the above phosphine oxide compound are shown below.

[Chemical Formula 97]

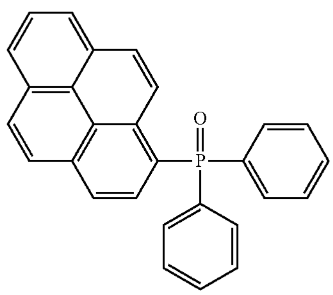

[1]

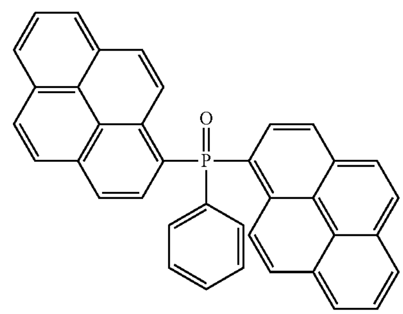

[2]

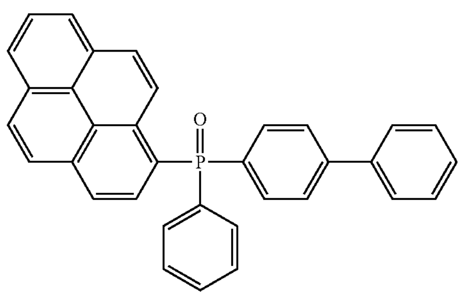

[3]

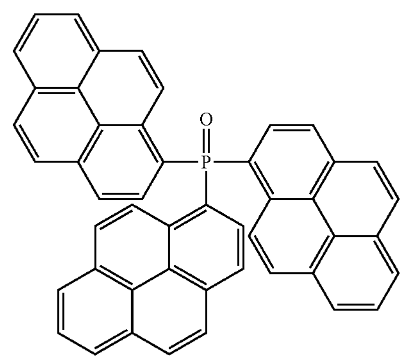

[4]

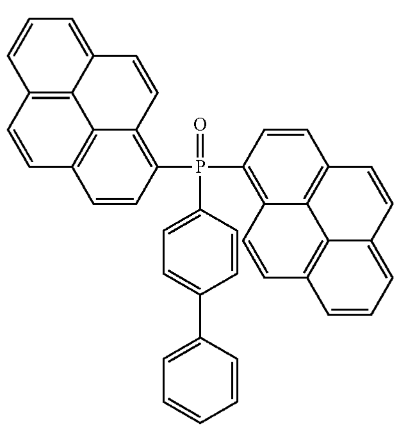

[5]

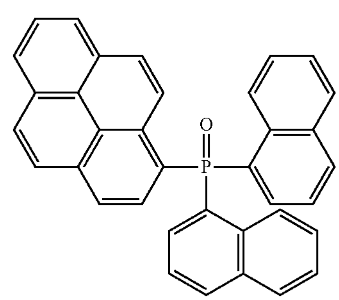

[6]

-continued
[7]
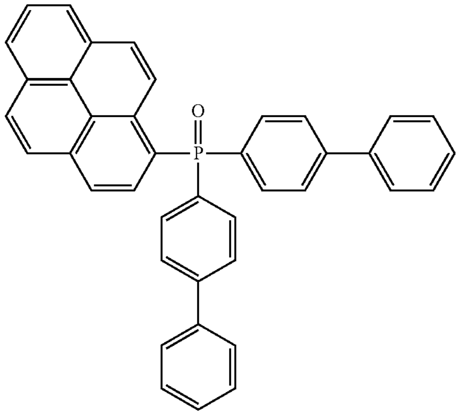
[8]
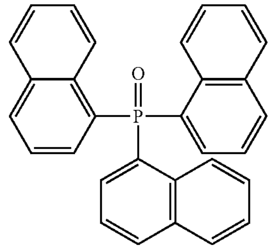
[Chemical Formula 98]
[9]
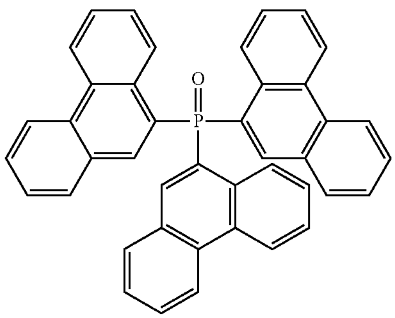
[10]
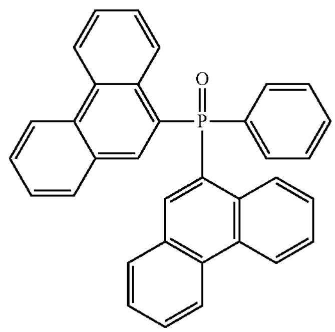
[11]
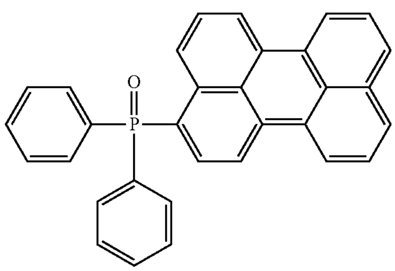
[12]
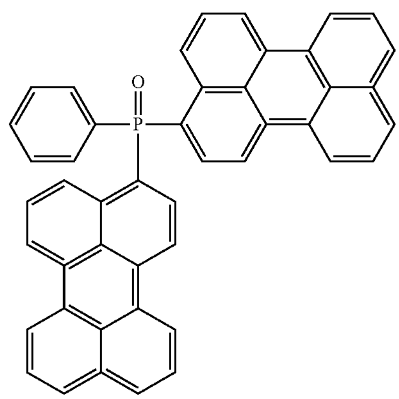
[13]
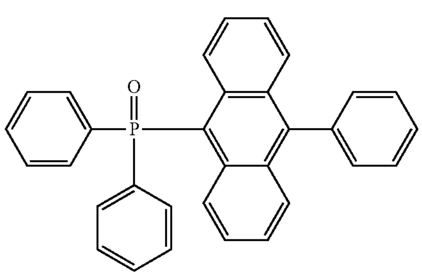
[14]
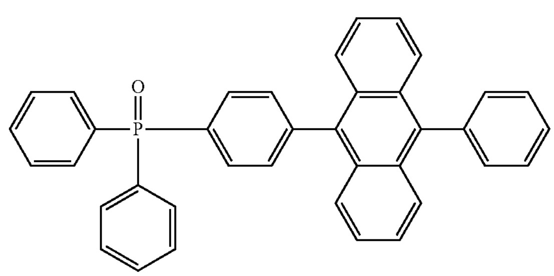

-continued
[15]
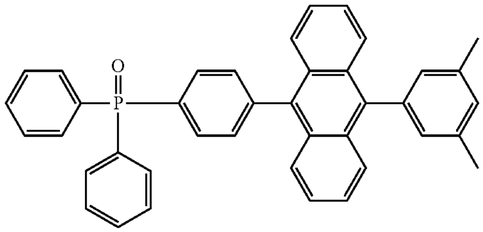
[16]
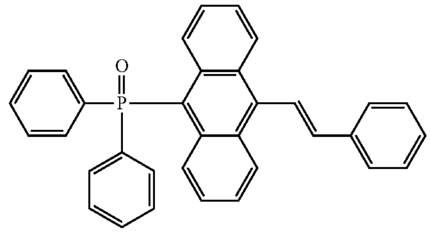
[17]
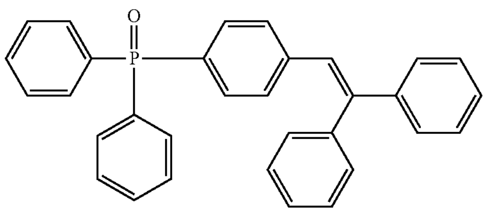
[18]
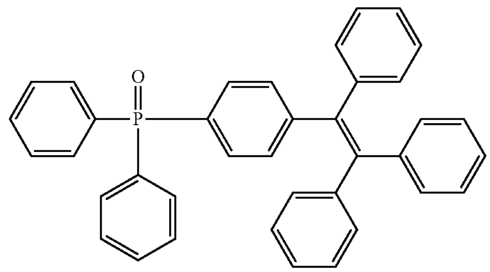
Chemical Formula 99]
[19]
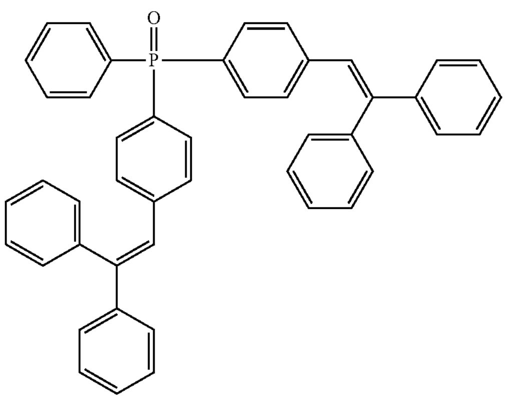
[20]
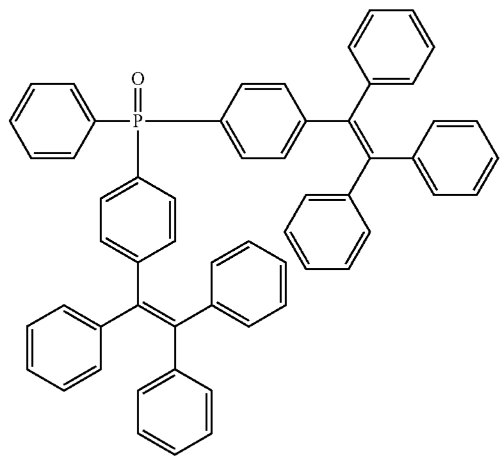
[21]
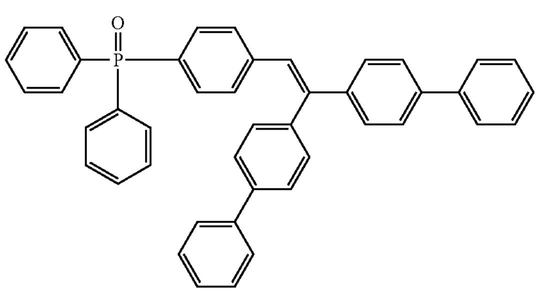
[22]
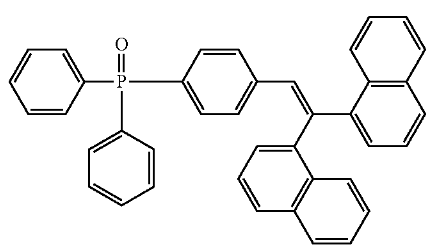
[23]
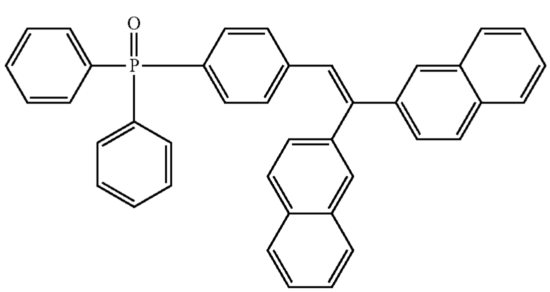
[24]
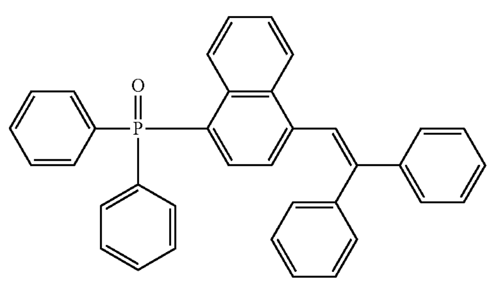

-continued
[25]
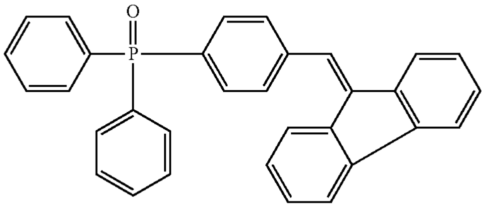
[26]
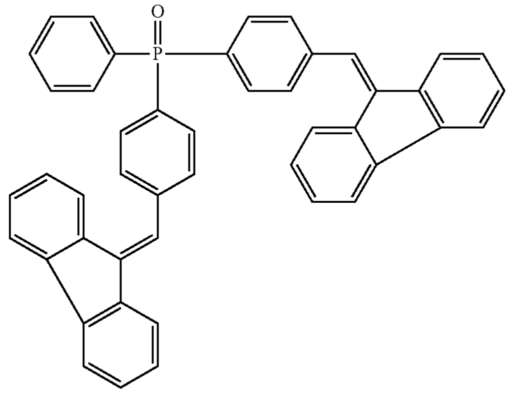
[27]
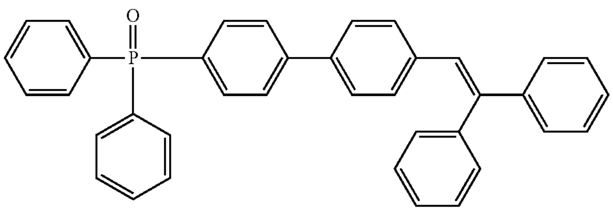
[Chemical Formula 100]
[28]
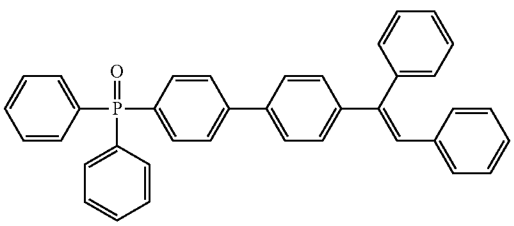
[29]
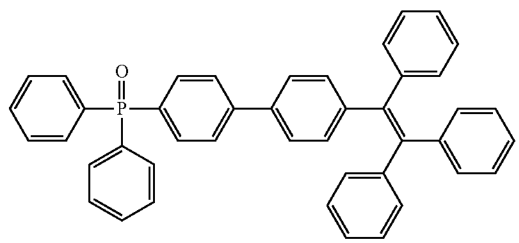
[30]
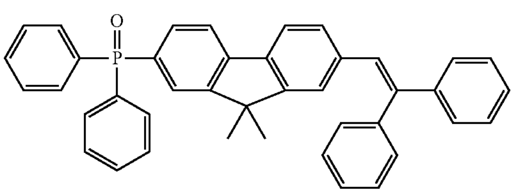
[31]
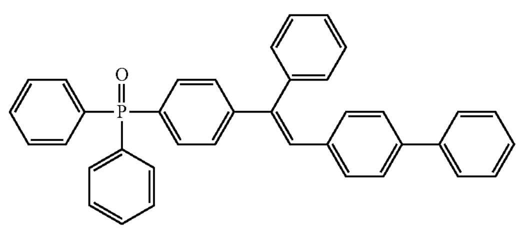
[32]
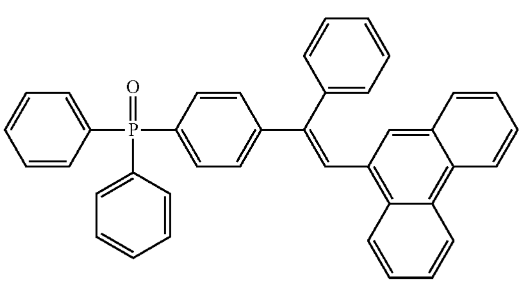

-continued
[33]
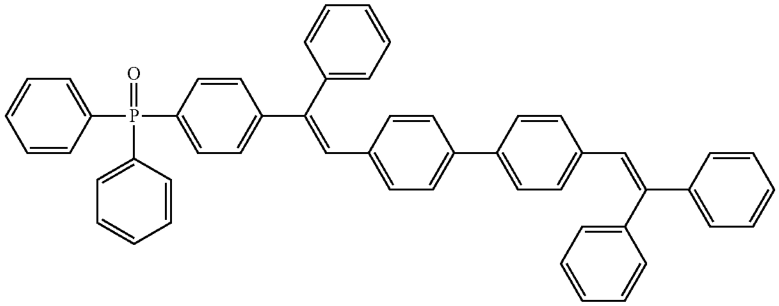
[34]
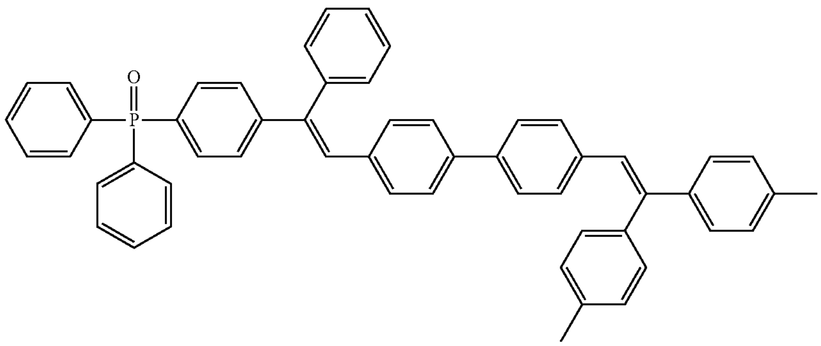
[35]
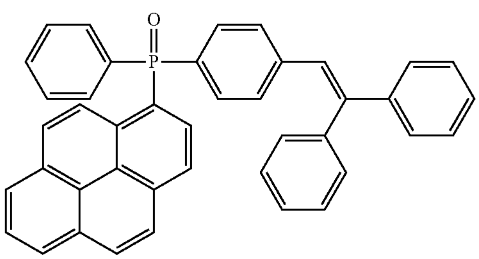
[36]
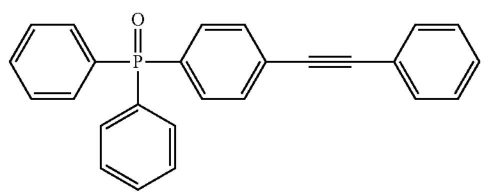
[Chemical Formula 101]
[37]
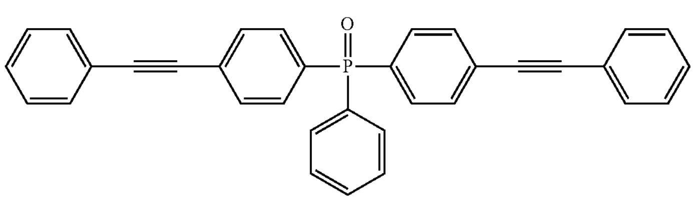
[38]
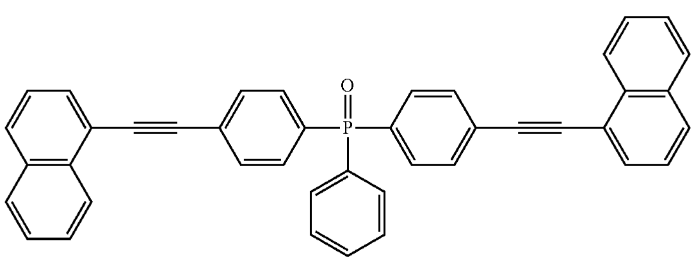

-continued
[39]
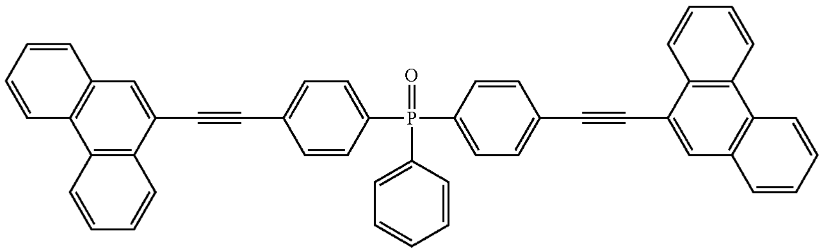
[40]
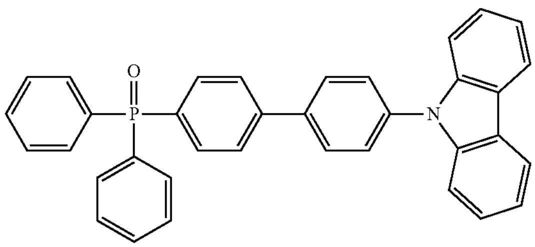
[41]
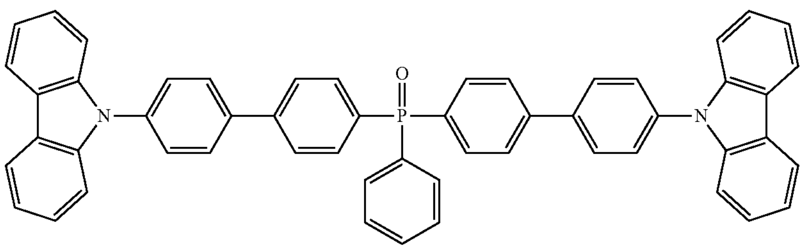
[42]
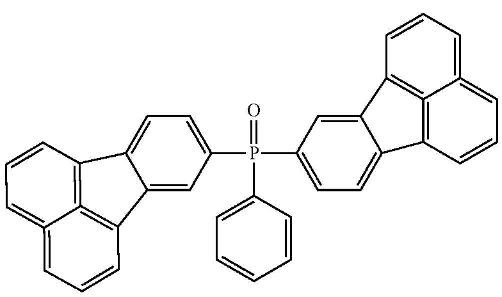
[43]
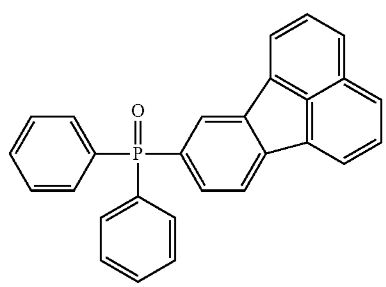
[44]
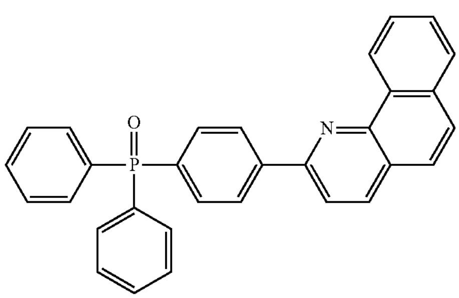

-continued
[Chemical Formula 102]
[45]
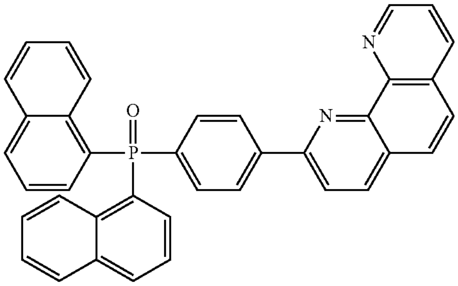
[46]
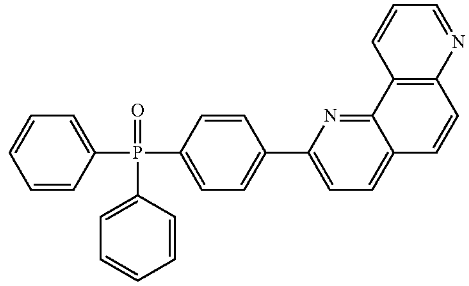
[47]
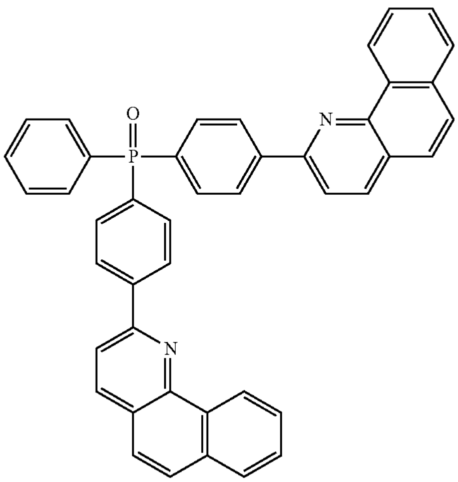
[48]
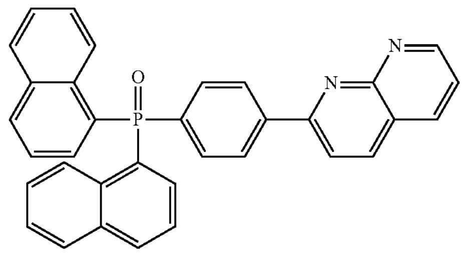
[49]
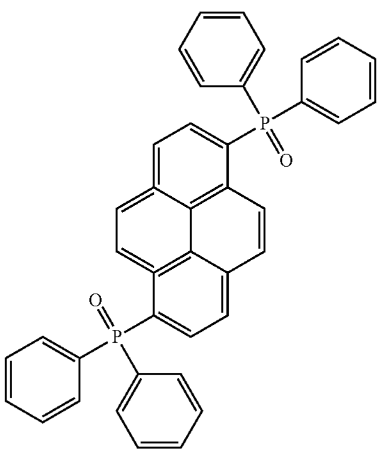
[50]
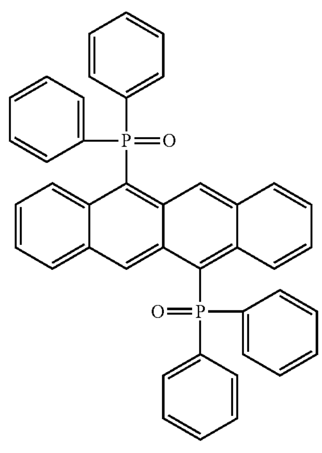
[51]
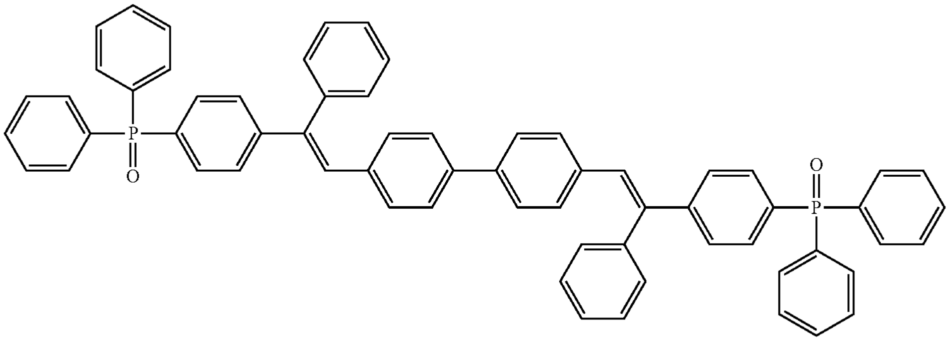

-continued
[Chemical Formula 103]
[52]
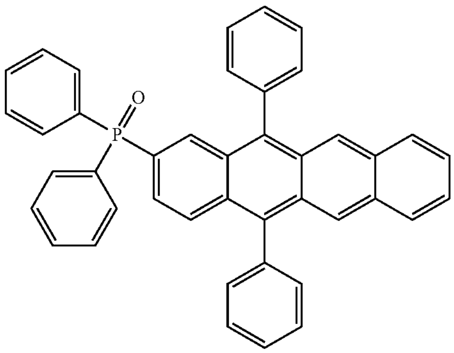
[53]
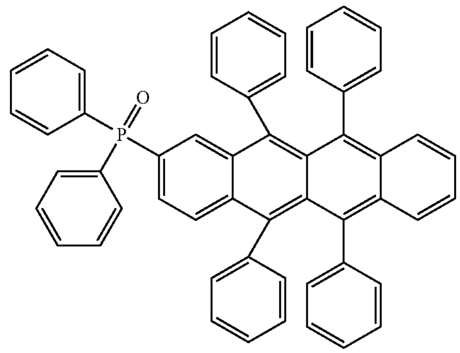
[54]
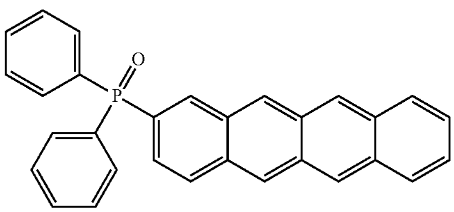
[55]
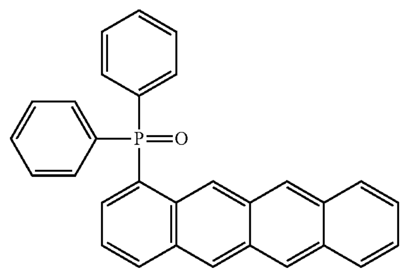
[56]
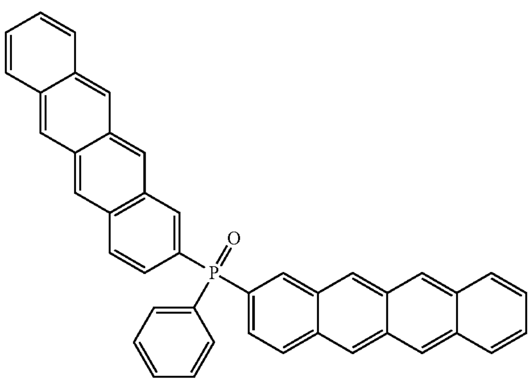
[57]
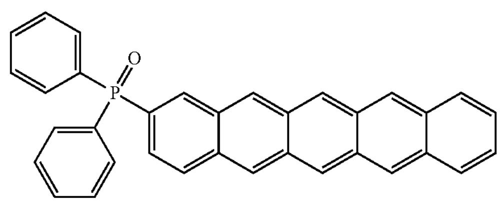
[58]
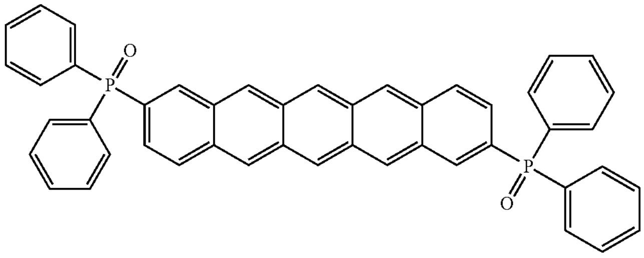

-continued
[Chemical Formula 104]
[59]
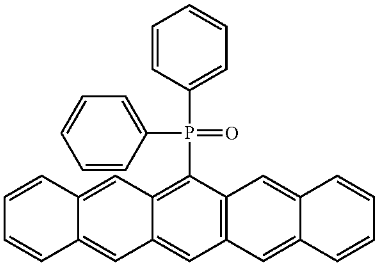
[60]
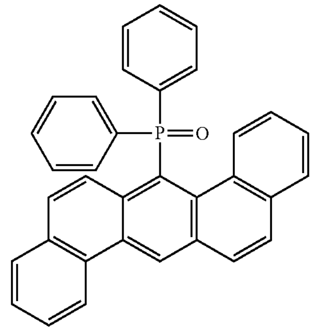
[61]
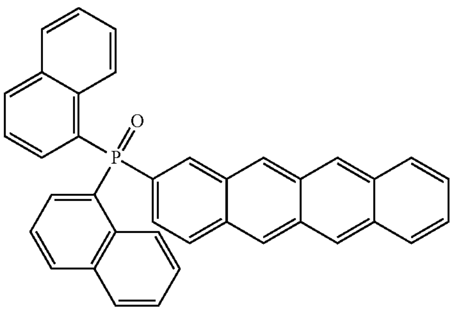
[62]
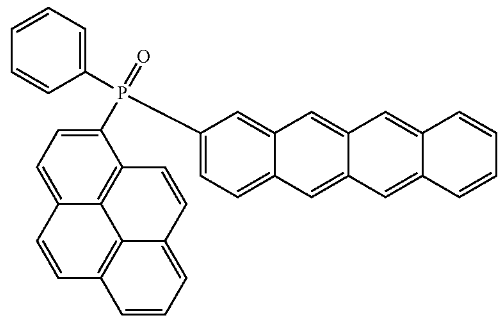
[63]
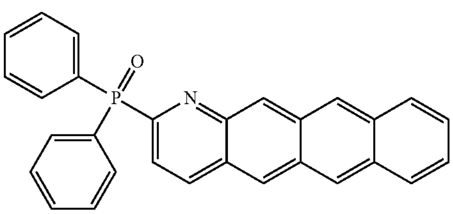
[64]
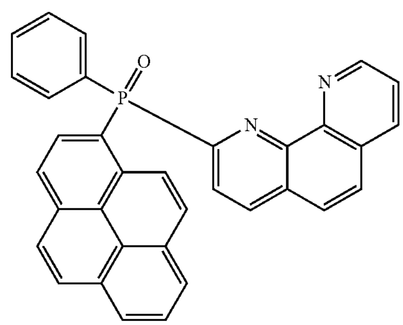
[65]
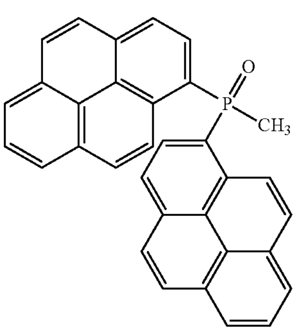
[66]
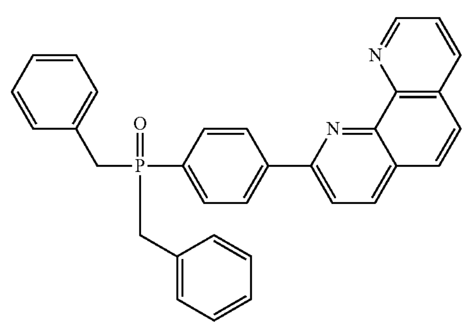

-continued

[67]

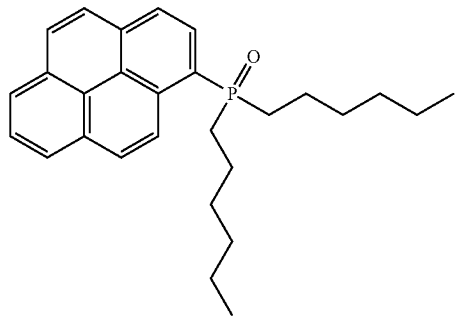

The compounds of the formulae (4) to (6) can provide the same excellent advantages as the compounds of the formulae (1) to (3).

In the aspect of the invention, a minimum triplet energy of the host material is in a range of 2.1 eV to 2.7 eV.

The host material, which exhibits Eg(T) of 2.1 eV to 2.7 eV, can transfer energy to the phosphorescent dopant exhibiting Eg(T) of 2.7 eV or less, more effectively 2.5 eV or less, thereby emitting phosphorescent light.

While an anthracene derivative, which is well-known as a fluorescent host, is not suitably applied as a host for red-emitting phosphorescent dopant, the host material according to the aspect of the invention, which exhibits Eg(T) of 2.1 eV or more, can be effectively applied for the red-emitting phosphorescent dopant to emit light.

However, while CBP, which is a conventionally-known phosphorescent host, can serve as a host even for a phosphorescent dopant for emitting light of a shorter wavelength than green, the host material according to the aspect of the invention, which exhibits Eg(T) of 2.7 eV or less, can be used for a green-emitting phosphorescent dopant but cannot be used for a phosphorescent dopant for emitting light of a shorter wavelength than green.

Conventionally, CBP and the like exhibiting a large Eg(T) have been used as the host because the host material is selected so as to be applicable for a broad range of phosphorescent dopants from a blue-emitting phosphorescent dopant to a red-emitting phosphorescent dopant.

However, CBP shortens emission lifetime although exhibiting a large Eg(T).

In this respect, the host according to the aspect of the invention, which includes 10 to 30 ring-forming atoms of the polycyclic fused aromatic skeleton (not including atoms of the substituent) and exhibits Eg(T) of 2.1 eV to 2.7 eV, is not applicable as a host for such a wide-gap phosphorescent dopant as to be comparable to a blue-emitting phosphorescent dopant, but is applicable as a host for a phosphorescent dopant exhibiting Eg(T) of 2.7 eV or less.

Moreover, when Eg(T) is excessively large as Eg(T) of CBP, a difference in Eg(T) between the phosphorescent dopant and the host against the red-emitting phosphorescent dopant is increased, so that intermolecular energy cannot be effectively transferred.

In contrast, since the host material according to the aspect of the invention exhibits Eg(T) suitable for a red-emitting phosphorescent dopant, energy can be efficiently transferred from the host to the phosphorescent dopant, thereby providing a phosphorescent-emitting layer of considerably high efficiency.

The triplet energy gap Eg(T) of the material can be defined based on, for example, phosphorescent spectrum.

For instance, in the aspect of the invention, the triplet energy gap Eg(T) may be defined as follows.

Specifically, the materials each are dissolved in an EPA solvent (diethylether:isopentane:ethanol=5:5:2 in volume ratio) with a concentration of 10 μmol/L, thereby forming a sample for phosphorescence measurement.

Then, the sample for phosphorescence measurement is put into a quartz cell, cooled to 77K and irradiated with exciting light, so that a wavelength of phosphorescence radiated therefrom is measured.

A tangent line is drawn to be tangent to a rising section adjacent to short-wavelength of the obtained phosphorescence spectrum, a wavelength value at an intersection of the tangent line and a base line measured from absorbance is obtained.

The obtained wavelength value is converted into energy value, and the converted energy value is defined as the Eg(T).

For the measurement, for instance, a commercially-available measuring equipment F-4500 (manufactured by Hitachi, Ltd.) can be used.

However, Eg(T) does not need to be defined by the above method, but may be defined by any other suitable method as long as an object and a spirit of the present invention are not impaired.

According to the aspect of the invention, the ring-forming atoms of the polycyclic fused aromatic skeleton (not including atoms of the substituent) are preferably from 10 to 30.

When the ring-forming atoms of the polycyclic fused aromatic skeleton (not including atoms of the substituent) are excessively few, stability of molecules is not sufficiently enhanced. Accordingly, the ring-forming atoms of the polycyclic fused aromatic skeleton (not including atoms of the substituent) are defined as 10 or more.

On the other hand, the number of the rings of the polycyclic fused aromatic skeleton is excessively large, HOMO-LUMO gap becomes narrow to decrease Eg(T). In this case, energy cannot be reliably transferred to a phosphorescent dopant for phosphorescent emission of a useful wavelength. Accordingly, the ring-forming atoms of the polycyclic fused aromatic skeleton (not including atoms of the substituent) are defined as 30 or less.

The ring-forming atoms of the polycyclic fused aromatic skeleton (not including atoms of the substituent) are more preferably from 15 to 30, further preferably 20 to 30.

In the organic electroluminescence device according to the aspect of the invention, it is preferable that the organic thin-film layer includes a hole transporting layer provided closer to the anode than the phosphorescent-emitting layer and the hole transporting layer contains at least one of compounds represented by formulae (7) to (11) below.

[Chemical Formula 105]

(7)

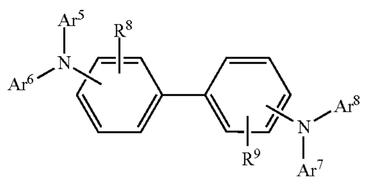

[Chemical Formula 106]

(8)

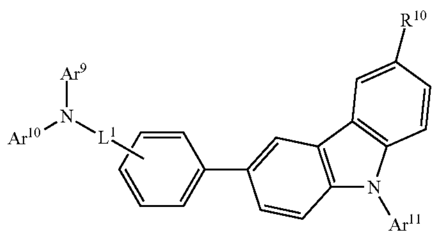

[Chemical Formula 107]

(9)

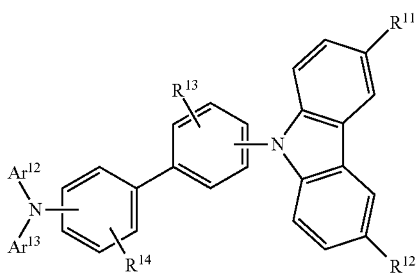

[Chemical Formula 108]

(10)

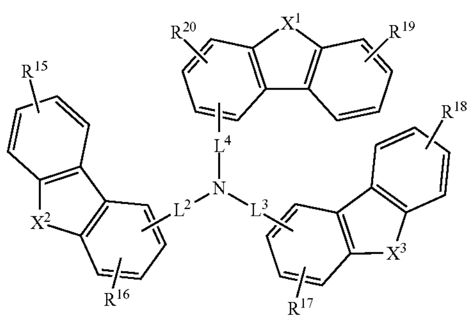

[Chemical Formula 109]

(11)

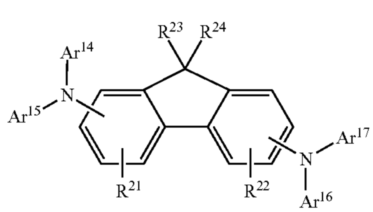

In the formulae (7) to (11), $Ar^5$ to $Ar^8$ each are a substituted or unsubstituted phenyl group, a substituted or unsubstituted biphenyl group, a substituted or unsubstituted terphenyl group or a substituted or unsubstituted phenanthrene group.

$Ar^9$ to $Ar^{17}$ each represent a substituted or unsubstituted aryl group having 5 to 40 carbon atoms, a substituted or unsubstituted aromatic heterocyclic group having 5 to 40 carbon atoms, a substituted or unsubstituted aryl group having 8 to 40 carbon atoms bonded with an aromatic amino group, or a substituted or unsubstituted aryl group having 8 to 40 carbon atoms bonded with an aromatic heterocyclic group.

$Ar^5$, $Ar^7$, $Ar^9$, $Ar^{12}$, $Ar^{14}$ and $Ar^{16}$ may be adapted to be respectively bonded to $Ar^6$, $Ar^8$, $Ar^{10}$, $Ar^{13}$, $Ar^{15}$ and $Ar^{17}$ to form a ring.

$L^1$ to $L^4$ represent a single bond or a linking group having 1 to 30 carbon atoms.

$R^8$ to $R^{24}$ each represent hydrogen, a halogen atom, a substituted or unsubstituted alkyl group having 1 to 40 carbon atoms, a substituted or unsubstituted heterocyclic group having 3 to 20 carbon atoms, a substituted or unsubstituted non-fused aryl group having 6 to 40 carbon atoms, a substituted or unsubstituted fused aryl group having 6 to 12 carbon atoms, a substituted or unsubstituted fused/non-fused-mixed aryl group having 12 to 40 Carbon atoms, a substituted or unsubstituted aralkyl group having 7 to 20 carbon atoms, a substituted or unsubstituted alkenyl group having 2 to 40 carbon atoms, a substituted or unsubstituted alkyl amino group having 1 to 40 carbon atoms, a substituted or unsubstituted aralkyl amino group having 7 to 60 carbon atoms, a substituted or unsubstituted alkylsilyl group having 3 to 20 carbon atoms, a substituted or unsubstituted arylsilyl group having 8 to 40 carbon atoms, a substituted or unsubstituted aralkylsilyl group having 8 to 40 carbon atoms, or a substituted or unsubstituted halogenated alkyl group having 1 to 40 carbon atoms.

$X^1$ to $X^3$ each represent a sulfur atom, an oxygen atom or a monoaryl-substituted nitrogen atom.

The compounds represented by the formulae (7) to (11), which exhibit hole injecting/transporting capability, are suitably usable as the hole transporting layer.

Further, the compounds represented by the formulae (7) to (11) each have a small Af. Accordingly, when these compounds are used for forming the hole transporting layer that is bonded to the phosphorescent emitting layer, the hole transporting layer exhibits an excellent blocking capability.

Furthermore, because all the compounds represented by the formulae (7) to (11) exhibit high electron tolerance, lifetime of the organic electroluminescence device is unlikely to be reduced even when electrons concentrate in electron blocking.

Since the host material having a large Eg(T), which is conventionally used as a phosphorescent host, also has a large Eg(S) and a small affinity level (Af), electrons injected from the cathode to the emitting layer are not recombined with holes in the emitting layer and are likely to be transferred into the anode.

In order to solve such a problem, there has been known a method of forming a hole injecting/transporting layer by a material having a smaller Af than the host material of the emitting layer, and trapping electrons in the emitting layer.

With this arrangement, electron blocking can enhance probability of recombination of charges in the emitting layer, thereby providing phosphorescent emission with high efficiency.

However, on electron blocking, the electrons concentrate on an interface between the emitting layer and the hole injecting/transporting layer. The concentration of the electron may promote degradation of the materials and reduce lifetime of the device. Accordingly, the hole injecting/transporting layer needs to be highly tolerant of the electrons.

Further, as the name implies, the hole injecting/transporting layer needs to have capability for injecting and transporting holes.

Thus, although an electron injecting/transporting layer of a phosphorescent organic electroluminescence device needs to have electron blocking capability and electron tolerance in addition to hole injecting/transporting capability, such a hole injecting/transporting material has not been developed.

On the other hand, in the organic electroluminescence device according to the aspect of the invention, the hole transporting layer is formed by using the compound represented by the formulae (7) to (11), so that the hole can be injected into the phosphorescent-emitting layer while the electrons are trapped in the phosphorescent-emitting layer, thereby enhancing probability of recombination of charges to obtain phosphorescent emission with high efficiency.

Although the electrons concentrate on the interface between the phosphorescent-emitting layer and the hole transporting layer in electron blocking, lifetime of the emission is unlikely to be reduced because the compounds represented by the formulae (7) to (11) have high electron tolerance.

Here, an affinity level Af (i.e. electron affinity) refers to ejected or absorbed energy when an electron is given to a molecule of a material, which is defined to be positive in the case of ejection and negative in the case of absorption.

Af is defined by an ionization potential Ip and an optical energy gap Eg(S) as follows.

$$Af=Ip-Eg(S)$$

Here, Ip refers to energy necessary for a compound of each material to remove electrons to ionize, for which a value measured with an ultraviolet ray photoelectron spectrometer (AC-3 manufactured by Riken Keiki Co., Ltd.).

Eg(S) refers to a difference between conductive level and covalent electron level, which can, for example, be defined by a wavelength value at an intersection of the tangent line adjacent to a long wavelength of an absorption spectrum and a base line measured from absorbance in a solution in which each material is dissolved in toluene being converted into energy value.

Further, the compounds represented by the formulae (7) to (11) have a high glass-transition temperature (Tg) and excellent heat resistance. Particularly, introduction of a substituent having a large molecular weight can enhance heat resistance of the hole transporting layer.

Here, α-NPD which has been typically used as a material for forming the hole transporting layer (see, for instance, US patent 2006-0088728) has Tg of 100 degrees C. or less, whereby heat resistance is insufficient.

On the other hand, the present invention can improve heat resistance of the organic electroluminescence device by applying the compounds having a high Tg represented by the formulae (7) to (11).

In the invention of US Patent 2006-0088728, a hole injection layer is formed of copper phthalocyanine compound.

However, since a copper complex compound absorbs wavelength in a visible region, a thickened layer thereof unfavorably becomes bluish. Moreover, since the copper complex compound has low amorphousness and high crystallinity, the copper complex compound has a difficulty in forming a thick layer and is very limitative in arrangement of the device.

On the other hand, the compounds represented by the formulae (7) to (11) do not significantly absorb the wavelength in the visible region and exhibit high amorphousness and low crystallinity, which is therefore suitable for forming a thick layer.

Accordingly, in the organic electroluminescence device of the invention, which employs the compounds represented by the formulae (7) to (11), various arrangements of the device are possible.

In the organic electroluminescence device disclosed in Patent Document 1, the hole transporting layer does not exhibit electron blocking capability or electron tolerance, so that high efficiency and long lifetime cannot be sufficiently obtained.

Examples of the halogen atom of $R^8$ to $R^{24}$ in the formulae (7) to (11) are fluorine, chlorine, bromine and iodine.

Examples of the substituted or unsubstituted alkyl group having 1 to 40 carbon atoms at $R^8$ to $R^{24}$ in the above formulae (7) to (11) are a methyl group, ethyl group, propyl group, isopropyl group, n-butyl group, s-butyl group, isobutyl group, t-butyl group, n-pentyl group, n-hexyl group, n-heptyl group, n-octyl group, n-nonyl group, n-decyl group, n-undecyl group, n-dodecyl group, n-tridecyl group, n-tetradecyl group, n-pentadecyl group, n-hexadecyl group, n-heptadecyl group, n-octadecyl group, neo-pentyl group, 1-methylpentyl group, 2-methylpentyl group, 1-pentylhexyl group, 1-butylpentyl group, 1-heptyloctyl group, 3-methylpentyl group, hydroxymethyl group, 1-hydroxyethyl group, 2-hydroxyethyl group, 2-hydroxyisobutyl group, 1,2-dihydroroxyethyl group, 1,3-dihydroxyisopropyl group, 2,3-dihydroxy-t-butyl group, 1,2,3-trihydroxypropyl group, chloromethyl group, 1-chloroethyl group, 2-chloroethyl group, 2-chloroisobutyl group, 1,2-dichloroethyl group, 1,3-dichloroisopropyl group, 2,3-dichloro-t-butyl group, 1,2,3-trichloropropyl group, bromomethyl group, 1-bromoethyl group, 2-bromoethyl group, 2-bromoisobutyl group, 1,2-dibromoethyl group, 1,3-dibromoisopropyl group, 2,3-dibromo-t-butyl group, 1,2,3-tribromopropyl group, iodomethyl group, 1-iodoethyl group, 2-iodoethyl group, 2-iodoisobutyl group, 1,2-diiodoethyl group, 1,3-diiodoisopropyl group, 2,3-diiodo-t-butyl group, 1,2,3-triiodopropyl group, aminomethyl group, 1-aminoethyl group, 2-aminoethyl group, 2-aminoisobutyl group, 1,2-diaminoethyl group, 1,3-diaminoisopropyl group, 2,3-diamino-t-butyl group, 1,2,3-triaminopropyl group, cyanomethyl group, 1-cyanoethyl group, 2-cyanoethyl group, 2-cyanoisobutyl group, 1,2-dicyanoethyl group, 1,3-dicyanoisopropyl group, 2,3-dicyano-t-butyl group, 1,2,3-tricyanopropyl group, nitromethyl group, 1-nitroethyl group, 2-nitroethyl group, 1,2-dinitroethyl group, 2,3-dinitro-t-butyl group, 1,2,3-trinitropropyl group, cyclopentyl group, cyclohexyl group, cyclooctyl group and 3,5-tetramethyl cyclohexyl group.

Among the above, the alkyl group is preferably a methyl group, ethyl group, propyl group, isopropyl group, n-butyl group, s-butyl group, isobutyl group, t-butyl group, n-pentyl group, n-hexyl group, n-heptyl group, n-octyl group, n-nonyl group, n-decyl group, n-undecyl group, n-dodecyl group, n-tridecyl group, n-tetradecyl group, n-pentadecyl group, n-hexadecyl group, n-heptadecyl group, n-octadecyl group, neo-pentyl group, 1-methylpentyl group, 1-pentylhexyl group, 1-butylpentyl group, 1-heptyloctyl group, cyclohexyl group, cyclooctyl group and 3,5-tetramethyl cyclohexyl group.

Examples of the substituted or unsubstituted heterocyclic group having 3 to 20 carbon atoms at $R^8$ to $R^{24}$ in the formulae (7) to (11) are a 1-pyroryl group, 2-pyroryl group, 3-pyroryl group, pyrazinyl group, 2-pyridinyl group, 1-imidazolyl, 2-imidazolyl, 1-pyrazolyl, 1-indolidinyl, 2-indolidinyl, 3-indolidinyl, 5-indolidinyl, 6-indolidinyl, 7-indolidinyl, 8-indolidinyl, 2-imidazopyridinyl, 3-imidazopyridinyl, 5-imidazopyridinyl, 6-imidazopyridinyl, 7-imidazopyridinyl, 8-imidazopyridinyl, 3-pyridinyl group, 4-pyridinyl group, 1-indolyl group, 2-indolyl group, 3-indolyl group, 4-indolyl group, 5-indolyl group, 6-indolyl group, 7-indolyl group, 1-isoindolyl group, 2-isoindolyl group, 3-isoindolyl group, 4-isoindolyl group, 5-isoindolyl group, 6-isoindolyl group, 7-isoindolyl group, 2-furyl group, 3-furyl group, 2-benzofuranyl group, 3-benzofuranyl group, 4-benzofuranyl group, 5-benzofuranyl group, 6-benzofuranyl group, 7-benzofuranyl group, 1-isobenzofuranyl group, 3-isobenzofuranyl group, 4-isobenzofuranyl group, 5-isobenzofuranyl group, 6-isobenzofuranyl group, 7-isobenzofuranyl group, 2-quinolyl group, 3-quinolyl group, 4-quinolyl group, 5-quinolyl group, 6-quinolyl group, 7-quinolyl group, 8-quinolyl group, 1-isoquinolyl group, 3-isoquinolyl group, 4-isoquinolyl group, 5-isoquinolyl group, 6-isoquinolyl group, 7-isoquinolyl group, 8-isoquinolyl group, 2-quinoxalinyl group, 5-quinoxalinyl group, 6-quinoxalinyl group, 1-carbazolyl group, 2-carbazolyl group, 3-carbazolyl group, 4-carbazolyl group, 9-carbazolyl group, β-carboline-1-yl, β-carboline-3-yl, β-carboline-4-yl, β-carboline-5-yl, β-carboline-6-yl, β-carboline-7-yl, β-carboline-6-yl, β-carboline-9-yl, 1-phenanthrydinyl group, 2-phenanthrydinyl group, 3-phenanthrydinyl group, 4-phenanthrydinyl group, 6-phenanthrydinyl group, 7-phenanthrydinyl group, 8-phenanthrydinyl group, 9-phenanthrydinyl group, 10-phenanthrydinyl group, 1-acridinyl group, 2-acridinyl group, 3-acridinyl group, 4-acridinyl group, 9-acridinyl group, 1,7-phenanthroline-2-yl group, 1,7-phenanthroline-3-yl group, 1,7-phenanthroline-4-yl group, 1,7-phenanthroline-5-yl group, 1,7-phenanthroline-6-yl group, 1,7-phenanthroline-8-yl group, 1,7-phenanthroline-9-yl group, 1,7-phenanthroline-10-yl group, 1,8-phenanthroline-2-yl group, 1,8-phenanthroline-3-yl group, 1,8-phenanthroline-4-yl group, 1,8-phenanthroline-5-yl group, 1,8-phenanthroline-6-yl group, 1,8-phenanthroline-7-yl group, 1,8-phenanthroline-9-yl group, 1,8-phenanthroline-10-yl group, 1,9-phenanthroline-2-yl group, 1,9-phenanthroline-3-yl group, 1,9-phenanthroline-4-yl group, 1,9-phenanthroline-5-yl group, 1,9-phenanthroline-6-yl group, 1,9-phenanthroline-7-yl group, 1,9-phenanthroline-8-yl group, 1,9-phenanthroline-10-yl group, 1,10-phenanthroline-2-yl group, 1,10-phenanthroline-3-yl group, 1,10-phenanthroline-4-yl group, 1,10-phenanthroline-5-yl group, 2,9-phenanthroline-1-yl group, 2,9-phenanthroline-3-yl group, 2,9-phenanthroline-4-yl group, 2,9-phenanthroline-5-yl group, 2,9-phenanthroline-6-yl group, 2,9-phenanthroline-7-yl group, 2,9-phenanthroline-8-yl group, 2,9-phenanthroline-10-yl group, 2,8-phenanthroline-1-yl group, 2,8-phenanthroline-3-yl group, 2,8-phenanthroline-4-yl group, 2,8-phenanthroline-5-yl group, 2,8-phenanthroline-6-yl group, 2,8-phenanthroline-7-yl group, 2,8-phenanthroline-9-yl group, 2,8-phenanthroline-10-yl group, 2,7-phenanthroline-1-yl group, 2,7-phenanthroline-3-yl group, 2,7-phenanthroline-4-yl group, 2,7-phenanthroline-5-yl group, 2,7-phenanthroline-6-yl group, 2,7-phenanthroline-8-yl group, 2,7-phenanthroline-9-yl group, 2,7-phenanthroline-10-yl group, 1-phenazinyl group, 2-phenazinyl group, 1-phenothiazinyl group, 2-phenothiazinyl group, 3-phenothiazinyl group, 4-phenothiazinyl group, 10-phenothiazinyl group, 1-phenoxazinyl group, 2-phenoxazinyl group, 3-phenoxazinyl group, 4-phenoxazinyl group, 10-phenoxazinyl group, 2-oxazolyl group, 4-oxazolyl group, 5-oxazolyl group, 2-oxadiazolyl group, 11-oxadiazolyl group, 3-furazanyl group, 2-thienyl group, 3-thienyl group, 2-methylpyrrole-1-yl group, 2-methylpyrrole-3-yl group, 2-methylpyrrole-4-yl group, 2-methylpyrrole-5-yl group, 3-methylpyrrole-1-yl group, 3-methylpyrrole-2-yl group, 3-methylpyrrole-4-yl group, 3-methylpyrrole-5-yl group, 2-t-butylpyrrole-4-yl group, 3-(2-phenylpropyl)pyrrole-1-yl group, 2-methyl-1-indolyl group, 4-methyl-1-indolyl group, 2-methyl-3-indolyl group, 4-methyl-3-indolyl group, 2-t-butyl-1-indolyl group, 4-t-butyl-1-indolyl group, 2-t-butyl-3-indolyl group, 4-t-butyl-3-indolyl group, 1-dibenzofuranyl group, 2-dibenzofuranyl group, 3-dibenzofuranyl group, 4-dibenzofuranyl group, 1-dibenzothiophenyl group, 2-dibenzothiophenyl group, 3-dibenzothiophenyl group, 4-dibenzothiophenyl group, 1-silafluorenyl group, 2-silafluorenyl group, 3-silafluorenyl group, 4-silafluorenyl group, 1-germafluorenyl group, 2-germafluorenyl group, 3-germafluorenyl group and 4-germafluorenyl group.

Among the above, the heterocyclic group is preferably a 2-pyridinyl group, 1-indolidinyl, 2-indolidinyl, 3-indolidinyl, 5-indolidinyl, 6-indolidinyl, 7-indolidinyl, 8-indolidinyl, 2-imidazopyridinyl, 3-imidazopyridinyl, 5-imidazopyridinyl, 6-imidazopyridinyl, 7-imidazopyridinyl, 8-imidazopyridinyl, 3-pyridinyl group, 4-pyridinyl group, 1-indolyl group, 2-indolyl group, 3-indolyl group, 4-indolyl group, 5-indolyl group, 6-indolyl group, 7-indolyl group, 1-isoindolyl group, 2-isoindolyl group, 3-isoindolyl group, 4-isoindolyl group, 5-isoindolyl group, 6-isoindolyl group, 7-isoindolyl group, 1-carbazolyl group, 2-carbazolyl group, 3-carbazolyl group, 4-carbazolyl group, 9-carbazolyl group, 1-dibenzofuranyl group, 2-dibenzofuranyl group, 3-dibenzofuranyl group, 4-dibenzofuranyl group, 1-dibenzothiophenyl group, 2-dibenzothiophenyl group, 3-dibenzothiophenyl group, 4-dibenzothiophenyl group, 1-silafluorenyl group, 2-silafluorenyl group, 3-silafluorenyl group, 4-silafluorenyl group, 1-germafluorenyl group, 2-germafluorenyl group, 3-germafluorenyl group and 4-germafluorenyl group.

Examples of the substituted or unsubstituted non-fused aryl group having 6 to 40 carbon atoms at $R^8$ to $R^{24}$ in the formulae (7) to (11) are a phenyl group, 2-biphenylyl group, 3-biphenylyl group, 4-biphenylyl group, p-terphenyl-4-yl group, p-terphenyl-3-yl group, p-terphenyl-2-yl group, m-terphenyl-4-yl group, m-terphenyl-3-yl group, m-terphenyl-2-yl group, o-tolyl group, m-tolyl group, p-tolyl group, p-t-butylphenyl group, p-(2-phenylpropyl)phenyl group, 4'-methylbiphenylyl group, 4"-t-butyl-p-terphenyl-4-yl group, o-cumenyl group, m-cumenyl group, p-cumenyl group, 2,3-xylyl group, 3,4-xylyl group, 2,5-xylyl group, mesityl group and m-quarter-phenyl group.

Among the above, the non-fused aryl group is preferably a phenyl group, 2-biphenylyl group, 3-biphenylyl group, 4-biphenylyl group, m-terphenyl-4-yl group, m-terphenyl-3-yl group, m-terphenyl-2-yl group, p-tolyl group, 3,4-xylyl group and m-quarter-phenyl-2-yl group.

Examples of the substituted or unsubstituted fused aryl group having 6 to 12 carbon atoms at $R^8$ to $R^{24}$ in the formulae (7) to (11) are a 1-naphthyl group and 2-naphthyl group.

A substituted or unsubstituted fused/non-fused-mixed aryl group having 12 to 40 carbon atoms at $R^8$ to $R^{24}$ in the formulae (7) to (11) is exemplified by a group in combination of the substituted or unsubstituted fused aryl group having 6 to 12 carbon atoms with the substituted or unsubstituted non-fused aryl group having carbon atoms of 6 to 40.

Examples of the substituted or unsubstituted aralkyl group having 7 to 20 carbon atoms at $R^8$ to $R^{24}$ in the above formulae (7) to (11) are a benzyl group, 1-phenylethyl group, 2-phenylethyl group, 1-phenylisopropyl group, 2-phenylisopropyl group, phenyl-t-butyl group, α-naphthylmethyl group, 1-α-naphthylethyl group, 2-α-naphthylethyl group, 1-α-naphthylisopropyl group, 2-α-naphthylisopropyl group, β-naphthylmethyl group, 1-α-naphthylethyl group, 2-α-naphthylethyl group, 1-α-naphthylisopropyl group, 2-α-naphthylisopropyl group, 1-pyrorylmethyl group, 2-(1-pyroryl)ethyl group, p-methylbenzyl group, m-methylbenzyl group, o-methylbenzyl group, p-chlorobenzyl group, m-chlorobenzyl group, o-chlorobenzyl group, p-bromobenzyl group, m-bromobenzyl group, o-bromobenzyl group, p-iodobenzyl group, m-iodobenzyl group, o-iodobenzyl group, p-hydroxybenzyl group, m-hydroxybenzyl group, o-hydroxybenzyl group, p-aminobenzyl group, m-aminobenzyl group, o-aminobenzyl group, p-nitrobenzyl group, m-nitrobenzyl group, o-nitrobenzyl group, p-cyanobenzyl group, m-cyanobenzyl group, o-cyanobenzyl group, 1-hydroxy-2-phenylisopropyl group and 1-chloro-2-phenyl isopropyl group.

Among the above, the aralkyl group is preferably a benzyl group, p-cyanobenzyl group, m-cyanobenzyl group, o-cyanobenzyl group, 1-phenylethyl group, 2-phenylethyl group, 1-phenylisopropyl group and 2-phenylisopropyl group.

Examples of the substituted or unsubstituted alkenyl group having 2 to 40 carbon atoms at $R^8$ to $R^{24}$ in the above formulae (7) to (11) are a vinyl group, allyl group, 1-butenyl group, 2-butenyl group, 3-butenyl group, 1,3-butanedienyl group, 1-methylvinyl group, styryl group, 2,2-diphenylvinyl group, 1,2-diphenylvinyl group, 1-methylallyl group, 1,1-dimethylallyl group, 2-methylallyl group, 1-phenylallyl group, 2-phenylallyl group, 3-phenylallyl group, 3,3-diphenylallyl group, 1,2-dimethylallyl group, 1-phenyl-1-butenyl group and 3-phenyl-1-butenyl group, among which a styryl group, 2,2-diphenylvinyl group, 1,2-diphenylvinyl group and the like are preferable.

A substituted or unsubstituted alkyl amino group having 1 to 40 carbon atoms at $R^8$ to $R^{24}$ in the formulae (7) to (11) and a substituted or unsubstituted aralkyl amino group having 7 to 60 carbon atoms are represented by —$NQ^1Q^2$. Specific examples for each of $Q^1$ and $Q^2$ are the same as the examples described in relation to the alkyl group, the aryl group and the aralkyl group, and preferable examples for each of $Q^1$ and $Q^2$ are also the same as those described in relation to the alkyl group, the aryl group and the aralkyl group.

Examples of the substituted or unsubstituted alkylsilyl group having 3 to 20 carbon atoms at $R^8$ to $R^{24}$ in the above formulae (7) to (11) are a trimethylsilyl group, triethylsilyl group, t-butyldimethylsilyl group, vinyldimethylsilyl group and propyldimethylsilyl group.

Examples of the substituted or unsubstituted arylsilyl group having 8 to 40 carbon atoms at $R^8$ to $R^{24}$ in the above formulae (7) to (11) are a triphenylsilyl group, tribiphenylsilyl group, di-terphenyl-phenylsilyl group, phenyldimethylsilyl group and t-butyldiphenylsilyl group.

Examples of the substituted or unsubstituted aralkylsilyl group having 8 to 40 carbon atoms at $R^8$ to $R^{24}$ in the above formulae (7) to (11) are a tribenzylsilyl group, benzyldimethylsilyl group and t-butyldibenzylsilyl group.

Examples of the substituted or unsubstituted halogenated alkyl group having 1 to 40 carbon atoms at $R^8$ to $R^{24}$ in the above formulae (7) to (11) are a halogenated alkyl group in which at least one hydrogen atom of the alkyl group is substituted by a halogen atom, all of which are suitably used.

Specific examples of the compounds represented by the above formulae (7) to (11) will be shown below, but not limitative.

Examples of the compounds represented by the formula (7) are as follows.

[Chemical Formula 110]

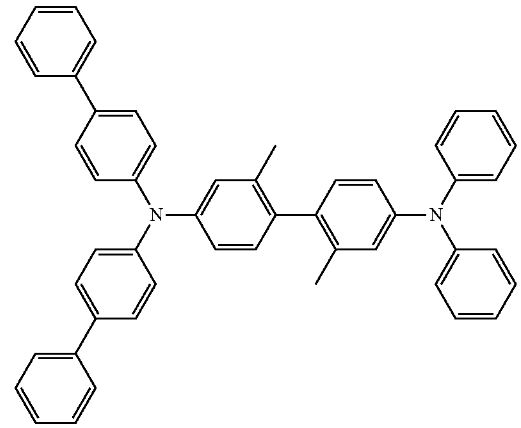

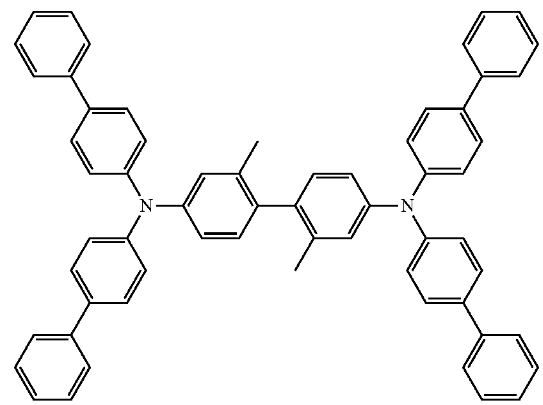

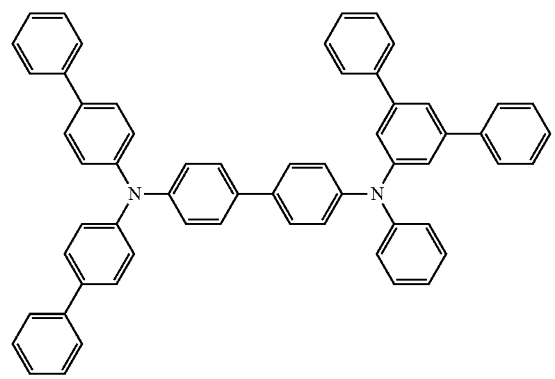

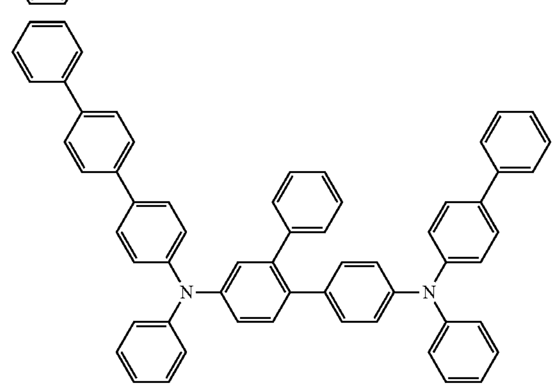

-continued
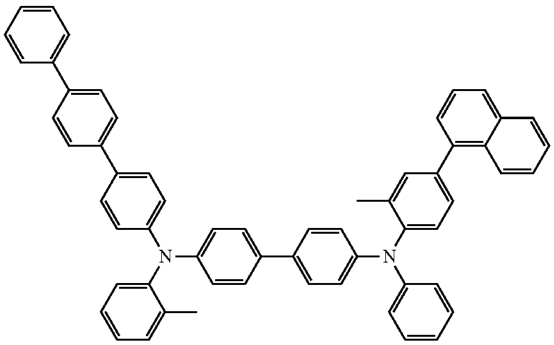
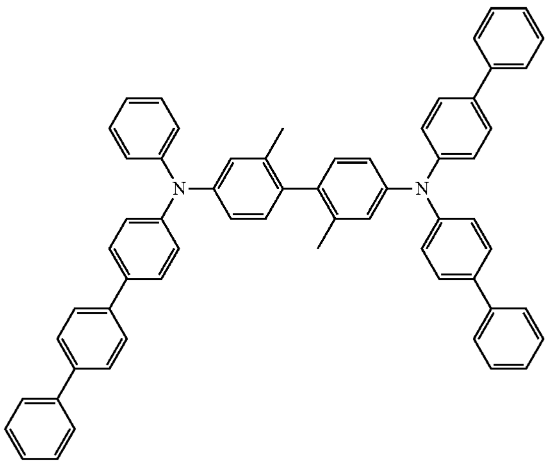
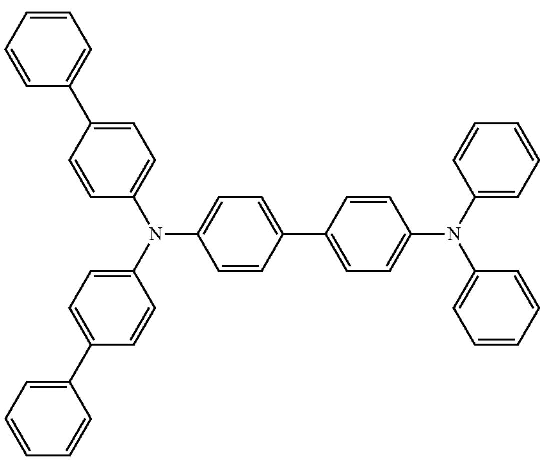
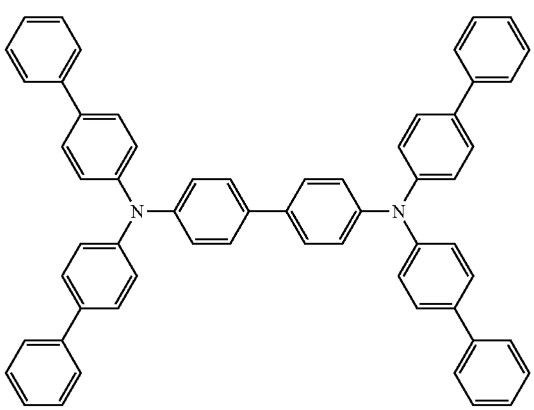
-continued
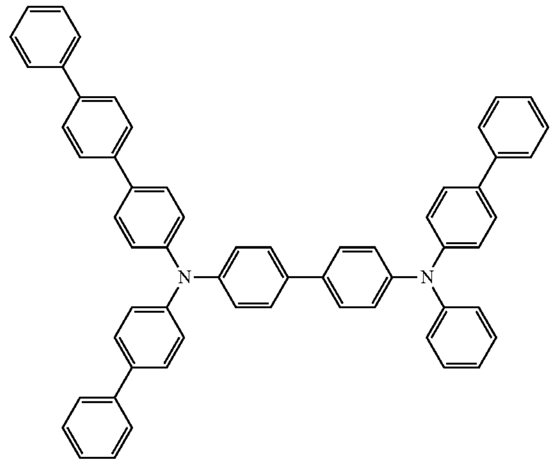
[Chemical Formula 111]
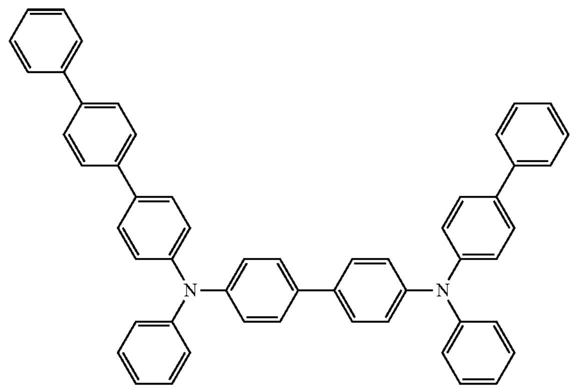
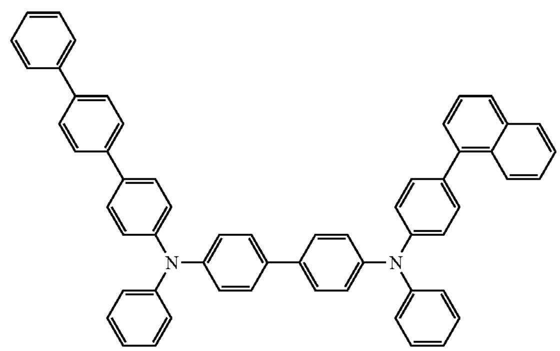
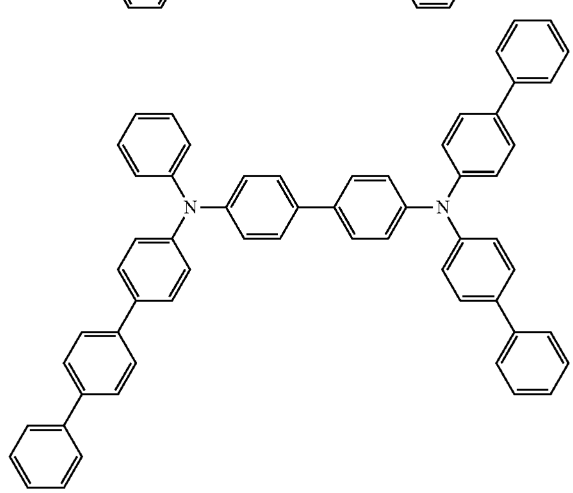

-continued
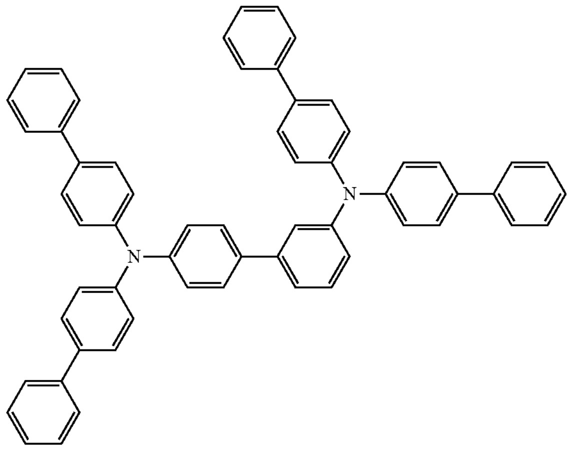
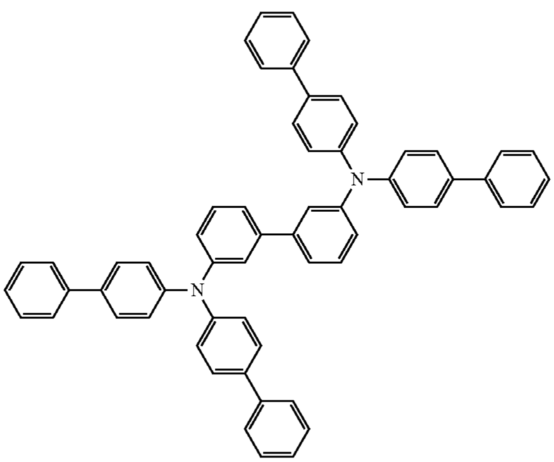
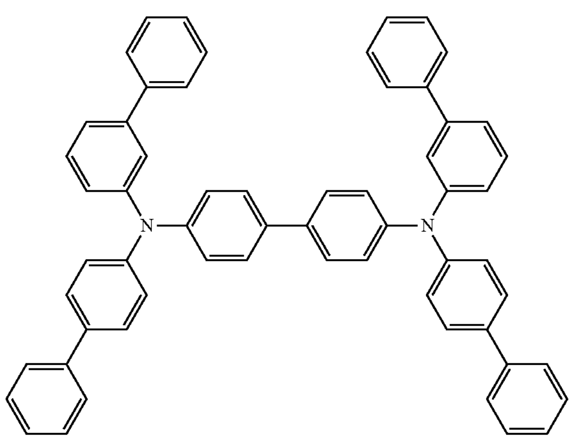
Examples of the compounds represented by the formula (8) are as follows.
[Chemical Formula 112]
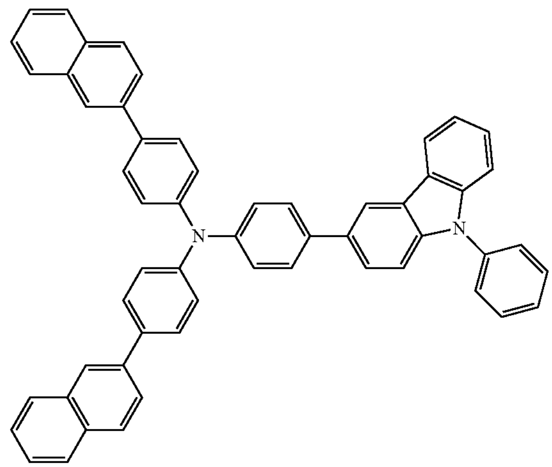
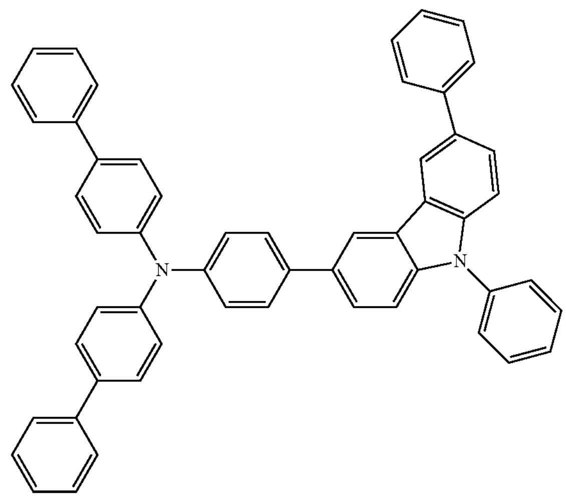
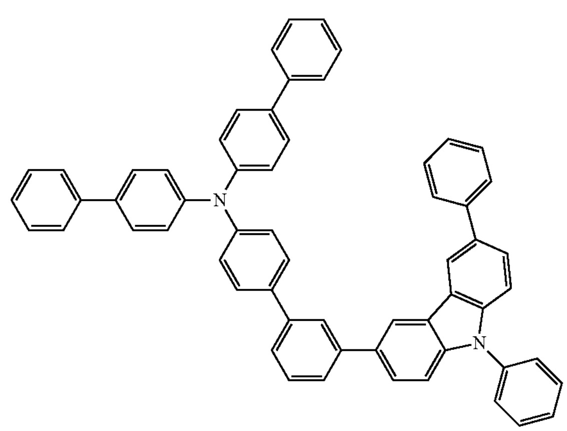

-continued
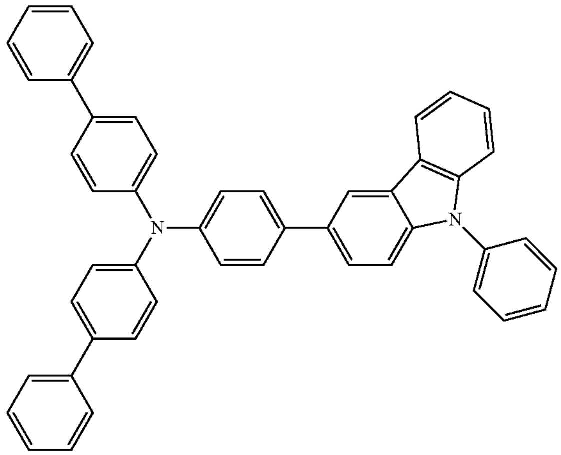
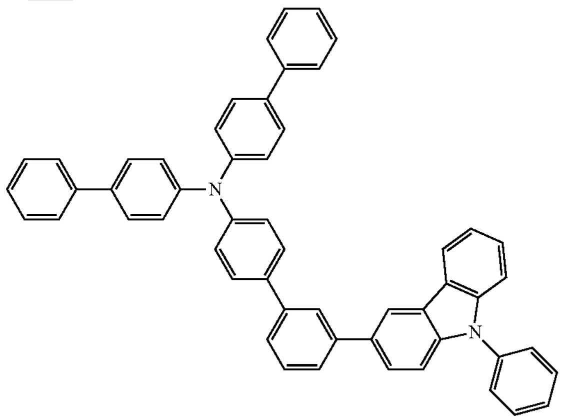
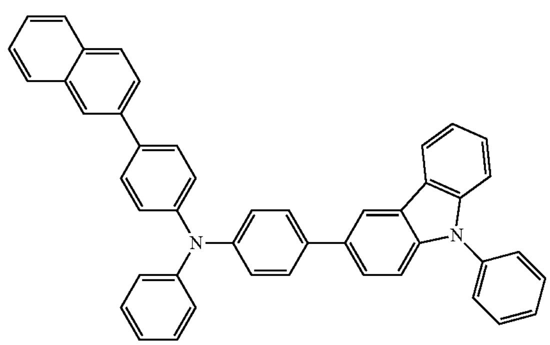
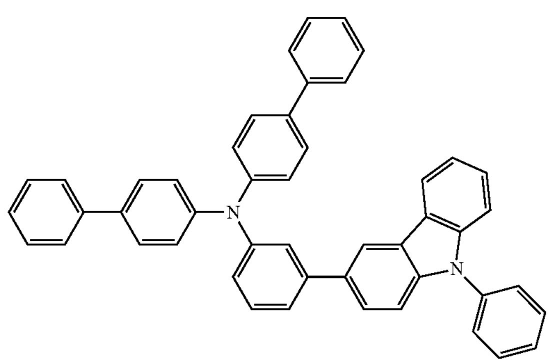
-continued
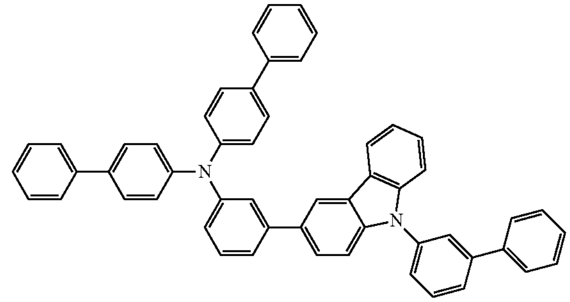
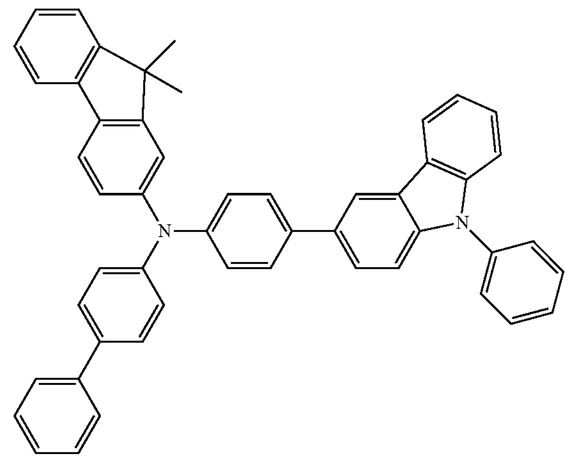
[Chemical Formula 113]
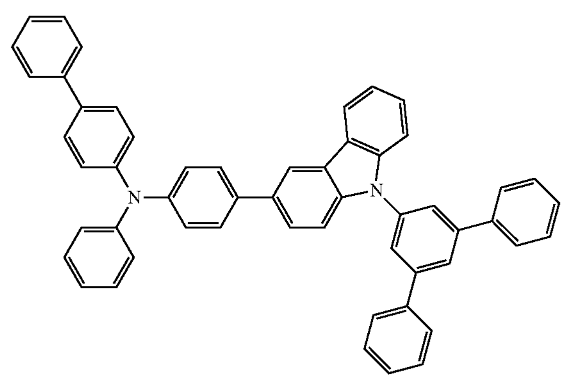
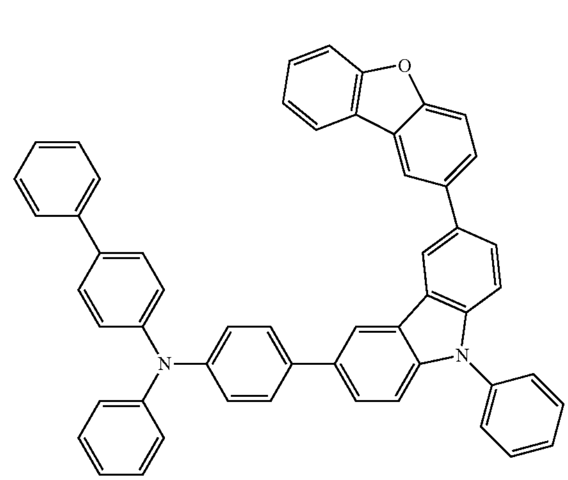

-continued
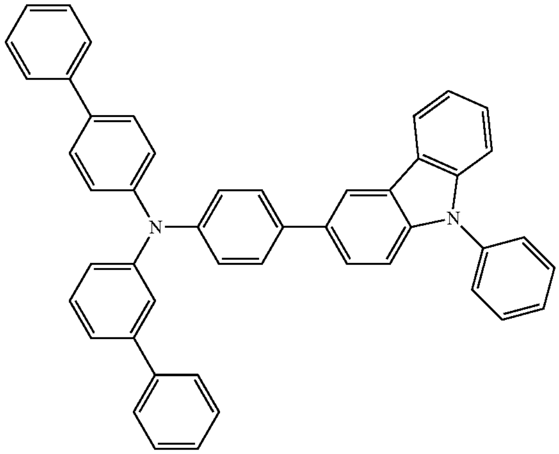
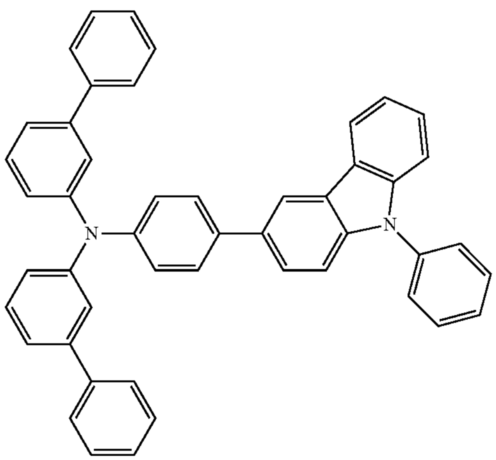
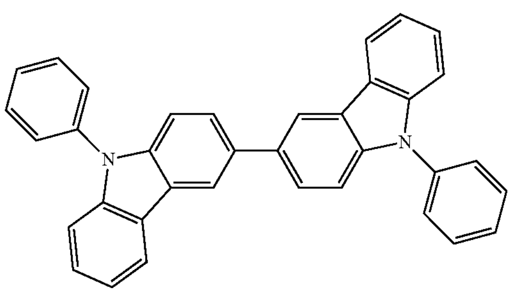
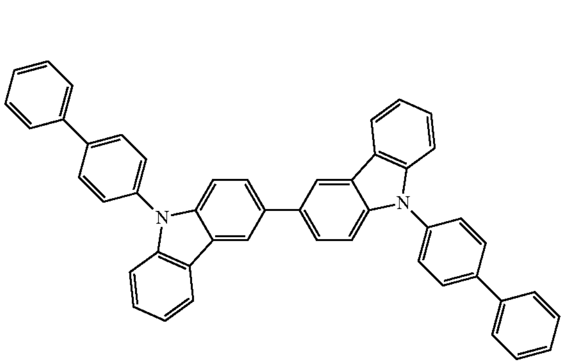
-continued
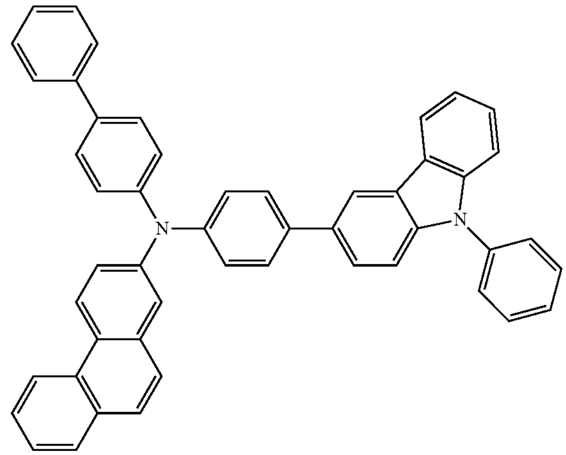
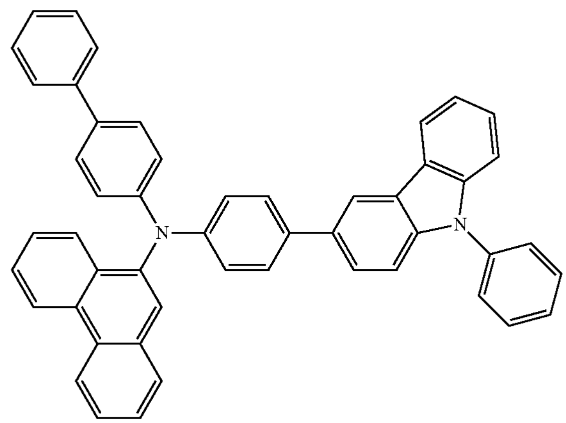
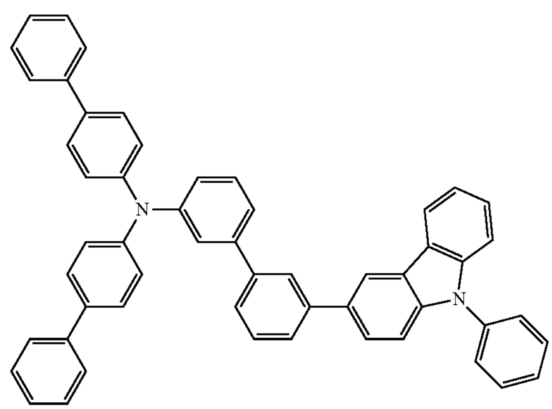
Examples of the compounds represented by the formula (9) are as follows.

[Chemical Formula 114]
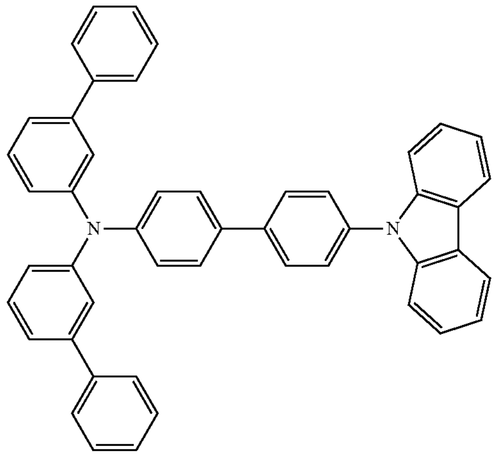
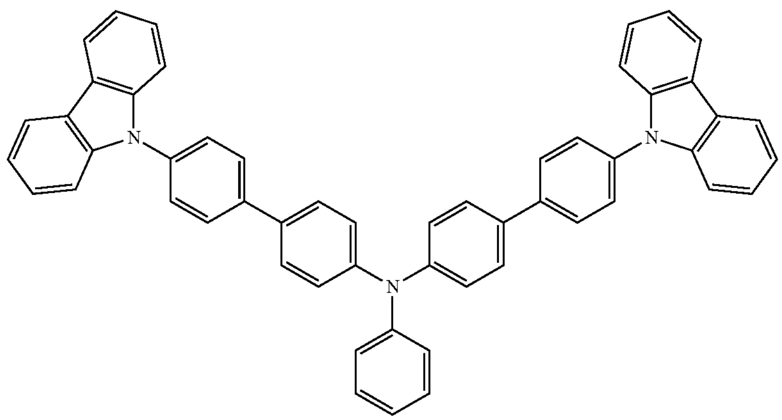
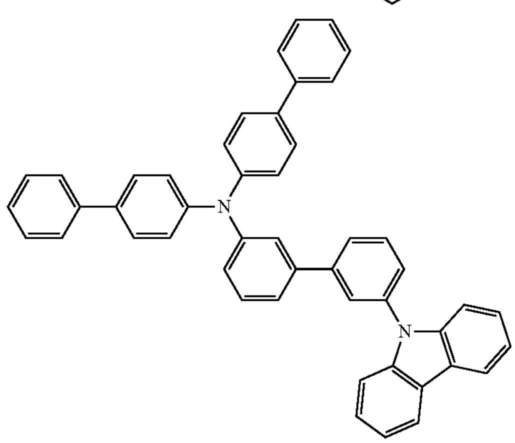
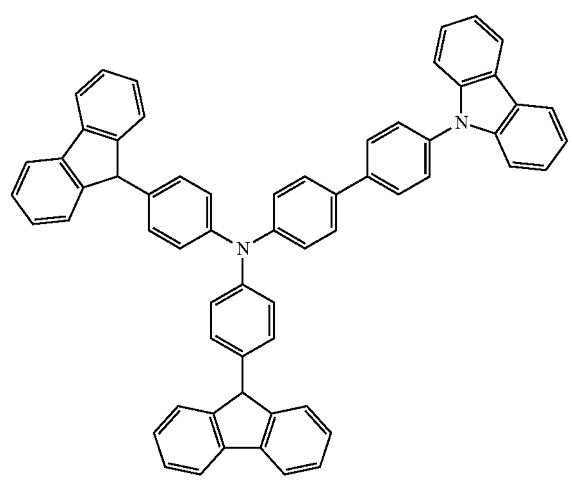
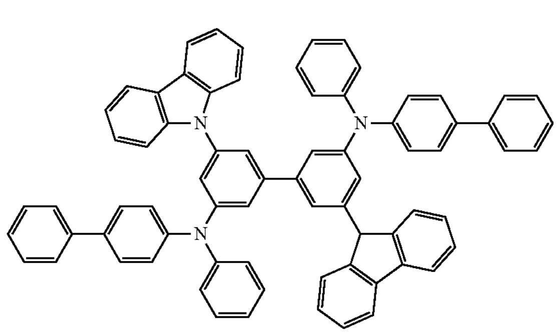
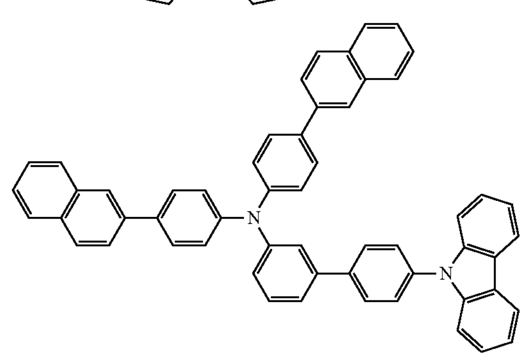

-continued
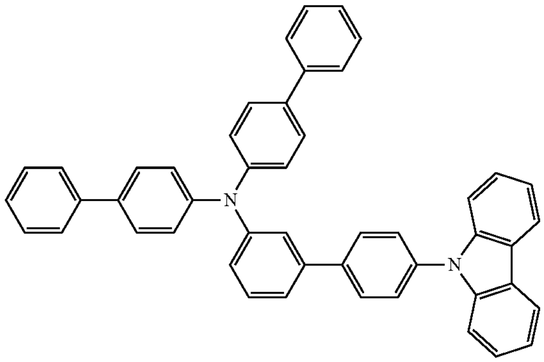
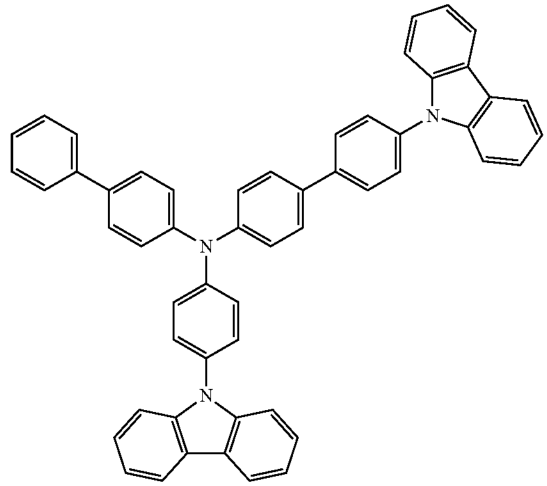
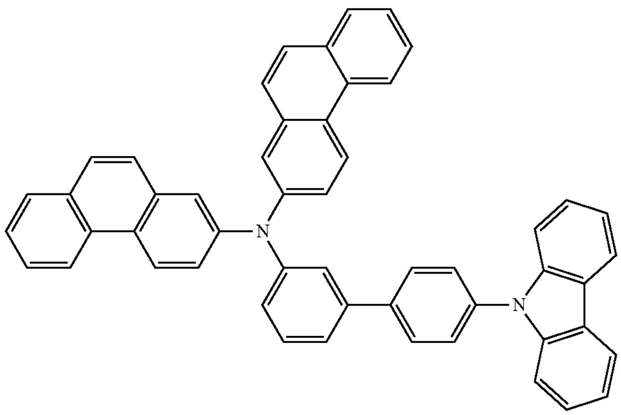
Examples of the compounds represented by the formula (10) are as follows.
[Chemical Formula 115]
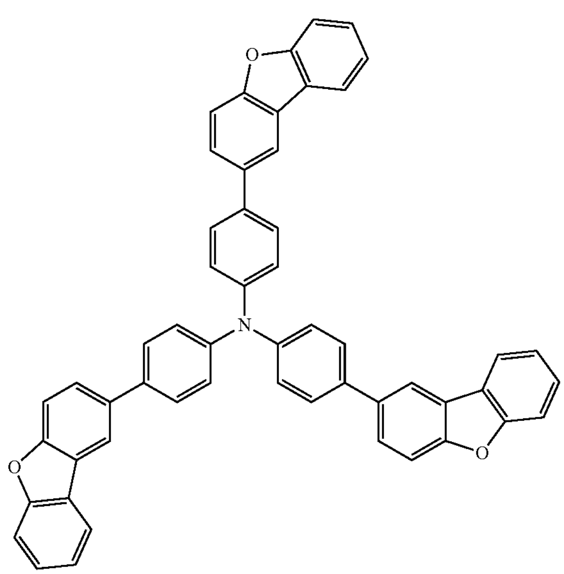
-continued
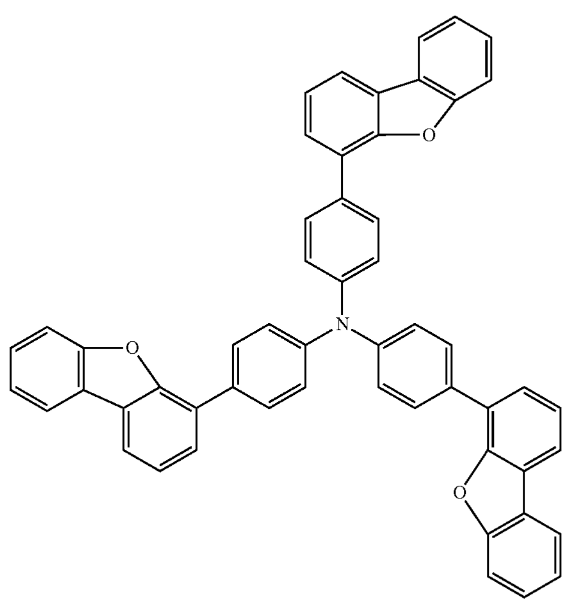

-continued
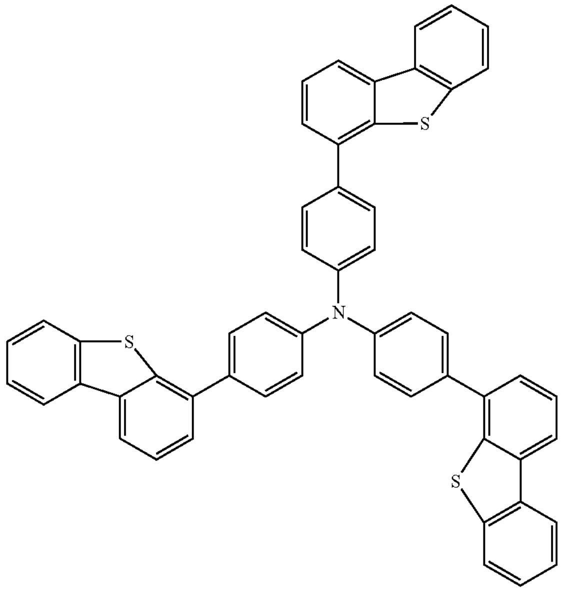
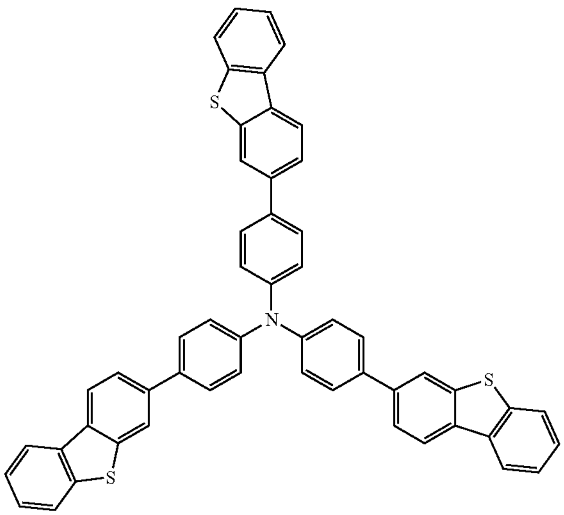
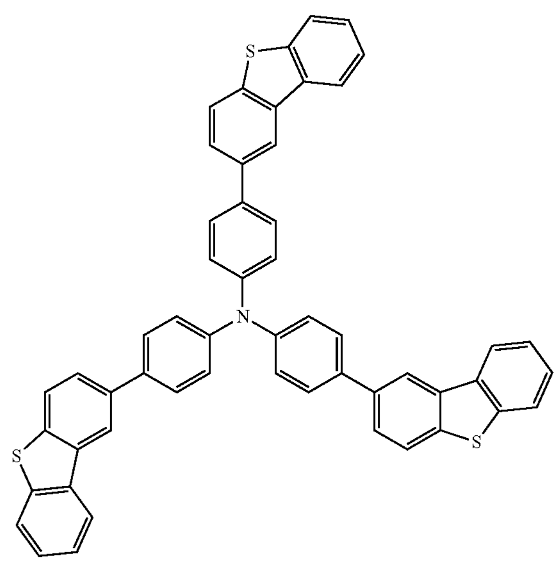
-continued
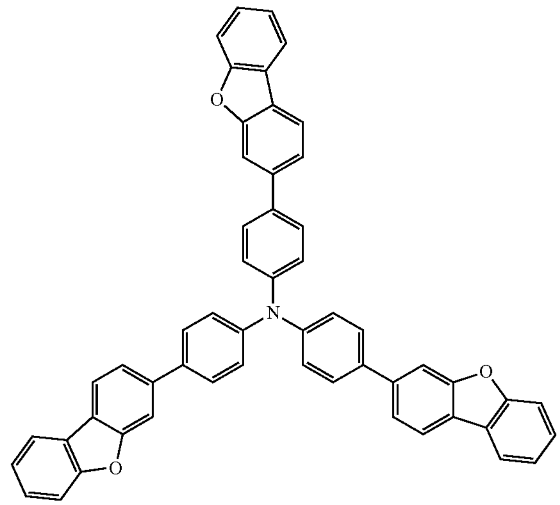
[Chemical Formula 116]
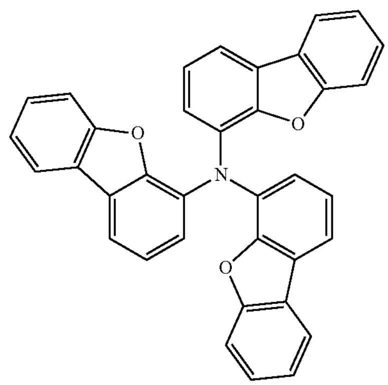
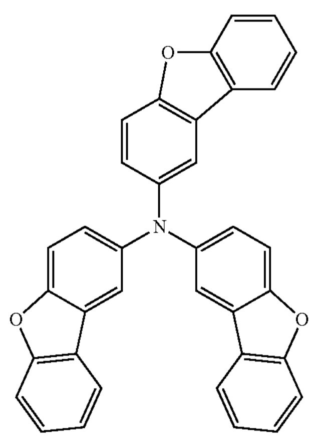

-continued
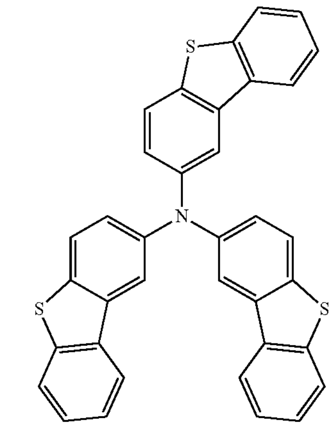
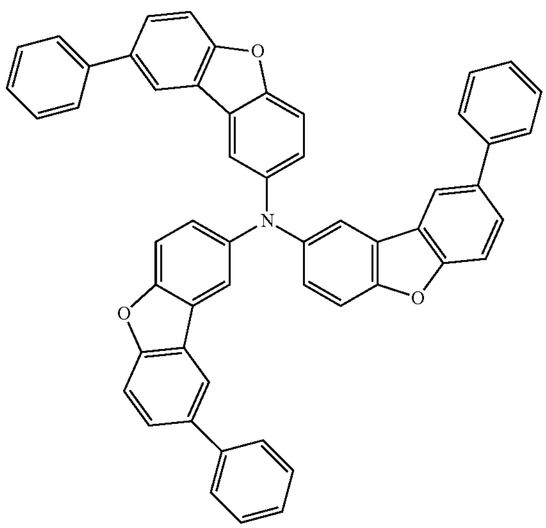
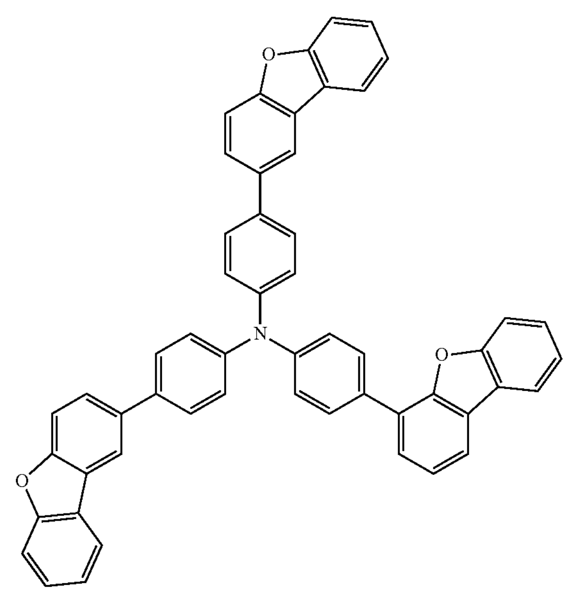
-continued
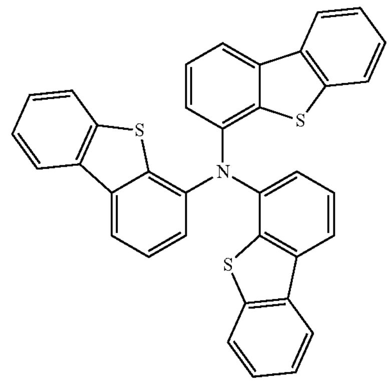
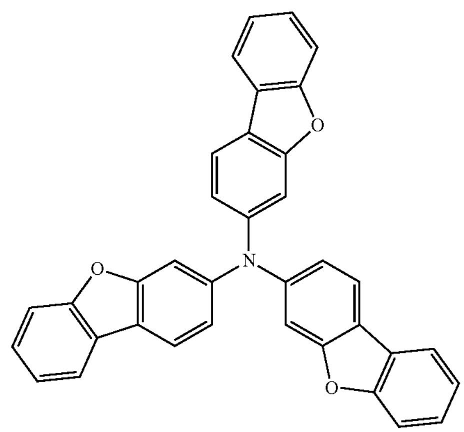
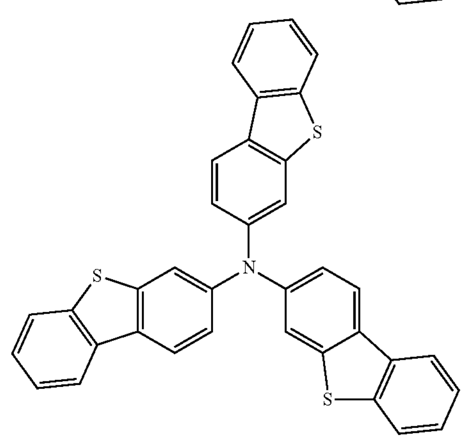
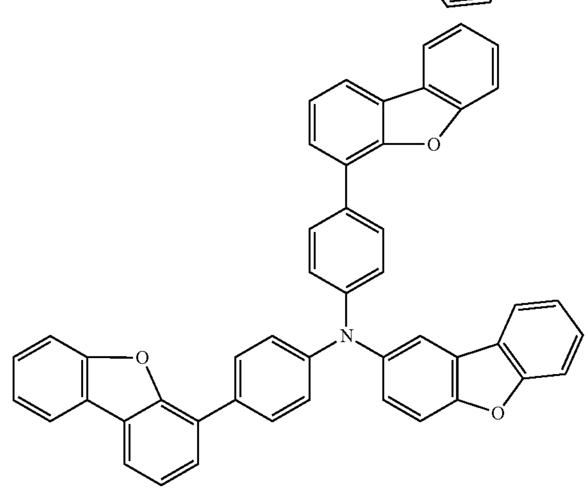

-continued
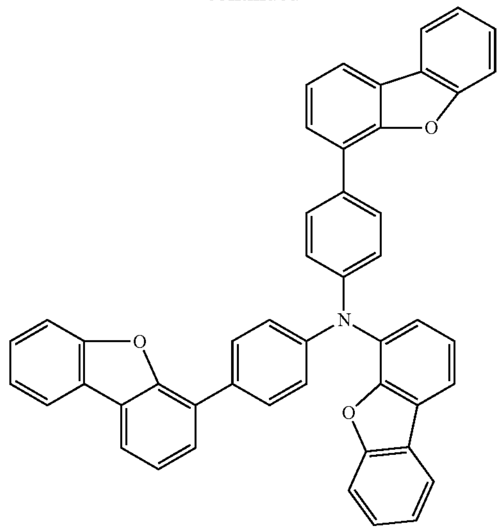
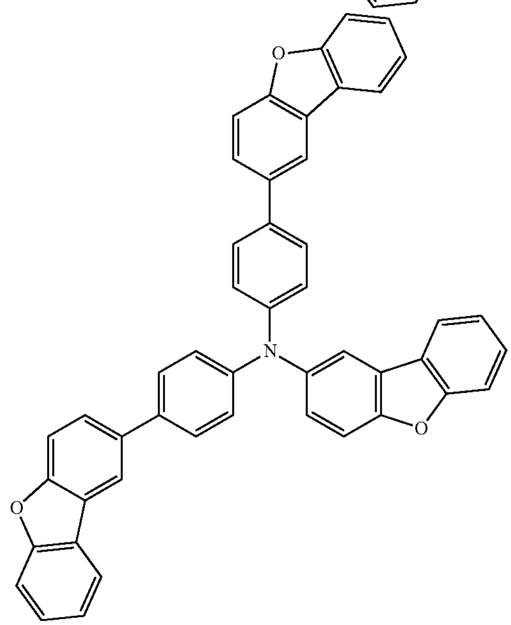
Examples of the compounds represented by the formula (11) are as follows.
[Chemical Formula 117]
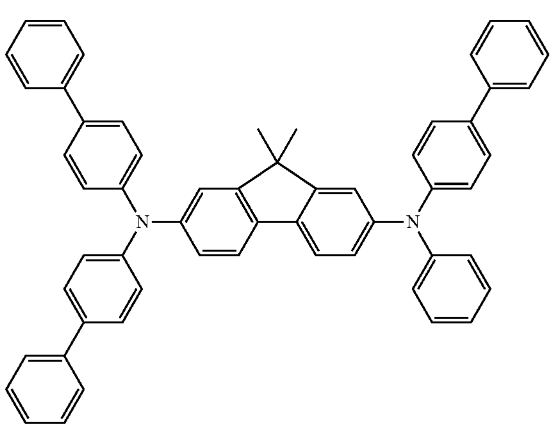
-continued
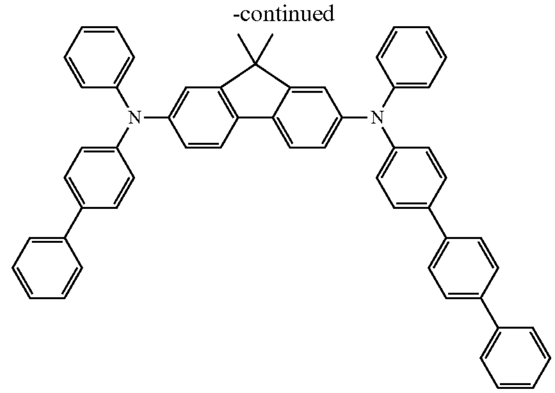
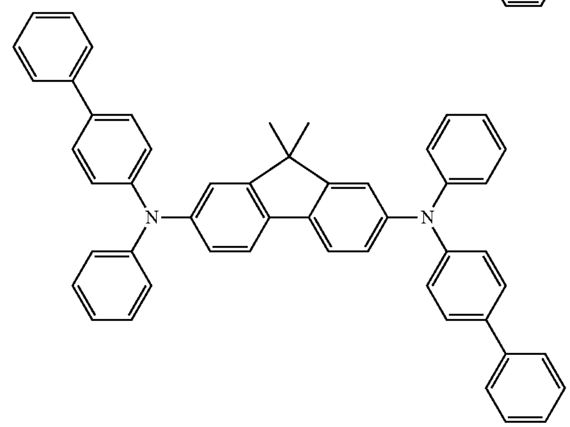
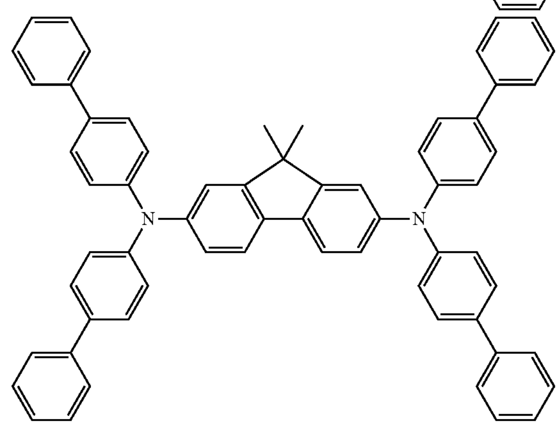
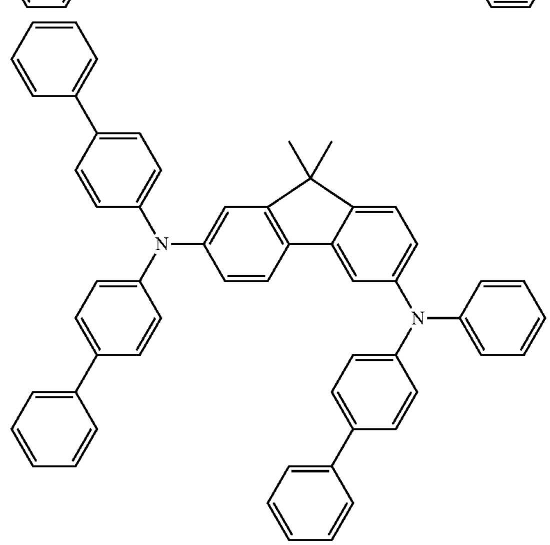

-continued
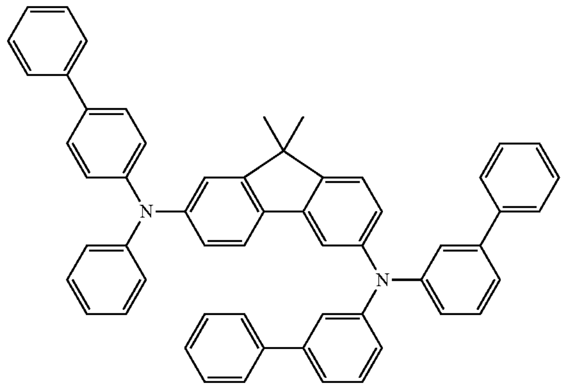
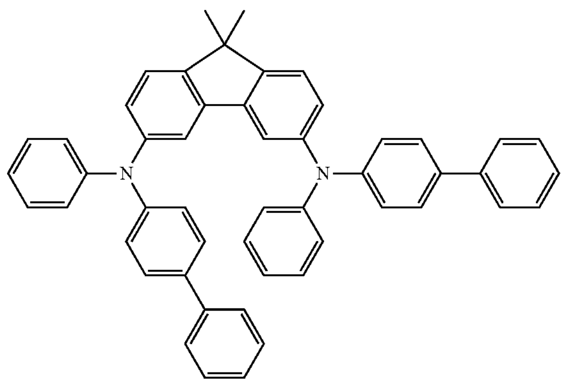
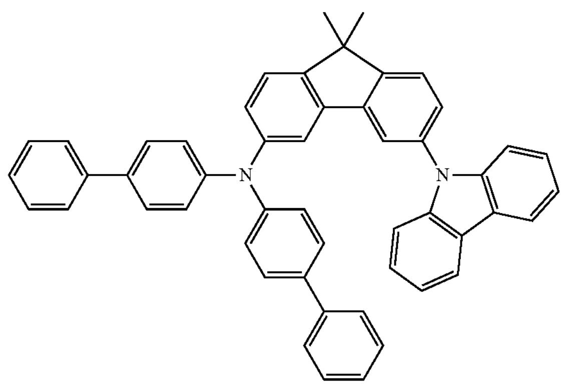
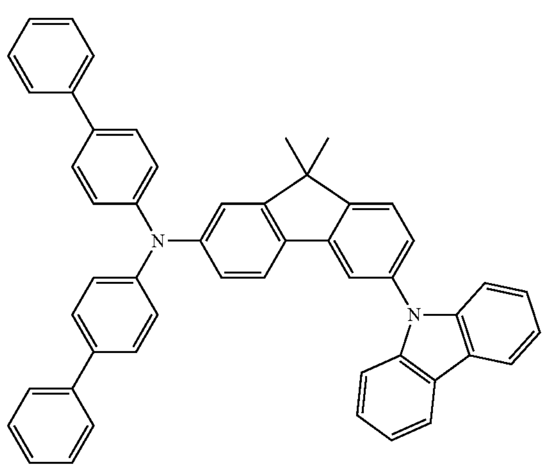
-continued
[Chemical Formula 118]
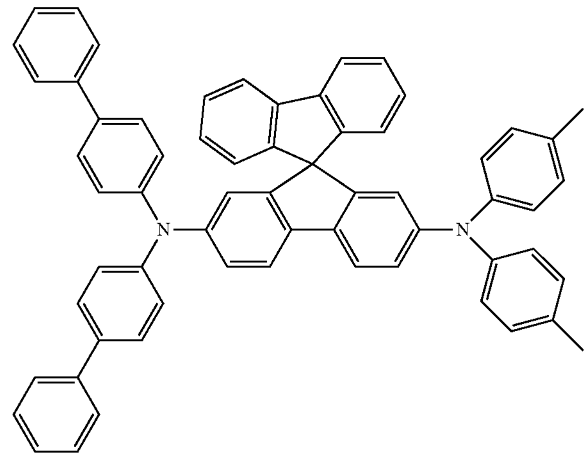
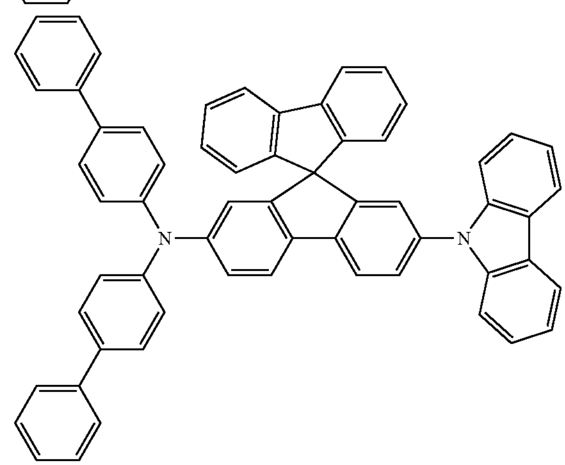
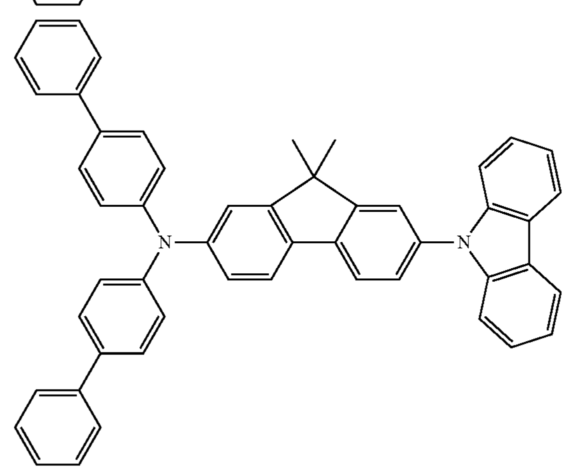
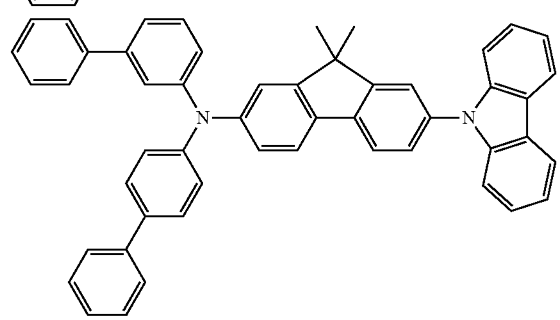

-continued

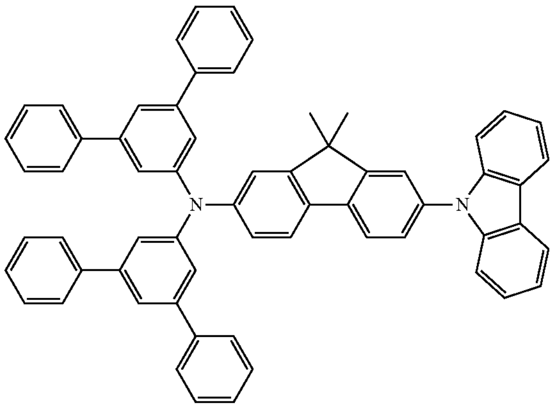

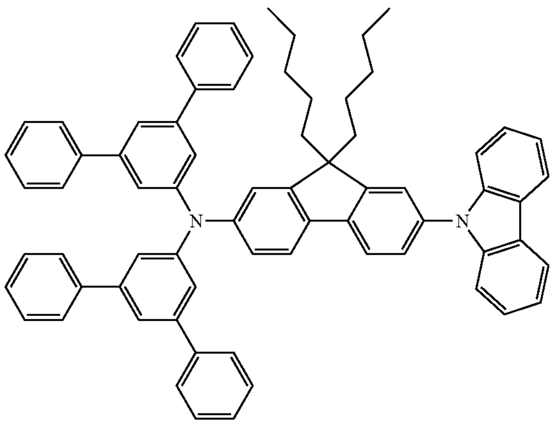

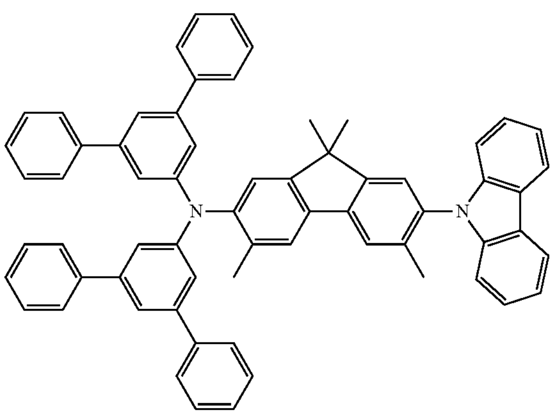

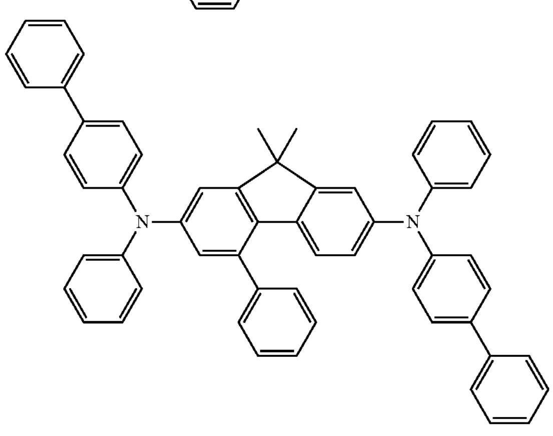

In the above formula (9), $Ar^{12}$ and $Ar^{13}$ are preferably not in a form of a ring structure.

When $Ar^{12}$ and $Ar^{13}$ form the ring structures, hole injecting capability is unfavorably decreased.

The compounds represented by the formulae (7) to (11) contained in the hole transporting layer is not limited to a single type of compound. In other words, the hole transporting layer may contain a plurality of the compounds represented by the formulae (7) to (11).

In the aspect of the invention, it is preferable that the hole transporting layer includes at least a first hole transporting layer and a second hole transporting layer that are sequentially layered on the anode, the first hole transporting layer containing a hole transporting material with hole transporting capability and the second hole transporting layer containing at least one of the compounds represented by formulae (7) to (11).

With this arrangement, the holes are likely to be injected from the second hole transporting layer to the emitting layer.

The first hole transporting layer preferably contains an amino compound substituted by an aromatic substituent.

In the aspect of the invention, it is preferable that the amino compound substituted by the aromatic substituent has 4 or less nitrogen atoms and a molecular weight of 300 to 1500.

With this arrangement, thermal decomposition does not occur during vapor deposition and a stable thin-film having a high Tg is obtainable. In other words, the thin-film can be formed by the vapor deposition method.

When the molecular weight is less than 300, Tg is unfavorably decreased and the thin-film lacks stability. On the other hand, when the molecular weight is more than 1500, thermal decomposition unfavorably occurs at vapor deposition.

A polymer material is also suitably used as the amino compound substituted by the aromatic substituent. In such a case, since a coating method is preferably used, the molecular weight of the polymer material has no upper limitation in use.

Particularly, the first hole transporting layer preferably contains the compound represented by the formula (7). With this arrangement, since the first hole transporting layer exhibits a suitable Ip, the holes are likely to be injected into the second hole transporting layer.

According to the aspect of the invention, the polycyclic fused aromatic skeleton is preferably contained as a divalent or multivalent group in the chemical formulae.

Examples of the substituent of the polycyclic fused aromatic skeleton are a halogen atom, hydroxyl group, substituted or unsubstituted amino group, nitro group, cyano group, substituted or unsubstituted alkyl group, substituted or unsubstituted alkenyl group, substituted or unsubstituted cycloalkyl group, substituted or unsubstituted alkoxy group, substituted or unsubstituted aromatic hydrocarbon group, substituted or unsubstituted aromatic heterocyclic group, substituted or unsubstituted aralkyl group, substituted or unsubstituted aryloxy group, substituted or unsubstituted alkoxycarbonyl group or carboxyl group.

When the polycyclic fused aromatic skeleton includes a plurality of substituents, the substituents may form a ring.

Examples of the halogen atom are fluorine, chlorine, bromine and iodine.

The substituted or unsubstituted amino group is represented by $—NX^1X^2$. Examples of $X^1$ and $X^2$ each independently include: a hydrogen atom, methyl group, ethyl group, propyl group, isopropyl group, n-butyl group, s-butyl group, isobutyl group, t-butyl group, n-pentyl group, n-hexyl group, n-heptyl group, n-octyl group, hydroxymethyl group, 1-hydroxyethyl group, 2-hydroxyethyl group, 2-hydroxyisobutyl group, 1,2-dihydroxyethyl group, 1,3-dihydroxyisopropyl group, 2,3-dihydroxy-t-butyl group, 1,2,3-trihydroxypropyl group, chloromethyl group, 1-chloroethyl group, 2-chloroethyl group, 2-chloroisobutyl group, 1,2-dichloroethyl group, 1,3-dichloroisopropyl group, 2,3-dichloro-t-butyl group, 1,2,3-trichloropropyl group, bromomethyl group, 1-bromoethyl group, 2-bromoethyl group, 2-bromoisobutyl group, 1,2-dibromoethyl group, 1,3-dibromoisopropyl group, 2,3-dibromo-t-butyl group, 1,2,3-tribromopropyl group, iodomethyl group, 1-iodoethyl group, 2-iodoethyl group, 2-iodoisobutyl group, 1,2-diiodoethyl group, 1,3-diiodoisopropyl group, 2,3-diiodo-t-butyl group, 1,2,3-triiodopropyl group, aminomethyl group, 1-aminoethyl group, 2-aminoethyl group, 2-aminoisobutyl group, 1,2-diaminoethyl group, 1,3-diaminoisopropyl group, 2,3-diamino-t-butyl group, 1,2,3-triaminopropyl group, cyanomethyl group, 1-cyanoethyl group, 2-cyanoethyl group, 2-cyanoisobutyl group, 1,2-dicyanoethyl group, 1,3-dicyanoisopropyl group, 2,3-dicyano-t-butyl group, 1,2,3-tricyanopropyl group, nitromethyl group, 1-nitroethyl group, 2-nitroethyl group, 2-nitroisobutyl group, 1,2-dinitroethyl group, 1,3-dinitroisopropyl group, 2,3-dinitro-t-butyl group, 1,2,3-trinitropropyl group, phenyl group, 1-naphthyl group, 2-naphthyl group, 1-anthryl group, 2-anthryl group, 9-anthryl group, 1-phenanthryl group, 2-phenanthryl group, 3-phenanthryl group, 4-phenanthryl group, 9-phenanthryl group, 1-naphthacenyl group, 2-naphthacenyl group, 9-naphthacenyl group, 4-styrylpyrenyl group, 1-pyrenyl group, 2-pyrenyl group, 4-pyrenyl group, 2-biphenylyl group, 3-biphenylyl group, 4-biphenylyl group, p-terphenyl-4-yl group, p-terphenyl-3-yl group, p-terphenyl-2-yl group, m-terphenyl-4-yl group, m-terphenyl-3-yl group, m-terphenyl-2-yl group, o-tolyl group, m-tolyl group, p-tolyl group, p-t-butylphenyl group, p-(2-phenylpropyl)phenyl group, 3-methyl-2-naphthyl group, 4-methyl-1-naphthyl group, 4-methyl-1-anthryl group, 4'-methylbiphenylyl group, 4"-t-butyl-p-terphenyl-4-yl group, 2-pyrrolyl group, 3-pyrrolyl group, pyrazinyl group, 2-pyridinyl group, 3-pyridinyl group, 4-pyridinyl group, 2-indolyl group, 3-indolyl group, 4-indolyl group, 5-indolyl group, 6-indolyl group, 7-indolyl group, 1-isoindolyl group, 3-isoindolyl group, 4-isoindolyl group, 5-isoindolyl group, 6-isoindolyl group, 7-isoindolyl group, 2-furyl group, 3-furyl group, 2-benzofuranyl group, 3-benzofuranyl group, 4-benzofuranyl group, 5-benzofuranyl group, 6-benzofuranyl group, 7-benzofuranyl group, 1-isobenzofuranyl group, 3-isobenzofuranyl group, 4-isobenzofuranyl group, 5-isobenzofuranyl group, 6-isobenzofuranyl group, 7-isobenzofuranyl group, 2-quinolyl group, 3-quinolyl group, 4-quinolyl group, 5-quinolyl group, 6-quinolyl group, 7-quinolyl group, 8-quinolyl group, 1-isoquinolyl group, 3-isoquinolyl group, 4-isoquinolyl group, 5-isoquinolyl group, 6-isoquinolyl group, 7-isoquinolyl group, 8-isoquinolyl group, 2-quinoxalinyl group, 5-quinoxalinyl group, 6-quinoxalinyl group, 1-phenanthridinyl group, 2-phenanthridinyl group, 3-phenanthridinyl group, 4-phenanthridinyl group, 6-phenanthridinyl group, 7-phenanthridinyl group, 8-phenanthridinyl group, 9-phenanthridinyl group, 10-phenanthridinyl group, 1-acridinyl group, 2-acridinyl group, 3-acridinyl group, 4-acridinyl group, 9-acridinyl group, 1,7-phenanthrolin-2-yl group, 1,7-phenanthrolin-3-yl group, 1,7-phenanthrolin-4-yl group, 1,7-phenanthrolin-5-yl group, 1,7-phenanthrolin-6-yl group, 1,7-phenanthrolin-8-yl group, 1,7-phenanthrolin-9-yl group, 1,7-phenanthrolin-10-yl group, 1,8-phenanthrolin-2-yl group, 1,8-phenanthrolin-3-yl group, 1,8-phenanthrolin-4-yl group, 1,8-phenanthrolin-5-yl group, 1,8-phenanthrolin-6-yl group, 1,8-phenanthrolin-7-yl group, 1,8-phenanthrolin-9-yl group, 1,8-phenanthrolin-10-yl group, 1,9-phenanthrolin-2-yl group, 1,9-phenanthrolin-3-yl group, 1,9-phenanthrolin-4-yl group, 1,9-phenanthrolin-5-yl group, 1,9-phenanthrolin-6-yl group, 1,9-phenanthrolin-7-yl group, 1,9-phenanthrolin-8-yl group, 1,9-phenanthrolin-10-yl group, 1,10-phenanthrolin-2-yl group, 1,10-phenanthrolin-3-yl group, 1,10-phenanthrolin-4-yl group, 1,10-phenanthrolin-5-yl group, 2,9-phenanthrolin-1-yl group, 2,9-phenanthrolin-3-yl group, 2,9-phenanthrolin-4-yl group, 2,9-phenanthrolin-5-yl group, 2,9-phenanthrolin-6-yl group, 2,9-phenanthrolin-7-yl group, 2,9-phenanthrolin-8-yl group, 2,9-phenanthrolin-10-yl group, 2,8-phenanthrolin-1-yl group, 2,2,8-phenanthrolin-3-yl group, 2,8-phenanthrolin-4-yl group, 2,8-phenanthrolin-5-yl group, 2,8-phenanthrolin-6-yl group, 2,8-phenanthrolin-7-yl group, 2,8-phenanthrolin-9-yl group, 2,8-phenanthrolin-10-yl group, 2,7-phenanthrolin-1-yl group, 2,7-phenanthrolin-3-yl group, 2,7-phenanthrolin-4-yl group, 2,7-phenanthrolin-5-yl group, 2,7-phenanthrolin-6-yl group, 2,7-phenanthrolin-8-yl group, 2,7-phenanthrolin-9-yl group, 2,7-phenanthrolin-10-yl group, 1-phenazinyl group, 2-phenazinyl group, 1-phenothiazinyl group, 2-phenothiazinyl group, 3-phenothiazinyl group, 4-phenothiazinyl group, 1-phenoxazinyl group, 2-phenoxazinyl group, 3-phenoxazinyl group, 4-phenoxazinyl group, 2-oxazolyl group, 4-oxazolyl group, 5-oxazolyl group, 2-oxadiazolyl group, 5-oxadiazolyl group, 3-furazanyl group, 2-thienyl group, 3-thienyl group, 2-methylpyrrol-1-yl group, 1-methylpyrrol-3-yl group, 2-methylpyrrol-4-yl group, 2-methylpyrrol-5-yl group, 3-methylpyrrol-1-yl group, 3-methylpyrrol-2-yl group, 3-methylpyrrol-4-yl group, 3-methylpyrrol-5-yl group, 2-t-butylpyrrol-4-yl group, 3-(2-phenylpropyl)pyrrol-1-yl group, 2-methyl-1-indolyl group, 4-methyl-1-indolyl group, 2-methyl-3-indolyl group, 4-methyl-3-indolyl group, 2-t-butyl-1-indolyl group, 4-t-butyl-1-indolyl group, 2-t-butyl-3-indolyl group, 4-t-butyl-3-indolyl group, and the like.

Examples of the substituted or unsubstituted alkyl group include: a methyl group, ethyl group, propyl group, isopropyl group, n-butyl group, s-butyl group, isobutyl group, t-butyl group, n-pentyl group, n-hexyl group, n-heptyl group, n-octyl group, hydroxymethyl group, 1-hydroxyethyl group, 2-hydroxyethyl group, 2-hydroxyisobutyl group, 1,2-dihydroroxyethyl group, 1,3-dihydroxyisopropyl group, 2,3-dihydroxy-t-butyl group, 1,2,3-trihydroxypropyl group, chloromethyl group, 1-chloroethyl group, 2-chloroethyl group, 2-chloroisobutyl group, 1,2-dichloroethyl group, 1,3-dichloroisopropyl group, 2,3-dichloro-t-butyl group, 1,2,3-trichloropropyl group, bromomethyl group, 1-bromoethyl group, 2-bromoethyl group, 2-bromoisobutyl group, 1,2-dibromoethyl group, 1,3-dibromoisopropyl group, 2,3-dibromo-t-butyl group, 1,2,3-tribromopropyl group, iodomethyl group, 1-iodoethyl group, 2-iodoethyl group, 2-iodoisobutyl group, 1,2-diiodoethyl group, 1,3-diiodoisopropyl group, 2,3-diiodo-t-butyl group, 1,2,3-triiodopropyl group, aminomethyl group, 1-aminoethyl group, 2-aminoethyl group, 2-aminoisobutyl group, 1,2-diaminoethyl group, 1,3-diaminoisopropyl group, 2,3-diamino-t-butyl group, 1,2,3-triaminopropyl group, cyanomethyl group, 1-cyanoethyl group, 2-cyanoethyl group, 2-cyanoisobutyl group, 1,2-dicyanoethyl group, 1,3-dicyanoisopropyl group, 2,3-dicyano-t-butyl group, 1,2,3-tricyanopropyl group, nitromethyl group, 1-nitroethyl group, 2-nitroethyl group, 2-nitroisobutyl group, 1,2-dinitroethyl group, 1,3-dinitroisopropyl group, 2,3-dinitro-t-butyl group and 1,2,3-trinitropropyl group.

Examples of the substituted or unsubstituted alkenyl group include: a vinyl group, allyl group, 1-butenyl group, 2-butenyl group, 3-butenyl group, 1,3-butanedienyl group, 1-methylvinyl group, styryl group, 4-diphenylaminostyryl group, 4-di-p-tolylaminostyryl group, 4-di-m-tolylaminostyryl group, 2,2-diphenylvinyl group, 1,2-diphenylvinyl group, 1-methylallyl group, 1,1-dimethylallyl group, 2-methylallyl group, 1-phenylallyl group, 2-phenylallyl group, 3-phenylallyl group, 3,3-diphenylallyl group, 1,2-dimethylallyl group, 1-phenyl-1-butenyl group and 3-phenyl-1-butenyl group.

Examples of the substituted or unsubstituted cycloalkyl group include a cyclopropyl group, cyclobutyl group, cyclopentyl group, cyclohexyl group and 4-methylcyclohexyl group.

The substituted or unsubstituted alkoxy group is represented by —OY. Examples of Y include: a methyl group, ethyl group, propyl group, isopropyl group, n-butyl group, s-butyl group, isobutyl group, t-butyl group, n-pentyl group, n-hexyl group, n-heptyl group, n-octyl group, hydroxymethyl group, 1-hydroxyethyl group, 2-hydroxyethyl group, 2-hydroxyisobutyl group, 1,2-dihydroroxyethyl group, 1,3-dihydroxyisopropyl group, 2,3-dihydroxy-t-butyl group, 1,2,3-trihydroxypropyl group, chloromethyl group, 1-chloroethyl group, 2-chloroethyl group, 2-chloroisobutyl group, 1,2-dichloroethyl group, 1,3-dichloroisopropyl group, 2,3-dichloro-t-butyl group, 1,2,3-trichloropropyl group, bromomethyl group, 1-bromoethyl group, 2-bromoethyl group, 2-bromoisobutyl group, 1,2-dibromoethyl group, 1,3-dibromoisopropyl group, 2,3-dibromo-t-butyl group, 1,2,3-tribromopropyl group, iodomethyl group, 1-iodoethyl group, 2-iodoethyl group, 2-iodoisobutyl group, 1,2-diiodoethyl group, 1,3-diiodoisopropyl group, 2,3-diiodo-t-butyl group, 1,2,3-triiodopropyl group, aminomethyl group, 1-aminoethyl group, 2-aminoethyl group, 2-aminoisobutyl group, 1,2-diaminoethyl group, 1,3-diaminoisopropyl group, 2,3-diamino-t-butyl group, 1,2,3-triaminopropyl group, cyanomethyl group, 1-cyanoethyl group, 2-cyanoethyl group, 2-cyanoisobutyl group, 1,2-dicyanoethyl group, 1,3-dicyanoisopropyl group, 2,3-dicyano-t-butyl group, 1,2,3-tricyanopropyl group, nitromethyl group, 1-nitroethyl group, 2-nitroethyl group, 2-nitroisobutyl group, 1,2-dinitroethyl group, 1,3-dinitroisopropyl group, 2,3-dinitro-t-butyl group and 1,2,3-trinitropropyl group.

Examples of the substituted or unsubstituted aromatic hydrocarbon group include: a phenyl group, 1-naphthyl group, 2-naphthyl group, 1-anthryl group, 2-anthryl group, 9-anthryl group, 1-phenanthryl group, 2-phenanthryl group, 3-phenanthryl group, 4-phenanthryl group, 9-phenanthryl group, 1-naphthacenyl group, 2-naphthacenyl group, 9-naphthacenyl group, 1-pyrenyl group, 2-pyrenyl group, 4-pyrenyl group, 2-biphenylyl group, 3-biphenylyl group, 4-biphenylyl group, p-terphenyl-4-yl group, p-terphenyl-3-yl group, p-terphenyl-2-yl group, m-terphenyl-4-yl group, m-terphenyl-3-yl group, m-terphenyl-2-yl group, o-tolyl group, m-tolyl group, p-tolyl group, p-t-butylphenyl group, p-(2-phenylpropyl)phenyl group, 3-methyl-2-naphthyl group, 4-methyl-1-naphthyl group, 4-methyl-1-anthryl group, 4'-methylbiphenylyl group and 4"-t-butyl-p-terphenyl-4-yl group.

Examples of the substituted or unsubstituted aromatic heterocyclic group include: a 1-pyroryl group, 2-pyroryl group, 3-pyroryl group, pyrazinyl group, 2-pyridiny group, 3-pyridinyl group, 4-pyridinyl group, 1-indolyl group, 2-indolyl group, 3-indolyl group, 4-indolyl group, 5-indolyl group, 6-indolyl group, 7-indolyl group, 1-isoindolyl group, 2-isoindolyl group, 3-isoindolyl group, 4-isoindolyl group, 5-isoindolyl group, 6-isoindolyl group, 7-isoindolyl group, 2-furyl group, 3-furyl group, 2-benzofuranyl group, 3-benzofuranyl group, 4-benzofuranyl group, 5-benzofuranyl group, 6-benzofuranyl group, 7-benzofuranyl group, 1-isobenzofuranyl group, 3-isobenzofuranyl group, 4-isobenzofuranyl group, 5-isobenzofuranyl group, 6-isobenzofuranyl group, 7-isobenzofuranyl group, 2-quinolyl group, 3-quinolyl group, 4-quinolyl group, 5-quinolyl group, 6-quinolyl group, 7-quinolyl group, 8-quinolyl group, 1-isoquinolyl group, 3-isoquinolyl group, 4-isoquinolyl group, 5-isoquinolyl group, 6-isoquinolyl group, 7-isoquinolyl group, 8-isoquinolyl group, 2-quinoxalinyl group, 5-quinoxalinyl group, 6-quinoxalinyl group, 1-phenanthrydinyl group, 2-phenanthrydinyl group, 3-phenanthrydinyl group, 4-phenanthrydinyl group, 6-phenanthrydinyl group, 7-phenanthrydinyl group, 8-phenanthrydinyl group, 9-phenanthrydinyl group, 10-phenanthrydinyl group, 1-acridinyl group, 2-acridinyl group, 3-acridinyl group, 4-acridinyl group, 9-acridinyl group, 1,7-phenanthroline-2-yl group, 1,7-phenanthroline-3-yl group, 1,7-phenanthroline-4-yl group, 1,7-phenanthroline-5-yl group, 1,7-phenanthroline-6-yl group, 1,7-phenanthroline-8-yl group, 1,1-phenanthroline-9-yl group, 1,7-phenanthroline-10-yl group, 1,8-phenanthroline-2-yl group, 1,8-phenanthroline-3-yl group, 1,8-phenanthroline-4-yl group, 1,8-phenanthroline-5-yl group, 1,8-phenanthroline-6-yl group, 1,8-phenanthroline-7-yl group, 1,8-phenanthroline-9-yl group, 1,8-phenanthroline-10-yl group, 1,9-phenanthroline-2-yl group, 1,9-phenanthroline-3-yl group, 1,9-phenanthroline-4-yl group, 1,9-phenanthroline-5-yl group, 1,9-phenanthroline-6-yl group, 1,9-phenanthroline-7-yl group, 1,9-phenanthroline-8-yl group, 1,9-phenanthroline-10-yl group, 1,10-phenanthroline-2-yl group, 1,10-phenanthroline-3-yl group, 1,10-phenanthroline-4-yl group, 1,10-phenanthroline-5-yl group, 2,9-phenanthroline-1-yl group, 2,9-phenanthroline-3-yl group, 2,9-phenanthroline-4-yl group, 2,9-phenanthroline-5-yl group, 2,9-phenanthroline-6-yl group, 2,9-phenanthroline-7-yl group, 2,9-phenanthroline-8-yl group, 2,9-phenanthroline-10-yl group, 2,8-phenanthroline-1-yl group, 2,8-phenanthroline-3-yl group, 2,8-phenanthroline-4-yl group, 2,8-phenanthroline-5-yl group, 2,8-phenanthroline-6-yl group, 2,8-phenanthroline-7-yl group, 2,8-phenanthroline-9-yl group, 2,8-phenanthroline-10-yl group, 2,7-phenanthroline-1-yl group, 2,7-phenanthroline-3-yl group, 2,7-phenanthroline-4-yl group, 2,7-phenanthroline-5-yl group, 2,7-phenanthroline-6-yl group, 2,7-phenanthroline-8-yl group, 2,7-phenanthroline-9-yl group, 2,7-phenanthroline-10-yl group, 1-phenazinyl group, 2-phenazinyl group, 1-phenothiazinyl group, 2-phenothiazinyl group, 3-phenothiazinyl group, 4-phenothiazinyl group, 10-phenothiazinyl group, 1-phenoxazinyl group, 2-phenoxazinyl group, 3-phenoxazinyl group, 4-phenoxazinyl group, 10-phenoxazinyl group, 2-oxazolyl group, 4-oxazolyl group, 5-oxazolyl group, 2-oxadiazolyl group, 5-oxadiazolyl group, 3-furazanyl group, 2-thienyl group, 3-thienyl group, 2-methylpyrrole-1-yl group, 2-methylpyrrole-3-yl group, 2-methylpyrrole-4-yl group, 2-methylpyrrole-5-yl group, 3-methylpyrrole-1-yl group, 3-methylpyrrole-2-yl group, 3-methylpyrrole-4-yl group, 3-methylpyrrole-5-yl group, 2-t-butylpyrrole-4-yl group, 3-(2-phenylpropyl)pyrrole-1-yl group, 2-methyl-1-indolyl group, 4-methyl-1-indolyl group, 2-methyl-3-indolyl group, 4-methyl-3-indolyl group, 2-t-butyl-1-indolyl group, 4-t-butyl-1-indolyl group, 2-t-butyl 3-indolyl group and 4-t-butyl 3-indolyl group.

Examples of the substituted or unsubstituted aralkyl group include: a benzyl group, 1-phenylethyl group, 2-phenylethyl group, 1-phenylisopropyl group, 2-phenylisopropyl group, phenyl-t-butyl group, α-naphthylmethyl group, 1-α-naphthylethyl group, 2-α-naphthylethyl group, 1-α-naphthylisopropyl group, 2-α-naphthylisopropyl group, β-naphthylmethyl group, 1-β-naphthylethyl group, 2-β-naphthylethyl group, 1-β-naphthylisopropyl group, 2-β-naphthylisopropyl group, 1-pyrorylmethyl group, 2-(1-pyroryl)ethyl group, p-methylbenzyl group, m-methylbenzyl group, o-methylbenzyl group, p-chlorobenzyl group, m-chlorobenzyl group, o-chlorobenzyl group, p-bromobenzyl group, m-bromobenzyl group, o-bromobenzyl group, p-iodobenzyl group, m-iodobenzyl group, o-iodobenzyl group, p-hydroxybenzyl group, m-hydroxybenzyl group, o-hydroxybenzyl group, p-aminobenzyl group, m-aminobenzyl group, o-aminobenzyl group, p-nitrobenzyl group, m-nitrobenzyl group, o-nitrobenzyl group, p-cyanobenzyl group, m-cyanobenzyl group, o-cyanobenzyl group, 1-hydroxy-2-phenylisopropyl group and 1-chloro-2-phenylisopropyl group.

The substituted or unsubstituted aryloxy group is represented by —OZ. Examples of Z include: a phenyl group, 1-naphthyl group, 2-naphtyl group, 1-anthryl group, 2-anthryl group, 9-anthryl group, 1-phenanthryl group, 2-phenanthryl group, 3-phenanthryl group, 4-phenanthryl group, 9-phenanthryl group, 1-naphthacenyl group, 2-naphthacenyl group, 9-naphthacenyl group, 1-pyrenyl group, 2-pyrenyl group, 4-pyrenyl group, 2-biphenylyl group, 3-biphenylyl group, 4-biphenylyl group, p-terphenyl-4-yl group, p-terphenyl-3-yl group, p-terphenyl-2-yl group, m-terphenyl-4-yl group, m-terphenyl-3-yl group, m-terphenyl-2-yl group, o-tolyl group, m-tolyl group, p-tolyl group, p-t-butylphenyl group, p-(2-phenylpropyl)phenyl group, 3-methyl-2-naphthyl group, 4-methyl-1-naphthyl group, 4-methyl-1-anthryl group, 4'-methylbiphenylyl group, 4"-t-butyl-p-terphenyl-4-yl group, 2-pyroryl group, 3-pyroryl group, pyrazinyl group, 2-pyridiny group, 3-pyridinyl group, 4-pyridinyl group, 2-indolyl group, 3-indolyl group, 4-indolyl group, 5-indolyl group, 6-indolyl group, 7-indolyl group, 1-isoindolyl group, 3-isoindolyl group, 4-isoindolyl group, 5-isoindolyl group, 6-isoindolyl group, 7-isoindolyl group, 2-furyl group, 3-furyl group, 2-benzofuranyl group, 3-benzofuranyl group, 4-benzofuranyl group, 5-benzofuranyl group, 6-benzofuranyl group, 7-benzofuranyl group, 1-isobenzofuranyl group, 3-isobenzofuranyl group, 4-isobenzofuranyl group, 5-isobenzofuranyl group, 6-isobenzofuranyl group, 7-isobenzofuranyl group, 2-quinolyl group, 3-quinolyl group, 4-quinolyl group, 5-quinolyl group, 6-quinolyl group, 7-quinolyl group, 8-quinolyl group, 1-isoquinolyl group, 3-isoquinolyl group, 4-isoquinolyl group, 5-isoquinolyl group, 6-isoquinolyl group, 7-isoquinolyl group, 8-isoquinolyl group, 2-quinoxalinyl group, 5-quinoxalinyl group, 6-quinoxalinyl group, 1-phenanthrydinyl group, 2-phenanthrydinyl group, 3-phenanthrydinyl group, 4-phenanthrydinyl group, 6-phenanthrydinyl group, 7-phenanthrydinyl group, 8-phenanthrydinyl group, 9-phenanthrydinyl group, 10-phenanthrydinyl group, 1-acridinyl group, 2-acridinyl group, 3-acridinyl group, 4-acridinyl group, 9-acridinyl group, 1,7-phenanthroline-2-yl group, 1,7-phenanthroline-3-yl group, 1,7-phenanthroline-4-yl group, 1,7-phenanthroline-5-yl group, 1,7-phenanthroline-6-yl group, 1,7-phenanthroline-8-yl group, 1,7-phenanthroline-9-yl group, 1,7-phenanthroline-10-yl group, 1,8-phenanthroline-2-yl group, 1,8-phenanthroline-3-yl group, 1,8-phenanthroline-4-yl group, 1,8-phenanthroline-5-yl group, 1,8-phenanthroline-6-yl group, 1,8-phenanthroline-7-yl group, 1,8-phenanthroline-9-yl group, 1,8-phenanthroline-10-yl group, 1,9-phenanthroline-2-yl group, 1,9-phenanthroline-3-yl group, 1,9-phenanthroline-4-yl group, 1,9-phenanthroline-5-yl group, 1,9-phenanthroline-6-yl group, 1,9-phenanthroline-7-yl group, 1,9-phenanthroline-8-yl group, 1,9-phenanthroline-10-yl group, 1,10-phenanthroline-2-yl group, 1,10-phenanthroline-3-yl group, 1,10-phenanthroline-4-yl group, 1,10-phenanthroline-5-yl group, 2,9-phenanthroline-1-yl group, 2,9-phenanthroline-3-yl group, 2,9-phenanthroline-4-yl group, 2,9-phenanthroline-5-yl group, 2,9-phenanthroline-6-yl group, 2,9-phenanthroline-7-yl group, 2,9-phenanthroline-8-yl group, 2,9-phenanthroline-10-yl group, 2,8-phenanthroline-1-yl group, 2,8-phenanthroline-3-yl group, 2,8-phenanthroline-4-yl group, 2,8-phenanthroline-5-yl group, 2,8-phenanthroline-6-yl group, 2,8-phenanthroline-7-yl group, 2,8-phenanthroline-9-yl group, 2,8-phenanthroline-10-yl group, 2,7-phenanthroline-1-yl group, 2,7-phenanthroline-3-yl group, 2,7-phenanthroline-4-yl group, 2,7-phenanthroline-5-yl group, 2,7-phenanthroline-6-yl group, 2,7-phenanthroline-8-yl group, 2,7-phenanthroline-9-yl group, 2,7-phenanthroline-10-yl group, 1-phenazinyl group, 2-phenazinyl group, 1-phenothiazinyl group, 2-phenothiazinyl group, 3-phenothiazinyl group, 4-phenothiazinyl group, 1-phenoxazinyl group, 2-phenoxazinyl group, 3-phenoxazinyl group, 4-phenoxazinyl group, 2-oxazolyl group, 4-oxazolyl group, 5-oxazolyl group, 2-oxadiazolyl group, 5-oxadiazolyl group, 3-furazanyl group, 2-thienyl group, 3-thienyl group, 2-methylpyrrole-1-yl group, 2-methylpyrrole-3-yl group, 2-methylpyrrole-4-yl group, 2-methylpyrrole-5-yl group, 3-methylpyrrole-1-yl group, 3-methylpyrrole-2-yl group, 3-methylpyrrole-4-yl group, 3-methylpyrrole-5-yl group, 2-t-butylpyrrole-4-yl group, 3-(2-phenylpropyl)pyrrole-1-yl group, 2-methyl-1-indolyl group, 4-methyl-1-indolyl group, 2-methyl-3-indolyl group, 4-methyl-3-indolyl group, 2-t-butyl-1-indolyl group, 4-t-butyl-1-indolyl group, 2-t-butyl-3-indolyl group and 4-t-butyl-3-indolyl group.

The substituted or unsubstituted alkoxycarbonyl group is represented by —COOY. Examples of Y include: a methyl group, ethyl group, propyl group, isopropyl group, n-butyl group, s-butyl group, isobutyl group, t-butyl group, n-pentyl group, n-hexyl group, n-heptyl group, n-octyl group, hydroxymethyl group, 1-hydroxyethyl group, 2-hydroxyethyl group, 2-hydroxyisobutyl group, 1,2-dihydroroxyethyl group, 1,3-dihydroxyisopropyl group, 2,3-dihydroxy-t-butyl group, 1,2,3-trihydroxypropyl group, chloromethyl group, 1-chloroethyl group, 2-chloroethyl group, 2-chloroisobutyl group, 1,2-dichloroethyl group, 1,3-dichloroisopropyl group, 2,3-dichloro-t-butyl group, 1,2,3-trichloropropyl group, bromomethyl group, 1-bromoethyl group, 2-bromoethyl group, 2-bromoisobutyl group, 1,2-dibromoethyl group, 1,3-dibromoisopropyl group, 2,3-dibromo-t-butyl group, 1,2,3-tribromopropyl group, iodomethyl group, 1-iodoethyl group, 2-iodoethyl group, 2-iodoisobutyl group, 1,2-diiodoethyl group, 1,3-diiodoisopropyl group, 2,3-diiodo-t-butyl group, 1,2,3-triiodopropyl group, aminomethyl group, 1-aminoethyl group, 2-aminoethyl group, 2-aminoisobutyl group, 1,2-diaminoethyl group, 1,3-diaminoisopropyl group, 2,3-diamino-t-butyl group, 1,2,3-triaminopropyl group, cyanomethyl group, 1-cyanoethyl group, 2-cyanoethyl group, 2-cyanoisobutyl group, 1,2-dicyanoethyl group, 1,3-dicyanoisopropyl group, 2,3-dicyano-t-butyl group, 1,2,3-tricyanopropyl group, nitromethyl group, 1-nitroethyl group, 2-nitroethyl group, 2-nitroisobutyl group, 1,2-dinitroethyl group, 1,3-dinitroisopropyl group, 2,3-dinitro-t-butyl group and 1,2,3-trinitropropyl group.

According to the aspect of the invention, it is preferable that the polycyclic fused aromatic skeleton has a substituent and the substituent is a substituted or unsubstituted aryl group or heteroaryl group.

By introducing the aryl group or the heteroaryl group as the substituent, Eg(T) can be adjusted and molecule association can be prevented. Thus, lifetime can be prolonged.

In the aspect of the invention, the substituent preferably contains no carbazole skeleton.

The introduction of the substituent having the carbazole skeleton increases Ip of a material to increase Eg(T) thereof, so that such a material is applicable as a host for a phosphorescent dopant for emitting light of shorter wavelength. However, it is unfavorable to introduce a carbazole group, which generally exhibits poor resistance to oxidation, because such a carbazole group shortens lifetime.

Accordingly, the substituent according to the aspect of the invention excludes the substituent having a carbazole skeleton, so that lifetime can be prolonged although Eg(T) is decreased.

In the aspect of the invention, the hole transporting layer is preferably bonded to the phosphorescent-emitting layer.

In the aspect of the invention, the phosphorescent dopant preferably contains a metal complex forming of a metal selected from the group consisting of Ir, Pt, Os, Au, Cu, Re and Ru, and a ligand.

Examples of the dopant are, for instance, PQIr(iridium(III) bis(2-phenyl quinolyl-N,$C^{2'}$) acetylacetonate), $Ir(ppy)_3$(fac-tris(2-phenylpyridine) iridium) and the following compounds.

[Chemical Formula 119]

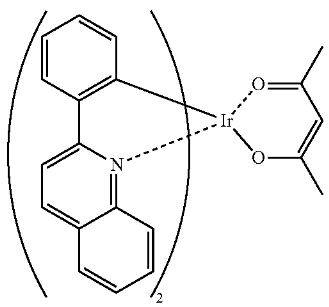

PQIr

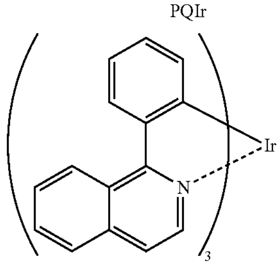

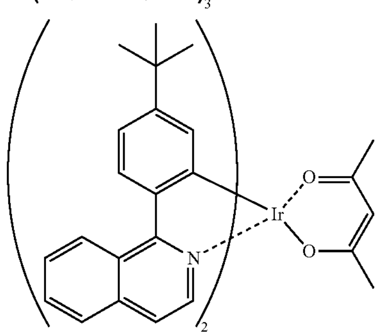

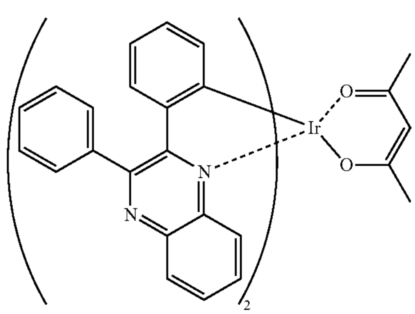

-continued

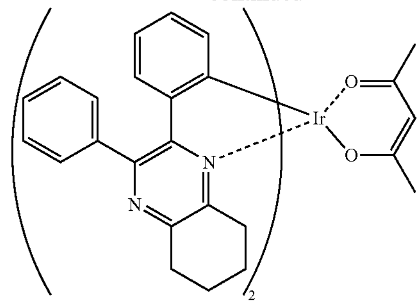

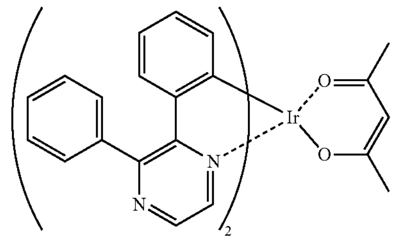

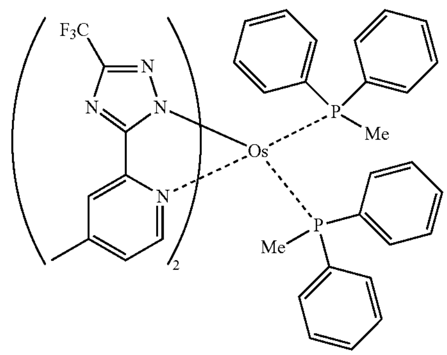

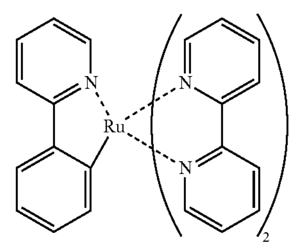

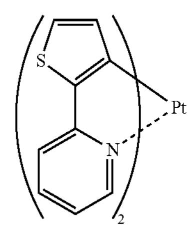

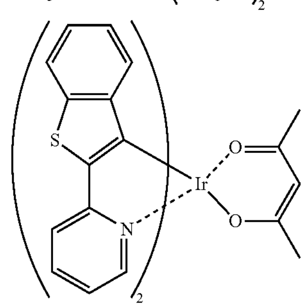

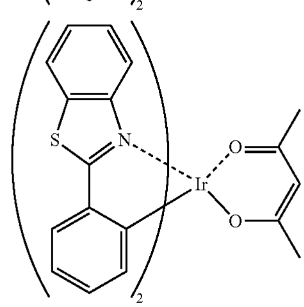

-continued
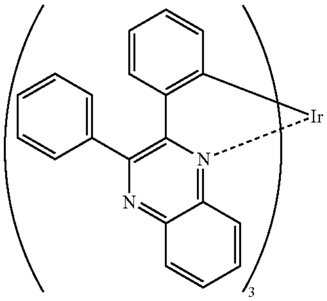
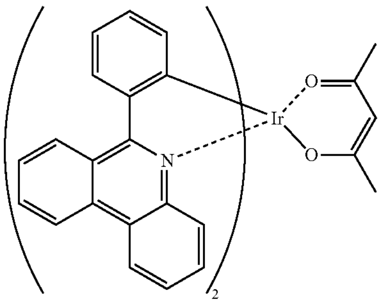
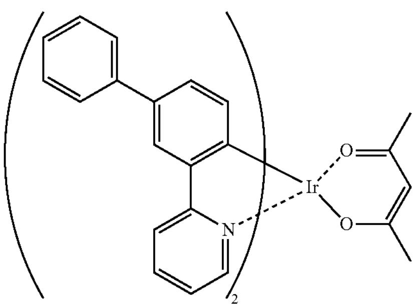
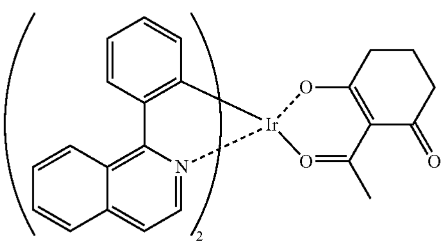
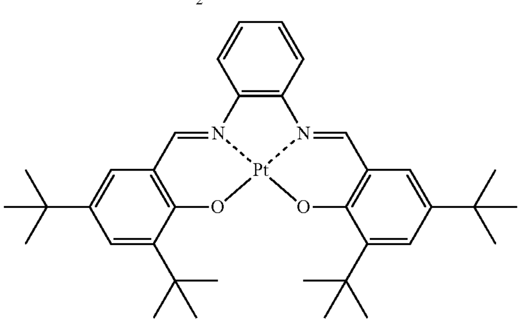
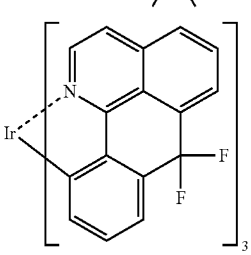
-continued
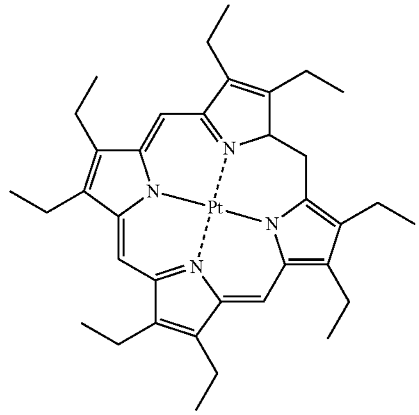
[Chemical Formula 120]
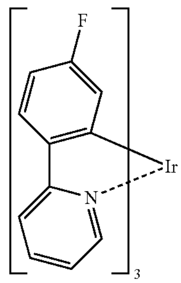
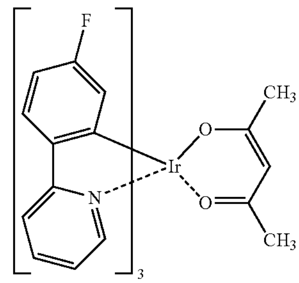
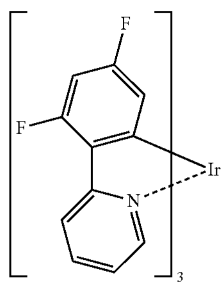
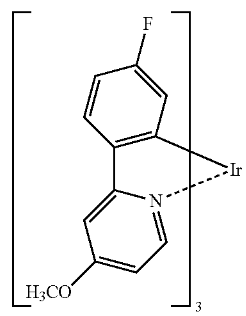
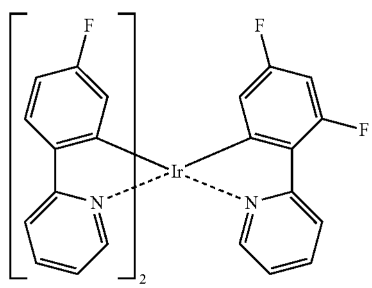
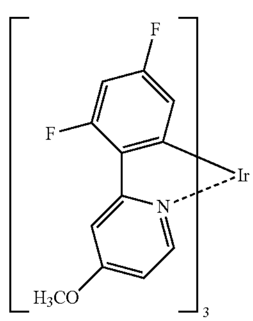

-continued
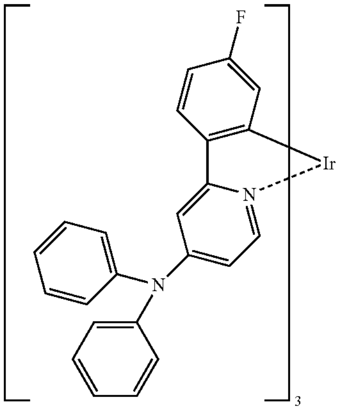
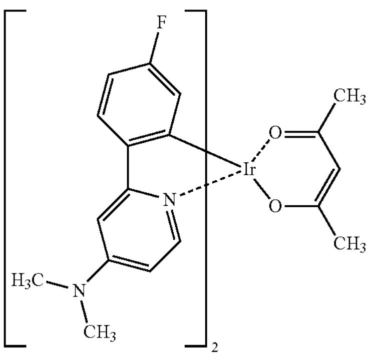
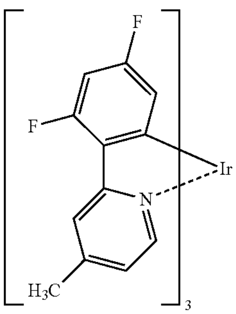
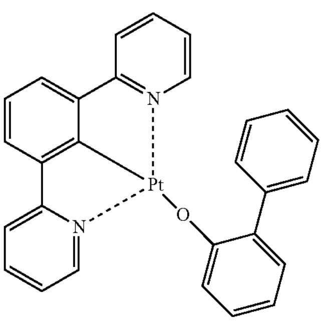
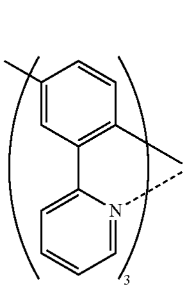
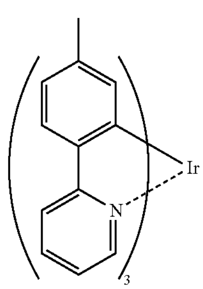
-continued
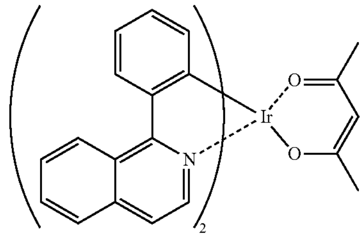
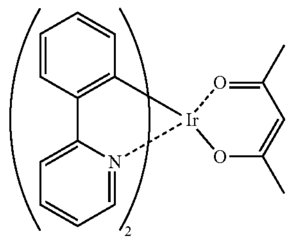
[Chemical Formula 121]
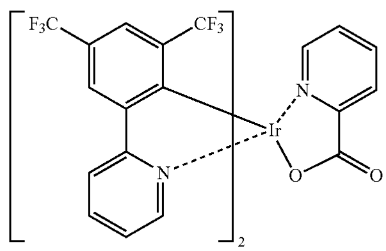
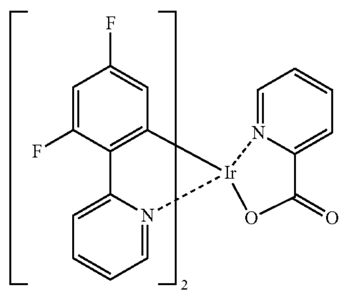
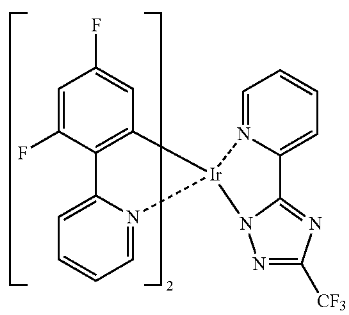
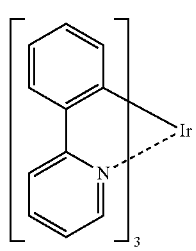
Ir(ppy)$_3$ -continued
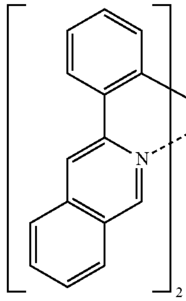
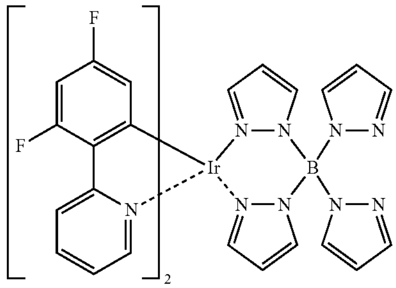
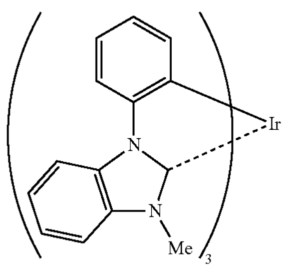
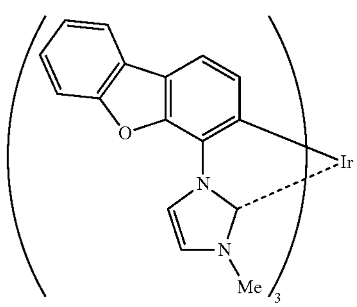
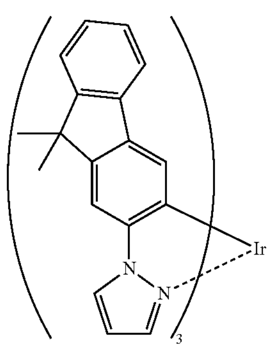
-continued
[Chemical Formula 122]
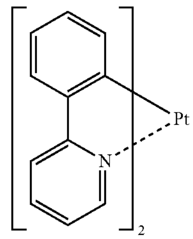
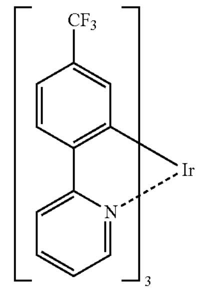
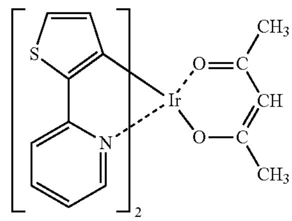
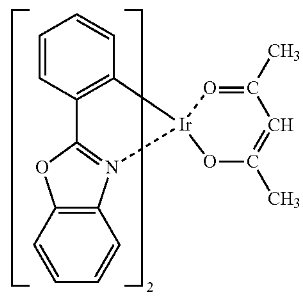
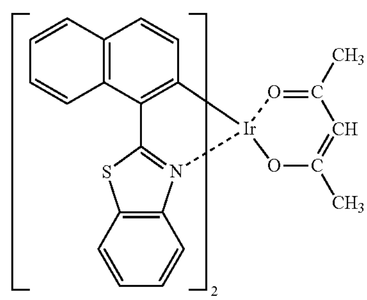
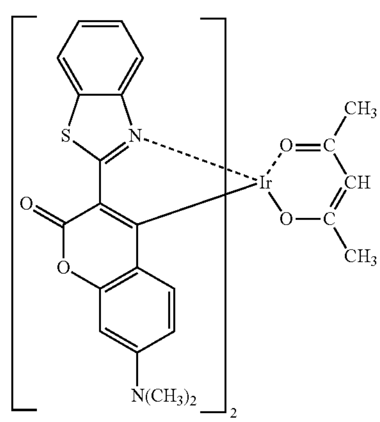

-continued

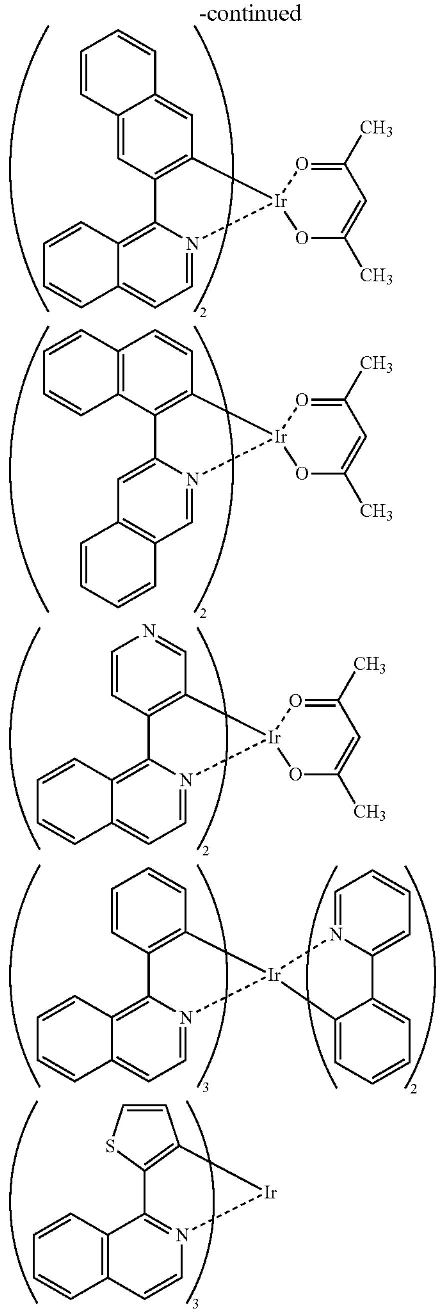

In the aspect of the invention, a wavelength of the phosphorescent dopant at a maximum luminance intensity is preferably in a range of 470 nm to 700 nm, more preferably, in a range of 480 nm to 700 nm, particularly preferably, in a range of 500 nm to 650 nm.

By doping the phosphorescent dopant having such an emission wavelength to the host material according to the aspect of the invention so as to form the phosphorescent-emitting layer, the organic electroluminescence device can exhibit high efficiency.

In the aspect of the invention, a reduction-causing dopant is present at an interfacial region between the cathode and the organic thin-film layer.

The reduction-causing dopant may be at least one compound selected from the group of an alkali metal, an alkali metal complex, an alkali metal compound, an alkali earth metal, an alkali earth metal complex, an alkali earth metal compound, a rare-earth metal, a rare-earth metal complex, a rare-earth metal compound and the like.

Examples of the alkali metal are Na (work function: 2.36 eV), K (work function: 2.28 eV), Rb (work function: 2.16 eV) and Cs (work function: 1.95 eV), which particularly preferably has a work function of 2.9 eV or less. Among the above, the alkali metal is preferably K, Rb or Cs, more preferably Rb or Cs, the most preferably Cs.

Examples of the alkali earth metal are Ca (work function: 2.9 eV), Sr (work function: 2.0 to 2.5 eV) and Ba (work function: 2.52 eV), which particularly preferably has a work function of 2.9 eV or less.

Examples of the rare-earth metal are Sc, Y, Ce, Tb, Yb and the like, which particularly preferably has a work function of 2.9 eV or less.

These metals possess especially high reducing property, so that doping to an electron injecting region in a relatively small amount can improve luminance of and extend a lifetime of an organic electroluminescence device.

Examples of the alkali metal compound are an alkali oxide such as $Li_2O$, $Cs_2O$ or $K_2O$, an alkali halogen compound such as LiF, NaF, CsF or KF, among which $Li_2O$ (the alkali oxide), LiF and NaF (the alkali fluoride) are preferable.

Examples of the alkali earth metal compound are BaO, SrO, CaO and a mixture thereof, i.e., $Ba_xSr_{1-x}O$ ($0<x<1$), $Ba_xCa_{1-x}O$ ($0<x<1$), among which BaO, SrO and CaO are preferable.

Examples of the rare-earth metal compound are $YbF_3$, $ScF_3$, $ScO_3$, $Y_2O_3$, $Ce_2O_3$, $GdF_3$ and $TbF_3$, among which $YbF_3$, $ScF_3$ and $TbF_3$ are preferable.

The alkali metal complex, the alkali earth metal complex and the rare-earth metal complex are not specifically limited, as long as at least one of alkali metal ion, alkali earth metal ion and rare-earth metal ion is contained therein as metal ion. A ligand for each of the complexes is preferably quinolinol, benzoquinolinol, acridinol, phenanthridinol, hydroxyphenyl oxazole, hydroxyphenyl thiazole, hydroxydiaryl oxadiazole, hydroxydiaryl thiadiazole, hydroxyphenyl pyridine, hydroxyphenyl benzoimidazole, hydroxybenzo triazole, hydroxy fluborane, bipyridyl, phenanthroline, phthalocyanine, porphyrin, cyclopentadiene, Ediketones, azomethines, or a derivative thereof, but the ligand is not limited thereto.

The reduction-causing dopant is added to preferably form a layer or an island pattern in the interfacial region. The layer of the reduction-causing dopant or the island pattern of the reduction-causing dopant is preferably formed by depositing the reduction-causing dopant by resistance heating deposition while an emitting material for forming the interfacial region or an organic substance as an electron-injecting material are simultaneously deposited, so that the reduction-causing dopant is dispersed in the organic substance. Dispersion concentration at which the reduction-causing dopant is dispersed in the organic substance is a mole ratio (organic substance to reduction-causing dopant) of 100:1 to 1:100, preferably 5:1 to 1:5.

When the reduction-causing dopant forms the layer, the emitting material or the electron injecting material for forming the organic layer of the interfacial region is initially layered, and the reduction-causing dopant is subsequently deposited singularly thereon by resistance heating deposition to form a preferably 0.1 to 15 nm-thick layer.

When the reduction-causing dopant forms an island pattern, the emitting material or the electron injecting material for forming the organic layer of the interfacial region is initially formed in the island shape, and the reduction-causing dopant is subsequently deposited singularly thereon by resistance heating deposition to form a preferably 0.05 to 1 nm-thick island shape.

A ratio of the main component to the reduction-causing dopant in the organic electroluminescence device of the invention is preferably a mole, ratio (main component to reduction-causing dopant) of 5:1 to 1:5, more preferably 2:1 to 1:2.

In the aspect of the invention, an electron injecting layer is preferably interposed between the phosphorescent-emitting layer and the cathode, and the electron injecting layer preferably contains a nitrogen-containing cyclic derivative as a main component.

It should be noted that "as the main component" means that the nitrogen-containing cyclic derivative is contained in the electron injecting layer with a content of 50 mass % or more.

A preferable example of an electron transporting material for forming the electron injecting layer is an aromatic heterocyclic compound having one or more heteroatoms in a molecule, among which a nitrogen-containing cyclic derivative is particularly preferable.

The nitrogen-containing cyclic derivative is preferably represented by a formula (A) below.

[Chemical Formula 123]

(A)

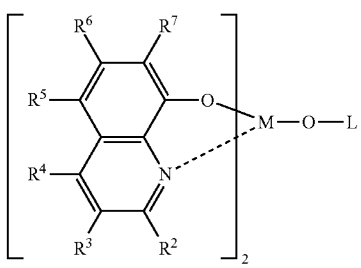

In the formula (A), $R^2$ to $R^7$ each independently represent a hydrogen atom, a halogen atom, an oxy group, an amino group or a hydrocarbon group having 1 to 40 carbon atoms. $R^2$ to $R^7$ may be substituted or unsubstituted.

Examples of the halogen atom include fluorine and chlorine. Examples of the substituted or unsubstituted amino group are an alkylamino group, an arylamino group, an aralkylamino group and the same as those described in relation to the above-mentioned amino group.

Examples of the hydrocarbon group having 1 to 40 carbon atoms are a substituted or unsubstituted alkyl group, alkenyl group, cycloalkyl group, alkoxy group, aryl group, heterocyclic group, aralkyl group, aryloxy group and alkoxycarbonyl group. Examples of the alkyl group, alkenyl group, cycloalkyl group, alkoxy group, aryl group, heterocyclic group, aralkyl group and aryloxy group are the same as above. The alkoxycarbonyl group is represented by —COOY', where examples of Y' are the same as those in relation to the above-mentioned alkyl group.

M represents aluminum (Al), gallium (Ga) or indium (In), among which aluminum (Al) is preferable.

L in the formula (A) represents a group represented by a formula (A') or (A") below.

[Chemical Formula 124]

(A')

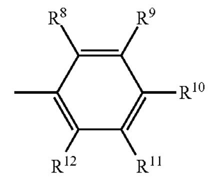

(A")

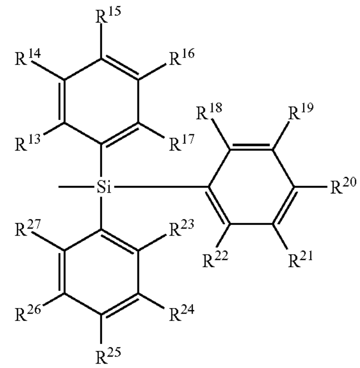

In the formula (A'), $R^8$ to $R^{12}$ each independently represent a hydrogen atom or a substituted or unsubstituted hydrocarbon group having 1 to 40 carbon atoms. Adjacent groups may form a cyclic structure.

In the formula (A"), $R^{13}$ to $R^{27}$ each independently represent a hydrogen atom or a substituted or unsubstituted hydrocarbon group having 1 to 40 carbon atoms. Adjacent groups may form a cyclic structure.

Examples of the hydrocarbon group having 1 to 40 carbon atoms represented by each of $R^8$ to $R^{12}$ and $R^{13}$ to $R^{27}$ in the formulae (A') and (A") are the same as those of $R^2$ to $R^7$.

Examples of the divalent group formed when an adjacent set of groups $R^8$ to $R^{12}$ and $R^{13}$ to $R^{27}$ forms a cyclic structure are a tetramethylene group, a pentamethylene group, a hexamethylene group, a diphenylmethane-2,2'-diyl group, a diphenylethane-3,3'-diyl group and a diphenylpropane-4,4'-diyl group.

Examples of the nitrogen-containing cyclic metal chelate complex represented by the formula (A) will be shown below. However, the nitrogen-containing cyclic metal chelate complex is not limited to the exemplary compounds shown below.

[Chemical Formula 125]

(A-1)

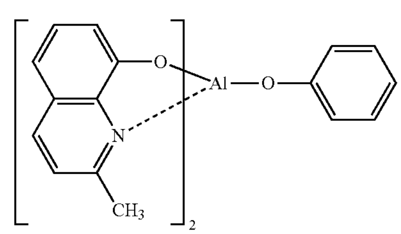

-continued
(A-2)
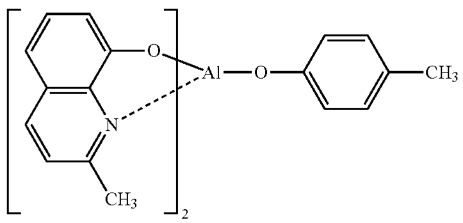
(A-3)
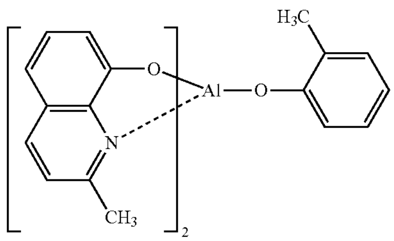
(A-4)
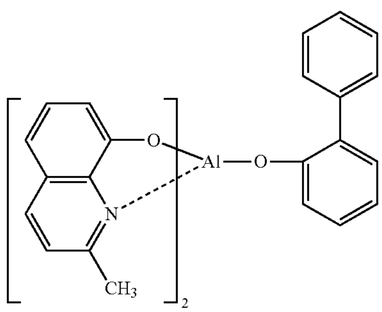
(A-5)
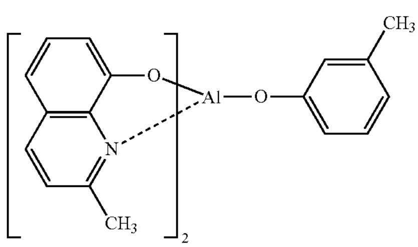
(A-6)
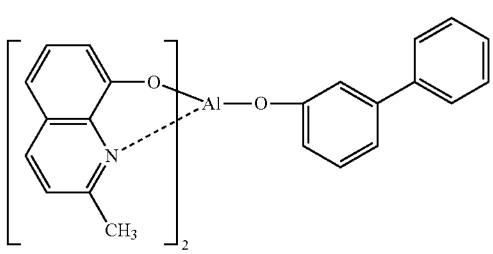
(A-7)
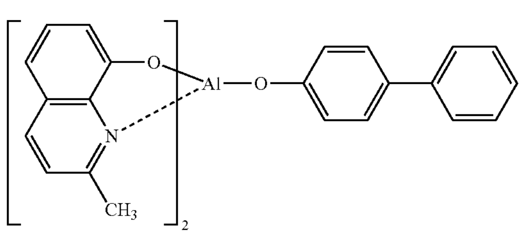
-continued
(A-8)
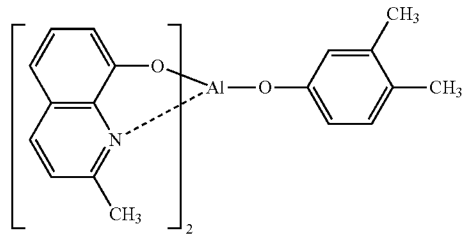
(A-9)
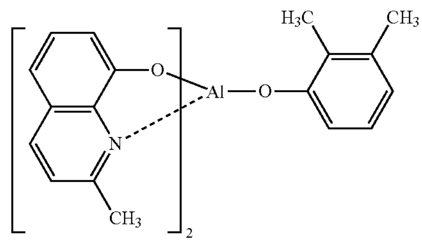
(A-10)
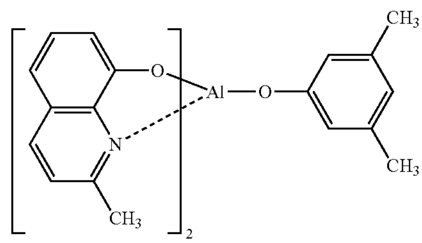
(A-11)
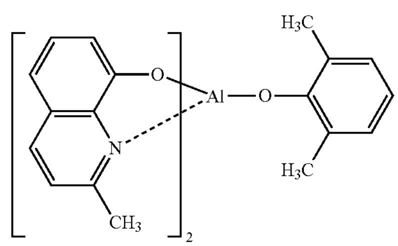
(A-12)
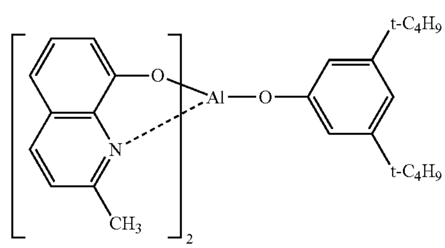
(A-13)
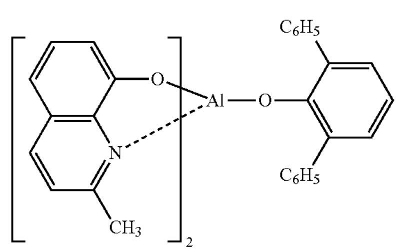

-continued
(A-14)
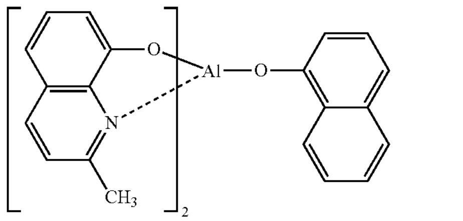
(A-15)
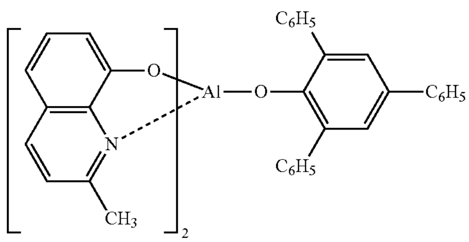
(A-16)
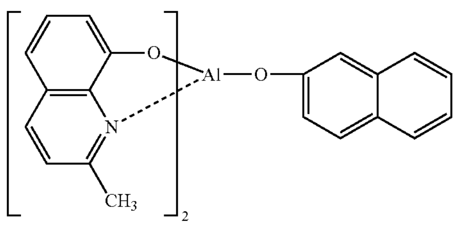
[Chemical Formula 126]
(A-17)
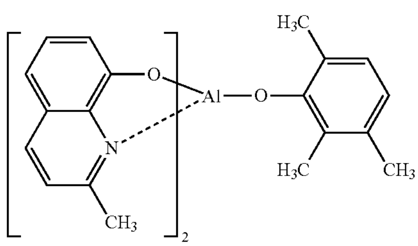
(A-18)
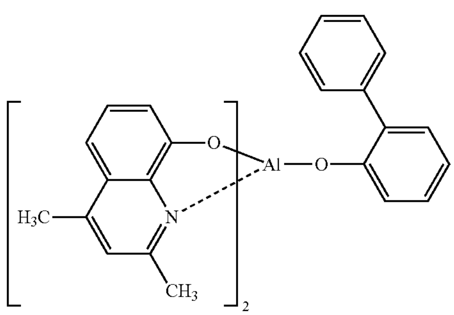
(A-19)
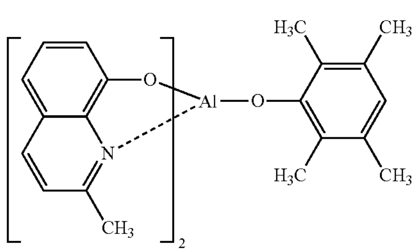
-continued
(A-20)
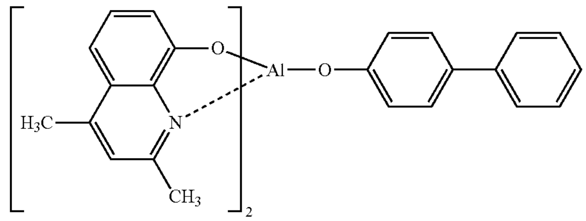
(A-22)
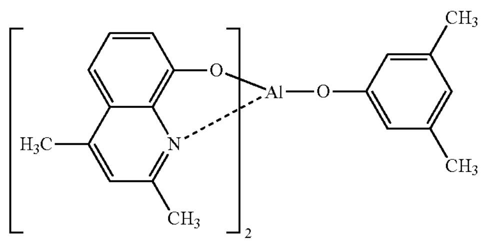
(A-23)
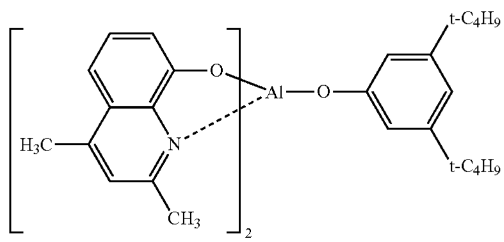
(A-24)
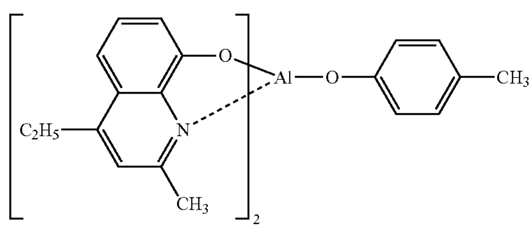
(A-25)
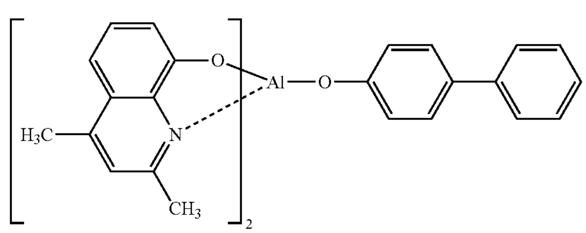
(A-26)
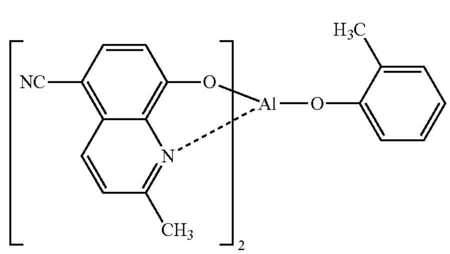

-continued (A-27)

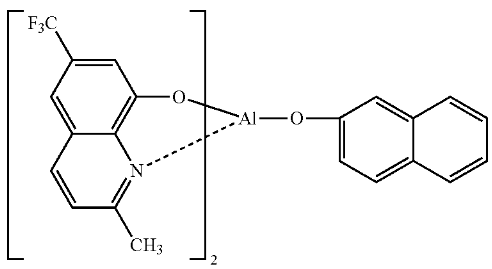

(A-28)

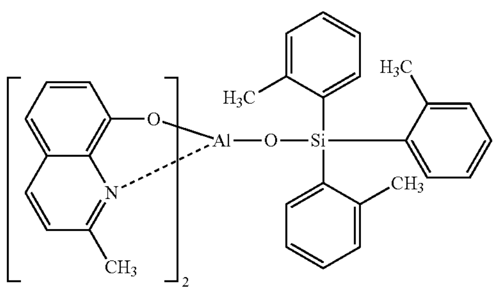

(A-29)

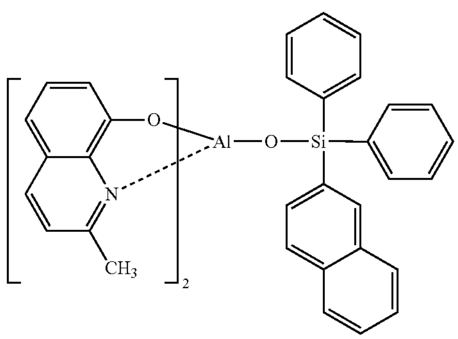

(A-30)

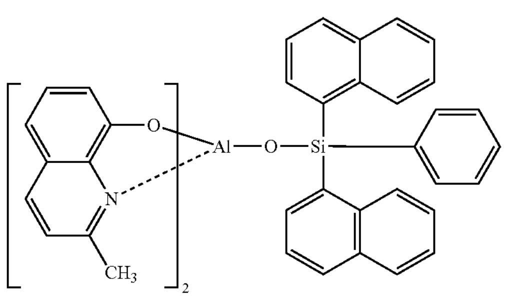

[Chemical Formula 127]

(A-31)

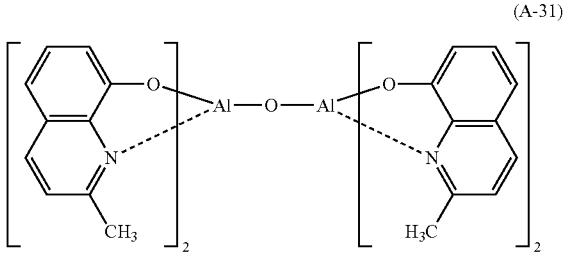

-continued (A-32)

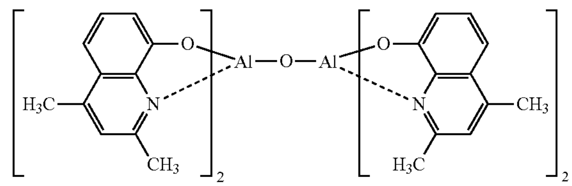

(A-33)

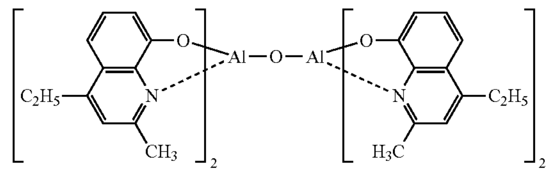

(A-34)

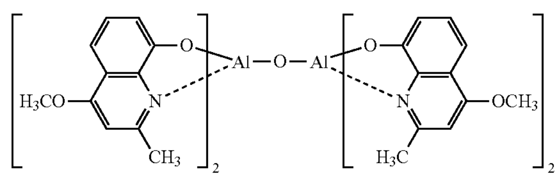

(A-35)

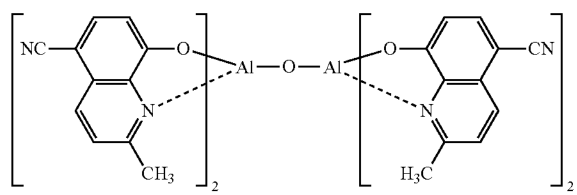

(A-36)

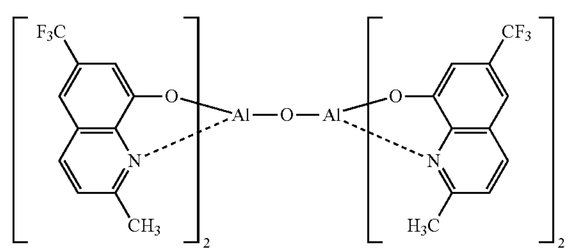

A preferable example of the nitrogen-containing cyclic derivative as the main component of the electron injecting layer also includes a nitrogen-containing 5-membered ring derivative. Examples of a nitrogen-containing 5-membered ring are an imidazoles ring, a triazoles ring, a tetrazole ring, an oxadiazole ring, a thiadiazole ring, an oxatriazole ring and a thiatriazole ring. Examples of the nitrogen-containing 5-membered ring derivative are a benzoimidazole ring, a benzotriazole ring, a pyridinoimidazole ring, a pyrimidinoimidazole ring and a pyridazinoimidazole ring, among which a compound represented by a formula (B) below is particularly preferable.

[Chemical Formula 128]

(B)

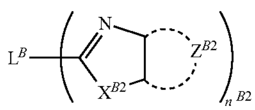

In the formula (B), $L^B$ represents a divalent or more linking group, examples of which are carbon, silicon, nitrogen, boron, oxygen, sulfur, metal (e.g. barium and beryllium), an aryl group and an aromatic heterocyclic group. Among those, carbon, nitrogen, silicon, boron, oxygen, sulfur, the aryl group and the aromatic heterocyclic group are preferable, and carbon, silicon, the aryl group and the aromatic heterocyclic group are more preferable.

The aryl group and aromatic heterocyclic group of $L^B$ may be substituted or unsubstituted. Examples of the substituent are preferably an alkyl group, an alkenyl group, an alkynyl group, an aryl group, an amino group, an alkoxy group, an aryloxy group, an acyl group, an alkoxycarbonyl group, an aryloxycarbonyl group, an acyloxy group, an acylamino group, an alkoxycarbonylamino group, an aryloxycarbonylamino group, a sulfonylamino group, a sulfamoyl group, a carbamoyl group, an alkylthio group, an arylthio group, a sulfonyl group, a halogen atom, a cyano group and an aromatic heterocyclic group, more preferably an alkyl group, an aryl group, an alkoxy group, aryloxy group, halogen, a cyano group and an aromatic heterocyclic group, further preferably an alkyl group, an aryl group, alkoxy group, an aryloxy group and an aromatic heterocyclic group, particularly preferably an alkyl group, an aryl group an alkoxy group and an aromatic heterocyclic group.

Specifically, examples for $L^B$ are as follows.

[Chemical Formula 129]

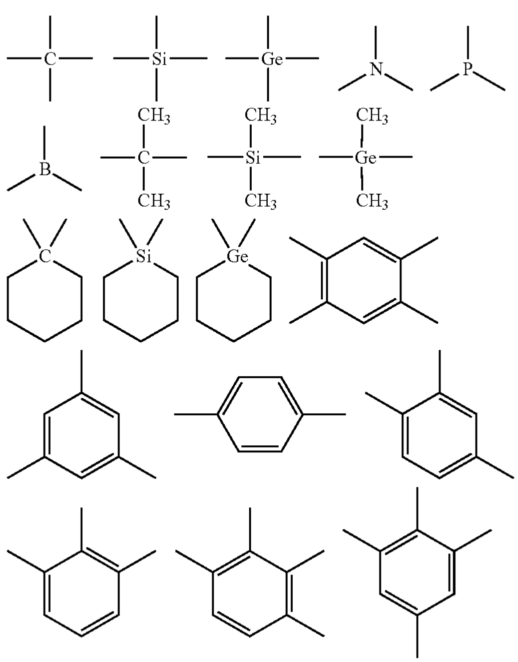

-continued

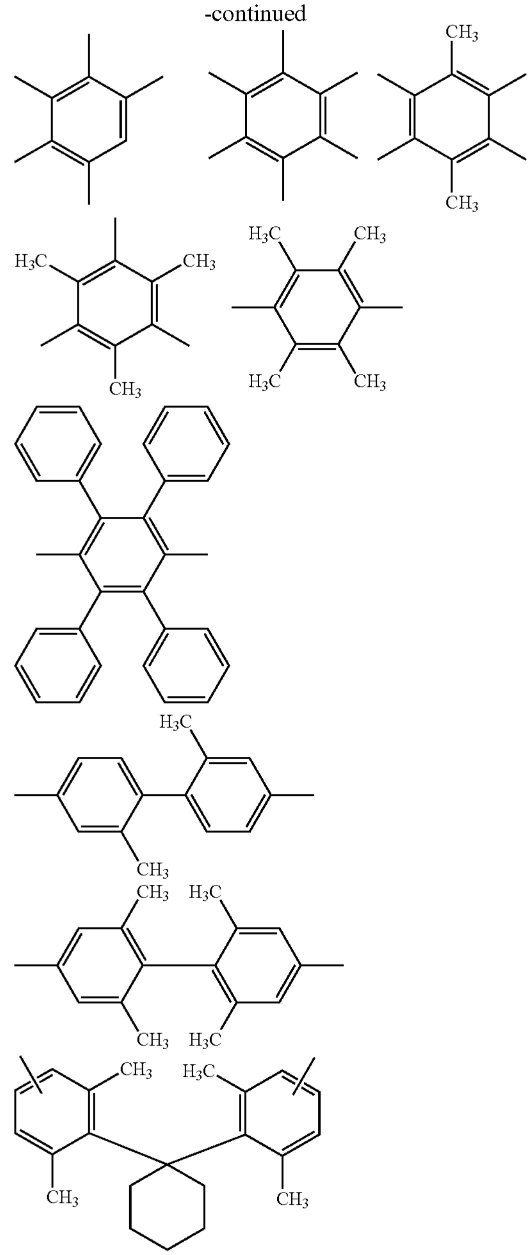

In the formula (B), $X^{B2}$ represents —O—, —S— or =N—$R^{B2}$. $R^{B2}$ represents hydrogen, an aliphatic hydrocarbon group, an aryl group or heterocyclic group.

The aliphatic hydrocarbon group for $R^{B2}$ is a linear, branched or cyclic alkyl group, which preferably has 1 to 20 carbon atoms, more preferably 1 to 12 carbon atoms, particularly preferably 1 to 8 carbon atoms, examples of which includes methyl, ethyl, isopropyl, t-butyl, n-octyl, n-decyl, n-hexadecyl, cyclopropyl, cyclopentyl and cyclohexyl; an alkenyl group, which preferably has 2 to 20 carbon atoms, more preferably 2 to 12 carbon atoms, particularly preferably 2 to 8 carbon atoms, examples of which includes vinyl, allyl, 2-butenyl and 3-pentenyl; and an alkynyl group, which preferably has 2 to 20 carbon atoms, more preferably 2 to 12 carbon atoms, particularly preferably 2 to 8 carbon atoms, examples of which includes propargyl and 3-pentynyl. The aliphatic hydrocarbon group is preferably an alkyl group among those.

The aryl group for $R^{B2}$, which may be monocyclic or condensed, preferably has 6 to 30 carbon atoms, more preferably 6 to 20 carbon atoms, further preferably 6 to 12 carbon atoms. Examples of the aryl group are phenyl, 2-methylphenyl, 3-methylphenyl, 4-methylphenyl, 2-methoxyphenyl, 3-trifluoromethylphenyl, pentafluorophenyl, 1-naphthyl and 2-naphthyl.

The heterocyclic group, which may be monocyclic or condensed, preferably has 1 to 20 carbon atoms, more preferably 1 to 12 carbon atoms, further preferably 2 to 10 carbon atoms. The heterocyclic group is preferably an aromatic heterocyclic group having at least one of a nitrogen atom, an oxygen atom, a sulfur atom and a selenium atom. Examples of the heterocyclic group are pyrrolidine, piperidine, piperazine, morpholine, thiophene, selenophene, furan, pyrrole, imidazole, pyrazole, pyridine, pyrazine, pyridazine, pyrimidine, triazole, triazine, indole, indazole, purine, thiazoline, thiazole, thiadiazole, oxazoline, oxazole, oxadiazole, quinoline, isoquinoline, phthalazine, naphthyridine, quinoxaline, quinazoline, cinnoline, pteridine, acridine, phenanthroline, phenazine, tetrazole, benzoimidazole, benzooxazole, benzothiazole, benzotriazole, tetra-aza indene, carbazole and azepine, preferably furan, thiophene, pyridine, pyrazine, pyrimidine, pyridazine, triazine, quinoline, phthalazine, naphthyridine, quinoxaline and quinazoline, further preferably furan, thiophene, pyridine and quinoline, further more preferably quinoline.

The aliphatic hydrocarbon group, aryl group and heterocyclic group, which are represented by $R^{B2}$, may be substituted or unsubstituted. Examples of the substituent are the same as those of the group represented by $L^{B}$ and preferable examples are also the same.

$R^{B2}$ is preferably the aliphatic hydrocarbon group, the aryl group or the heterocyclic group, more preferably the aliphatic hydrocarbon group (which preferably has 6 to 30 carbon atoms, more preferably 6 to 20 carbon atoms, further preferably 6 to 12 carbon atoms) or the aryl group, further preferably the aliphatic hydrocarbon group (which preferably has 1 to 20 carbon atoms, more preferably 1 to 12 carbon atoms, further preferably 2 to 10 carbon atoms).

$X^{B2}$ is preferably —O— or =N—$R^{B2}$, more preferably =N—$R^{B2}$.

$Z^{B2}$ represents a group of atoms necessary for forming an aromatic ring. The aromatic ring to be formed in $Z^{B2}$ may be an aromatic hydrocarbon ring or an aromatic heterocyclic ring. Examples of the aromatic ring are a benzene ring, a pyridine ring, a pyrazine ring, a pyrimidine ring, a pyridazine ring, a triazine ring, a pyrrole ring, a furan ring, a thiophene ring, a selenophene ring, a tellurophene ring, an imidazole ring, a thiazole ring, a selenazole ring, a tellurazole ring, a thiadiazole ring, an oxadiazole ring and a pyrazole ring, preferably a benzene ring, a pyridine ring, a pyrazine ring, a pyrimidine ring and a pyridazine ring, more preferably a benzene ring, a pyridine ring and a pyrazine ring, further preferably a benzene ring and pyridine ring, particularly preferably a pyridine ring.

The aromatic ring to be formed in $Z^{B2}$ may further form a condensed ring with another ring and may be substituted or unsubstituted. Examples of the substituent, which are the same as those of the group represented by $L^{B}$, are preferably an alkyl group, an alkenyl group, an alkynyl group, an aryl group, an amino group, an alkoxy group, an aryloxy group, an acyl group, an alkoxycarbonyl group, an aryloxycarbonyl group, an acyloxy group, an acylamino group, an alkoxycarbonylamino group, an aryloxycarbonylamino group, a sulfonylamino group, a sulfamoyl group, a carbamoyl group, an alkylthio group, an arylthio group, a sulfonyl group, a halogen atom, a cyano group and a heterocyclic group, more preferably an alkyl group, an aryl group, an alkoxy group, an aryloxy group, a halogen atom, a cyano group and a heterocyclic group, further preferably an alkyl group, an aryl group, an alkoxy group, an aryloxy group and an aromatic heterocyclic group, particularly preferably an alkyl group, an aryl group an alkoxy group and an aromatic heterocyclic group.

$N^{B2}$ is an integer in a range of 1 to 4, preferably 2 to 3.

Among the nitrogen-containing 5-membered ring derivatives represented by the formula (B), a compound represented by a formula (B') below is more preferable.

[Chemical Formula 130]

(B')

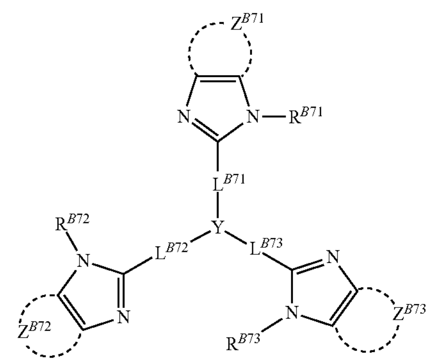

In the formula (B'), $R^{B71}$, $R^{B72}$ and $R^{B73}$ each are the same as $R^{B2}$ in the formula (B). Preferable range of $R^{B71}$, $R^{B72}$ and $R^{B73}$ each are the same as that of $R^{B2}$.

$Z^{B71}$, $Z^{B72}$ and $Z^{B73}$ each are the same as $Z^{B2}$ in the formula (B). Preferable range of $Z^{B71}$, $Z^{B72}$ and $Z^{B73}$ each are the same as that of $Z^{B2}$.

$L^{B71}$, $L^{B72}$ and $L^{B73}$ each represent a linking group and are exemplified by a divalent linking group among the examples of $L^{B}$ in the formula (B). The linking group is preferably in a combination of a single bond, a divalent aromatic hydrocarbon ring group, a divalent aromatic heterocyclic group and a combination thereof, more preferably a single bond. $L^{B71}$, $L^{B72}$ and $L^{B73}$ may be substituted or unsubstituted. Examples of the substituent are the same as those of the group represented by $L^{B}$ in the formula (B) and preferable examples are also the same.

Y represents a nitrogen atom, 1,3,5-benzenetriyl group or 2,4,6-triazinetriyl group. 1,3,5-benzenetriyl group may have a substituent at a 2,4,6-position. Examples of the substituent are an alkyl group, an aromatic hydrocarbon ring group and a halogen atom.

Specific examples of the nitrogen-containing 5-membered derivative represented by the formula (B) or (B') will be shown below. However, the nitrogen-containing 5-membered derivative is not limited to the exemplary compounds shown below.

[Chemical Formula 131]
(B-1)
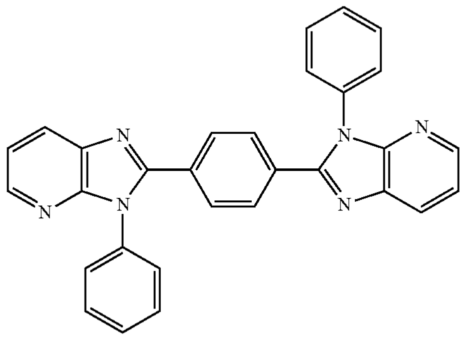
(B-2)
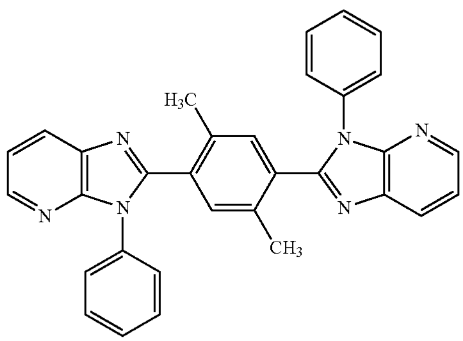
(B-3)
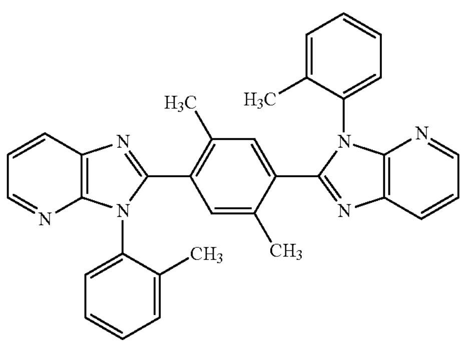
(B-4)
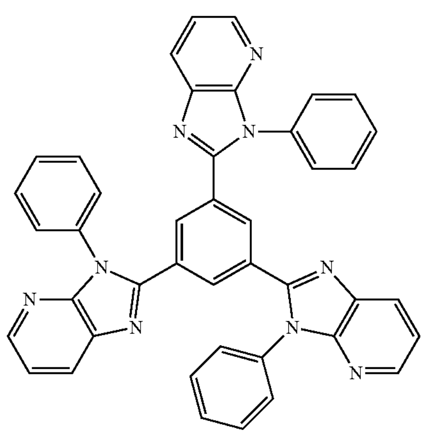
-continued
(B-5)
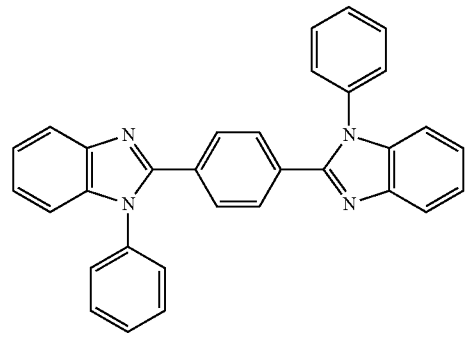
(B-6)
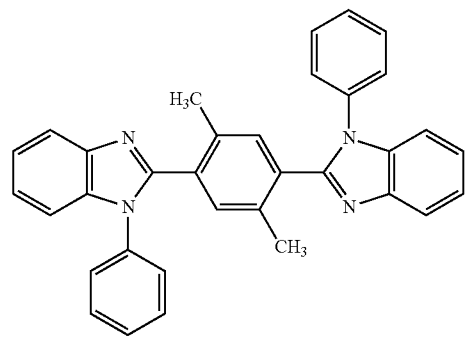
(B-7)
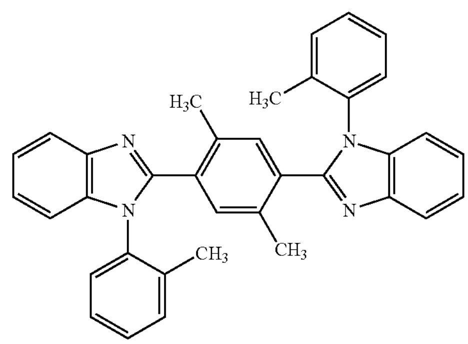
(B-8)
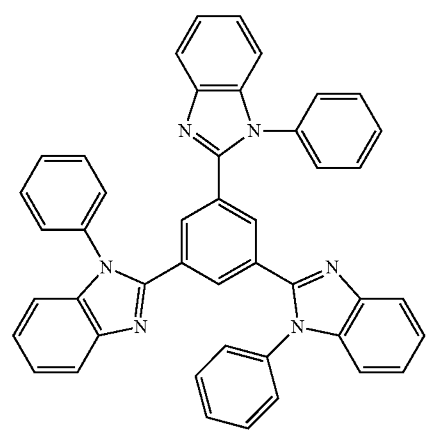

-continued
[Chemical Formula 132]
(B-9)
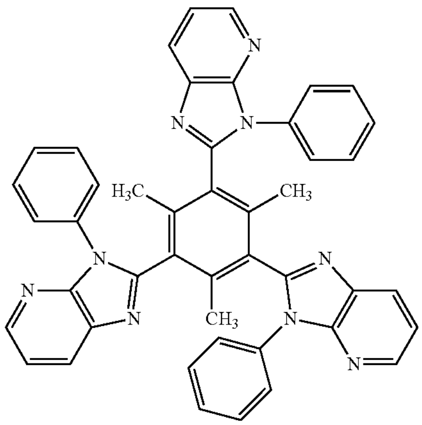
(B-10)
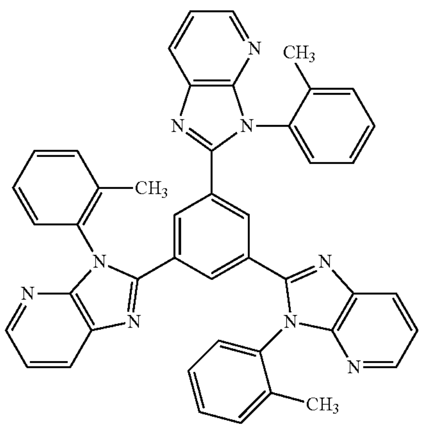
(B-11)
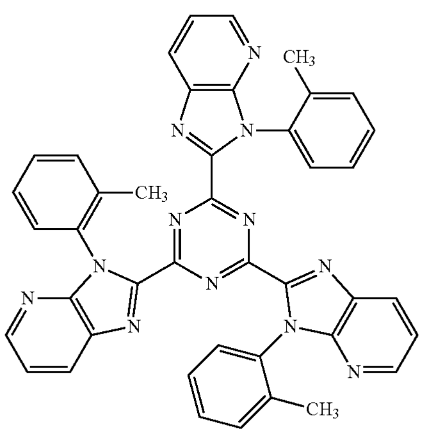
-continued
(B-12)
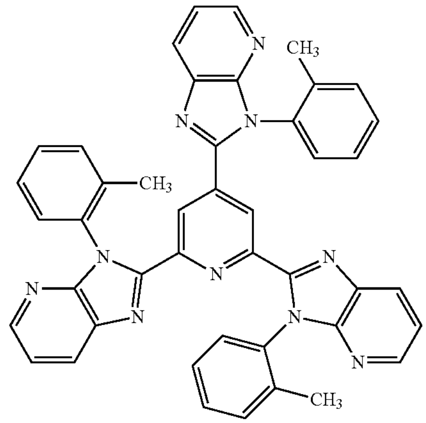
(B-13)
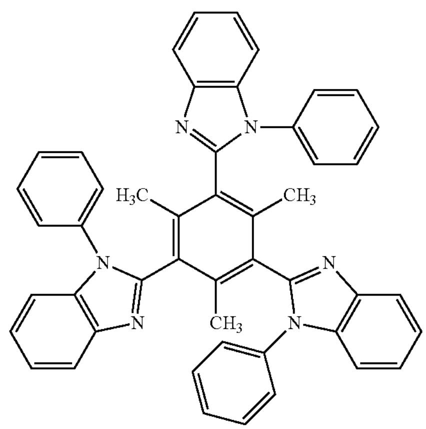
(B-14)
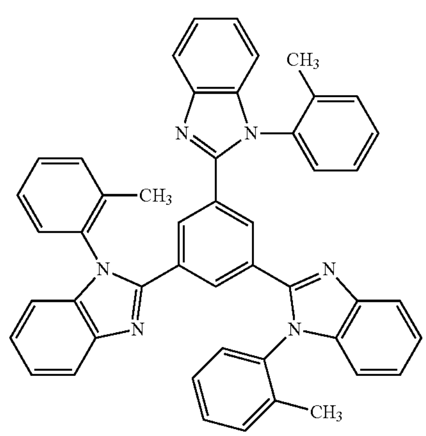

-continued (B-15)

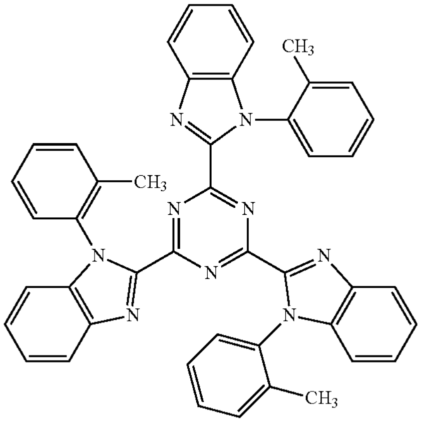

(B-16)

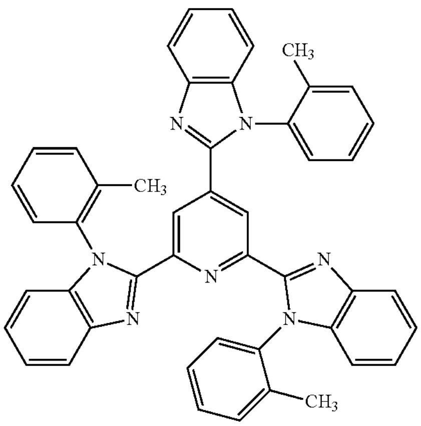

The compound forming the electron injecting layer and the electron transporting layer may be a compound in combination of a skeleton structure of an electron-deficient nitrogen-containing 5-membered ring or an electron-deficient nitrogen-containing 6-membered ring, a substituted or unsubstituted indole skeleton structure, a substituted or unsubstituted carbazole skeleton structure and a substituted or unsubstituted azacarbazole skeleton structure. The skeleton structure of an electron-deficient nitrogen-containing 5-membered ring or an electron-deficient nitrogen-containing 6-membered ring is preferably a skeleton structure of pyridine, pyrimidine, pyrazine, triazine, triazoles, oxadiazole, pyrazole, imidazoles, quinoxaline and pyrrole, and a molecular skeleton structure of benzimidazoles, imidazopyridine and the like that the above skeleton structures are mutually condensed. Among these combinations, a skeleton structure of pyridine, pyrimidine, pyrazine and triazine and a skeleton structure of carbazole, indole, azacarbazole and quinoxaline are preferable. The above skeleton structure may be substituted or unsubstituted.

Examples of the electron transporting compound are shown below.

[Chemical Formula 133]

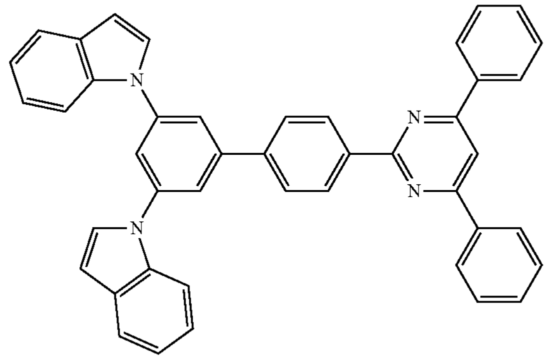

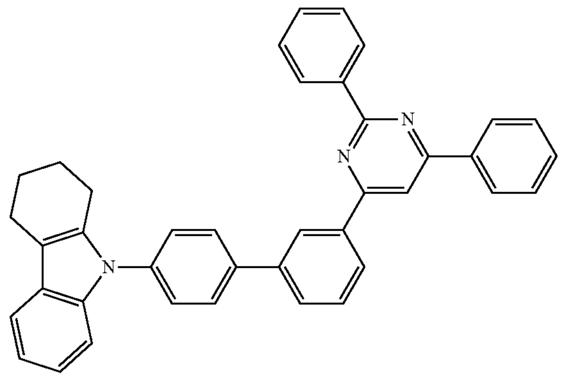

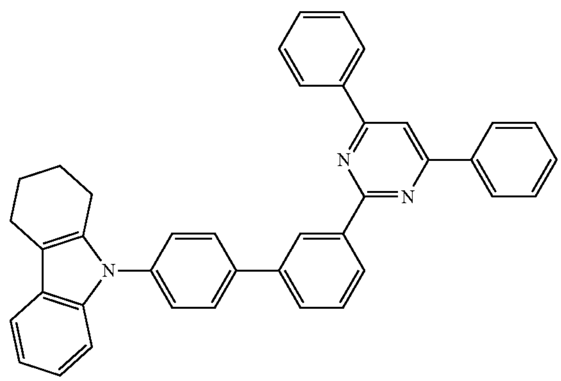

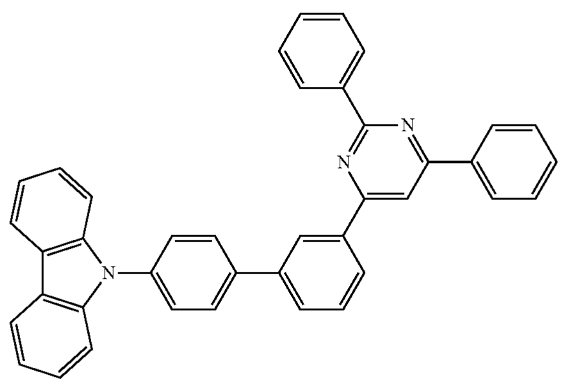

-continued
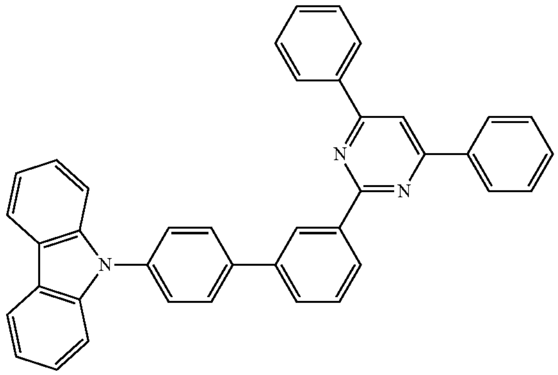
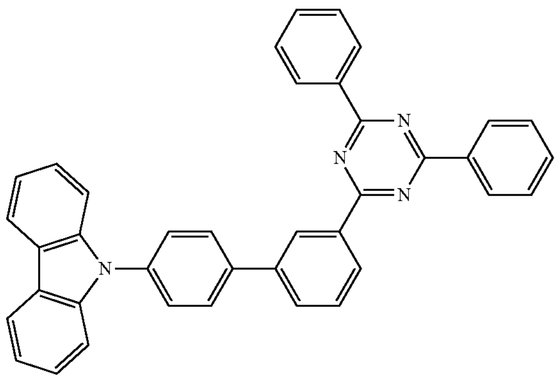
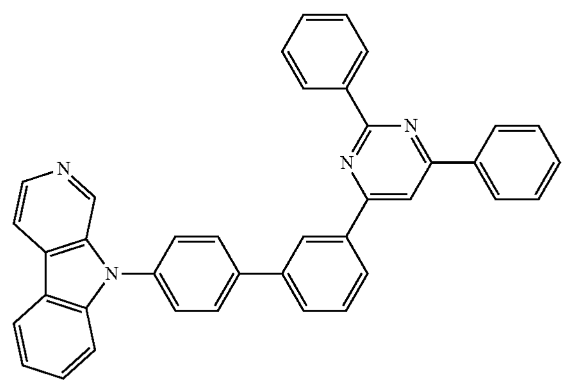
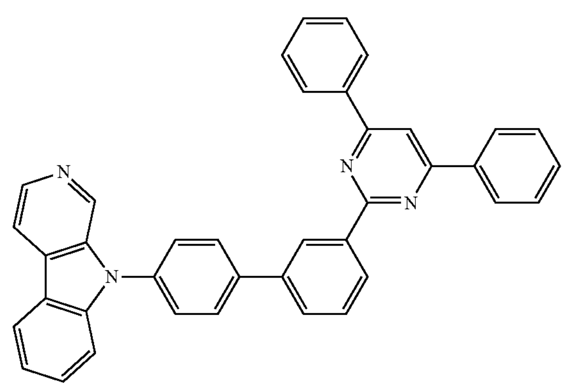
-continued
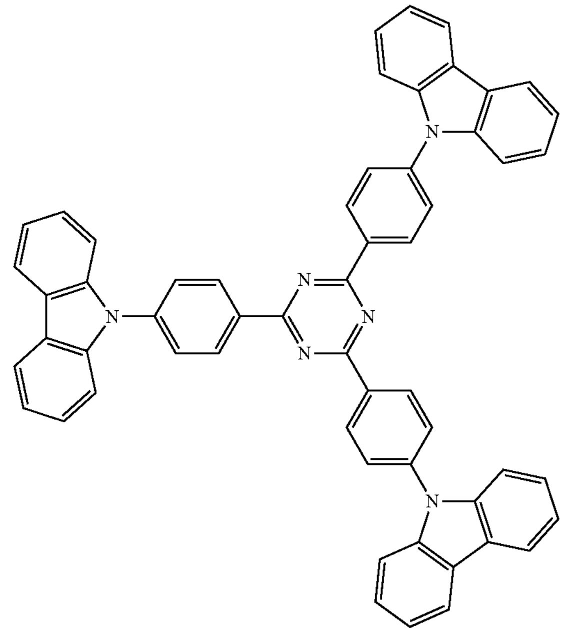
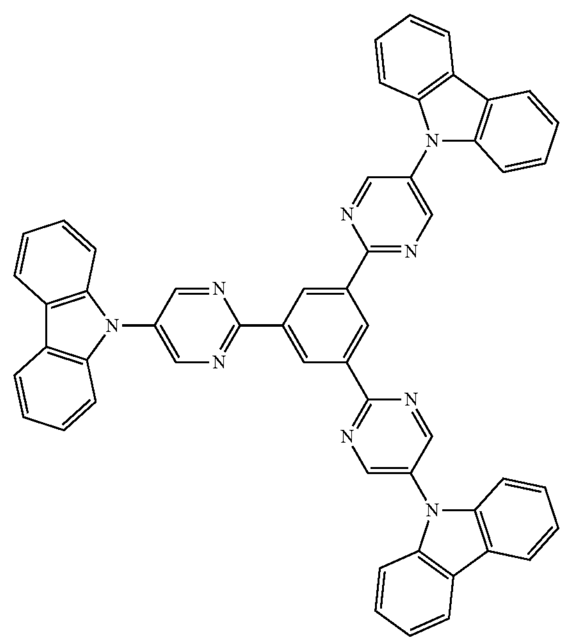

-continued
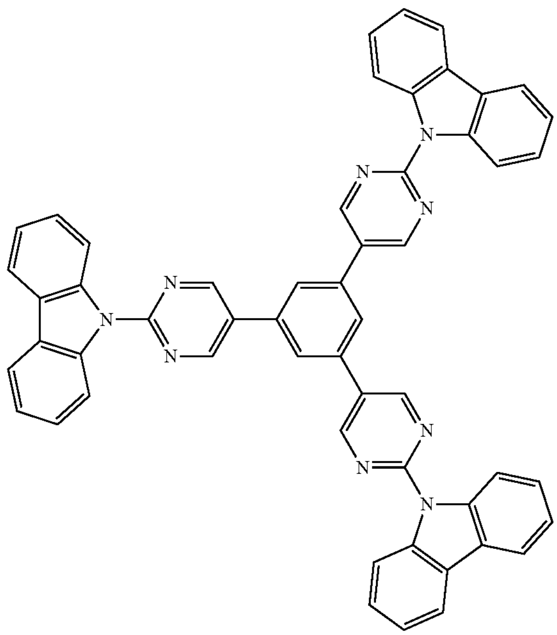
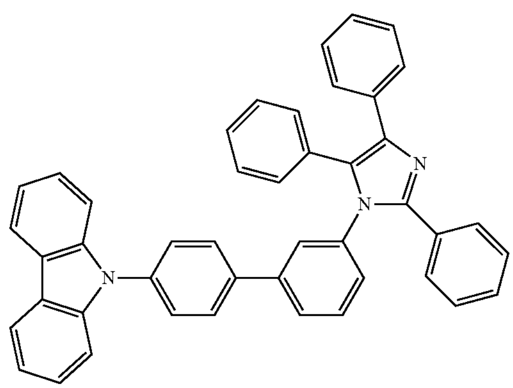
[Chemical Formula 134]
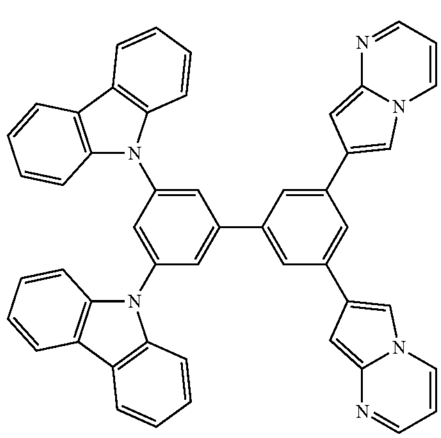
-continued
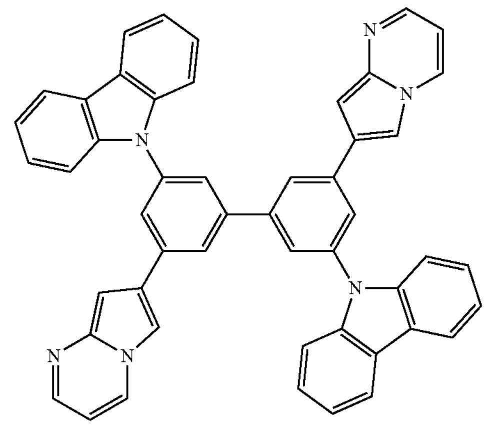
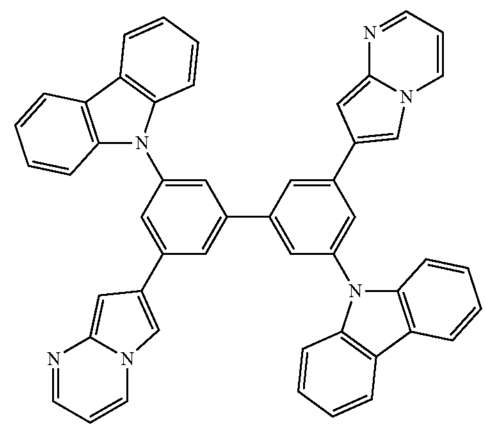
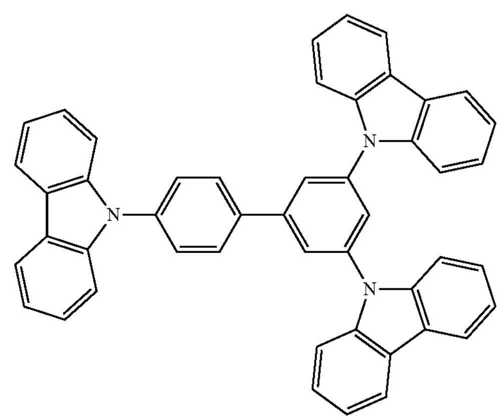
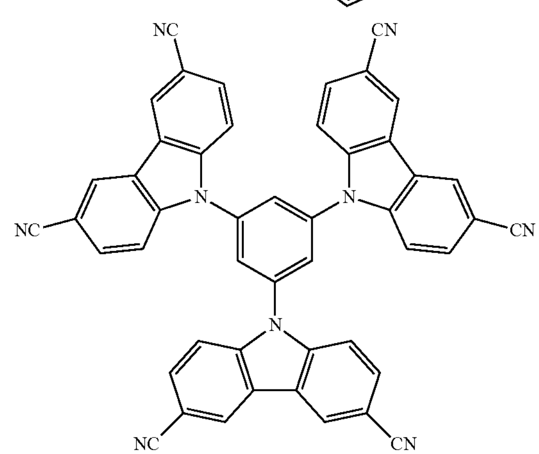

-continued

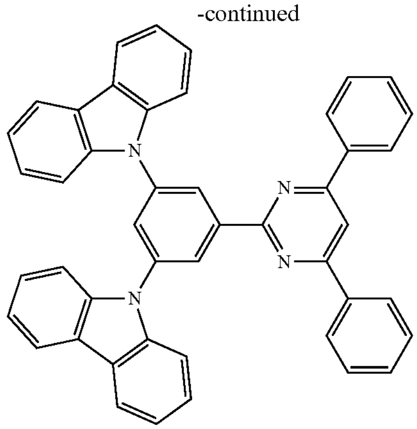

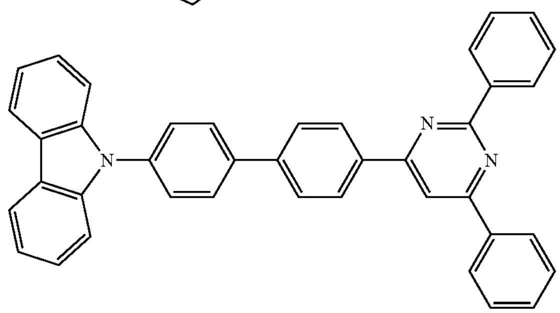

The electron injecting layer and the electron transporting layer may be a single layer structure formed by one or more materials selected from the above materials, or a multi-layer structure formed by a plurality of layers that have the same composition or different composition. The electron injecting layer and the electron transporting layer are preferably π electron-deficient nitrogen-containing hetero ring group.

The electron injecting layer preferably contains an inorganic compound such as an insulator or a semiconductor in addition to the nitrogen-containing cyclic derivative. Such an insulator or a semiconductor, when contained in the electron injecting layer, can effectively prevent a current leak, thereby enhancing electron injectability of the electron injecting layer.

As the insulator, it is preferable to use at least one metal compound selected from the group consisting of an alkali metal chalcogenide, an alkali earth metal chalcogenide, a halogenide of alkali metal and a halogenide of alkali earth metal. A configuration in which the electron injecting layer is formed by these alkali metal chalcogenide and the like is advantageous in that the electron injecting property is further improved. Specifically, preferable examples of the alkali metal chalcogenide are $Li_2O$, $K_2O$, $Na_2S$, $Na_2Se$ and $Na_2O$, while preferable example of the alkali earth metal chalcogenide are CaO, BaO, SrO, BeO, BaS and CaSe. Preferable examples of the halogenide of the alkali metal are LiF, NaF, KF, LiCl, KCl and NaCl. Preferable examples of the halogenide of the alkali earth metal are fluorides such as $CaF_2$, $BaF_2$, $SrF_2$, $MgF_2$ and $BeF_2$, and halogenides other than the fluoride.

Examples of the semiconductor are one of or a combination of two or more of an oxide, a nitride or an oxidized nitride containing at least one element selected from Ba, Ca, Sr, Yb, Al, Ga, In, Li, Na, Cd, Mg, Si, Ta, Sb and Zn. An inorganic compound for forming the electron injecting layer is preferably a microcrystalline or amorphous semiconductor film. When the electron injecting layer is formed of such insulator film, more uniform thin film can be formed, thereby reducing pixel defects such as a dark spot. Examples of such an inorganic compound are the above-described alkali metal chalcogenide, alkali earth metal chalcogenide, halogenide of the alkali metal and halogenide of the alkali earth metal.

The electron injecting layer according to the invention may preferably contain the above-described reduction-causing dopant.

In the aspect of the invention, an electron-receiving substance is added to or bonded to the first or second hole transporting layer.

With this arrangement, such effects as described in the patents below provide low-voltage driving and highly efficient emission.

As the electron-receiving substance to be added or bonded to the first hole transporting layer or the second hole transporting layer of the invention, an inorganic compound such as p-type Si and p-type SiC, an electron-receiving inorganic oxide such as molybdenum oxide and an electron-receiving organic compound such as TCNQ derivatives can be suitably used in addition to hexaazatriphenylene derivatives and the like described in Japanese Patent Publication No. 3614405, No. 3571977 or U.S. Pat. No. 4,780,536.

BRIEF DESCRIPTION OF DRAWINGS

FIG. 1 shows an outline structure of an organic electroluminescence device according to an exemplary embodiment of the invention.

BEST MODE FOR CARRYING OUT THE INVENTION

Preferable exemplary embodiment(s) of the invention will be described below.

[Organic Electroluminescence Device]

FIG. 1 shows a schematic arrangement of an organic electroluminescence device according to an exemplary embodiment of the invention.

An organic electroluminescence device 1 includes a transparent substrate 2, an anode 3, a cathode 4 and an organic thin-film layer 10 disposed between the anode 3 and the cathode 4.

The organic thin-film layer 10 includes a phosphorescent-emitting layer 5 containing the phosphorescent host and the phosphorescent dopant as described above, an electron transporting layer 7 provided closer to the cathode 4 than the phosphorescent-emitting layer 5, and a hole transporting layer 6 provided closer to the anode 3 than the phosphorescent-emitting layer 5.

The electron transporting layer 7 contains at least one of nitrogen-containing heterocycle derivatives represented by the formulae (1) to (3).

Alternatively, the electron transporting layer 7 contains at least one of compounds represented by the formulae (4) to (6).

The compounds represented by the formulae (1) to (6) contained in the electron transporting layer 7 are not limited to a single type of compound. In other words, the hole transporting layer 7 may contain a plurality of the compounds represented by the formulae (1) to (6).

The hole transporting layer 6 has a first hole transporting layer 61 and a second hole transporting layer 62 in this order starting from the side of the anode 3.

The first hole transporting layer 61 contains a hole transporting material with hole transporting capability and the second hole transporting layer 62 contains at least one of the compounds represented by the formulae (7) to (11).

The compounds represented by the above formulae (7) to (11) contained in the second hole transporting layer 62 are not limited to a single type of compound. In other words, the second hole transporting layer 62 may contain a plurality of the compounds represented by the formulae (7) to (11).

In the aspect of the invention, the anode 3 of the organic electroluminescence device 1 serves for injecting holes into the hole injecting layer or the hole transporting layer. Accordingly, it is favorable in terms of efficiency that the anode 3 has a work function of 4.5 eV or higher. Exemplary materials for the anode used in the invention are indium-tin oxide (ITO), tin oxide (NESA), gold, silver, platinum and copper. The cathode is preferably formed of a material having a smaller work function in order to inject electrons into the electron injecting layer or the phosphorescent-emitting layer 5.

The material used for the cathode 4 is not particularly limited, examples of the usable material are indium, aluminum, magnesium, alloy of magnesium and indium, alloy of magnesium and aluminum, alloy of aluminum and lithium, alloy of aluminum, scandium and lithium, and alloy of magnesium and silver.

A method of forming each of the layers in the organic electroluminescence device 1 according to the aspect of the invention is not particularly limited.

The layers may be formed by a conventional coating method such as vacuum deposition, molecular beam epitaxy (MBE method) and coating methods using a solution such as a dipping, spin coating, casting, bar coating and roll coating.

Although the thickness of each organic layer of the organic electroluminescence device 1 according to the aspect of the invention is not particularly limited, the thickness is generally preferably in a range of several nanometers to 1 μm because an excessively-thinned film is likely to entail defects such as a pin hole while an excessively-thickened film requires high voltage to be applied and deteriorates efficiency.

An arrangement of the organic electroluminescence device 1 according to the aspect of the invention is not particularly limited to the arrangement shown in FIG. 1.

For instance, a hole injecting layer may be provided between the first hole transporting layer 61 and the anode 3.

A hole blocking layer may be provided between the phosphorescent-emitting layer 5 and the electron transporting layer 7.

The hole blocking layer can trap holes in the phosphorescent-emitting layer 5, thereby enhancing probability of charge recombination in the phosphorescent-emitting layer 5 and improving luminous efficiency.

EXAMPLES

Next, the invention will be described in further detail by exemplifying Example(s) and Comparative(s). However, the invention is not limited by the description of Example(s).

Example 1

A glass substrate (size: 25 mm×75 mm×1.1 mm thick) having an ITO transparent electrode (manufactured by Asahi Glass Co., Ltd) was ultrasonic-cleaned in isopropyl alcohol for five minutes, and then UV/ozone-cleaned for 30 minutes.

After the glass substrate having the transparent electrode line was cleaned, the glass substrate was mounted on a substrate holder of a vacuum deposition apparatus, so that 30-nm thick film of a compound C was initially formed by resistance heating deposition to cover a surface of the glass substrate where the transparent electrode line was provided. The compound C film serves as a first hole transporting layer.

After the film-formation of the first hole transporting layer, a 20-nm thick film of an electron-blocking compound A was formed by resistance heating deposition to cover the film of the first hole transporting layer. The compound A film serves as a second hole transporting layer.

Further, on the second hole transporting layer, a compound D as a host and a compound $Ir(piq)_3$ as a phosphorescent dopant were co-evaporated by resistance heating deposition to form a 40-nm thick film. A concentration of $Ir(piq)_3$ was 5 mass %. This co-evaporated layer serves as a phosphorescent-emitting layer.

After the film-formation of the phosphorescent-emitting layer, a 40-nm thick film of a compound J was formed. The J film serves as an electron transporting layer.

Then, a 0.5-nm thick film of LiF was formed as an electron-injecting electrode (cathode) at a film-forming speed of 0.1 Å/min. Metal (Al) was vapor-deposited on the LiF film to form a 150-nm thick metal cathode, thereby providing an organic electroluminescence device.

Chemical Formula 135]

Compound A

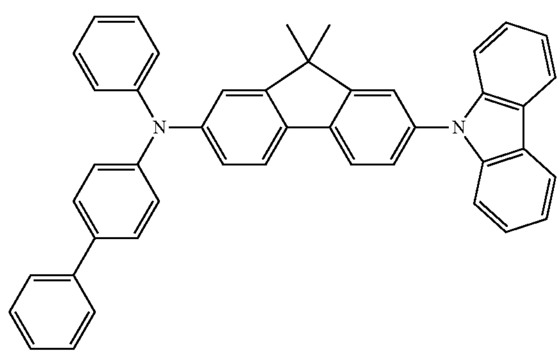

-continued

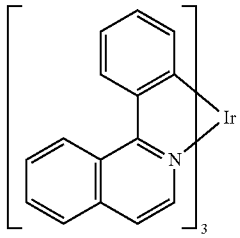

$Ir(piq)_3$

Compound C

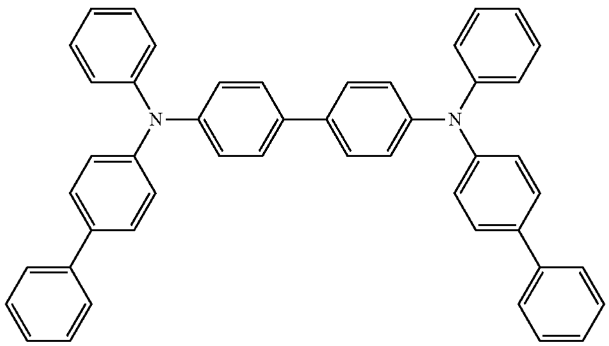

Compound D

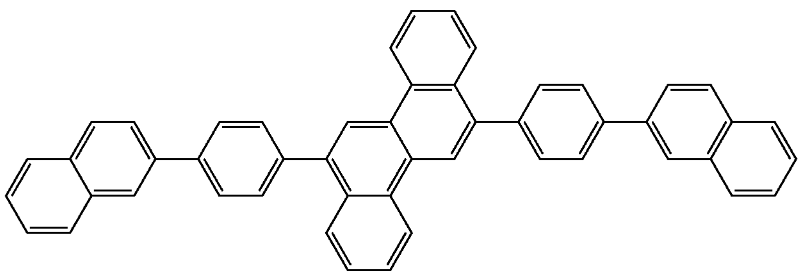

Compound J

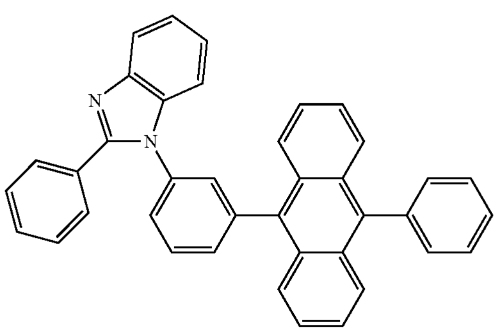

Examples 2 to 8 and Comparatives 1 and 2

The organic electroluminescence device was manufactured in the same manner as in Example 1 except that the compounds forming the second hole transporting layer and the phosphorescent-emitting layer were changed to the compounds shown in Tables 1 and 2 below.

In Comparatives 1 and 2, a single layer of the hole transporting layer, which was not divided into the first and second hole transporting layers, was provided.

TABLE 1

| | 2nd hole transporting layer | host | phosphorescent dopant | Electron transporting layer |
|---|---|---|---|---|
| Example 1 | Compound A | Compound D | $Ir(piq)_3$ | Compound J |
| Example 2 | Compound A | Compound E | $Ir(piq)_3$ | Compound J |
| Example 3 | Compound A | Compound F | $Ir(piq)_3$ | Compound L |
| Example 4 | Compound B | Compound F | $Ir(piq)_3$ | Compound K |
| Example 5 | Compound A | Compound G | $Ir(ppy)_3$ | Compound J |

TABLE 1-continued

| | 2nd hole transporting layer | host | phospho-rescent dopant | Electron transporting layer |
|---|---|---|---|---|
| Compara-tive 1 | NPD(single layer 50 nm) | CBP | Ir(piq)$_3$ | BAlq(10 nm)/ Alq (20 nm) |
| Compara-tive 2 | NPD(single layer 50 nm) | CBP | Ir(ppy)$_3$ | BAlq(10 nm)/ Alq (20 nm) |

TABLE 2

| | 2nd hole transporting layer | host | phospho-rescent dopant | Electron transporting layer |
|---|---|---|---|---|
| Example 6 | — | Compound F | Ir(piq)$_3$ | Compound M |
| Example 7 | — | Compound F | Ir(piq)$_3$ | Compound N |
| Example 8 | — | Compound F | Ir(piq)$_3$ | Compound O |

[Chemical Formula 136]

Compound B

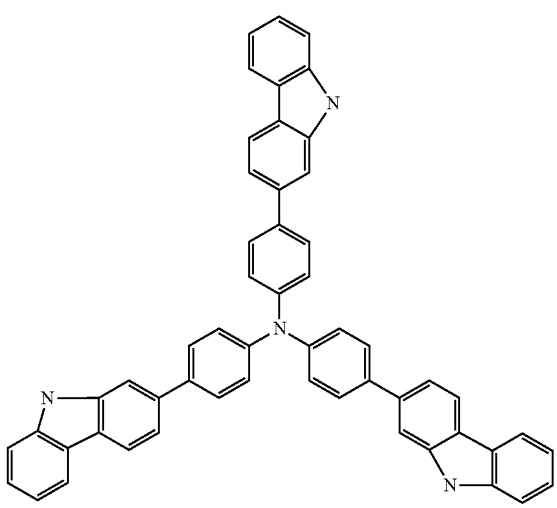

Compound E

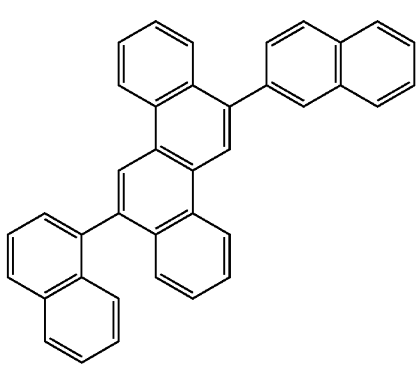

-continued

Compound F

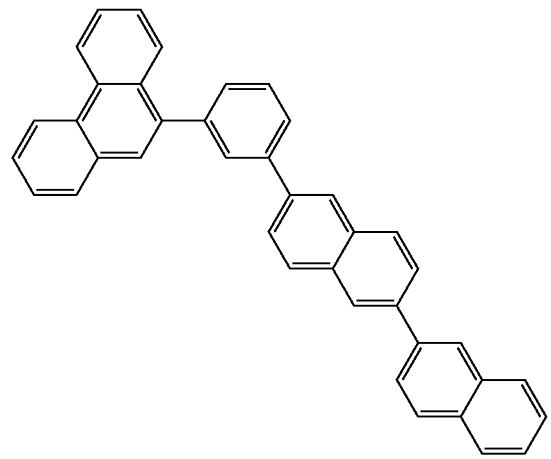

Compound G

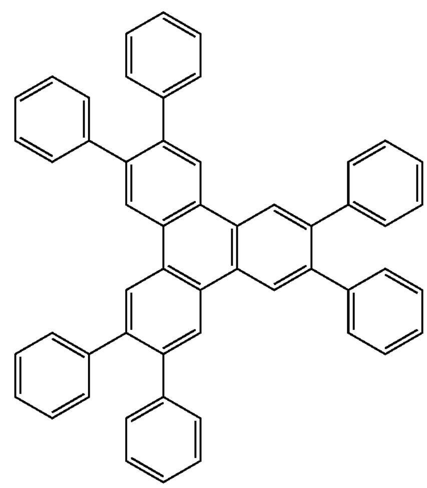

Compound K

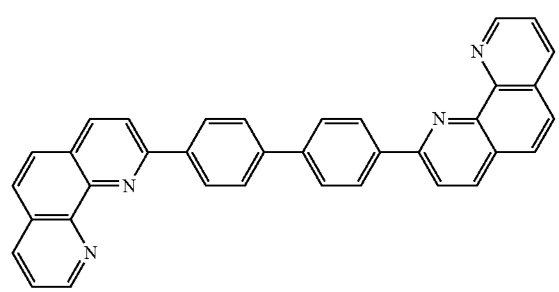

Compound L

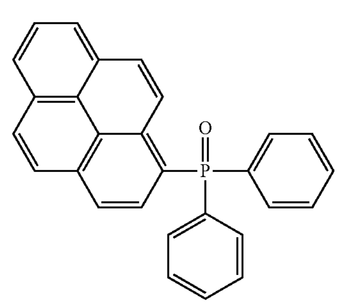

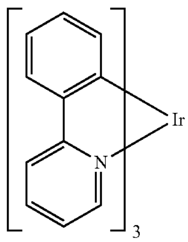
Ir(ppy)3
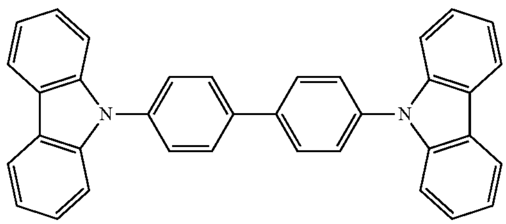
CBP
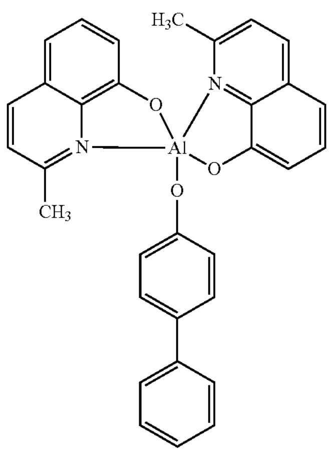
BAlq
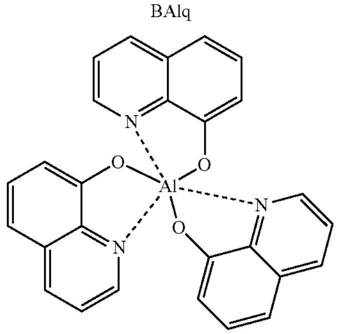
Alq
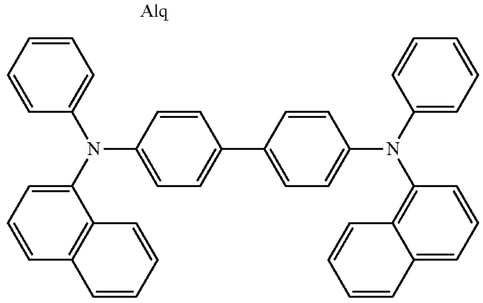
NPD
[Chemical Formula 137]
(M)
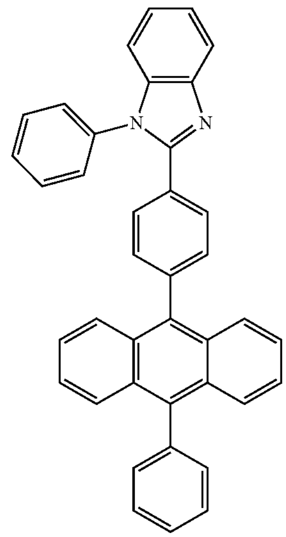
(N)
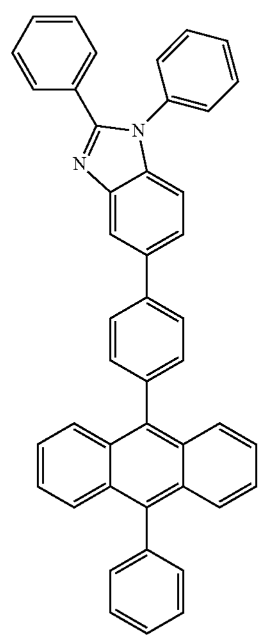

-continued (O)

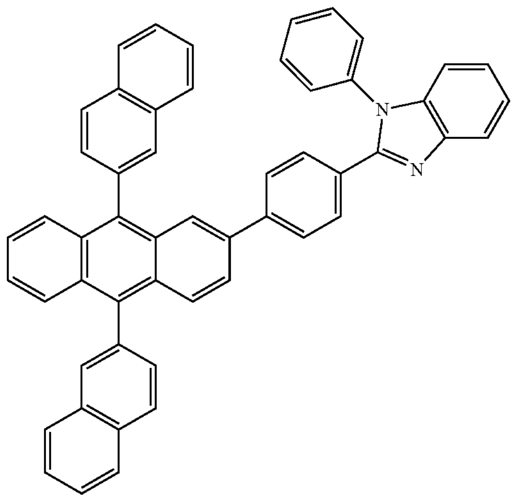

[Evaluation of Organic EL Device in Properties and Lifetime]

The organic electroluminescence devices produced as described above were applied with direct-current (1 mA/cm$^2$) to emit light, where chromaticity, luminance (L) and voltage were measured.

Based on the measurement, current efficiency (L/J) was obtained. Moreover, the organic electroluminescence devices were tested by a continuous current test under direct-current with the initial luminance intensity of 5000 nit(cd/m$^2$), where time until half-life was measured for each of the organic electroluminescence devices.

The results are shown in Tables 3 and 4 below. Eg(T) of each of the host materials is shown in Table 5 below.

TABLE 3

| | Voltage (V) | Chromaticity x | Chromaticity y | L/J (cd/A) | Light-emitting lifetime (H.@5000 nit) |
|---|---|---|---|---|---|
| Example 1 | 3.9 | 0.68 | 0.32 | 9.4 | 2000 |
| Example 2 | 4.3 | 0.69 | 0.31 | 11.8 | 4000 |
| Example 3 | 4.4 | 0.68 | 0.32 | 11.7 | 4000 |
| Example 4 | 4.6 | 0.68 | 0.32 | 12.7 | 5000 |
| Example 5 | 4.3 | 0.32 | 0.61 | 53.2 | 500 |
| Comparative 1 | 6.2 | 0.68 | 0.32 | 8.5 | 300 |
| Comparative 2 | 5.8 | 0.32 | 0.60 | 48.1 | 150 |

TABLE 4

| | Voltage (V) | Chromaticity x | Chromaticity y | L/J (cd/A) | Light-emitting lifetime (H.@5000 nit) |
|---|---|---|---|---|---|
| Example 6 | 4.5 | 0.69 | 0.31 | 11.8 | 4000 |
| Example 7 | 4.6 | 0.69 | 0.31 | 11.7 | 4000 |
| Example 8 | 4.8 | 0.69 | 0.31 | 11.5 | 4000 |

TABLE 5

| | Eg (T) (eV) |
|---|---|
| Compound D | 2.38 |
| Compound E | 2.40 |
| Compound F | 2.44 |
| Compound G | 2.66 |
| CBP | 2.81 |

As is clearly understood from Tables 1 to 4, the organic electroluminescence device according to each of Examples 1 to 4, which includes the host material, the electron transporting layer and the second hole transporting layer according to the aspect of the invention, exhibits a high luminous efficiency and a long light-emitting lifetime.

In contrast, the organic electroluminescence device of Comparative 1, in which the electron transporting layer contains no nitrogen-containing heterocycle derivatives represented by the formulae (1) to (6); the second hole transporting layer is not provided; and the hole transporting layer contains no compounds represented by the formulae (7) to (11), exhibits a lower luminous efficiency and a shorter light-emitting lifetime than the organic electroluminescence devices of Examples.

The similar evaluation was seen from the results of Example 5 and Comparative 2 in which the dopant was changed to $Ir(ppy)_3$. In other words, the organic electroluminescence device of Example 5 exhibits a higher efficiency and a longer lifetime than that of Comparative 2.

The invention claimed is:

1. An organic electroluminescence device, comprising:

an anode;

a cathode; and an organic thin-film layer interposed between the anode and the cathode, wherein the organic thin-film layer comprises:

an emitting layer that contains a host material and a phosphorescent dopant exhibiting phosphorescence; and a hole transporting layer that is provided between the anode and the emitting layer, wherein the host material comprises a host compound comprising a substituted or unsubstituted polycyclic fused aromatic skeleton, the polycyclic fused aromatic skeleton is represented by one of formulae (12) to (15) below, (12)

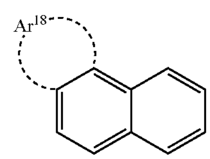

(13)

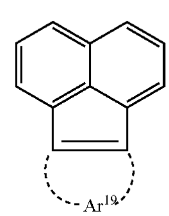

-continued (14)

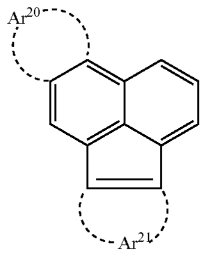

(15)

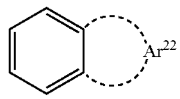

where $Ar^{18}$ to $Ar^{22}$ each represent a substituted or unsubstituted cyclic structure having 4 to 10 ring carbon atoms not including carbon atoms of the substituent, and the hole transporting layer contains a compound represented by a formula (8) below, (8)

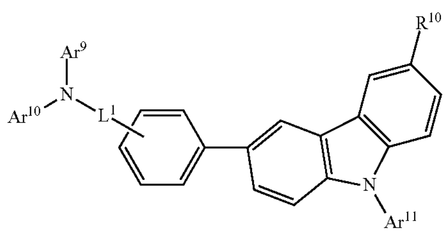

in which:

$Ar^9$ to $Ar^{11}$ each represent:

a substituted or unsubstituted aryl group having 6 to 40 carbon atoms; or a substituted or unsubstituted aromatic heterocyclic group having 5 to 40 carbon atoms, $L^1$ represents a single bond;

$R^{10}$ represents:

a hydrogen atom;

a substituted or unsubstituted alkyl group having 1 to 40 carbon atoms;

a substituted or unsubstituted heterocyclic group having 3 to 20 carbon atoms;

a substituted or unsubstituted non-fused aryl group having 6 to 40 carbon atoms;

a substituted or unsubstituted fused aryl group having 10 to 12 carbon atoms; or a substituted or unsubstituted fused/non-fused-mixed aryl group having 12 to 40 carbon atoms, $Ar^9$ or $Ar^{10}$ being a substituted or unsubstituted 9,9-dimethylfluorenyl group.

2. The organic electroluminescence device according to claim 1, wherein the hole transporting layer comprises the compound represented by the formula (8), in which:

$Ar^9$ to $Ar^{11}$ each represent a substituted or unsubstituted aryl group having 6 to 40 carbon atoms, $Ar^9$ or $Ar^{10}$ representing a substituted or unsubstituted 9,9-dimethylfluorenyl group;

$L^1$ represents a single bond; and $R^{10}$ represents a hydrogen atom or a phenyl group.

3. The organic electroluminescence device according to claim 1, wherein the hole transporting layer comprises the compound represented by the formula (8), in which:

$Ar^9$ represents a phenyl group, a biphenyl group, a 9,9-dimethylfluorenyl group or a phenanthryl group;

$Ar^{10}$ represents a phenyl group, a biphenyl group, a 9,9-dimethylfluorenyl group or a phenanthryl group;

$Ar^9$ or $Ar^{10}$ represents a 9,9-dimethylfluorenyl group;

$Ar^{11}$ represents a phenyl group or a biphenyl group;

$L^1$ represents a single bond; and $R^{10}$ represents a hydrogen atom.

4. The organic electroluminescence device according to claim 1, wherein the hole transporting layer is bonded to the emitting layer.

5. The organic electroluminescence device according to claim 1, wherein a wavelength of the phosphorescent dopant at a maximum luminance intensity is in a range of 470 nm to 700 nm.

6. The organic electroluminescence device according to claim 1, wherein a wavelength of the phosphorescent dopant at a maximum luminance intensity is in a range of 480 nm to 700 nm.

7. The organic electroluminescence device according to claim 1, wherein a wavelength of the phosphorescent dopant at a maximum luminance intensity is in a range of 500 nm to 650 nm.

8. The organic electroluminescence device according to claim 1, wherein the phosphorescent dopant comprises a metal complex comprising a metal selected from the group consisting of Ir, Pt, Os, Au, Cu, Re and Ru and a ligand.

9. The organic electroluminescence device according to claim 1, wherein a minimum triplet energy gap of the host compound is in a range of 2.1 eV to 2.7 eV.

10. The organic electroluminescence device according to claim 1, wherein the polycyclic fused aromatic skeleton does not include a nitrogen atom.

11. The organic electroluminescence device according to claim 1, wherein the polycyclic fused aromatic skeleton is an elementary substance or a derivative of phenanthrene.

12. The organic electroluminescence device according to claim 1, wherein the polycyclic fused aromatic skeleton is an elementary substance or a derivative of chrysene.

13. The organic electroluminescence device according to claim 1, wherein the polycyclic fused aromatic skeleton is an elementary substance or a derivative of fluoranthene.

14. The organic electroluminescence device according to claim 1, wherein the polycyclic fused aromatic skeleton is an elementary substance or a derivative of triphenylene.

15. An organic electroluminescence device, comprising:

an anode;

a cathode; and an organic thin-film layer interposed between the anode and the cathode, wherein the organic thin-film layer comprises:

an emitting layer that contains a host material and a phosphorescent dopant exhibiting phosphorescence; and a hole transporting layer that is provided between the anode and the emitting layer, wherein the hole transporting layer comprises a compound represented by a formula below

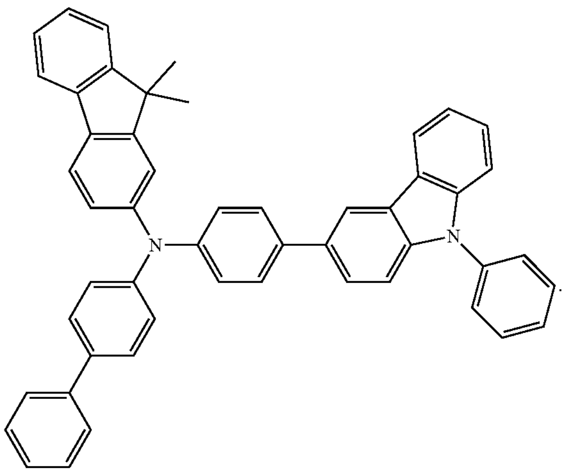 [SMILES: CC1(C)c2ccccc2-c2ccc(N(c3ccc(-c4ccccc4)cc3)c3ccc(-c4ccc5c(c4)c4ccccc4n5-c4ccccc4)cc3)cc21]

16. An organic electroluminescence device, comprising:

an anode;

a cathode; and an organic thin-film layer interposed between the anode and the cathode, wherein the organic thin-film layer comprises:

an emitting layer; and a hole transporting layer that is provided between the anode and the emitting layer, and the hole transporting layer comprises a compound represented by a formula below

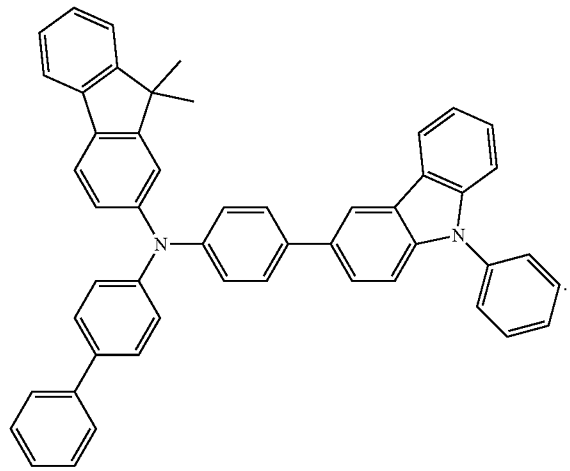 [SMILES: CC1(C)c2ccccc2-c2ccc(N(c3ccc(-c4ccccc4)cc3)c3ccc(-c4ccc5c(c4)c4ccccc4n5-c4ccccc4)cc3)cc21]

17. The organic electroluminescence device according to claim 16, wherein the hole transporting layer is bonded to the emitting layer.

* * * * *